US 6,496,956 B2
(12) United States Patent
Sako

(10) Patent No.: US 6,496,956 B2
(45) Date of Patent: Dec. 17, 2002

(54) PASS-TRANSISTOR LOGIC CIRCUIT AND A METHOD OF DESIGNING THEREOF

(75) Inventor: Norimitsu Sako, Okayama (JP)

(73) Assignee: Kawasaki Steel Corporation, Kobe (JP)

( * ) Notice: Subject to any disclaimer, the term of this patent is extended or adjusted under 35 U.S.C. 154(b) by 0 days.

(21) Appl. No.: 09/731,665

(22) Filed: Dec. 8, 2000

(65) Prior Publication Data

US 2002/0042903 A1 Apr. 11, 2002

Related U.S. Application Data

(62) Division of application No. 08/965,771, filed on Nov. 7, 1997, now Pat. No. 6,185,719.

(30) Foreign Application Priority Data

Jun. 6, 1997 (JP) .............................. 9-149719
Jun. 9, 1997 (JP) .............................. 9-151247

(51) Int. Cl.⁷ .............................................. G06F 17/50
(52) U.S. Cl. .................................. 716/3; 716/1; 716/18
(58) Field of Search ........................................ 716/1–21

(56) References Cited

U.S. PATENT DOCUMENTS

| | | | | |
|---|---|---|---|---|
| 4,870,302 A | | 9/1989 | Freeman ...................... | 326/41 |
| 5,040,139 A | | 8/1991 | Tran .......................... | 408/628 |
| 5,200,907 A | | 4/1993 | Tran .......................... | 326/113 |
| 5,399,921 A | * | 3/1995 | Dobbelaere .................. | 326/113 |
| 5,581,202 A | | 12/1996 | Yano et al. .................. | 326/101 |
| 5,872,716 A | | 2/1999 | Yano et al. .................... | 716/1 |
| 5,923,189 A | | 7/1999 | Sasaki et al. ............... | 326/113 |
| 6,051,031 A | * | 4/2000 | Shubat et al. ................. | 716/3 |

FOREIGN PATENT DOCUMENTS

| | | |
|---|---|---|
| JP | 1-129611 | 5/1989 |
| JP | 1-216622 | 8/1989 |
| JP | 1-256219 | 10/1989 |
| JP | 7-168874 | 7/1995 |
| JP | 9-006821 | 1/1997 |
| JP | 9-018332 | 1/1997 |
| JP | 9-097281 | 4/1997 |
| JP | 9-149749 | 6/1997 |
| JP | 9-151247 | 6/1997 |
| WO | WO96/34351 | 10/1996 |

OTHER PUBLICATIONS

Kumar et al, "A Heuristic for Decomposition in Multilevel Logic Optimization," IEEE, Dec. 1993, pp. 441–445.*

(List continued on next page.)

*Primary Examiner*—Vuthe Siek
(74) *Attorney, Agent, or Firm*—Oliff & Berridge, PLC

(57) ABSTRACT

A method of designing a logic circuit including pass transistors is disclosed. A logic group having a complementary variable in a given logical expression to be realized into the logic circuit is mapped using a multiplexer composed of a combination of the pass transistors. The number of transistors used in the logic circuit and the number of stages can be reduced by taking advantage of the multiplexer. When a logic circuit including both pass transistors and a multiple-input logic gate is designed, a logic group having a common variable in the given logical expression is mapped using the multiple-input logic gate. The number of transistors used in the logic circuit and the number of stages can be further reduced by taking advantage of the multiple-input logic gate. In order to ease the above mapping procedure, a complementary variable is identified and the given logical expression is optimized by grouping product terms of the logical expression by the complementary variable. Furthermore, a common variable is identified, and the logical expression is further optimized by grouping product terms of the logical expression by the common variable.

24 Claims, 70 Drawing Sheets

OTHER PUBLICATIONS

Ohkubo et al, "A 4.4 ns CMOS 54 ×54–b Multiplier Using Pass–Transistor Multiplexer," IEEE, Mar. 1995, pp. 251–257.*

"Top–Down Pass Transistor Logic Design" K. Yano et al., IEEE Journal of Solid–State Circuits, vol. 31 No. 6, Jun. 1996 pp. 792–803.

Suzuki et al. "A 1.5–ns 32–b CMOS ALU in Double Pass–Transistor Logic," IEEE, pp. 1145–1151, Nov. 1993.

Pass–Transistor/CMOS Collaborated Logic: The Best of Both Worlds, S. Yamashita et al., 1997 Symposium on VLSI Circuits Digest of Technical Papers (Jun. 12–14, 1997 Kyoto) pp. 31–32.

Neves et al. "A Pass Transistor Regular Structure for Implementing Multi–Level Combinational Circuits," IEEE, pp. 88–90, Sep. 1994.

Sasaki et al. "Pass Transistor Based Gate Array Architecture," IEEE, pp. 123–124, Jun. 1995.

Kazuo Yano et al., Multi–Level Pass–Transistor Logic for Low–Power ULSIs, IEEE, Jun. 1995.

"Method of Determining the Order of Variables with Respect to the 'Width' of a Common Binary Decision Diagram," Hata, the 42th Meeting of Information Processing Society of Japan, 2J–5, 1991.

"Binary Decision Diagrams", S. Akers, IEEE Transactions Computers, vol. c–27, No. 6, Jun. 1978, pp. 509–516.

"Universal logic gate transmission gate array" C. Zhang et al., Electronic Engineering (Oct. 1985) pp. 61–67.

"A Multiplexer–Based Architecture for High–Density, Low–Power Gate Arrays" R. Landers et al., IEEE Journal of Solid–State Circuits, vol. 30, No. 4 (Apr. 1995) pp. 392–396.

"Multi–Level Pass–Transistor Logic for Low–Power ULSLs", Y. Sasaki et al., IEEE Symposium on Low Power Electronic, Oct. 1995, pp. 14–15.

* cited by examiner

INTERNAL CIRCUIT CONFIGURATION

SYMBOLIC REPRESENTATION

FIG. 14

| a | b | c | d | e | f | g | h | i | j | |
|---|---|---|---|---|---|---|---|---|---|---|
| 0 | 0 | 0 | 0 | 0 | 0 | 0 | 0 | 0 | 2 | I |
| 0 | 0 | 0 | 0 | 0 | 1 | 1 | 1 | 2 | 1 | II |
| 1 | 1 | 1 | 1 | 1 | 0 | 0 | 2 | 0 | 0 | III |
| 1 | 1 | 1 | 1 | 1 | 1 | 2 | 1 | 1 | 1 | IV |
| 1 | 1 | 1 | 0 | 0 | 2 | 0 | 0 | 1 | 1 | V |
| 0 | 0 | 0 | 1 | 2 | 1 | 1 | 1 | 0 | 0 | VI |
| 1 | 0 | 1 | 2 | 1 | 0 | 1 | 0 | 1 | 0 | VII |
| 0 | 1 | 2 | 1 | 0 | 1 | 0 | 1 | 0 | 1 | VIII |

| a | b | c | d | e | f | g | h | i | j | | |
|---|---|---|---|---|---|---|---|---|---|---|---|
| – | – | 3 | 5 | 5 | 6 | 5 | 6 | 5 | 6 | b | a |
| – | 4 | – | 5 | 4 | 5 | 5 | 5 | 4 | 5 | c | a |
| – | 6 | 5 | – | 5 | 6 | 7 | 6 | 6 | 7 | d | a |
| – | 6 | 4 | 5 | – | 5 | 6 | 6 | 5 | 5 | e | a |
| – | 7 | 5 | 6 | 5 | – | 6 | 5 | 6 | 5 | f | a |
| – | 6 | 5 | 7 | 6 | 6 | – | 6 | 6 | 7 | g | a |
| – | 7 | 5 | 6 | 6 | 5 | 6 | – | 5 | 6 | h | a |
| – | 6 | 4 | 6 | 5 | 6 | 6 | 5 | – | 6 | i | a |
| – | 7 | 5 | 7 | 5 | 5 | 7 | 6 | 6 | – | j | a |
| – | – | 3 | 5 | 5 | 6 | 5 | 6 | 5 | 6 | a | b |
| 4 | – | – | 5 | 5 | 6 | 5 | 6 | 5 | 6 | c | b |
| 6 | – | 5 | – | 5 | 6 | 6 | 6 | 6 | 6 | d | b |
| 6 | – | 5 | 5 | – | 7 | 6 | 7 | 7 | 6 | e | b |
| 7 | – | 6 | 6 | 7 | – | 6 | 4 | 7 | 6 | f | b |
| 6 | – | 5 | 6 | 6 | 6 | – | 6 | 6 | 5 | g | b |
| 7 | – | 6 | 6 | 7 | 4 | 6 | – | 7 | 6 | h | b |
| 6 | – | 5 | 6 | 7 | 7 | 6 | 7 | – | 6 | i | b |
| 7 | – | 6 | 6 | 6 | 6 | 5 | 6 | 6 | – | j | b |

FIG. 15

| | | | | | | | | | | | |
|---|---|---|---|---|---|---|---|---|---|---|---|
| – | 4 | – | 5 | 4 | 5 | 5 | 5 | 4 | 5 | a | c |
| 4 | – | – | 5 | 5 | 6 | 5 | 6 | 5 | 6 | b | c |
| 6 | 6 | – | – | 5 | 7 | 7 | 7 | 7 | 7 | d | c |
| 5 | 6 | – | 5 | – | 6 | 7 | 7 | 6 | 6 | e | c |
| 6 | 7 | – | 7 | 6 | – | 6 | 6 | 7 | 6 | f | c |
| 6 | 6 | – | 7 | 7 | 6 | – | 6 | 7 | 7 | g | c |
| 6 | 7 | – | 7 | 7 | 6 | 6 | – | 6 | 7 | h | c |
| 5 | 6 | – | 7 | 6 | 7 | 7 | 6 | – | 6 | i | c |
| 6 | 7 | – | 7 | 6 | 6 | 7 | 7 | 6 | – | j | c |
| – | 6 | 5 | – | 5 | 6 | 7 | 6 | 6 | 7 | a | d |
| 6 | – | 5 | – | 5 | 6 | 6 | 6 | 6 | 6 | b | d |
| 6 | 6 | – | – | 5 | 7 | 7 | 7 | 7 | 7 | c | d |
| 6 | 6 | 5 | – | – | 7 | 6 | 6 | 7 | 6 | e | d |
| 7 | 7 | 7 | – | 7 | – | 7 | 5 | 6 | 6 | f | d |
| 8 | 7 | 7 | – | 6 | 7 | – | 6 | 6 | 7 | g | d |
| 7 | 7 | 7 | – | 6 | 5 | 6 | – | 6 | 6 | h | d |
| 7 | 7 | 7 | – | 7 | 6 | 6 | 6 | – | 6 | i | d |
| 8 | 7 | 7 | – | 6 | 6 | 7 | 6 | 6 | – | j | d |
| – | 6 | 4 | 5 | – | 5 | 6 | 6 | 5 | 5 | a | e |
| 6 | – | 5 | 5 | – | 7 | 6 | 7 | 7 | 6 | b | e |
| 5 | 6 | – | 5 | – | 6 | 7 | 7 | 6 | 6 | c | e |
| 6 | 6 | 5 | – | – | 7 | 6 | 6 | 7 | 6 | d | e |
| 6 | 8 | 6 | 7 | – | – | 7 | 6 | 7 | 5 | f | e |
| 7 | 7 | 7 | 6 | – | 7 | – | 6 | 6 | 6 | g | e |
| 7 | 8 | 7 | 6 | – | 6 | 6 | – | 7 | 6 | h | e |
| 6 | 8 | 6 | 7 | – | 7 | 6 | 7 | – | 7 | i | e |
| 6 | 7 | 6 | 6 | – | 5 | 6 | 6 | 7 | – | j | e |

FIG. 16

| | | | | | | | | | | | |
|---|---|---|---|---|---|---|---|---|---|---|---|
| – | 7 | 5 | 6 | 5 | – | 6 | 5 | 6 | 5 | a | f |
| 7 | – | 6 | 6 | 7 | – | 6 | 4 | 7 | 6 | b | f |
| 6 | 7 | – | 7 | 6 | – | 6 | 6 | 7 | 6 | c | f |
| 7 | 7 | 7 | – | 7 | – | 7 | 5 | 6 | 6 | d | f |
| 6 | 8 | 6 | 7 | – | – | 7 | 6 | 7 | 5 | e | f |
| 7 | 7 | 6 | 7 | 7 | – | – | 6 | 6 | 7 | g | f |
| 6 | 5 | 6 | 5 | 6 | – | 6 | – | 6 | 5 | h | f |
| 7 | 8 | 7 | 6 | 7 | – | 6 | 6 | – | 7 | i | f |
| 6 | 7 | 6 | 6 | 5 | – | 7 | 5 | 7 | – | j | f |
| – | 6 | 5 | 7 | 6 | 6 | – | 6 | 6 | 7 | a | g |
| 6 | – | 5 | 6 | 6 | 6 | – | 6 | 6 | 5 | b | g |
| 6 | 6 | – | 7 | 7 | 6 | – | 6 | 7 | 7 | c | g |
| 8 | 7 | 7 | – | 6 | 7 | – | 6 | 6 | 7 | d | g |
| 7 | 7 | 7 | 6 | – | 7 | – | 6 | 6 | 6 | e | g |
| 7 | 7 | 6 | 7 | 7 | – | – | 6 | 6 | 7 | f | g |
| 7 | 7 | 6 | 6 | 6 | 6 | – | – | 7 | 7 | h | g |
| 7 | 7 | 7 | 6 | 6 | 6 | – | 7 | – | 7 | i | g |
| 8 | 6 | 7 | 7 | 6 | 7 | – | 7 | 7 | – | j | g |
| – | 7 | 5 | 6 | 6 | 5 | 6 | – | 5 | 6 | a | h |
| 7 | – | 6 | 6 | 7 | 4 | 6 | – | 7 | 6 | b | h |
| 6 | 7 | – | 7 | 7 | 6 | 6 | – | 6 | 7 | c | h |
| 7 | 7 | 7 | – | 6 | 5 | 6 | – | 6 | 6 | d | h |
| 7 | 8 | 7 | 6 | – | 6 | 6 | – | 7 | 6 | e | h |
| 6 | 5 | 6 | 5 | 6 | – | 6 | – | 6 | 5 | f | h |
| 7 | 7 | 6 | 6 | 6 | 6 | – | – | 7 | 7 | g | h |
| 6 | 8 | 6 | 6 | 7 | 6 | 7 | – | – | 7 | i | h |
| 7 | 7 | 7 | 6 | 6 | 5 | 7 | – | 7 | – | j | h |

FIG. 17

| | | | | | | | | | | |
|---|---|---|---|---|---|---|---|---|---|---|
| – | 6 | 4 | 6 | 5 | 6 | 6 | 5 | – | 6 | a i |
| 6 | – | 5 | 6 | 7 | 7 | 6 | 7 | – | 6 | b i |
| 5 | 6 | – | 7 | 6 | 7 | 7 | 6 | – | 6 | c i |
| 7 | 7 | 7 | – | 7 | 6 | 6 | 6 | – | 6 | d i |
| 6 | 8 | 6 | 7 | – | 7 | 6 | 7 | – | 7 | e i |
| 7 | 8 | 7 | 6 | 7 | – | 6 | 6 | – | 7 | f i |
| 7 | 7 | 7 | 6 | 6 | 6 | – | 7 | – | 7 | g i |
| 6 | 8 | 6 | 6 | 7 | 6 | 7 | – | – | 7 | h i |
| 7 | 7 | 6 | 6 | 7 | 7 | 7 | 7 | – | – | j i |
| – | 7 | 5 | 7 | 5 | 5 | 7 | 6 | 6 | – | a j |
| 7 | – | 6 | 6 | 6 | 6 | 5 | 6 | 6 | – | b j |
| 6 | 7 | – | 7 | 6 | 6 | 7 | 7 | 6 | – | c j |
| 8 | 7 | 7 | – | 6 | 6 | 7 | 6 | 6 | – | d j |
| 6 | 7 | 6 | 6 | – | 5 | 6 | 6 | 7 | – | e j |
| 6 | 7 | 6 | 6 | 5 | – | 7 | 5 | 7 | – | f j |
| 8 | 6 | 7 | 7 | 6 | 7 | – | 7 | 7 | – | g j |
| 7 | 7 | 7 | 6 | 6 | 5 | 7 | – | 7 | – | h j |
| 7 | 7 | 6 | 6 | 7 | 7 | 7 | 7 | – | – | i j |
| a | b | c | d | e | f | g | h | i | j | |
| 8 | 8 | 7 | 7 | 7 | 7 | 7 | 7 | 7 | 7 | MAXIMUM NUMBER OF COMBINATIONS |
| 6 | 10 | 22 | 22 | 22 | 20 | 26 | 18 | 28 | 24 | OCCURRENCE OF MAXIMUM NUMBER |
| 4 | 4 | 3 | 5 | 4 | 4 | 5 | 4 | 4 | 5 | MINIMUM NUMBER OF COMBINATIONS |
| 2 | 2 | 2 | 14 | 2 | 2 | 8 | 2 | 2 | 12 | OCCURRENCE OF MINIMUM NUMBER |

FIG. 18

| a | b | c | d | e | f | g | h | i | j | |
|---|---|---|---|---|---|---|---|---|---|---|
| 0 | 0 | 0 | 0 | 0 | 0 | 0 | 0 | 0 | 2 | I |
| 0 | 0 | 0 | 0 | 0 | 1 | 1 | 1 | 2 | 1 | II |
| 1 | 1 | 1 | 1 | 1 | 0 | 0 | 2 | 0 | 0 | III |
| 1 | 1 | 1 | 1 | 1 | 1 | 2 | 1 | 1 | 1 | IV |
| 1 | 1 | 1 | 0 | 0 | 2 | 0 | 0 | 1 | 1 | V |
| 0 | 0 | 0 | 1 | 2 | 1 | 1 | 1 | 0 | 0 | VI |
| 1 | 0 | 1 | 2 | 1 | 0 | 1 | 0 | 1 | 0 | VII |
| 0 | 1 | 2 | 1 | 0 | 1 | 0 | 1 | 0 | 1 | VIII |

| a | b | c | d | e | f | g | h | i | j | |
|---|---|---|---|---|---|---|---|---|---|---|
| – | 4 | 2 | 4 | 3 | 4 | 4 | 4 | 3 | 4 | a |
| 4 | – | 3 | 4 | 4 | 4 | 3 | 4 | 4 | 4 | b |
| 2 | 3 | – | 4 | 3 | 4 | 4 | 4 | 3 | 4 | c |
| 4 | 4 | 4 | – | 3 | 4 | 4 | 3 | 4 | 3 | d |
| 3 | 4 | 3 | 3 | – | 4 | 4 | 4 | 4 | 3 | e |
| 4 | 4 | 4 | 4 | 4 | – | 4 | 2 | 4 | 3 | f |
| 4 | 3 | 4 | 4 | 4 | 4 | – | 4 | 4 | 4 | g |
| 4 | 4 | 4 | 3 | 4 | 2 | 4 | – | 4 | 4 | h |
| 3 | 4 | 3 | 4 | 4 | 4 | 4 | 4 | – | 4 | i |
| 4 | 4 | 4 | 3 | 3 | 3 | 4 | 4 | 4 | – | j |

| a | b | c | d | e | f | g | h | i | j | |
|---|---|---|---|---|---|---|---|---|---|---|
| 4 | 4 | 4 | 4 | 4 | 4 | 4 | 4 | 4 | 4 | MAXIMUM NUMBER OF COMBINATIONS |
| 6 | 7 | 5 | 6 | 5 | 7 | 8 | 7 | 7 | 6 | OCCURRENCE OF MAXIMUM NUMBER |
| 2 | 3 | 2 | 3 | 3 | 2 | 3 | 2 | 3 | 3 | MINIMUM NUMBER OF COMBINATIONS |
| 1 | 2 | 1 | 3 | 4 | 1 | 1 | 1 | 2 | 3 | OCCURRENCE OF MINIMUM NUMBER |

FIG. 19

| d | e | f | g | h | i | j | | |
|---|---|---|---|---|---|---|---|---|
| 0 | 0 | 0 | 0 | 0 | 0 | 2 | I | |
| 0 | 0 | 1 | 1 | 1 | 2 | 1 | II | |
| 1 | 2 | 1 | 1 | 1 | 0 | 0 | VI | |
| d | e | f | g | h | i | j | | |
| – | – | 3 | 3 | 3 | 2 | 2 | e | d |
| – | 2 | – | 3 | 3 | 2 | 2 | f | d |
| – | 2 | 3 | – | 3 | 2 | 2 | g | d |
| – | 2 | 3 | 3 | – | 2 | 2 | h | d |
| – | 2 | 3 | 3 | 3 | – | 2 | i | d |
| – | 2 | 3 | 3 | 3 | 2 | – | j | d |
| – | – | 3 | 3 | 3 | 2 | 2 | d | e |
| 3 | – | – | 3 | 3 | 2 | 2 | f | e |
| 3 | – | 3 | – | 3 | 2 | 2 | g | e |
| 3 | – | 3 | 3 | – | 2 | 2 | h | e |
| 3 | – | 3 | 3 | 3 | – | 2 | i | e |
| 3 | – | 3 | 3 | 3 | 2 | – | j | e |
| – | 2 | – | 3 | 3 | 2 | 2 | d | f |
| 3 | – | – | 3 | 3 | 2 | 2 | e | f |
| 3 | 2 | – | – | 2 | 2 | 2 | g | f |
| 3 | 2 | – | 2 | – | 2 | 2 | h | f |
| 3 | 2 | – | 3 | 3 | – | 2 | i | f |
| 3 | 2 | – | 3 | 3 | 2 | – | j | f |
| – | 2 | 3 | – | 3 | 2 | 2 | d | g |
| 3 | – | 3 | – | 3 | 2 | 2 | e | g |
| 3 | 2 | – | – | 2 | 2 | 2 | f | g |
| 3 | 2 | 2 | – | – | 2 | 2 | h | g |
| 3 | 2 | 3 | – | 3 | – | 2 | i | g |
| 3 | 2 | 3 | – | 3 | 2 | – | j | g |

FIG. 20

| | | | | | | | | |
|---|---|---|---|---|---|---|---|---|
| – | 2 | 3 | 3 | – | 2 | 2 | d | h |
| 3 | – | 3 | 3 | – | 2 | 2 | e | h |
| 3 | 2 | – | 2 | – | 2 | 2 | f | h |
| 3 | 2 | 2 | – | – | 2 | 2 | g | h |
| 3 | 2 | 3 | 3 | – | – | 2 | i | h |
| 3 | 2 | 3 | 3 | – | 2 | – | j | h |
| – | 2 | 3 | 3 | 3 | – | 2 | d | i |
| 3 | – | 3 | 3 | 3 | – | 2 | e | i |
| 3 | 2 | – | 3 | 3 | – | 2 | f | i |
| 3 | 2 | 3 | – | 3 | – | 2 | g | i |
| 3 | 2 | 3 | 3 | – | – | 2 | h | i |
| 3 | 2 | 3 | 3 | 3 | – | – | j | i |
| – | 2 | 3 | 3 | 3 | 2 | – | d | j |
| 3 | – | 3 | 3 | 3 | 2 | – | e | j |
| 3 | 2 | – | 3 | 3 | 2 | – | f | j |
| 3 | 2 | 3 | – | 3 | 2 | – | g | j |
| 3 | 2 | 3 | 3 | – | 2 | – | h | j |
| 3 | 2 | 3 | 3 | 3 | – | – | i | j |
| d | e | f | g | h | i | j | | |
| 3 | 2 | 3 | 3 | 3 | 2 | 2 | MAXIMUM NUMBER OF COMBINATIONS | |
| 30 | 30 | 28 | 28 | 28 | 30 | 30 | OCCURRENCE OF MAXIMUM NUMBER | |
| 3 | 2 | 2 | 2 | 2 | 2 | 2 | MINIMUM NUMBER OF COMBINATIONS | |
| 30 | 30 | 2 | 2 | 2 | 30 | 30 | OCCURRENCE OF MINIMUM NUMBER | |

FIG. 31

| a | b | c | d | e | f | g | h | i | j | | |
|---|---|---|---|---|---|---|---|---|---|---|---|
| 0 | 0 | 0 | 0 | 0 | 0 | 0 | 0 | 0 | 2 | I | |
| 0 | 0 | 0 | 0 | 0 | 1 | 1 | 1 | 2 | 1 | II | |
| 1 | 1 | 1 | 1 | 1 | 0 | 0 | 2 | 0 | 0 | III | |
| 1 | 1 | 1 | 1 | 1 | 1 | 2 | 1 | 1 | 1 | IV | |
| 1 | 1 | 1 | 0 | 0 | 2 | 0 | 0 | 1 | 1 | V | |
| 0 | 0 | 0 | 1 | 2 | 1 | 1 | 1 | 0 | 0 | VI | |
| 1 | 0 | 1 | 2 | 1 | 0 | 1 | 0 | 1 | 0 | VII | |
| 0 | 1 | 2 | 1 | 0 | 1 | 0 | 1 | 0 | 1 | VIII | |

| a | b | c | d | e | f | g | h | i | j | | | COUNT |
|---|---|---|---|---|---|---|---|---|---|---|---|---|
| 0 | 0 | 0 | 0 | 0 | 2 | 2 | 2 | 2 | 2 | II | I | 5 |
| 2 | 2 | 2 | 2 | 2 | 0 | 0 | 2 | 0 | 2 | III | I | 3 |
| 2 | 2 | 2 | 2 | 2 | 2 | 2 | 2 | 2 | 2 | IV | I | 0 |
| 2 | 2 | 2 | 0 | 0 | 2 | 0 | 0 | 2 | 2 | V | I | 4 |
| 0 | 0 | 0 | 2 | 2 | 2 | 2 | 2 | 0 | 2 | VI | I | 4 |
| 2 | 0 | 2 | 2 | 2 | 0 | 2 | 0 | 2 | 2 | VII | I | 3 |
| 0 | 2 | 2 | 2 | 0 | 2 | 0 | 2 | 0 | 2 | VIII | I | 4 |
| 2 | 2 | 2 | 2 | 2 | 2 | 2 | 2 | 2 | 2 | III | II | 0 |
| 2 | 2 | 2 | 2 | 2 | 1 | 2 | 1 | 2 | 1 | IV | II | 3 |
| 2 | 2 | 2 | 0 | 0 | 2 | 2 | 2 | 2 | 1 | V | II | 3 |

FIG. 32

| | | | | | | | | | | | | |
|---|---|---|---|---|---|---|---|---|---|---|---|---|
| 0 | 0 | 0 | 2 | 2 | 1 | 1 | 1 | 2 | 2 | VI | II | 6 |
| 2 | 0 | 2 | 2 | 2 | 2 | 1 | 2 | 2 | 2 | VII | II | 2 |
| 0 | 2 | 2 | 2 | 0 | 1 | 2 | 1 | 2 | 1 | VIII | II | 5 |
| 1 | 1 | 1 | 1 | 1 | 2 | 2 | 2 | 2 | 2 | VI | III | 5 |
| 1 | 1 | 1 | 2 | 2 | 2 | 0 | 2 | 2 | 2 | V | III | 4 |
| 2 | 2 | 2 | 1 | 2 | 2 | 2 | 2 | 0 | 0 | VI | III | 3 |
| 1 | 2 | 1 | 2 | 1 | 0 | 2 | 2 | 2 | 0 | VII | III | 5 |
| 2 | 1 | 2 | 1 | 2 | 2 | 0 | 2 | 0 | 2 | VIII | III | 4 |
| 1 | 1 | 1 | 2 | 2 | 2 | 2 | 2 | 1 | 1 | V | IV | 5 |
| 2 | 2 | 2 | 1 | 2 | 1 | 2 | 1 | 2 | 2 | VI | IV | 3 |
| 1 | 2 | 1 | 2 | 1 | 2 | 2 | 2 | 1 | 2 | VII | IV | 4 |
| 2 | 1 | 2 | 1 | 2 | 1 | 2 | 1 | 2 | 1 | VIII | IV | 5 |
| 2 | 2 | 2 | 2 | 2 | 2 | 2 | 2 | 2 | 2 | VI | V | 0 |
| 1 | 2 | 1 | 2 | 2 | 2 | 2 | 0 | 1 | 2 | VII | V | 4 |
| 2 | 1 | 2 | 2 | 0 | 2 | 0 | 2 | 2 | 1 | VIII | V | 4 |
| 2 | 0 | 2 | 2 | 2 | 2 | 1 | 2 | 2 | 0 | VII | VI | 3 |
| 0 | 2 | 2 | 1 | 2 | 1 | 2 | 1 | 0 | 2 | VIII | VI | 5 |
| 2 | 2 | 2 | 2 | 2 | 2 | 2 | 2 | 2 | 2 | VIII | VII | 0 |
| a | b | c | d | e | f | g | h | i | j | | | |
| 6 | 6 | 3 | 3 | 6 | 3 | 6 | 3 | 6 | 3 | COUNT OF "0" | | |
| 6 | 6 | 6 | 6 | 3 | 6 | 3 | 6 | 3 | 6 | COUNT OF "1" | | |

FIG. 33

| a | b | c | d | e | f | g | h | i | j | | | |
|---|---|---|---|---|---|---|---|---|---|---|---|---|
| 0 | 0 | 0 | 2 | 2 | 1 | 1 | 1 | 2 | 2 | I | VI | II |
| 1 | 1 | 1 | 1 | 1 | 2 | 2 | 2 | 2 | 2 | II | IV | III |
| 1 | 2 | 1 | 2 | 1 | 0 | 2 | 2 | 2 | 0 | III | VII | III |
| 1 | 1 | 1 | 2 | 2 | 2 | 2 | 2 | 1 | 1 | IV | V | IV |
| 2 | 1 | 2 | 1 | 2 | 1 | 2 | 1 | 2 | 1 | V | VIII | IV |

| a | b | c | d | e | f | g | h | i | j | | | COUNT |
|---|---|---|---|---|---|---|---|---|---|---|---|---|
| 2 | 2 | 2 | 2 | 2 | 2 | 2 | 2 | 2 | 2 | II | I | 0 |
| 2 | 2 | 2 | 2 | 2 | 2 | 2 | 2 | 2 | 2 | III | I | 0 |
| 2 | 2 | 2 | 2 | 2 | 2 | 2 | 2 | 2 | 2 | IV | I | 0 |
| 2 | 2 | 2 | 2 | 2 | 1 | 2 | 1 | 2 | 2 | V | I | 2 |
| 1 | 2 | 1 | 2 | 1 | 2 | 2 | 2 | 2 | 2 | III | II | 3 |
| 1 | 1 | 1 | 2 | 2 | 2 | 2 | 2 | 2 | 2 | IV | II | 3 |
| 2 | 1 | 2 | 1 | 2 | 2 | 2 | 2 | 2 | 2 | V | II | 2 |
| 1 | 2 | 1 | 2 | 2 | 2 | 2 | 2 | 2 | 2 | IV | III | 2 |
| 2 | 2 | 2 | 2 | 2 | 2 | 2 | 2 | 2 | 2 | V | III | 0 |
| 2 | 1 | 2 | 2 | 2 | 2 | 2 | 2 | 2 | 1 | V | IV | 2 |

| a | b | c | d | e | f | g | h | i | j | |
|---|---|---|---|---|---|---|---|---|---|---|
| 0 | 0 | 0 | 0 | 0 | 0 | 0 | 0 | 0 | 0 | COUNT OF "0" |
| 3 | 3 | 3 | 1 | 1 | 1 | 0 | 1 | 0 | 1 | COUNT OF "1" |

FIG. 34

| a | b | c | d | e | f | g | h | i | j | | | |
|---|---|---|---|---|---|---|---|---|---|---|---|---|
| 0 | 0 | 0 | 2 | 2 | 1 | 1 | 1 | 2 | 2 | I | VI | II |
| 1 | 1 | 1 | 2 | 2 | 2 | 2 | 2 | 1 | 1 | II | V | IV |
| 1 | 2 | 1 | 2 | 1 | 0 | 2 | 2 | 2 | 0 | III | VII | III |
| 0 | 2 | 2 | 2 | 0 | 2 | 0 | 2 | 0 | 2 | IV | VIII | I |
| a | b | c | d | e | f | g | h | i | j | | | COUNT |
| 2 | 2 | 2 | 2 | 2 | 2 | 2 | 2 | 2 | 2 | II | I | 0 |
| 2 | 2 | 2 | 2 | 2 | 2 | 2 | 2 | 2 | 2 | III | I | 0 |
| 0 | 2 | 2 | 2 | 2 | 2 | 2 | 2 | 2 | 2 | IV | I | 1 |
| 1 | 2 | 1 | 2 | 2 | 2 | 2 | 2 | 2 | 2 | III | II | 2 |
| 2 | 2 | 2 | 2 | 2 | 2 | 2 | 2 | 2 | 2 | IV | II | 0 |
| 2 | 2 | 2 | 2 | 2 | 2 | 2 | 2 | 2 | 2 | IV | III | 0 |
| a | b | c | d | e | f | g | h | i | j | | | |
| 1 | 0 | 0 | 0 | 0 | 0 | 0 | 0 | 0 | 0 | COUNT OF "0" | | |
| 1 | 0 | 1 | 0 | 0 | 0 | 0 | 0 | 0 | 1 | COUNT OF "1" | | |

FIG. 43

| a | b | c | d | e | f | g | h | i | j | | | | |
|---|---|---|---|---|---|---|---|---|---|---|---|---|---|
| 0 | 0 | 0 | 0 | 0 | 0 | 0 | 0 | 0 | 2 | I | | | |
| 0 | 0 | 0 | 0 | 0 | 1 | 1 | 1 | 2 | 1 | II | | | |
| 1 | 1 | 1 | 1 | 1 | 0 | 0 | 2 | 0 | 0 | III | | | |
| 1 | 1 | 1 | 1 | 1 | 1 | 2 | 1 | 1 | 1 | IV | | | |
| 1 | 1 | 1 | 0 | 0 | 2 | 0 | 0 | 1 | 1 | V | | | |
| 0 | 0 | 0 | 1 | 2 | 1 | 1 | 1 | 0 | 0 | VI | | | |
| 1 | 0 | 1 | 2 | 1 | 0 | 1 | 0 | 1 | 0 | VII | | | |
| 0 | 1 | 2 | 1 | 0 | 1 | 0 | 1 | 0 | 1 | VIII | | | |
| a | b | c | d | e | f | g | h | i | j | | | | COUNT |
| 2 | 2 | 2 | 2 | 2 | 2 | 2 | 2 | 2 | 2 | III | II | I | 0 |
| 2 | 2 | 2 | 2 | 2 | 2 | 2 | 2 | 2 | 2 | IV | II | I | 0 |
| 2 | 2 | 2 | 0 | 0 | 2 | 2 | 2 | 2 | 2 | V | II | I | 2 |
| 0 | 0 | 0 | 2 | 2 | 2 | 2 | 2 | 2 | 2 | VI | II | I | 3 |
| 2 | 0 | 2 | 2 | 2 | 2 | 2 | 2 | 2 | 2 | VII | II | I | 1 |
| 0 | 2 | 2 | 2 | 0 | 2 | 2 | 2 | 2 | 2 | VIII | II | I | 2 |
| 2 | 2 | 2 | 2 | 2 | 2 | 2 | 2 | 2 | 2 | IV | III | I | 0 |
| 2 | 2 | 2 | 2 | 2 | 0 | 2 | 2 | 2 | 2 | V | III | I | 1 |
| 2 | 2 | 2 | 2 | 2 | 2 | 2 | 2 | 0 | 2 | VI | III | I | 1 |
| 2 | 2 | 2 | 2 | 2 | 0 | 2 | 2 | 2 | 2 | VII | III | I | 1 |
| 2 | 2 | 2 | 2 | 2 | 2 | 0 | 2 | 0 | 2 | VIII | III | I | 2 |
| 2 | 2 | 2 | 2 | 2 | 2 | 2 | 2 | 2 | 2 | V | IV | I | 0 |
| 2 | 2 | 2 | 2 | 2 | 2 | 2 | 2 | 2 | 2 | VI | IV | I | 0 |
| 2 | 2 | 2 | 2 | 2 | 2 | 2 | 2 | 2 | 2 | VII | IV | I | 0 |
| 2 | 2 | 2 | 2 | 2 | 2 | 2 | 2 | 2 | 2 | VIII | IV | I | 0 |
| 2 | 2 | 2 | 2 | 2 | 2 | 2 | 2 | 2 | 2 | VI | V | I | 0 |
| 2 | 2 | 2 | 2 | 2 | 2 | 0 | 2 | 2 | 2 | VII | V | I | 1 |
| 2 | 2 | 2 | 2 | 0 | 2 | 0 | 2 | 2 | 2 | VIII | V | I | 2 |
| 2 | 0 | 2 | 2 | 2 | 2 | 2 | 2 | 2 | 2 | VII | VI | I | 1 |
| 0 | 2 | 2 | 2 | 2 | 2 | 2 | 2 | 0 | 2 | VIII | VI | I | 2 |
| 2 | 2 | 2 | 2 | 2 | 2 | 2 | 2 | 2 | 2 | VIII | VII | I | 0 |

FIG. 44

| | | | | | | | | | | | | | |
|---|---|---|---|---|---|---|---|---|---|---|---|---|---|
| 2 | 2 | 2 | 2 | 2 | 2 | 2 | 2 | 2 | 2 | IV | III | II | 0 |
| 2 | 2 | 2 | 2 | 2 | 2 | 2 | 2 | 2 | 2 | V | III | II | 0 |
| 2 | 2 | 2 | 2 | 2 | 2 | 2 | 2 | 2 | 2 | VI | III | II | 0 |
| 2 | 2 | 2 | 2 | 2 | 2 | 2 | 2 | 2 | 2 | VII | III | II | 0 |
| 2 | 2 | 2 | 2 | 2 | 2 | 2 | 2 | 2 | 2 | VIII | III | II | 0 |
| 2 | 2 | 2 | 2 | 2 | 2 | 2 | 2 | 2 | 1 | V | IV | II | 1 |
| 2 | 2 | 2 | 2 | 2 | 1 | 2 | 1 | 2 | 2 | VI | IV | II | 2 |
| 2 | 2 | 2 | 2 | 2 | 2 | 2 | 2 | 2 | 2 | VII | IV | II | 0 |
| 2 | 2 | 2 | 2 | 2 | 1 | 2 | 1 | 2 | 1 | VIII | IV | II | 3 |
| 2 | 2 | 2 | 2 | 2 | 2 | 2 | 2 | 2 | 2 | VI | V | II | 0 |
| 2 | 2 | 2 | 2 | 2 | 2 | 2 | 2 | 2 | 2 | VII | V | II | 0 |
| 2 | 2 | 2 | 2 | 0 | 2 | 2 | 2 | 2 | 1 | VIII | V | II | 2 |
| 2 | 0 | 2 | 2 | 2 | 2 | 1 | 2 | 2 | 2 | VII | VI | II | 2 |
| 0 | 2 | 2 | 2 | 2 | 1 | 2 | 1 | 2 | 2 | VIII | VI | II | 3 |
| 2 | 2 | 2 | 2 | 2 | 2 | 2 | 2 | 2 | 2 | VIII | VII | II | 0 |
| 1 | 1 | 1 | 2 | 2 | 2 | 2 | 2 | 2 | 2 | V | IV | III | 3 |
| 2 | 2 | 2 | 1 | 2 | 2 | 2 | 2 | 2 | 2 | VI | IV | III | 1 |
| 1 | 2 | 1 | 2 | 1 | 2 | 2 | 2 | 2 | 2 | VII | IV | III | 3 |
| 2 | 1 | 2 | 1 | 2 | 2 | 2 | 2 | 2 | 2 | VIII | IV | III | 2 |
| 2 | 2 | 2 | 2 | 2 | 2 | 2 | 2 | 2 | 2 | VI | V | III | 0 |
| 1 | 2 | 1 | 2 | 2 | 2 | 2 | 2 | 2 | 2 | VII | V | III | 2 |
| 2 | 1 | 2 | 2 | 2 | 2 | 0 | 2 | 2 | 2 | VIII | V | III | 2 |
| 2 | 2 | 2 | 2 | 2 | 2 | 2 | 2 | 2 | 0 | VII | VI | III | 1 |
| 2 | 2 | 2 | 1 | 2 | 2 | 2 | 2 | 0 | 2 | VIII | VI | III | 2 |
| 2 | 2 | 2 | 2 | 2 | 2 | 2 | 2 | 2 | 2 | VIII | VII | III | 0 |

FIG. 45

| | | | | | | | | | | | | | |
|---|---|---|---|---|---|---|---|---|---|---|---|---|---|
| 2 | 2 | 2 | 2 | 2 | 2 | 2 | 2 | 2 | 2 | VI | V | IV | 0 |
| 1 | 2 | 1 | 2 | 2 | 2 | 2 | 2 | 1 | 2 | VII | V | IV | 3 |
| 2 | 1 | 2 | 2 | 2 | 2 | 2 | 2 | 2 | 1 | VIII | V | IV | 2 |
| 2 | 2 | 2 | 2 | 2 | 2 | 2 | 2 | 2 | 2 | VII | VI | IV | 0 |
| 2 | 2 | 2 | 1 | 2 | 1 | 2 | 1 | 2 | 2 | VIII | VI | IV | 3 |
| 2 | 2 | 2 | 2 | 2 | 2 | 2 | 2 | 2 | 2 | VIII | VII | IV | 0 |
| 2 | 2 | 2 | 2 | 2 | 2 | 2 | 2 | 2 | 2 | VII | VI | V | 0 |
| 2 | 2 | 2 | 2 | 2 | 2 | 2 | 2 | 2 | 2 | VIII | VI | V | 0 |
| 2 | 2 | 2 | 2 | 2 | 2 | 2 | 2 | 2 | 2 | VIII | VII | V | 0 |
| 2 | 2 | 2 | 2 | 2 | 2 | 2 | 2 | 2 | 2 | VIII | VII | VI | 0 |
| a | b | c | d | e | f | g | h | i | j | | | | |
| 4 | 4 | 1 | 1 | 4 | 1 | 4 | 1 | 4 | 1 | COUNT OF "0" | | | |
| 4 | 4 | 4 | 4 | 1 | 4 | 1 | 4 | 1 | 4 | COUNT OF "1" | | | |

FIG. 46

| a | b | c | e | f | g | h | i | j | | |
|---|---|---|---|---|---|---|---|---|---|---|
| 0 | 0 | 0 | 2 | 1 | 1 | 1 | 2 | 2 | VI | II |
| 1 | 1 | 1 | 2 | 2 | 2 | 2 | 1 | 1 | V | IV |
| 1 | 2 | 1 | 1 | 0 | 2 | 2 | 2 | 0 | VII | III |
| 0 | 2 | 2 | 0 | 2 | 0 | 2 | 0 | 2 | VIII | I |

| a | b | c | e | f | g | h | i | j | |
|---|---|---|---|---|---|---|---|---|---|
| – | 2 | 2 | 2 | 2 | 2 | 1 | 2 | 2 | a |
| 2 | – | 2 | 0 | 1 | 1 | 1 | 1 | 1 | b |
| 2 | 2 | – | 1 | 2 | 1 | 1 | 1 | 2 | c |
| 2 | 0 | 1 | – | 1 | 1 | 0 | 1 | 1 | e |
| 2 | 1 | 2 | 1 | – | 1 | 1 | 0 | 1 | f |
| 2 | 1 | 1 | 1 | 1 | – | 1 | 1 | 0 | g |
| 1 | 1 | 1 | 0 | 1 | 1 | – | 0 | 0 | h |
| 2 | 1 | 1 | 1 | 0 | 1 | 0 | – | 1 | i |
| 2 | 1 | 2 | 1 | 1 | 0 | 0 | 1 | – | j |

| a | b | c | e | f | g | h | i | j | |
|---|---|---|---|---|---|---|---|---|---|
| 2 | 2 | 2 | 2 | 2 | 2 | 1 | 2 | 2 | MAXIMUM NUMBER OF COMBINATIONS |
| 7 | 2 | 4 | 1 | 2 | 1 | 5 | 1 | 2 | OCCURRENCE OF MAXIMUM NUMBER |
| 1 | 0 | 1 | 0 | 0 | 0 | 0 | 0 | 0 | MINIMUM NUMBER OF COMBINATIONS |
| 1 | 1 | 4 | 2 | 1 | 1 | 3 | 2 | 2 | OCCURRENCE OF MINIMUM NUMBER |

PASS-TRANSISTOR LOGIC CIRCUIT AND A METHOD OF DESIGNING THEREOF

This is a division of application Ser. No. 08/965,771 filed Nov. 7, 1997 now U.S. Pat. No. 6,185,719. The entire disclosure of the prior application is hereby incorporated by reference herein in its entirety.

FIELD OF THE INVENTION

The present invention relates to a logic circuit using pass transistors, and more particularly to a logic circuit with a combination of one or more pass transistors and one or more multiple-input logic gates. Further, the present invention relates to a method of designing a logic circuit for executing a desired logical operation, using a small number of transistors and a small number of stages in a form in which the advantages of pass transistors and multiple-input logic gates are utilized. The present invention also relates to a logic circuit using pass transistors, capable of executing a logical operation in an efficient manner, and to a system using such a logic circuit. The present invention also relates to a method of executing a logical operation in an efficient fashion using a logical circuit including pass transistors.

DESCRIPTION OF THE RELATED ART

It is known in the art to employ a "pass-transistor logic circuit" to reduce a number of elements and power consumption, and to improve operating speed. Pass-transistor logic circuits use pass transistors each comprising a switching device. Conduction between an input terminal and output terminal of the switching device is turned ON or OFF according to a potential at a control terminal. Each pass transistor is realized by connecting the switching device so that whether a logic signal applied to the input terminal is transmitted to the output terminal can be determined with the conducting or nonconducting state of each switching device. In general, a plurality of pass transistors are connected in series and/or parallel to constitute a pass-transistor logic circuit for executing a desired logical operation. As for the switching devices, MOS transistors, for example, may be used. In this case, the gate, source, and drain of each MOS transistor correspond to the control, input, and output terminals, respectively. Both n- and p-channel MOS transistors and the combination of the n- and p-channel MOS transistors may be used as the pass transistors. A pass transistor employing the combination of an n- and a p-channel MOS transistor is often called as a "transmission gate" or a "transfer gate".

It is also known to realize a logic circuit using a combination of one or more transfer gates and a logic gate such as an inverter, multiple-input NOR gate, multiple-input NAND gate, etc.

The inventor of the present invention has proposed a composite pass-transistor logic circuits which is realized with a combination of a plurality of pass-transistor logic circuits (pass-transistor logic trees) and a multiple-input logic circuit as disclosed in the U.S. patent application Ser. No. 08/716,883 titled "LOGIC CIRCUIT UTILIZING PASS TRANSISTORS AND LOGIC GATE," filed on Sep. 20, 1996, and in the U.S. patent application Ser. No. 08/763,264 titled "SEMICONDUCTOR INTEGRATED CIRCUIT CAPABLE OF REALIZING LOGIC FUNCTIONS," filed on Dec. 10, 1996. These patent applications cited above are incorporated herein by reference.

However, a practical technique of designing integrated circuits, in which various functions required by various users are realized using a logic circuit including pass transistors, has not been established. For example, in the technique disclosed in Japanese Unexamined Patent Publication No. 1-216622, logic circuits each composed of a combination of transfer gates and a logic gate are prepared as logic cells, and a desired LSI is designed by combining these logic cells. However, a specific technique is not disclosed for designing various logic circuits required for practical applications, although some simple logic circuits such as an exclusive OR, exclusive NOR, and full adder are disclosed.

One known technique of designing pass-transistor logic circuits is to use a BDD (binary decision diagram). For example, a logical expression (1) which includes variables a, b, and c as described below can be represented in a BDD as shown in FIG. 1. This BDD can then be mapped to a pass-transistor logic circuit as shown in FIG. 2. Herein, a process of replacing a logical expression by a corresponding logic circuit is referred to as a mapping. Symbol $\oplus$ denotes exclusive OR in the logical expression (1).

$$f = a \oplus b \oplus c \tag{1}$$

When equivalent logical expressions are represented by BDDs, the size of the graph varies depending on the order of variables included in the equivalent logical expressions. For example, the logic circuit shown in FIG. 3 and the logic circuit shown in FIG. 5 are equivalent to each other although there is a difference in the order of variables. The logic circuit shown in FIG. 3 can be represented by a BDD graph as shown in FIG. 4, and the logic circuit shown in FIG. 5 can be represented by a BDD graph as shown in FIG. 6. The logic circuit shown in FIG. 3 and the corresponding BDD graph shown in FIG. 4 is the optimum in terms of the order of variables. In contrast, the logic circuit shown in FIG. 5 and the corresponding BDD graph shown in FIG. 6 is the worst in the order of variables.

If the number of inputs of a logical operation, that is the number of variables included in a logical expression, is given by n, then, in theory, there can be at most $2^n$ different orders of variables. It is practically impossible to select an optimum order from such a huge number of possible orders of variables, because the process of selecting the optimum order will take a very long time. On the other hand, if the processing time required to determine the order of variables is limited, there is a risk that the resultant order of variables be inadequate and very far from the optimum order, which will cause an impractically great increase in the number of gates making up a logic circuit mapped from the inadequate BDD graph.

There are various techniques known to determine the order of variables in a BDD. For example, in a technique disclosed in a paper titled "Method of determining the order of variables with respect to the "width" of a common binary decision diagram" (Hata, The 42-th Meeting of Information Processing Society of Japan, 2J-5, 1991, hereinafter referred to as the first prior art), when a BDD is divided into two parts at a boundary between a k-th input variable and a (k+1)th input variable, the number of edges passing through the cross section is defined as the "width". When variables are selected in the process of determining variables from the top to bottom, each variable is selected from input variables remaining as candidates so that each variable results in a minimum width. In this method, if the number of input variable is n and the number of nodes of the BDD is G, the calculation time required to determine the order of the input variables is of the order of $O(n^2 \cdot G)$, wherein $O(n^2 \cdot G)$ refers to a time required to perform $n^2 \cdot G$ times operations.

In another technique disclosed in a paper titled "Multi-Level Pass-Transistor Logic for Low-Power ULSIs" (Yano et al., IEEE 0-7803-3036-6/95, hereinafter the second prior art), those parts which share the same logic function are extracted from the original BDD, and the BDD is replaced by a new BDD so that the resultant BDD has the same number of leaves as that included in the original BDD. After that, logic associated with the control inputs at nodes in the resultant BDD is created so that the BDD represents the original logic.

In the first prior art, however, the BDD has a feature that AND and/or OR logic circuits are connected in series by pass transistors, and thus a great number of pass-transistor stages are required in the logic circuit. To determine the order of input variables within a practical calculation time, the number of input variables should be limited to a few tens and the number of nodes should be limited to a few ten thousands. Furthermore, the solution of the order of input variables obtained by the above calculation is still far from the optimum solution.

In the second prior art, it is possible to map a logical expression into a pass-transistor logic circuit having a less number of pass-transistor stages. However, a buffer is needed to be provided at a control input of each pass transistor, and no reduction in the number of transistors is achieved. Furthermore, the degree of freedom is too large in the process of replacing parts which have a common logic by a new BDD. Therefore, this technique is not suitable for use in designing a large scale integrated circuit with a CAD (computer aided design) system.

In both the first and second conventional techniques, a desired logic circuit is realized using usual pass-transistor logic circuits including a plurality of stages of multiplexers constructed of pass transistors. Therefore, these techniques are unsuitable for use in designing a logic circuit composed of both pass transistors and one or more multiple-input logic gates. That is, it is impossible to construct a logic circuit with pass transistors and one or more multiple-input logic gates in an efficient fashion in which their advantages are utilized. If a logical expression is optimized according to the first or second prior art, and the result is mapped into a logical circuit including both pass transistors and multiple-input logic gates, the resultant logic circuit will include a great number of transistors and/or the circuit will include a great number of stages.

SUMMARY OF THE INVENTION

In view of the above problems in the conventional techniques, it is an object of the present invention to provide a design method and a CAD system for designing a logic circuit with pass transistors in such a manner that the total number of transistors and the number of stages are minimized. It is another object of the present invention to provide a logic circuit with pass transistor in which various logical operations can be realized in an efficient fashion, an electronic system using such a logic circuit, and a method of executing various logical operations in an efficient fashion.

According to an aspect of the present invention, there is provided a method of mapping a logical expression, which expresses logic to be realized by a logic circuit, to a specific form of a logic circuit in which pass transistor are used in an advantageous fashion, and there is also provided a method of designing a logic circuit including such a mapping process. Furthermore, there is also provided a CAD system for use in practicing such the methods.

According to another aspect of the present invention, there is provided a method of designing a logic circuit including a process of transforming a logical expression into an optimized form so as to make it easy to map the logical expression to a logic circuit in which pass transistor are used in an advantageous fashion. Furthermore, there is also provided a CAD system for use in practicing such the design method.

According to still another aspect of the present invention, there is provided a method of mapping a combinational logical expression to a logic circuit comprising a multiplexer composed of a combination of pass-transistors and inverting logic gates so that the logic circuit includes a small total number of transistors. Furthermore, there is also provided a CAD system for use in practicing such the method.

According to still another aspect of the present invention, there is provided a method of mapping product terms containing a various number of logic functions to a logic circuit comprising a combination of one or more multiple-input gates and an appropriate number of multiplexers so that the logic circuit includes a small total number of transistors and a small number of stages. There is also provided a CAD system for use in practicing such the method. Furthermore, there is provided a logic circuit for executing a logical operation expressed by a logical expression including product terms containing a various number of logic functions wherein the logic circuit includes a small total number of transistors and a small number of stages. There is also provided an electronic system using such a logic circuit. Furthermore, there is provided a method of efficiently executing a logical operation expressed by a logical expression including product terms containing a various number of logic functions.

According to another aspect of the present invention, there is provided a method of mapping a logical expression including a logic group containing a complementary variable to a logic circuit comprising a combination of one or more multiple-input gates and one or more multiplexers so that the logic circuit includes a small total number of transistors and a small number of stages. There is also provided a CAD system for use in practicing such the method. Furthermore, there is provided a logic circuit comprising a combination of one or more multiple-input gates and one or more multiplexers, for executing a logical operation expressed by a logical expression including a logic group containing a complementary variable wherein the logic circuit includes a small total number of transistors and small number of stages. There is also provided an electronic system using such a logic circuit. Furthermore, there is provided a method of efficiently executing a logical operation expressed by a logical expression including a logic group containing a complementary variable, using a logic circuit comprising a combination of one or more multiple-input gates and one or more multiplexers.

According to another aspect of the present invention, there is provided a method of mapping a logical expression including a logic group containing a complementary variable to a logic circuit comprising a combination of two types of multiple-input gates and one or more multiplexers so that the logic circuit includes a small total number of transistors and a small number of stages. There is also provided a CAD system for use in practicing such the method. Furthermore, there is provided a logic circuit comprising a combination of two types of multiple-input gates and one or more multiplexers, for executing a logical operation expressed by a logical expression including a logic group containing a complementary variable, wherein the logic circuit includes a small total number of transistors and a small number of stages. There is also provided an electronic system using such a logic circuit. Furthermore, there is provided a method of efficiently executing a logical operation expressed by a logical expression including a logic group containing a complementary variable, using a logic circuit comprising a combination of two types of multiple-input gates and one or more multiplexers.

According to an aspect of the present invention, there is provided a method of designing a logic circuit for mapping a logical expression, comprising: identifying a first logic group including a first plurality of logic functions and at least one complementary variable shared by the first plurality of logic functions in the logical expression; and mapping the logical expression, including: placing a multiplexer having input terminals, at least one control terminal and an output terminal in the logic circuit; and connecting the input terminals and the at least one control terminal of the multiplexer to input the first plurality of logic functions and the at least one complementary variable so that the first logic group is output from the output terminal of the multiplexer.

Preferably, the identifying step further identifies a second logic group having a second plurality of logic function and a common variable shared by the second plurality of logic functions in the logical expression; and the mapping further includes: placing a multiple-input logic gate having input terminals and an output terminal in the logic circuit; and connecting the input terminals of the multiple-input logic gate to input the common variable and a sum of the second plurality of logic functions so that the second logic group is output from the output terminal of the multiple-input logic gate.

There is also provided a CAD system for designing a logic circuit for mapping a logical expression, the system comprising: means for identifying a first logic group including a first plurality of logic functions and at least one complementary variable shared by the first plurality of logic functions in the logical expression; and means for mapping the logical expression, including: means for placing a multiplexer having input terminals, at least one control terminal and an output terminal in the logic circuit; and means for connecting the input terminals and the at least one control terminal of the multiplexer to input the first plurality of logic functions and the at least one complementary variable so that the first logic group is output from the output terminal of the multiplexer.

There is further provided a method of designing a logic circuit for mapping a logical expression, comprising: placing a multiplexer having input terminals, at least one control terminal and an output terminal in the logic circuit; and connecting the input terminals and the at least one control terminal of the multiplexer to input a first plurality of logic functions and at least one complementary variable so that a first logic group of the logical expression including the first plurality of logic functions and the at least one complementary variable shared by the first plurality of logic functions is output from the output terminal of the multiplexer.

To obtain a high-performance logic circuit with a small number of transistors, capable of operating at a high speed with small power consumption, it is desirable to map a given logical expression to a logic circuit in such a manner that a logic group in-the logical expression having a form suited to be mapped using pass transistors be mapped using pass transistors.

For example, in the case of a logic group in the form expressed by a logical expression $a \cdot C + \bar{a} \cdot E$ (where C and E are arbitrary logic functions, $\cdot$ denotes AND operation, and + denotes OR operation) which is a sum of product terms including a variable a in a complementary fashion, that is, one product term includes variable a in the non-inverted (positive-logic) form and the other product term includes variable a in the inverted (negative-logic) form, the logic group can be mapped in an efficient fashion to a logic circuit having a 2-input 1-stage multiplexer constructed with two pass transistors whose output terminals are connected to each other (herein referred to as a "unit multiplexer"). More specifically, the variable a (a signal corresponding to the variable a) is input to the control terminal of the multiplexer, and the logic functions C and E (signals corresponding to the logic functions C and E) sharing the variable a are input to the two input terminals, respectively, of the multiplexer so that the logic group (a signal corresponding to the logic group) is output at the output terminal of the multiplexer. Hereinafter, variables such as a described above are referred to as "complementary variables". If a logic group including a complementary variable is mapped to a multiplexer constructed with pass transistors in the above-described manner, the total number of transistors used and the power consumption are reduced compared to the case where the logic group is mapped using for example multiple-input logic gates.

In the above logical expression, lower-case characters such as a denote variables and upper-case characters such as C and E denote logic functions. The logic functions may be either a simple function only including a single variable or a complex function expressed by products and/or sums of a great number of variables. Furthermore, terms represented by products of a plurality of variables or logic functions such as $a \cdot C$ and $\bar{a} \cdot E$ in the above logical expression are referred to as product terms. In the case where C and E are simple variables, the above-described product terms are simple product terms having a plurality of variables. Conversely, all elements of a product term may be logic functions (other than simple variables).

As another example, let us consider a logic group such as $a \cdot b \cdot C + a \cdot \bar{b} \cdot D + \bar{a} \cdot b \cdot E + \bar{a} \cdot \bar{b} \cdot F$ (where C, D, E and F are arbitrary logic functions) including a sum of product terms each including two variables in a complementary fashion, that is, each product term includes either one of four possible combinations of two variables wherein each variable is in either the positive-logic form or the negative-logic form. In this case, the logic group can be mapped in an efficient fashion to a logic circuit using a 2-stage multiplexer including three unit multiplexers wherein the output terminals of two first-stage unit multiplexers are connected to the input terminals, respectively, of a second-stage unit multiplexer. In this specific example, variables a and b in the logical expression are complementary variables, and these variables are input to the control terminals of the multiplexer. More specifically, mapping may be performed in such a manner that the logic functions C, D, E and F are input to the four input terminals, respectively, of the two first-stage unit multiplexers each having two input terminals, variable b is input to the control terminal of each of the two first-stage unit multiplexer, and variable a is input to the control terminal of the second-stage unit multiplexer. Complementary-variables of a logic group which can be mapped in an efficient fashion using a two- or more-stage multiplexer as in the above example are referred to as multiple-complementary variables. As can be understood from the above description, a logic group including a multiple-complementary variable can be mapped in an efficient fashion to a logic circuit using a multi-stage multiplexer including a less total number of transistors and a less number of stages.

A logical group expressed by a logical expression having a sum of three combinations of possible four combinations of two variables in the positive- and negative-logic forms, such as a·b·C+a·b̄·D+ā·b·E may also be mapped in an efficient fashion using a 2-stage multiplexer. Also in this case, variables a and b act as multiple-complementary variables.

Furthermore, a logical expression including three or more multiple-complementary variables can be mapped using a three- or more-stage multiplexer. In practice, however, a limited number of pass transistors can be connected in series and thus there is a limit in the number of stages which can be included in a multiplexer.

In the case where a logic circuit is designed using both pass transistors and a multiple-input logic gate, it is desirable that a multiple-input logic gate be used in the mapping for a particular part, which is suitable for mapping using a multiple-input logic gate, of the logical expression to be realized by that logic circuit. For example, a simple NAND logic including a plurality of variables can be mapped in a preferable fashion using a multiple-input logic gate. A variable which is included in common in a plurality of product terms (hereinafter such a variable will be referred to as a "common variable") can be mapped using in common a multiple-input logic gate in a more preferable fashion than can be achieved when the respective product terms are mapped individually using different multiple-input logic gates. The use of the common multiple-input logic prevents dispersion of AND or NAND terms. As a result, the logic can be realized with a reduced number of transistors. Furthermore, because the common variable can be input in a parallel fashion to the multiple-input logic gate, the number of stages of the logic circuit is reduced.

For example, in the case of a logic group in the form expressed by a logical expression a·C+a·D=a·(C+D) including product terms containing a variable a in common, logic functions C and D share the common variable a. In this case, the logic group can be mapped in an efficient fashion such that variable a is input to one of the input terminals of an AND gate, and a sum of the logic functions C and D, which is obtained by properly mapping these logic functions, is input to the other input terminal of the AND gate. In the case where logic level adjustment which will be described later is made, a NAND gate or a NOR gate may be employed as a multiple-input logic gate for mapping a logic including a common variable.

More specifically, in the case where a·b·c·d, a·b·c·e, ā·b̄·c̄·f, and a·b̄·g are given as product terms, variables a, b, and c in a grouped product terms a·b·c·(d+e) and a variable b̄ in a grouped product terms b̄·(ā·c̄·f+a·g) are common variables. In this case, a·b·c and (d+e) are input to input terminals of one multiple-input logic gate, and b̄ and (ā·c̄·f+a·g) are input to input terminals of another multiple-input logic gate.

Furthermore, in the design of a logic circuit including pass transistors and a multiple-input logic gate, it is more preferable to simultaneously take into account the above two points. For example, it is preferable that a logic group including one or more complementary variables be mapped using a multiplexer composed of a combination of pass transistors, and that a logic group including one or more common variables be mapped using a multiple-input logic gate.

In practice, the above mapping process is performed in the process of designing a logic circuit using a CAD system including a CPU and a storage device. In a practical operation using the CAD system, the mapping process is performed by the CPU to generate electric information corresponding to the circuit and to store it at proper locations in the storage device. The above information is finally converted to a mask data after various procedures, and masks are produced according to the mask data. Using these masks, an actual circuit is realized in the form of a semiconductor integrated circuit. In the design process using the CAD system, in general, logic groups including complementary variables and/or logic groups including common variables are found (identified) in a logical expression to be realized by a logic circuit, before mapping the logic groups into the circuit using multiplexers and multiple-input logic gates. The above finding (identification) can be performed in various manners. For example, the process of optimizing a logical expression, as will be described in detail later, also includes a process for finding logic groups including complementary variables and/or logic groups including common variables.

According to another aspect of the present invention, there is provided a method of designing a logic circuit for mapping a logical expression, comprising: optimizing the logical expression including at least one cycle of a first procedure comprising: (a) selecting at least a part of the logical expression including a plurality of product terms each including plurality of variables; (b) identifying at least one complementary variable complementarily included in at least two of the product terms; and (c) grouping the at least two of the product terms by the at least one complementary variable to make a logic group including the at least one complementary variable and at least two logic functions sharing the at least one complementary variable; and mapping the optimized logical expression to the logic circuit.

Preferably, the optimizing further includes at least one cycle of a second procedure comprising: (a) selecting at least a part of the logical expression including a plurality of product terms each including a plurality of variables; (b) identifying a set of at least one common variable commonly included in at least two of the product terms; and (c) grouping the at least two of the product terms to make a second logic group including the at least one common variable and second logic functions sharing the at least one common variable.

There is also provided a CAD system for designing a logic circuit for mapping a logical expression, the system comprising: means for optimizing the logical expression including at least one cycle of a first procedure comprising: (a) selecting at least a part of the logical expression including a plurality of product terms each including plurality of variables; (b) identifying at least one complementary variable complementarily included in at least two of the product terms; and (c) grouping the at least two of the product terms by the at least one complementary variable to make a logic group including the at least one complementary variable and at least two logic functions sharing the at least one complementary variable; and means for mapping the optimized logical expression to the logic circuit.

There is further provided a method of designing a logic circuit for mapping a logical expression, comprising: optimizing the logical expression including at least one cycle of a procedure comprising: (a) selecting at least a part of the logical expression including a plurality of product terms each including a plurality of variables; (b) identifying a set of at least one common variable commonly included in at least two of the product terms; and (c) grouping the at least two of the product terms to make a logic group including the at least one common variable and logic functions sharing the at least one common variable; and mapping the optimized logical expression to the logic circuit including a multiplexer.

There is also provided a CAD system for designing a logic circuit for mapping a logical expression, the system comprising: means for optimizing the logical expression including at least one cycle of a procedure comprising: (a) selecting at least a part of the logical expression including a plurality of product terms each including a plurality of variables; (b) identifying a set of at least one common variable commonly included in at least two of the product terms; and (c) grouping the at least two of the product terms to make a logic group including the at least one common variable and logic functions sharing the at least one common variable; and means for mapping the optimized logical expression to the logic circuit including a multiplexer.

In order to design a logic circuit with pass transistors and a multiple-input logic gate used in an advantageous fashion, it is desirable to optimize, before mapping, a given logical expression representing a logical operation to be executed by the logic circuit so that the logical expression may be easily mapped to a specific form of the logic circuit in the advantageous fashion. The optimization may be performed using a CAD system.

The present invention provides a technique of making a logic group containing one or more complementary variables so as to make it easier to map the logical expression to a logic circuit in which a multiplexer is used in an advantageous fashion. The technique preferably makes a logic group containing multiple-complementary variables when it is possible. To the above end, the concept of the number of logical combinations of variables in product terms included in a logical expression is introduced.

As an example, in the case of a logical expression including product terms $a \cdot b \cdot c$, $a \cdot \bar{b} \cdot d$, $\bar{a} \cdot b \cdot c$ and $\bar{a} \cdot \bar{b} \cdot f$, two variables a and b act as multiple-complementary variables. In this expression, the logical combinations of variables associated with the set of variables a and b are $a \cdot b$, $a \cdot \bar{b}$, $\bar{a} \cdot b$, and $\bar{a} \cdot \bar{b}$. Thus, in this example, the number of logical combinations of variables with respect to the set of variables a and b is four. While, the number of combinations between either variable a or b and any one of variables c, d, e, and f is one, and therefore any variable c, d, e, f cannot be a complementary variable. In a further example of a logical expression including product terms $a \cdot b \cdot c$, $a \cdot \bar{b} \cdot d$ and $\bar{a} \cdot b \cdot e$ in which two variables a and b act as multiple-complementary variables, the logical combinations with respect to variables a and b are $a \cdot b$, $a \cdot \bar{b}$, and $\bar{a} \cdot b$, and thus the number of logical combinations with respect to the set of variables a and b is three.

As can be understood from the above discussion, a variable included in a set of variables which has a larger number of logical combinations has a possibility of being a complementary variable. Thus, one or more variables included in one or more set of variables having the largest number of logical combinations are the first candidates for identifying one or more complementary variables. Further, one or more variables included in one or more set of variables having the second largest number of combinations are the second candidates.

The number of logical combinations may change depending on a specific variable under consideration, when the number of combinations is determined with respect to the specific variable. For example, when $a \cdot b \cdot c \cdot d$, $a \cdot b \cdot c \cdot e$, $\bar{a} \cdot \bar{b} \cdot \bar{c} \cdot f$, and $a \cdot \bar{b} \cdot g$ are given as product terms, logical combinations of a set of three variables a, b, and c are "a, b, c" and "$\bar{a}, \bar{b}, \bar{c}$" if all variables are equally treated. That is, the number of logical combinations is two. On the contrary, logical combinations of the same set of variables with respect to the variable a are "a, b, c", "$\bar{a}, \bar{b}, \bar{c}$", and "a, $\bar{b}$". That is, the number of logical combinations is three. Similarly, the number of combinations with respect to the variable b is also three. On the other hand, the combinations with respect to the variable c are "a, b, c" and "$\bar{a}, \bar{b}\bar{c}$". That is, the number of combinations is two. When the number of logical combinations is determined with respect to a particular variable, such a combination which does not include one of the variables in the set is also regarded as an allowed combination as long as the combination includes the variable under consideration.

Thus, when the number of combinations with respect to a particular variable is determined for a particular set of variables, there is a possibility that the number of logical combinations varies depending on the variable under consideration. When a variable included in a set having a larger number of combinations is selected as a candidate for a complementary variable, the selection is preferably performed according to the number of combinations with respect to individual variables.

Thus, in the process of grouping the above four product terms, if a and b are selected as complementary variables, then the logic group will become $a \cdot b \cdot (c \cdot d + c \cdot e) + a \cdot \bar{b} \cdot (g) + \bar{a} \cdot \bar{b} \cdot (\bar{c} \cdot f)$. This logic group comprises multiple-complementary variables a and b and also three logic functions $c \cdot d + c \cdot e$, g and $\bar{c} \cdot f$ which share the above complementary variables. This logic group, therefore, can be mapped in an efficient fashion to a logic circuit using a 2-stage multiplexer.

In such an optimization comprising: identifying one or more complementary variables from the variables in the product-terms; and grouping two or more product terms by the selected complementary variable(s) thereby forming a logic group including the complementary variable(s), the optimization may be performed for either the whole parts of a given logical expression to be realized by a logic circuit or a particular part of the logical expression. Furthermore, the optimization procedure may be performed repeatedly a plurality of cycles so as to enhance the degree of optimization. In the second and subsequent optimization cycles, a particular part is selected and optimized depending on the result of the previous optimization cycle.

If the identification is performed only according to whether the variable is included in a set of variables having a larger number of combinations, there is a possibility that the number of variables at the same level will be too many. In such a case, the frequency of occurrence of a variable in a set of variables having a large number of combinations may be employed as a criterion for identifying a variable as a complementary variable. When a given logical expression is optimized by repeatedly performing the procedures of making a logic group including a complementary variable, the employment of the above selection criterion makes it possible to identify a complementary variable in the second or subsequent optimization processes thereby increasing the possibility of achieving a higher degree of optimization.

In a variable-combination method, which is an embodiment of the present invention, complementary variables are selected according to the criterion in terms of the frequency of occurrence in a set of variables having a great number of combinations.

Furthermore, the present invention also provides a technique of making a logic group including a common variable so as to make it easier to map the logical expression to a circuit using a multiple-input gate in an advantageous fashion.

It is easy to find a common variable included in a particular set of product terms. For example, a common variable can be found by calculating AND of the product terms. However, careful consideration is required to determine which product terms should be grouped together. For example, in the case where a logical expression includes three or more product terms, the common variable may become different depending on which product terms are grouped. For example, in the case of a logical expression a·b·c·d+a·b·c·e+a·d·f·g, if the first and second product terms are grouped, then variables a, b, and c are common variables. On the other hand, variable a and d become common variables if the first and third product terms are grouped. If the second and third product terms are grouped, then variable a becomes a common variable. In the case where the first, second, and third product terms are grouped, variable a becomes a common variable. In general, when an equal number of product terms can be grouped in different manners, it is more desirable to employ a group which includes a larger number of common variables. On the other hand, when product terms can be grouped in different manners so that each group has an equal number of common variables, it is generally desirable to select a group which includes a larger number of product terms. In general, however, the number of common variables decreases with the increase in the number of product terms grouped together.

In embodiments of the present invention, two techniques of optimizing a logical expression by making a logic group including one or more common variables are provided: bottom-up common-variable method and top-down common-variable method.

In a bottom-up common-variable method, product terms are first grouped into groups each including two product terms such that the group includes a larger number of common variables. Then the common variables identified in the above first cycle are regarded as product terms, and the common variables included in these product terms are identified so as to perform a further grouping. Thus, in this technique, the number of grouped product terms increases as the procedure is repeated.

On the other hand, in a top-down common-variable method, product terms are first grouped into $2^v$ groups wherein v is the number of allowed stages of pass transistors used in the logic circuit. For example, when v=2 and there are 32 product terms, common variables are identified for sets of 8 product terms thereby grouping these product terms. In this technique, thus, common variables among a larger number of product terms are identified first. Then, the product terms in each group are further grouped into $2^v$ groups by identifying common variables from a reduced number of product terms. Thus, in this technique, the number of common variables increases as the procedure is repeated.

For example, in a logical expression a·b·c·d+a·b·c·e+a·$\bar{b}$·$\bar{c}$·f+a·$\bar{b}$·g, if the first and second product terms are grouped together and the third and fourth product terms are grouped together so that the resultant groups have common variables a, b and c, and $\bar{b}$, the expression is transformed as a·b·c·(d+e)+$\bar{b}$·(a·$\bar{c}$·f+a·g). In the first logic group, logic functions (each is a single variable) d and e share the common variables a, b, and c. While, in the second logic group, logic functions a·$\bar{c}$·f and a·g share the common variable $\bar{b}$. Each of these two logic groups can be mapped in an efficient fashion in which a multiple-input logic gate is advantageously used.

Although either the procedure of making logic groups including complementary variables or the procedure of making logic groups including common variables may only be performed, it is more desirable to perform both procedures so as to obtain greater advantages. If these two techniques are properly coupled together, logical expressions can be optimized in a more desirable fashion in which advantages of both techniques are achieved. That is, it is possible to achieve a reduction in the total number of transistors used in logic circuits and it is also possible to improve the operating speed of the circuits by reducing the number of stages. The grouping of product terms into logic groups including complementary variables may be performed in various manners, and the grouping of product terms into logic groups including common variables may also be performed in various manners. These various procedures may be combined in various orders.

In a common-variable/variable-combination method, which is one embodiment according to the present invention, the above-described common-variable method and the variable-combination method are combined. In this technique, logic groups including common variables are first made according to the common-variable method. Then the common variables which have identified in the above grouping process are regarded as product terms, and variable-combination method is performed on these product terms so as to make logic groups including complementary variables. In this technique in which the common-variable method and the variable-combination method are combined, product terms are first grouped into a form which may be mapped in an efficient fashion using a multiple-input logic gate and which can prevent dispersion of common variables, and then complementary variables are identified so that a multiplexer composed of pass transistors may be advantageously used.

Alternatively, grouping may be performed according to the variable-combination method first, then the logic functions in the obtained groups may be further grouped according to the common-variable method. This technique, which is referred to herein as the variable-combination/common-variable method, is also useful in the optimization. This technique can be further classified into a variable-combination/bottom-up common-variable method and a variable-combination/top-down common-variable method according to whether the common-variable method is performed in a bottom-up fashion or a top-down fashion.

According to another aspect of the present invention, there is provided a method of mapping a combinational logical expression to a logic circuit, comprising: zoning the logic circuit into at least three consecutive positive-, negative- and positive-logic zones; placing a first non-inverting logic gate having at least one input terminal and an output terminal on an input side of the negative-logic zone, a multiplexer having input terminals, at least one control terminal and an output terminal in the negative logic zone, and a second non-inverting logic gate having at least one input terminal and an output terminal on an output side of the negative-logic zone; connecting the input terminals of the multiplexer to non-invertingly input an output signal from the output terminal of the first non-inverting logic gate or to input a direct-input signal; and adjusting logic levels in the logic circuit by inverting the output signal from the first non-inverting logic gate and at least one input signal input to the at least one input terminal of the second non-inverting logic gate.

Preferably, the method further comprises connecting one of the at least one input terminal of the second non-inverting logic gate to non-invertingly input an output signal from the output terminal of the multiplexer, wherein the inverting the input signal to the second non-inverting logic gate includes inverting the direct-input signal input to the input terminal of the multiplexer.

There is also provided a CAD system for mapping a combinational logical expression to a logic circuit, the system comprising: means for zoning the logic circuit into at least three consecutive positive-, negative- and positive-logic zones; means for placing a first non-inverting logic gate having at least one input terminal and an output terminal on an input side of the negative logic zone, a multiplexer having input terminals, at least one control terminal and an output terminal in the negative logic zone, and a second non-inverting logic gate having at least one input terminal and an output terminal on an output side of the negative logic zone; means for connecting the input terminals of the multiplexer to non-invertingly input an output signal from the output terminal of the first multiple-input logic gate or to input a direct-input signal; and means for adjusting logic levels in the logic circuit by inverting the output signal from the first non-inverting logic gate and at least one input signal input to the at least one gate input terminal of the second non-inverting logic gate.

In the case of a logic circuit comprising only pass transistors, inversion in the logic level never occurs. Therefore, in this case, a given logical expression may be mapped to a logic circuit without having to take into account the inversion in the logic level. However, in pass-transistor logic circuits, a reduction in logic swing can occur as signals are passed through pass transistors, and this reduction limits the number of stages of pass transistors which can be connected in series. As a result, it is required that circuit elements such as inverters for restoring the logic swing be inserted in every predetermined number of stages so that the logic swing reduced by the pass transistors is restored to the original level. The inverters cause inversion in the logic level, and therefore it becomes necessary to perform mapping taking into account the inversion in the logic level. To restore the reduction in the logic swing, circuit elements such as buffers which cause no inversion in the logic level may also be employed. However, inverters are more preferable because use of buffers results in an increase in the total number of transistors. When logic circuits are composed of pass transistors and one or more multiple input logic gates, the reduction in logic swing can be restored by the multiple-input logic gates. Also in this case, multiple-input logic gates such as NAND or NOR gates by which signals are inverted are more preferable than those which cause no inversion in the logic level, such as AND or OR gates, from the viewpoint of reduction in the total number of transistors. Therefore, the mapping should be performed taking into account the inversion in the logic level.

One technique of performing mapping taking into account the inversion in the logic level is to first perform mapping without taking into account the inversion in the logic level (preliminary mapping), and then adjust the logic level (logic level adjustment). In the preliminary mapping, a given logical expression is mapped using circuit elements which do not give rise to inversion in the logic level such as buffers, AND gates, or OR gates (herein such types of elements are referred to as "non-inverting logic gates"). After forming a logic circuit in which at least a major part of the given logical expression is mapped, logic levels are adjusted. In the logic level adjustment, the non-inverting logic gates are replaced by circuit elements which cause inversion in the logic level such as inverters, NAND gates, or NOR gates (herein such types of elements are referred to as "inverting logic gates"). It is not necessary to consider the inversion in logic level in the preliminary mapping process, because no inverting logic gates are used. Therefore, the given logical expression can be mapped in a short time by a simple process. After that, the non-inverting logic gates are replaced by inverting logic gates in the logic level adjustment so that the final logic circuit includes a reduced number of transistors.

In the preliminary mapping, when the output of a non-inverting logic gate is connected to an input terminal of a multiplexer, the connection is made non-invertingly. That is, the connection is made without passing through, for example, an inverting logic gate such as an inverter. Similarly, when the output of a multiplexer is connected to an input terminal of a non-inverting logic gate, the connection is made so that no inversion in the logic level occurs. In addition to the signal from the output terminal of non-inverting logic gate, other input signals such as variables or constants may also be input to the input terminals of a multiplexer without passing through the non-inverting logic gate. Herein such signals are referred to as "direct-input signals."

In the logic level adjustment, the logic circuit obtained in the primary mapping is divided at the non-inverting logic gates, and positive-logic zones and negative-logic zones are alternately formed. This procedure may also be performed, equivalently, by first forming alternately positive-logic zones and negative-logic zones and then placing non-inverting gates at boundaries between adjacent positive- and negative-logic zones while placing multiplexers in the respective positive- and negative-logic zones thereby mapping the given logical expression therein. In a simplest case, for example, three consecutive positive-, negative- and positive-logic zones are formed, and then non-inverting logic gates are placed on input and output side of the negative-logic zone and a multiplexer is placed in the -negative-logic zone. Furthermore, signals output from non-inverting logic gates placed at the input side of the negative-logic zone are inverted, and signals input to non-inverting logic gates placed at the output side of the negative-logic zone are inverted.

Herein, the process of "inverting signals" refers to a procedure performed on a CAD system and does not refer to a process of actually inserting inverters in the circuit. Thus, the non-inverting logic gates are replaced by inverting logic gates. The above process is equivalent to such a process in which inverters are temporarily inserted in the circuit and then each set of a non-inverting gate and one or more inverters is replaced by an equivalent inverting logic gate including a less number of transistors. More specifically, AND and OR gates at the input side of negative-logic zones are replaced by NAND and NOR gates, respectively, and AND and OR gates at the output side of negative-logic zones are replaced by zero-AND gates (=NOR gates) and zero-OR gates (=NAND gates). Buffers at the input and output sides are all replaced by inverters. Furthermore, those signals which are directly input to the input terminals of the multiplexers in the negative-logic zones are also inverted. Thus these signals are transmitted via multiplexers to the input terminals of the logic gates at the output side of the negative-logic zones. As a result, the signals transmitted via multiplexers and input to the logic gates at the output side of the negative-logic zones are also inverted.

In practice, if a given logical expression is directly mapped to a logic circuit, high efficiency and high performance (a small number of transistors included, low power consumption, high operating speed) are not always achieved in the resultant logic circuit. To avoid such the problem, it is desirable to optimize the given logical expression before the mapping so that the logical expression can be mapped to a logic circuit in a highly efficient fashion. That is, as shown in FIG. 7, it is desirable to design the logic circuit as follows. First in step SR12 in FIG. 7, the given logic expression is optimized. Then in step SR14, the optimized logic expression is mapped to a logic circuit in the preliminary mapping. Finally, in step SR16, the logic level is adjusted.

The preliminary mapping process may be performed either in such a manner that the mapping is performed from the lowest-level groups in the logical expression to the highest-level group, or in such a manner that the mapping is performed from the highest-level group to the lowest-level groups. The highest-level group refer to such a group having the strongest influence on the value of the logical expression, and the lowest-level groups refer to such groups having the weakest influence. The highest-level group is mapped nearest to the output of the logic circuit, and the lowest-level groups are mapped nearest to the input of the logic circuit. This means that the mapping is performed either from the input side to the output side of the logic circuit or from the output side to the input side of the logic circuit. To perform the mapping in such the systematic order, it is required that the logical expression to be mapped has a hierarchical structure at least in some part thereof. For example, in the variable-combination method, common-variable method, and common-variable/variable-combination method, as will be described in greater detail later, either one of or both the procedure of grouping the product terms in given logical expression by making logic groups including complementary variables and the procedure of grouping the product terms in the logical expression by making logic groups including common variables are performed repeatedly thereby optimizing the logical expression into a hierarchical structure.

Another method of mapping the logical expression taking into account the inversion of logical levels at inverting logic gates is to take the inversion of the logical level into account from the beginning of the mapping process so that the logical level adjustment is simultaneously made during the mapping process. The advantage of this method is that a logic circuit including inverting logic gates can be formed by a process including a smaller number of steps than can be achieved by the method in which the logic level adjustment is made after the primary mapping process.

The mapping procedure is the same as that performed in the method in which the logic level adjustment is made after the preliminary mapping except that the logic level adjustment is made simultaneously.

More specifically, the circuit is divided at logic gates such that positive-logic zones and negative-logic zones are disposed alternately and inverting logic gates are placed at the boundaries between respective positive-logic and negative-logic zones. For example, when an AND gate is required to map a logic group including a common variable at the input side of a negative-logic zone, a NAND gate is placed there instead of the AND gate so that the output signal is inverted. On the other hand, if an AND gate is required to be mapped at the output side of a negative-logic zone, a zero-AND gate (=NOR gate) is placed there instead of the AND gate. When an OR gate is required to be mapped at the input side of a negative-logic zone, a NOR gate is employed instead of the OR gate. If an OR gate is required to be mapped at the output side of a negative-logic zone, a NAND gate is placed there instead of the OR gate. In the case where a signal is directly input to a negative-logic zone, the signal is inverted.

In the top-down mapping method according to an embodiment of the invention, a logical expression having a hierarchical structure is mapped from the highest-level group to the lowest-level groups taking into account the logic level inversion at inverting logic gates. More specifically, a final-stage of the logic circuit is determined in accordance with the given logical expression to be realized wherein the final-stage of the logic circuit is made in a positive-logic zone if the corresponding logic is represented in a positive-logic form while the final-stage is made in a negative-logic zone if the logic is represented in a negative-logic form. Then positive-logic zones and negative-logic zones are formed alternately whenever an inverting logic gate is placed in the circuit during the mapping from the output side to the input side of the logic circuit. When the highest-level group is mapped, if it has only such logic functions which share one or more complementary variables, a multiplexer with an inverter at the output is placed at the output of the logic circuit. When the highest-level group includes only one logic function including one or more common variables, a NOR gate is placed at the output of the logic circuit if the output of the logic circuit is in the positive-logic form, while a NAND gate is placed if the output of the logic circuit is in the negative-logic form. When the highest-level group includes only one logic function having no common variable, an inverter is placed at the output of the logic circuit. When the highest-level group includes a plurality of independent subservient logic groups, a NAND gate is placed at the output of the logic circuit if the final output is in the positive-logic form while a NOR gate is placed if the final output is in the negative-logic form.

According to another aspect of the present invention, there is provided a method of mapping a logical expression to a logic circuit, the expression comprising a first and a second product term including n and m logic functions, wherein m is greater than n, the method comprising: placing a first multiple-input logic gate having at least n input terminals and an output terminal; connecting the input terminals of the first multiple-input logic gate to directly input the logic functions of the first product term so that the first product term is output from the output terminal of the first multiple-input logic gate; placing a second multiple-input logic gate having less than m input terminals and an output terminal, and an unit multiplexer having a first input terminal, a second input terminal to input a constant, a control terminal and an output terminal; connecting the first input and control terminal of the unit multiplexer to input at least two of the logic functions of the second product term; and connecting the input terminals of the second multiple-input logic gate to input the logic functions of the second product term by inputting the at least two of the logic functions through the output terminal of the unit multiplexer so that the second product term is output from the output terminal of the second multiple-input logic gate.

There is also provided a CAD system for mapping a logical expression to a logic circuit, the expression comprising a first and a second product term including n and m logic functions, wherein m is greater than n, the system comprising: means for placing a first multiple-input logic gate having at least n input terminals and an output terminal; means for connecting the input terminals of the first multiple-input logic gate to directly input the logic functions of the first product term so that the first product term is output from the output terminal of the first multiple-input logic gate; means for placing a second multiple-input logic gate having less than m input terminals and an output terminal, and a first unit multiplexer having a first input terminal, a second input terminal to input a constant, a control terminal and an output terminal; and means for connecting the first input and control terminal of the unit multiplexer to input at least two of the logic functions of the second product term; and means for connecting the input terminals of the second multiple-input logic gate to input the logic functions of the second product term by inputting the at least two of the logic functions through the output terminal of the unit multiplexer so that the second product term is output from the output terminal of the second multiple-input logic gate.

There is further provided a logic circuit for executing a logical operation expressed by a logical expression comprising a first and a second product term including n and m logic functions, wherein m is greater than n, the logic circuit comprising: a first multiple-input logic gate having at least n input terminals and an output terminal, wherein the logic functions of the first product term are input directly to the input terminals of the first multiple-input logic gate to output the first product term from the output terminal of the first multiple-input logic gate; a second multiple-input logic gate having less than m input terminals and an output terminal; and an unit multiplexer having a first input terminal, a second input terminal to input a constant, a control terminal and an output terminal connected to one of the input terminals of the second multiple-input logic gate, wherein the logic functions of the second product term are input to the input terminals of the second multiple-input logic gate by inputting at least two of the logic functions through the first input and the control terminal of the unit multiplexer to output the second product term from the output terminal of the second multiple-input logic gate.

There is also provided an electronic system including a logic circuit for executing a logical operation expressed by a logical expression comprising a first and a second product term including n and m logic functions, wherein m is greater than n, the logic circuit comprising: a first multiple-input logic gate having at least n input terminals and an output terminal, wherein the logic functions of the first product term are input directly to the input terminals of the first multiple-input logic gate to output the first product term from the output terminal of the first multiple-input logic gate; a second multiple-input logic gate having less than m input terminals and an output terminal; and an unit multiplexer having a first input terminal, a second input terminal to input a constant, a control terminal and an output terminal connected to one of the input terminals of the second multiple-input logic gate, wherein the logic functions of the second product term are input to the input terminals of the second multiple-input logic gate by inputting at least two of the logic functions through the first input and the control terminal of the unit multiplexer to output the second product term from the output terminal of the second multiple-input logic gate.

There is also provided a method of executing a logical operation expressed by a logical expression comprising a first and a second product term including n and m logic functions, wherein m is greater than n, the method comprising: inputting the logic functions of the first product term directly to input terminals of a first multiple-input logic gate to output the first product term from an output terminal of the first multiple-input logic gate; inputting at least two of the logic functions of the second product term to a first input and a control terminal of an unit multiplexer having a second input terminal connected to input a constant; and inputting the logic functions of the second product term to input terminals of a second multiple-input logic gate by inputting the at least two of the logic functions through an output terminal of the unit multiplexer to output the second product term from an output terminal of the second multiple-input logic gate.

When a given logical expression is mapped to a logic circuit including pass transistors and multiple-input logic gates either in such a manner that the preliminary mapping is first performed and then the logic level adjustment is made or in such a manner that the logic level adjustment is made during the mapping process, it is desirable to properly combine multiple-input logic gates and pass transistors so that the total number of transistors and the number of stages in the resultant logic circuit are minimized.

In the mapping of the logical expression to the logic circuit, mapping of product terms is common. In the mapping of the lowest-level group, each product term includes only variables. In the mapping of groups other than the lowest-level group, each product term includes one or more variables and one or more logic functions mapped by other logic circuits, or otherwise each product term includes a plurality of logic functions. For example, in the case of a logic group including a common variable, if the sum of the logic functions which share that common variable is regarded as one logic function, then that logic group can be regarded as a product term including that logic function and the common variable. A logic function in the simplest form is a single variable. Therefore, "a product term including logic functions" includes a product of variables.

When such products term are mapped into a logic circuit using pass transistors and multiple-input logic gates, it is desirable to properly combine multiple-input logic gates and pass transistors depending on the number of logic functions included in the product term so that the number of transistors and the number of stages are minimized. For example, if a product term is mapped using only a multiple-input logic gate, it is required that the multiple-input logic gate should have as many input terminals as there are logic functions in the product term. However, the number of transistors included in the multiple-input logic gate increases with the number of input terminals. Furthermore, the number of stages increases and the operating speed decreases with the number of input terminals. To avoid the above problem, it is generally desirable to limit the number of input terminals of the multiple-input logic gate to three or four. If a product term to be mapped includes a greater number of logic functions than the upper limit, a pass transistor is combined with a multiple-input logic gate.

More specifically, the total number of variables or logic functions included in a product term is two or more but less than the maximum allowable number of input terminals of the multiple-input logical gate, a multiple-input logical gate is placed and the logic functions are input to the input terminals thereof. On the other hand, if the total number of logic functions is greater than the maximum allowable number of input terminals of the multiple-input logical gate, a multiple-input logic gate and a pass transistor is combined such that the output of the pass-transistor is connected to an input terminal of the multiple-input logic gate and the input terminal and the control terminal of the pass transistor as well as the input terminals of the multiple-input logic gate are used to receive logic signals corresponding to the logic functions.

In general, it is preferable to employ a combination of pass transistors in a form of a multiplexer rather than a single pass transistor. When an unit multiplexer is used, a constant is input to one of the two input terminals, and the output terminals is connected to one of the input terminal of a multiple-input logical gate. The other input terminals and the control terminal of the unit multiplexer are used to receive logic functions of the product term. That is, it is possible to input two logic functions to the multiple-input logic gate via the unit multiplexers wherein one logic function is input to one input terminal of the multiplexer and another logic function is input to the control terminal of the multiplexer. When a series connection of two unit multiplexers is connected to one input terminal of a multiple-input logic gate, two logic functions are connected to one input terminal and the control terminals, respectively, of the first-stage unit multiplexer so that these two logic functions are input to one input terminal of the second-stage unit multiplexer via the first-stage unit multiplexer. These two logic functions and another logic function input to the control terminal of the second-stage unit multiplexer, thus three logic functions in total, are input to the multiple-input logic gate via the two unit multiplexers. If a large number, within an allowable limit, of multiplexers are connected in series, and each input terminal of a multiple-input logic gate is connected to a similar series connection of unit multiplexers, then it becomes possible to map a product term including a greater number of logic functions.

In other words, when the number of logic functions included in a product term is equal to or less than the maximum allowable number of input terminals of the multiple-input logic gate, all the logic functions are input directly, i.e., without passing through multiplexers, to the input terminals of the multiple-input logic gate. While, when the number of logic functions is larger than the maximum allowable number of input terminals of the multiple-input logic gate, some of the logic functions are input through one or more multiplexers and they are input to the input terminals of the multiple-input logic gate.

In the case where an inverter including a pull-up transistor is used to restore the reduction in the logic swing which occurs when a signal is passed through pass transistors, as disclosed in U.S. patent application Ser. No. 08/716,883 or in the second prior art described earlier, logic functions input through the one or more multiplexers (or, more accurately, a product of the logic functions) is input to the corresponding input terminal of the multiple-input logic gate after the product is inverted by the inverter.

In the case where product terms are mapped in the above-described manner in the preliminary mapping procedure, AND gates are used as the multiple-input logic gates. These AND gates are replaced by NAND or NOR gates in the logic level adjustment after completion of the preliminary mapping. On the other hand, in the case where the logic level adjustment is performed during the mapping, NOR or NAND gates are employed depending on whether the gates are placed at the output side or input side of the negative-logic zones.

In some cases, a logic function included in a product term can be represented by a product of a plurality of variables, a plurality of subservient logic functions, or a combination of variable(s) and subservient logical function(s). In this case, the logic function may first be mapped into a circuit using for example a multiple-input logic gate, and then the product term may be mapped using another multiple-input logic gate in the above-described manner. In this case, the number of unit multiplexers combined with the multiple-input logic gate by which the product term is mapped is determined by the number of logic functions included in the product term wherein the former logic function is counted as one. Alternatively, one or more variables or lower-level logic functions included in such a logic function may be input to the input terminals, respectively, of a multiple-input logic gate by which the product term is mapped. In this case, the number of unit multiplexers combined with the multiple-input logic gate by which the product term is mapped is determined by the total number of logic functions included in the product term wherein all the variables and subservient logic functions included in the former logic function are counted. To reduce the number of stages and the number of multiple-input logic gates connected in series, the latter technique is more preferable than the former technique.

According to another aspect of the invention, there is provided a method of mapping a logical expression to a logic circuit, comprising: placing a multiple-input logic gate having input terminals and an output terminal, and a multiplexer having input terminals, at least one control terminal and an output terminal in the logic circuit; and connecting the input terminals of the multiple-input logic gate to input subservient logic functions to output a product of the subservient logic functions from an output terminal of the multiple-input logic gate, and the input terminals and the at least one control terminal of the multiplexer to input logic functions including the product of the subservient logic functions and at least one complementary variable to output a logic group including the logic functions and the at least one complementary variable shared by the logic functions from the output terminal of the multiplexer.

There is also provided a CAD system for mapping a logical expression to a logic circuit, the system comprising: means for placing a multiple-input logic gate having input terminals and an output terminal, and a multiplexer having input terminals, at least one control terminal and an output terminal in the logic circuit; and means for connecting the input terminals of the multiple-input logic gate to input subservient logic functions to output a product of the subservient logic functions from an output terminal of the multiple-input logic gate, and the input terminals and the at least one control terminal of the multiplexer to input logic functions including the product of the subservient logic functions and at least one complementary variable to output a logic group including the logic functions and the at least one complementary variable shared by the logic functions from the output terminal of the multiplexer.

There is further provided a logic circuit for executing a logical operation, comprising: a multiple-input logic gate having input terminals to input subservient logic functions and an output terminal to output a product of the subservient logic functions; and a multiplexer having input terminals to input logic functions including the product of the subservient logic functions, at least one control terminal to input at least one complementary variable and an output terminal to output a logic group including the logic functions and the at least one complementary variable shared by the logic functions.

There is also provided an electronic system comprising a logic circuit for executing a logical operation, the logic circuit comprising: a multiple-input logic gate having input terminals to input subservient logic functions and an output terminal to output a product of the at least two subservient logic functions; and a multiplexer having input terminals to input logic functions including the product of the subservient logic functions, at least one control terminal to input at least one complementary variable and an output terminal to output a logic group including the logic functions and the at least one complementary variable shared by the logic functions.

There is also provided a method of executing a logical operation, comprising: inputting subservient logic functions to input terminal of a multiple-input logic gate to output a product of the subservient logic functions from an output terminal of the multiple-input logic gate; and inputting logic functions including the product of the subservient logic functions and at least one complementary variable to input terminals and to at least one control terminal of a multiplexer to output a logic group including the logic functions and the at least one complementary variable shared by the logic functions from an output terminal of the multiplexer.

When the given logical expression is mapped to a logic circuit including pass transistors and a multiple-input logic gate, if the logical expression includes a logic group including a complementary variable, a multiplexer formed by combining pass transistors is employed in the mapping, while a multiple-input logic gate is employed if the logical expression includes a product of logic functions, so that the logic expression is mapped to the logic circuit using a smaller number of transistors and a smaller number of stages. Therefore, in the case where the logical expression includes a logic group including a complementary variable, logic functions which share that complementary variable are input to input terminals, respectively, of a multiplexer, and the complementary variable is input to the control terminal of the multiplexer. If the logic group includes multiple-complementary variables, a multi-stage multiplexer is employed. If a part of or all of the logic functions which share the complementary variable are each a product of subservient logic functions, such the logic functions are first mapped using multiple-input logic gates and then input to the input terminals of a multiplexer. That is, the subservient logic functions are input to input terminals of a multiple-input logic gate so that the logic function including these subservient logic functions is output from the output terminal of the multiple-input logic gate. Depending on the number of subservient logical functions included in the product term, a certain number of unit multiplexers whose one input is maintained at a constant logical value are added.

According to another aspect of the invention, there is provided a method of mapping a logical expression to a logic circuit, comprising: placing a multiplexer having input terminals, at least one control terminal and an output terminal, and a multiple-input logic gate having a first input terminal, at least one second input terminal and an output terminal in the logic circuit; and connecting the input terminals and the at least one control terminal of the multiplexer to input subservient logic functions and at least one complementary variable to output a subservient logic group including the subservient logic functions and at least one complementary variable shared by the subservient logic functions from the output terminal of the multiplexer, and the first input terminal and the at least one second input terminal of the multiple-input logic gate to input the subservient logic group and at least one common variable to output a logic group comprising a product of the at least one common variable and the subservient logic group from the output terminal of the multiple-input logic gate.

There is also provided a CAD system for mapping a logical expression to a logic circuit, the system comprising: means for placing a multiplexer having input terminals, at least one control terminal and an output terminal, and a multiple-input logic gate having a first input terminal, at least one second input terminal and an output terminal in the logic circuit; and means for connecting the input terminals and the at least one control terminal of the multiplexer to input subservient logic functions and at least one complementary variable to output a subservient logic group including the subservient logic functions and the at least one complementary variable shared by the subservient logic functions from the output terminal of the multiplexer, and the first input terminal and the at least one second input terminal of the multiple-input logic gate to input the subservient logic group and at least one common variable to output a logic group comprising a product of the at least one common variable and the subservient logic group from the output terminal of the multiple-input logic gate.

There is further provided a logic circuit for executing a logical operation, comprising: a multiplexer having input terminals to input subservient logic functions, at least one control terminal to input at least one complementary variable and an output terminal to output a subservient logic group including the subservient logic functions and the at least one complementary variable shared by the subservient logic functions; and a multiple-input logic gate having a first input terminal to input the subservient logic group and at least one second input terminal to input at least one common variable and an output terminal to output a logic group comprising a product of the subservient logic group and the at least one common variable.

There is also provided an electronic system comprising a logic circuit for executing a logical operation, the logic circuit comprising: a multiplexer having input terminals to input subservient logic functions, at least one control terminal to input at least one complementary variable and an output terminal to output a subservient logic group including the subservient logic functions and the at least one complementary variable shared by the subservient logic functions; and a multiple-input logic gate having a first input terminal to input the subservient logic group and at least one second input terminal to input at least one common variable and an output terminal to output a logic group comprising a product of the subservient logic group and the at least one common variable.

There is also provided a method of executing a logical operation, comprising: inputting subservient logic functions and at least one complementary variable to input terminals and to at least one control terminal of a multiplexer to output a subservient logic group including the subservient logic functions and the at least one complementary variable shared by the subservient logic functions from an output terminal of the multiplexer; and inputting the subservient logic group and at least one common variable to a first input terminal and to at least one second input terminal of a multiple-input logic gate to output a logic group comprising a product of the at least one common variable and the subservient logic group from the output terminal of the multiple-input logic gate.

In the case where the logical expression to be mapped includes a logic group including a common variable, the common variable and a sum of logic functions which share the common variable are input to the input terminals of a multiple-input logic gate. If the sum of the logic functions sharing the common variable is a subservient logic group including a complementary variable, the subservient logic group is first mapped using a multiplexer and then is input to the multiple-input logic gate. That is, the subservient logic functions which share the complementary variable is input to the input terminals of the multiplexer and the complementary variable is input to the control terminal of the multiplexer so that the subservient logic group is output from the output terminal of the multiplexer. The subservient logic group mapped in the above-described manner and the common variable are input to the input terminals of the multiple-input logic gate. Depending on the number of common variables, a required number of unit multiplexers whose one input terminal is maintained at a constant logic value are added. If the subservient logic group is a logic group including multiple-complementary variables, a multi-stage multiplexers is employed.

In the case where an inverter including a pull-up transistor is used to restore the reduction in the logic swing which occurs when a signal is passed through pass transistors, the subservient logic group output from the output terminal of the multiplexer is input to the input terminal of the multiple-input logic gate after the subservient logic group is inverted by the inverter.

If a part of or all of the subservient logic functions which share the complementary variable are each a product of second-subservient logic functions, such the subservient logic functions are first mapped using another multiple-input logic gate and then input to the input terminals of a multiplexer.

According to still another aspect of the invention, there is provided a method of mapping a logical expression to a logic circuit, comprising: placing a first-type multiple-input logic gate having input terminals and an output terminal, a multiplexer having input terminals, at least one control terminal and an output terminal, and a second-type multiple-input logic gate having input terminals and an output terminal in the logic circuit; and non-invertingly connecting one of the input terminals of the multiplexer to the output terminal of the first-type multiple-input logic gate, and one of the input terminals of the second-type multiple-input logic gate to the output terminal of the multiplexer, wherein the first-type multiple-input logic gate is one of a NAND and a NOR gate and the second-type multiple-input logic gate is the other one of a NAND and a NOR gate.

Preferably, the method further comprises: connecting the input terminals of the first-type multiple-input logic gate to input second-subservient logic functions to output a product of the second-subservient logic functions from the output terminal of the first-type multiple-input logic gate, the input terminals and the at least one control terminal of the multiplexer to input subservient logic functions including the product of the second-subservient logic functions and at least one complementary variable to output a subservient logic group including the subservient logic functions and the at least one complementary variable shared by the subservient logic functions from the output terminal of the multiplexer, and the input terminals of the second-type multiple-input logic gate to input logic functions including the subservient logic group to output a logic group comprising a product of the logic functions from the output terminal of the second-type multiple-input logic gate.

There is also provided a CAD system for mapping a logical expression to a logic circuit, comprising: means for placing a first-type multiple-input logic gate having input terminals and an output terminal, a multiplexer having input terminals, at least one control terminal and an output terminal, and a second-type multiple-input logic gate having input terminals and an output terminal in the logic circuit; and means for non-invertingly connecting one of the input terminals of the multiplexer to the output terminal of the first-type multiple-input logic gate, and one of the input terminals of the second-type multiple-input logic gate to the output terminal of the multiplexer, wherein the first-type multiple-input logic gate is one of a NAND and a NOR gate and the second-type multiple-input logic gate is the other one of a NAND and a NOR gate.

There is further provided a logic circuit for executing a logical operation, comprising: a first type multiple-input logic gate having input terminals and an output terminal; a multiplexer having input terminals one of which being non-invertingly connected to the output terminal of the first type multiple-input logic gate, at least one control terminal and an output terminal; and a second-type multiple-input logic gate having input terminals one of which being non-invertingly connected to the output terminal of the multiplexer, and an output terminal, wherein the first-type multiple-input logic gate is one of a NAND and a NOR gate and the second-type multiple-input logic gate is the other one of a NAND and a NOR gate.

Preferably, the input terminals of the first-type multiple-input logic gate are connected to input second-subservient logic functions so that a product of the second-subservient logic functions is output from the output terminal of the first-type multiple-input logic gate; the input terminals and the at least one control terminal of the multiplexer are connected to input subservient logic functions including the product of the second-subservient logic functions and at least one complementary variable so that a subservient logic group including the subservient logic functions and the at least one complementary variable shared by the subservient logic functions is output from the output terminal of the multiplexer; and the input terminals of the second-type multiple-input logic gate is connected to input logic functions including the subservient logic group so that a logic group comprising a product of the logic functions is output from the output terminal of the second-type multiple-input logic gate.

There is also provided an electronic system comprising a logic circuit for executing a logical operation, the logic circuit comprising: a first type multiple-input logic gate having input terminals and an output terminal; a multiplexer having input terminals one of which being non-invertingly connected to the output terminal of the first type multiple-input logic gate, at least one control terminal and an output terminal; and a second-type multiple-input logic gate having input terminals one of which being non-invertingly connected to the output terminal of the multiplexer, and an output terminal, wherein the first-type multiple-input logic gate is one of a NAND and a NOR gate and the second-type multiple-input logic gate is the other one of a NAND and a NOR gate.

There is also provided a method of executing a logical operation, comprising: inputting second-subservient logic functions to input terminals of a first-type multiple-input logic gate to output a product of the second-subservient logic functions from an output terminal of the first-type multiple-input logic gate; inputting subservient logic functions and at least one complementary variable to input terminals and to at least one control terminal of a multiplexer including non-invertingly inputting the product of the second-subservient logic functions as one of the subservient logic functions to output a subservient logic group including the subservient logic functions and the at least one complementary variable shared by the subservient logic functions from an output terminal of the multiplexer; and inputting logic functions to input terminals of a second-type multiple-input logic gate including non-invertingly inputting the subservient logic group as one of the logic functions to output a logic group comprising a product of the logic functions from an output terminal of the second-type multiple-input logic gate, wherein the first-type multiple-input logic gate is one of a NAND and a NOR gate and the second-type multiple-input logic gate is the other one of a NAND and a NOR gate.

As an example, let us assume that the logical expression includes a logic group comprising a product of two or more logic functions, and that one of the logic functions is a subservient logic group including a complementary variable and subservient logic functions which share that complementary variable, and that a part of or all of the subservient logic functions are each a product of second-subservient logic functions. If such the logical expression is mapped to a logic circuit either by means of first performing a preliminary mapping and then performing a logic level adjustment or by means of simultaneously performing a mapping and a logic level adjustment, the resultant logic circuit includes a first-type multiple-input logic gate located at the input side, a multiplexer whose one input terminal is connected to the output terminal of the first-type multiple-input logic gate, and a second-type multiple-input logic gate whose one input terminal is connected to the output terminal of the multiplexer. One of the first- and second-type multiple-input logic gates is a NAND gate and the other is a NOR gate. Which multiple-input logic is a NAND gate or a NOR gate is determined depending on whether the circuit area between these multiple-input logic gates is a positive-logic zone or a negative-logic zone. In this logic circuit, the connection between the output terminal of the first-type multiple-input logic gate and the one input terminal of the multiplexer and also the connection between the output terminal of the multiplexer and the one input terminal of the second-type multiple-input logic gate are made non-invertingly, i.e., the connections are made such that no logic inversion occurs.

The first-type multiple-input logic gate is used to input the second-subservient logic functions at its input terminals and to output from its output terminal the product of the second-subservient logic functions. On the other hand, the multiplexer is used to input the subservient logic functions at its input terminals and also the complementary variable at its control terminal, and to output from its output terminal the subservient logic group including the complementary variable and the subservient logic functions which share that complementary variable. The second-type multiple-input logic gate is used to input the two or more logic functions at its input terminals and to output from its output terminal the logic group comprising the product of those two or more logic functions.

The logic circuit constructed in the above-described manner has the following advantages. First, in this technique, a logic group including a complementary variable is mapped to a multiple-input logic gate and a product of a plurality of logic functions included in the logic group is mapped to a multiple-input logic gate. This makes it possible to realize a logic circuit with a smaller number of transistors and a smaller number of stages taking the advantages of both the pass transistors and the multiple-input logic gates. Furthermore, the use of a NAND or NOR gate, which are an inverting logic gate, as the multiple-input logic gate also allows a reduction in the number of transistors.

In some cases, one of logic functions included in the logic group can be one or more common variables. Depending on the number of common variables, a certain number of unit multiplexers whose one input terminal is maintained at a fixed logic level may also be used in combination of the second-type multiple-input logic gate.

In the case where two or more logic functions included in the logic group are each a subservient logic group including a complementary variable, each subservient logic group may be mapped using one multiplexer.

Let us further assume that one of the second-subservient logic functions is a second-subservient logic group including of a subservient complementary variable and a third-subservient logic functions which share the subservient complementary variable and furthermore a part of or all of the third-subservient logic functions are each comprising a product of fourth-subservient logic functions. In such the case, the second-subservient logic group may be mapped into a logic circuit including a second second-type multiple-input logic gate located at the input side, a second multiplexer whose one input terminal is connected to the output terminal of the second second-type multiple-input logic gate. The second second-type multiple-input logic gate is used to input the fourth-subservient logic functions at its input terminals and to output from its output terminal the third-subservient logic function. The second multiplexer is used to input the third-subservient logic functions at its input terminals and also the subservient complementary variable at its control terminal and to output from its output terminal the second-subservient logic group. The second-subservient logic group thus mapped is then input to an input terminal of the first-type multiple-input logic gate as one of the second-subservient logic functions. The connection between the output terminal of the second second-type multiple-input logic gate and the one input terminal of the second multiplexer and the connection between the output terminal of the second multiplexer and the one input terminal of the first-type multiple-input logic gate are made non-invertingly.

BRIEF DESCRIPTION OF THE DRAWINGS

FIG. 14 is a top part of a first variable table used for designing a logic circuit according to a first embodiment of the present invention;

FIG. 15 is a part of the first variable table following the part shown in FIG. 14;

FIG. 16 is a part of the first variable table following the part shown in FIG. 15;

FIG. 17 is a part of the first variable table following the part shown in FIG. 16;

FIG. 18 is a second variable table used in the first embodiment of the present invention;

FIG. 19 is a top part of a third variable table used in the first embodiment of the present invention;

FIG. 20 is a part of the third variable table following the part shown in FIG. 19;

FIG. 31 is a top part of a first variable table used in designing a logic circuit according to a second embodiment of the present invention;

FIG. 32 is a part of the first variable table following the part shown in FIG. 31;

FIG. 33 is a second variable table used in the second embodiment;

FIG. 34 is a third variable table used in the second embodiment;

FIG. 43 is a top part of a variable table used in designing a logic circuit according to a third embodiment of the present invention;

FIG. 44 is a part of the variable table following the part shown in FIG. 43;

FIG. 45 is a part of the variable table following the part shown in FIG. 44;

FIG. 46 is a variable table used in a process of designing a logic circuit according to a fourth embodiment of the present invention;

DESCRIPTION OF THE PREFERRED EMBODIMENTS

This invention was first described in Japanese applications Nos. 9-149749 and 9-151247, which are incorporated by reference.

The present invention will be described in further detail below with reference to preferred embodiments in conjunction with the accompanying drawings.

Figure 8:
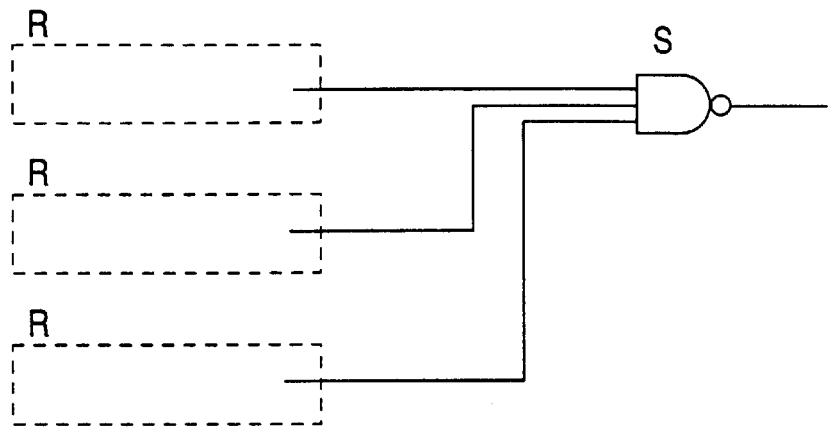
FIG. 8 is a circuit diagram of a logic circuit illustrating the basic structure of a composite pass-transistor logic circuit.

FIG. 8 illustrates the basic structure of the composite pass-transistor logic circuit disclosed in U.S. patent application Ser. No. 08/716,883. The composite pass-transistor logic circuit is constructed such that a plurality of signals output from a plurality of pass-transistor logic circuit (pass-transistor logic tree) R are input separately to input terminals of a multiple-input logic gate S. A pass-transistor logic tree is defined as a circuit having two or more pass transistors connected in series and/or parallel, and outputting a result of a logical operation based on input logic signals received through two or more input nodes.

When pass transistors are connected in series, the output terminal of the pass transistor in a preceding stage is connected to the input terminal of the pass transistor in the next stage. When pass transistors are connected in parallel, the output terminals of the pass transistors are coupled. The control terminals and the input terminals which are not connected to the output terminals of the other pass transistors can be used as input nodes.

Figure 9:
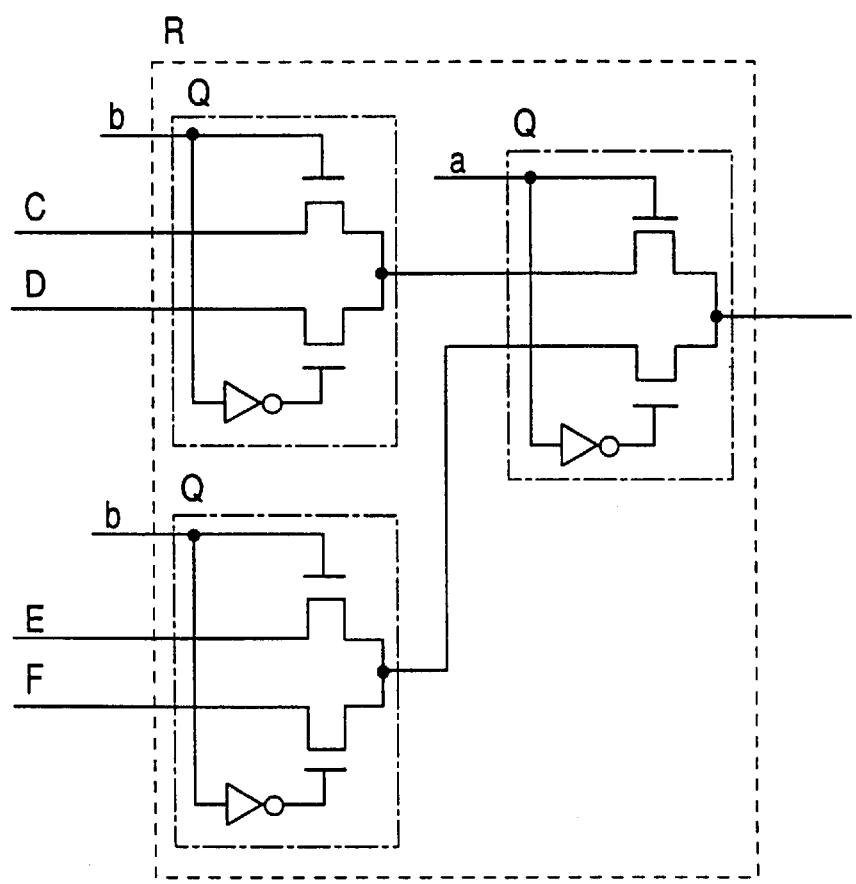
FIG. 9 is a circuit diagram illustrating an example of a pass-transistor logic tree used in a composite pass-transistor logic circuit.
Figure 10:
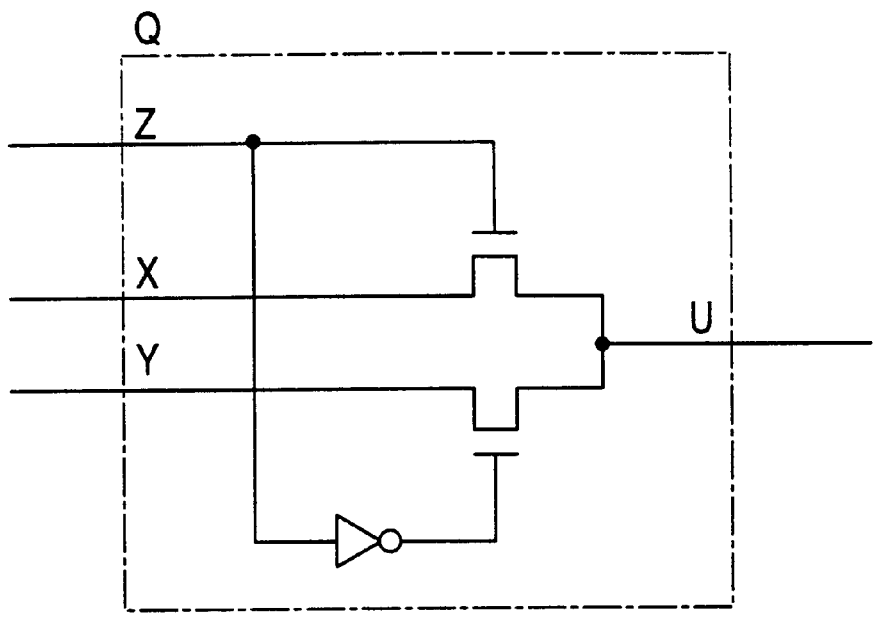
FIG. 10 is a circuit diagram illustrating an example of an unit multiplexer used in an embodiment of the invention.
Figure 10:
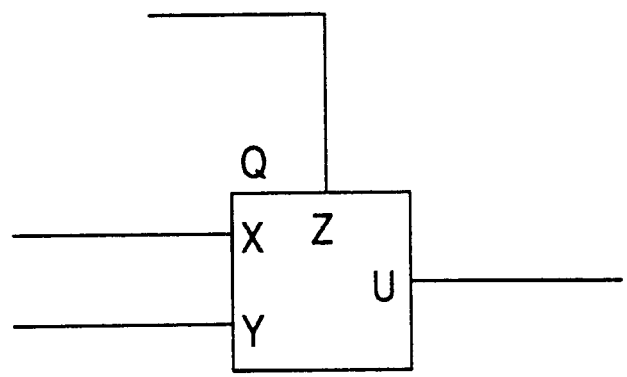

FIG. 9 illustrates a specific example of the pass-transistor logic tree. The pass-transistor logic tree R shown in FIG. 9 is constructed with three unit multiplexers Q shown in FIG. 10. For convenience of representation, the unit multiplexer Q is represented by the symbol shown at the bottom of FIG. 10. This unit multiplexer has two pass transistors each realized by an n-channel MOS transistor wherein the drains of these n-channel MOS transistors are connected together. The sources of the respective two transistors serve as input terminals X and Y, respectively, of the unit multiplexer, and the drains connected together serve as the output terminal U. In many cases, complementary signals are input to the gates, which serve as the control terminals, of the respective pass transistors. Thus, in the specific example shown in FIG. 10, the gate of one MOS transistor is directly connected to the control terminal Z of the unit multiplexer, while the gate of the other MOS transistor is connected to the control terminal via an inverter so that the signal applied to the control terminal Z is supplied to that gate after being inverted.

Multiplexers used in the present invention are constructed in the above-described manner. That is, the structure including two pass transistors whose output terminals are connected together is employed as an unit structure and a plurality of unit structures are combined as required. However, the invention is not limited to such the structures shown in FIGS. 9 and 10.

For example, it is not necessarily required that each unit multiplexer include an inverter therein. For example, when a pair of complementary signals is generated by another circuit, the complementary signals may be applied to the control terminals of the respective two pass transistors. When common signals are applied to the control terminals of a plurality of unit multiplexers, an inverter may be shared by these unit multiplexers.

Instead of using an n-channel MOS transistors to construct a pass transistor, a p-channel MOS transistor may also be employed. Alternatively, an n-channel MOS transistor and a p-channel MOS transistor may be combined.

Furthermore, switching elements other than MOS transistors may also be employed.

As disclosed in U.S. patent application Ser. No. 08/716,883, a pass transistor may also be constructed by combining a switching element and an auxiliary switching element having an opposite polarity and having a smaller driving ability. More specifically, an n-channel MOS transistor is employed as the switching element and a p-channel MOS transistor, which is smaller in size (gate width to gate length ratio) than the n-channel MOS transistor, is employed as the auxiliary switching element. Furthermore, as disclosed in U.S. patent application Ser. No. 08/716,823, a unit multiplexer may also be constructed using two switching elements which are opposite in polarity to each other, for example an n-channel MOS transistor and a p-channel MOS transistor, in such manner that the output terminals of the respective switching elements are connected together.

As for the multiple-input logic gate S shown in FIG. 8, an AND gate, OR gate, NAND gate, or NOR gate may be employed. Furthermore, a multiple-input logic gate having more complicated structure may also be employed. The number of input terminals may be two or some other proper value. In a typical case, a 3-input NAND gate or a 3-input NOR gate may be employed as in some embodiments of the present invention which will be described later. These multiple-input logic gates are typically multiple-input CMOS logic gates, although other types of multiple-input logic gates may also be employed.

In some embodiments of the present invention, multiple-input logic gates and multiplexers composed of a combination of pass transistors such as those described above are employed to construct a logic circuit. However, the manner of connecting a multiplexer to a multiple-input logic gate is not limited to that employed in the composite pass-transistor logic circuit shown in FIG. 8 in which the outputs from a plurality of multiplexers are input separately to input terminals of a multiple-input logic gate. Furthermore, a logic circuit may also be constructed using only pass transistors without using any multiple-input logic gate.

In the case of a logic circuit including both pass transistors and one or more multiple-input logic gates, it is important to construct the logic circuit in such a manner that the advantages are obtained as a result of the cooperation of the pass transistors and the multiple-input logic gates. In the present invention, when a logical expression to be realized is given, portions of the expression suited to be realized with pass transistors and portions suited to be realized with multiple-input logic gates are extracted from the logical expression, and the logical expression is mapped to a logic circuit in which the pass transistors and multiple-input logic gates are used in an advantageous fashion. This technique makes it possible to construct a logic circuit in which the advantages of both pass transistors and multiple-input logic gates are utilized. That is, the present invention is not limited to the particular manner of connecting pass transistors to a multiple-input logic gate employed in the composite pass-transistor logic circuits, but pass transistors and multiple-input logic gates are combined in various manners depending on the logical operation to be realized so that the advantages of both pass transistors and multiple-input logic gates are obtained in the resultant logic circuit.

Generally, a reduction in the logic swing occurs when a signal is passed through pass transistors. If a great number of pass transistors are connected in series, the reduction in the logic swing becomes greater. As a result, a reduction in noise margin occurs, and, in the worst case, the logic signal cannot be transferred correctly to the following stage. Furthermore, in the case where a great number of pass transistors are connected in series, the series connection of resistances between the input and output terminals of pass transistors causes a reduction in the signal propagation speed. To avoid the above problems, it is desirable that the maximum allowable number of pass transistors to be connected in series be predetermined. When the number of pass transistors connected in series reaches the predetermined maximum number, an element to restore the logic swing such as a buffer is inserted. In the case of a logic circuit including both pass transistors and multiple-input logic gates, a multiple-input logic gate may be employed as the element to restore the logic swing. Although the maximum allowable number of pass transistors which can be connected in series without the element to restore the logic swing, that is the maximum allowable number of stages in a pass-transistor logic tree, is not limited to a specific value, it is generally desirable that the maximum allowable number be set to two or three if the complexity of the logic circuit and the balance of the operating speed among other parts of the logic circuit are taken into account.

If a multiple-input logic gate is disposed at the stage following a pass-transistor logic tree, there is a possibility that a large static feedthrough current flows through the multiple-input logic gate and thus power consumption of the logic circuit becomes great. The static feedthrough current is referred to a feedthrough current which flows from VDD power supply into GND power supply through a device element after the output level has reached a steady state at either "1" or "0" logic level. This can occur even if a device structure having small static feedthrough current, such as the CMOS structure, is employed to construct the multiple-input logic gate, because the reduction in the logic swing caused by pass transistors can cause one of complementary switching elements (a n-channel MOS transistors and a p-channel MOS transistor in the case of a CMOS multiple-input logic gate) making up the multiple-input logic gate to be in an incomplete off-state. To avoid such the problem, it is preferable to suppress the static feedthrough current by any of possible techniques such as that disclosed in U.S. patent application Ser. No. 08/716,883.

Before describing specific embodiments according to the present invention, issues in the circuit design techniques common to all embodiments will be described first.

Figure 11:
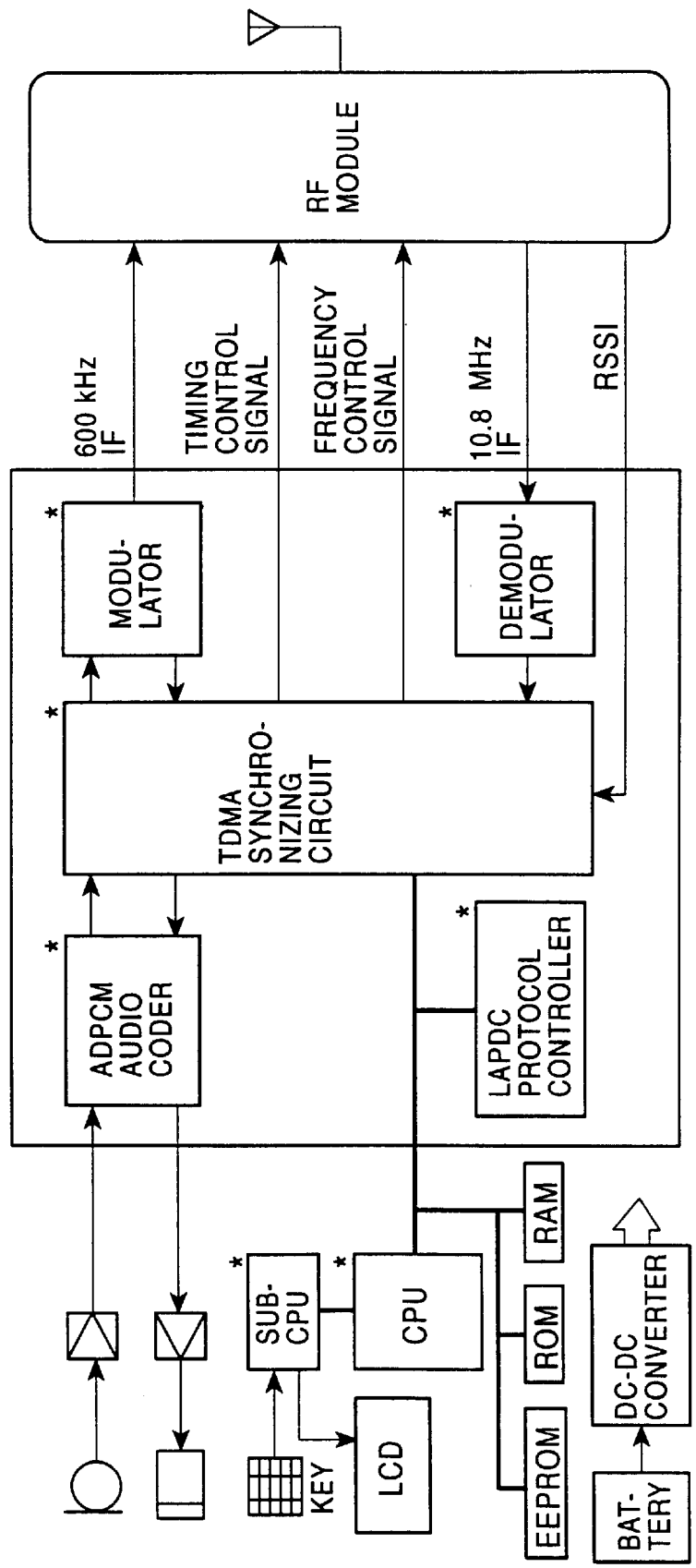
FIGS. 11 and 12 are block diagrams of a hand-set of a personal handy phone and a subscriber unit of a cellular phone, respectively.
Figure 12:
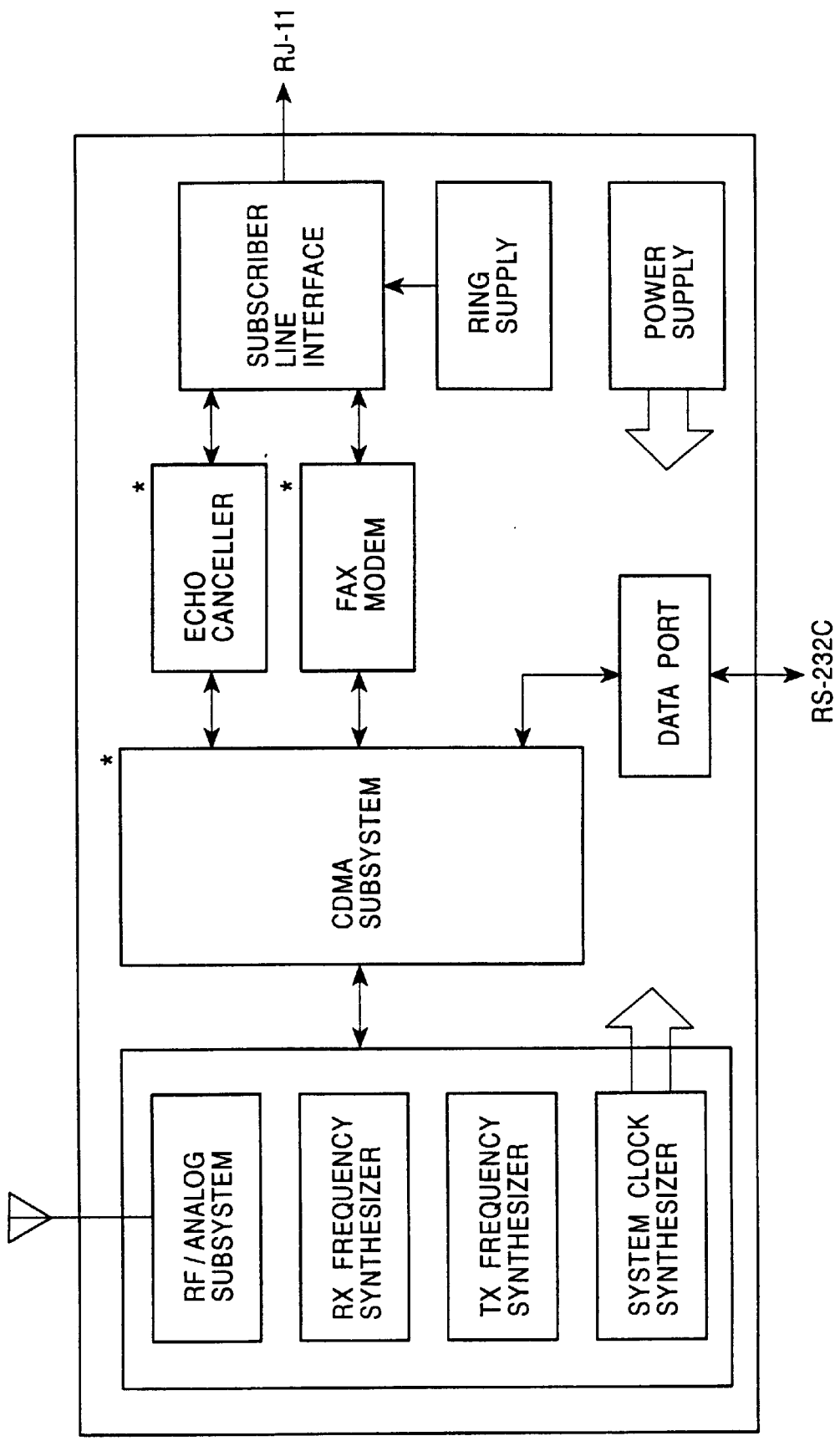

In the embodiments described below, methods of designing a logic circuit for executing a particular logical operation will be presented. Typically, the logic circuit designed according to the present invention will be realized in a semiconductor integrated circuit including one or more logic circuits designed according to the present invention. The integrated circuit may also include one or more logic circuits designed according to some other techniques. The integrated circuit may be used in conjunction with other integrated circuits or discrete devices so as to construct an electronic system for realizing various functions. For example, FIGS. 11 and 12 shows block diagrams of a hand-set of a personal handy phone and a subscriber unit of a digital cellular phone, respectively. As shown in these figures, various circuits are used in these systems. Among these circuits, part or whole of the circuits marked (*) in the figures are particularly suited to be designed according to the present invention, because a small number of transistors, low power consumption and a high operation speed are strongly required in these circuits.

The embodiments described below deal with methods of optimizing a given logical expression or mapping the given logical expression to a logic circuit including pass transistors, in particular to a logic circuit including both pass transistor and a multiple-input logic gate. The present invention may be employed to design large-scale logic circuits in the form of an integrated circuit for use in various practical applications.

Figure 13:
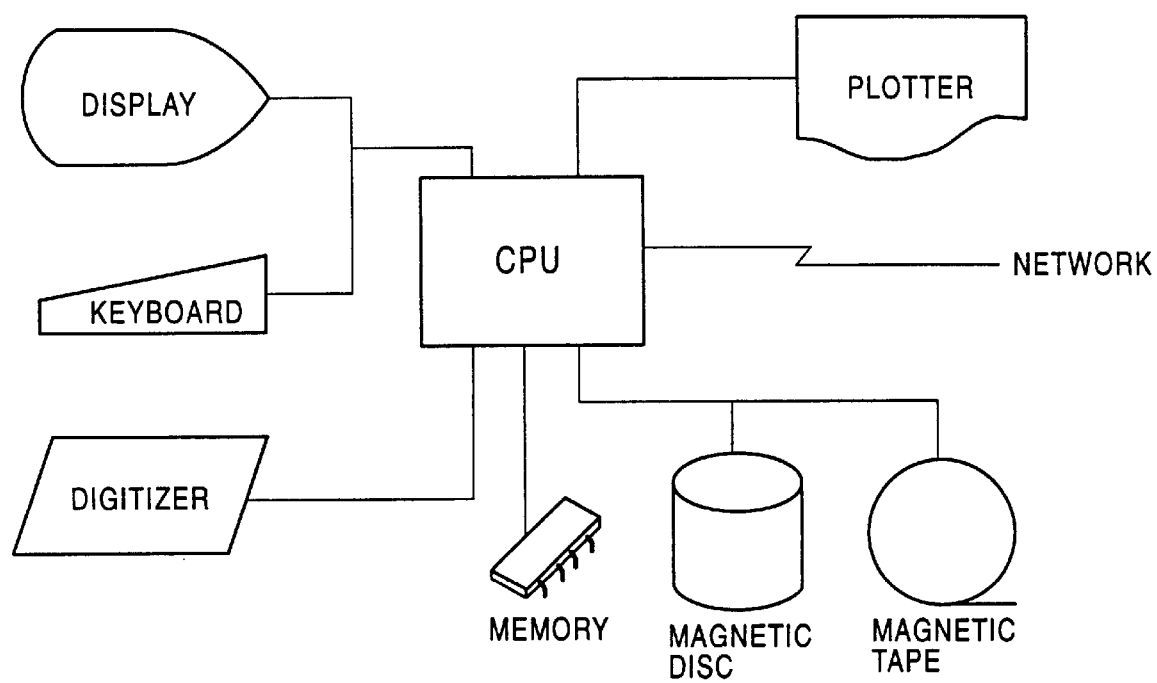
FIG. 13 is a schematic diagram of a CAD system.

Typically, the methods of these embodiments according to the invention may be practiced on a CAD (computer aided design) system based on a mainframe computer, engineering workstation, or personal computer. As shown in FIG. 13, the CAD system includes a CPU, an input device (such as a magnetic tape device and a network) for inputting a logical expression to be designed, an output device (such as a magnetic tape device and a network) for outputting a designed circuit data, and a storage device (such as a semiconductor memory and a magnetic disk) for storing the logical expression and the logic circuits during the design procedure. The storage device also stores a software which controls the system. The CAD system may further include a keyboard, display, and digitizer for use as man-machine interfaces. All procedures shown in FIG. 7 may be performed on either a single CAD system or a plurality of separate CAD systems for the respective procedures. Furthermore, the CAD system may also be used to perform a circuit simulation for verifying the designed circuit, and also to create a mask layout according to the designed circuit. Such CAD systems also fall within the scope of the present invention.

Furthermore, the present invention also includes in its scope a CAD program in which a design algorithm or technique according to the invention, a medium such as a magnetic disk on which such a program is stored.

The logic circuits obtained by the design method according to the embodiments described below include various novel logic circuits. Such the novel logic circuits and electronic systems including such the novel logic circuits are also included in the scope of the invention. Furthermore, methods of executing logical operations using such novel logic circuits are also included in the scope of the invention.

The logical operation to be executed by the logic circuit can be expressed by a logical expression including variables associated with inputs and outputs given from and to the outside of the integrated circuit, variables associated with inputs and outputs given from and to sequential circuits and/or memory circuits (such as flip-flops, registers, memories) in the integrated circuit, and inputs and outputs given from and to nodes in the integrated circuit. Herein, the term "logical expression" generally means an expression which describes a logical relationship between an output variables and a plurality of input variables. The expression may include a sum, a product, and/or a sum of products of the input variables. The expression may also includes various logic functions of the input variables. Typically, the expression is described as a mathematical expression in the form of "an output variable"="a sum of products of the input variables". However, the expression can be described in various other forms including a HDL (Hardware Description Language), a truth table and a state transition diagram. In a CAD system for designing logic circuits, a logical expression given in any forms is transformed in the form that can be read by a CPU and stored in an appropriate location of a storage device of the CAD system, so that the expression can be processed by the CPU.

To obtain a logic circuit which is excellent in the operating speed, the number of transistors, power consumption, and/or other characteristics, it is generally desirable to optimize a given logical expression taking the following points into account.

A1. Variables having strong influences on outputs are placed at high levels in the logical expression. These variable placed at high levels in the logical expression will be input near the output side of the designed logic circuit.

A2. Variables which are closely related together are placed at similar levels.

In the design of a logic circuit including pass transistors, it is desirable to take the following point into account.

A3. The logic circuit should be designed to have a circuit structure in which the advantages of multiplexers composed of pass transistors are realized. This can allow a reduction in the number of transistors used in the circuit. In view of this point, the present invention provides a variable-combination method which will be described below.

In the design of a logic circuit also including a multiple-input logic gate, it is desirable to take the following point into account.

A4. Instead of mapping respective product terms using separate multiple-input logic gates, a plurality of product terms having one or more common variables are combined together, and these product terms are input to a common multiple-input logic gate. This can allow a reduction in the number of transistors used and also in the number of stages. In view of this point, the present invention provides a common-variable method which will be described later.

Further, when multiple-input logic gates are used in the logic circuit, it is desirable to take the following point into account.

A5. NAND gates or NOR gates are more suitable for use as multiple-input logic gates than AND or OR gates. Note that the NAND and NOR gates result in logic inversion, and thus it is required to adjust the logic level as will be described later.

The design methods according to the invention, in which all the above points A1–A5 or some of them are taken into account, will be described below. Logic circuits having unique features achieved by the design methods will also be described in conjunction with the respective methods. As briefly shown in FIG. 7, the basic design procedure according to the invention includes the steps of: transforming the given combinational logical expression into an optimum form suited to be mapped to a logic circuit; performing a preliminary mapping; and adjusting the logical level. In another embodiment, the mapping and the logic level adjustment are simultaneously performed. In these and other embodiments described below, preferable techniques associated with various parts of the above procedure are presented. In practice, logic circuits may be designed according to a proper combination of those techniques described below with reference to specific embodiments. Furthermore, these techniques may also be combined with other conventional techniques.

Now, first through fourth embodiments will be described below wherein the first embodiment is based on the variable-combination method, the second embodiment is based on the bottom-up common-variable method, the third embodiment is based on the top-down common-variable method, and the fourth embodiment is based on the common-variable/variable-combination method. Before describing these first through fourth embodiments separately, common issues will be described first.

In the first through fourth embodiments, a logical expression shown below in equation (2) will be taken as an example.

$$X = \bar{a}\cdot\bar{b}\cdot\bar{c}\cdot\bar{d}\cdot\bar{e}\cdot\bar{f}\cdot\bar{g}\cdot\bar{h}\cdot\bar{i} + \bar{a}\cdot\bar{b}\cdot\bar{c}\cdot\bar{d}\cdot\bar{e}\cdot f\cdot g\cdot h\cdot j + \qquad (2)$$
$$a\cdot b\cdot c\cdot d\cdot e\cdot \bar{f}\cdot\bar{g}\cdot\bar{i}\cdot\bar{j} + a\cdot b\cdot c\cdot d\cdot e\cdot f\cdot g\cdot h\cdot i\cdot j +$$
$$a\cdot b\cdot c\cdot\bar{d}\cdot\bar{e}\cdot g\cdot\bar{h}\cdot i\cdot j + \bar{a}\cdot\bar{b}\cdot\bar{c}\cdot d\cdot f\cdot g\cdot h\cdot\bar{i}\cdot\bar{j} +$$
$$a\cdot\bar{b}\cdot c\cdot e\cdot\bar{f}\cdot g\cdot\bar{h}\cdot i\cdot\bar{j} + \bar{a}\cdot b\cdot d\cdot\bar{e}\cdot f\cdot\bar{g}\cdot h\cdot\bar{i}\cdot j$$

where a, b, c, d, e, f, g, h, i, and j are input variables, · denotes logical AND, and + denotes logical OR.

This logical expression includes eight product terms in total. These eight product terms are denoted by symbols I, II, . . . , VIII. In the table shown in FIG. 14, these eight product terms are represented in the second through ninth rows counted from the top. In this table, negative-logic variables are represented by "0" while positive-logic variables are represented by "1". Variables which are not included in respective product terms are represented by "2" (don't care). In the first row in the table shown in FIG. 14, variables a through j included in equation (2) are disposed in the respective columns from left to right.

For example, the second row represents $\bar{a}\cdot\bar{b}\cdot\bar{c}\cdot\bar{d}\cdot\bar{e}\cdot\bar{f}\cdot\bar{g}\cdot\bar{h}\cdot\bar{i}$ of a product term I in the equation (2). In this product term I, the columns corresponding to the variables a through i are filled with "0" because the product term I includes variables a through i in the negative logic. While the column corresponding to variable j is filled with 2 because the product term I does not include variable j. Thus, the second row in FIG. 14 is given as "0000000002".

To verify the algorithms according to the first, second and fourth embodiments of the invention, the programs shown in FIGS. 27, 28, 41, and 42, which will be described in detail later, were created using Visual Basic on the spreadsheet program Excel™ provided by Microsoft Corporation. For example, in the case of the table shown in FIG. 14, the respective variable names are registered in the first row starting with "A1" in an Excel™ sheet, and the product terms are stored in the second and following rows. Then the program is started.

In the first through fourth embodiments, and also in the fifth through seventh embodiments described below, the maximum allowable number of pass transistor stages is set to two, and the maximum allowable number of input terminals of the multiple-input logic gate is set to three.

Now, the method of designing a logic circuit according to the first embodiment of the invention will be described.

A logical expression shown below in equation (3) can be mapped to a multiplexer including six pass transistors and three inverters as shown in FIG. 9. This circuit includes a small number of transistors, and a small number of stages compared with a logic circuit achieved using multiple-input logic gates. In this respect, this circuit is a good example of an ideal circuit structure. In this circuit, each inverter may be constructed with a combination of an n-channel MOS transistor and a p-channel transistor. Thus, this circuit includes twelve transistors in total. If one inverter is shared by the two first-stage multiplexers, the total number of transistors can be reduced to ten.

$$X = a\cdot b\cdot C + a\cdot\bar{b}\cdot D + \bar{a}\cdot b\cdot E + \bar{a}\cdot\bar{b}\cdot F \qquad (3)$$

where C, D, E, and F are arbitrary logic functions.

In equation (3), variables a and b are complementary variables. From this example, it can be seen that if complementary variables are selected from the given logical expression representing the logical operation to be realized, the logical expression is grouped with respect to the selected complementary variables, and then the resultant logical expression is mapped to a logical circuit using multiplexers, then the resultant logical circuit has a preferable circuit structure including pass-transistors.

In the first embodiment, the variable-combination method is used to identify one or more complementary variables and group the product terms in an efficient manner. In the variable-combination method, sets of variables are first made wherein the number of variables in the set is determined in accordance with the maximum allowable number of pass-transistor stages which can be connected in series. For example, if the maximum allowable number of pass-transistor stages is v, then set of (v+1) variables are made. Then the number of logical combinations of variables in the set is determined. An example for v=2 is shown in variable tables of FIGS. 14–17 wherein a single variable table is divided into four tables shown in FIGS. 14–17 for convenience of description.

For example, let us consider the number of logical combinations of set of variables a, b, and c with respect to variable c. In the second through ninth rows in the table shown in FIG. 14, a combination of "000" appears in the product terms I, II, and VI, a combination of "111" appears in the product terms III, IV, and VI, and a combination of "101" appears in the product term VII. Therefore, there are three different combinations of variables. Thus, the third column in the eleventh row in FIG. 14 is filled with "3". The product term VIII does not include variable c as can be seen from the fact that the corresponding value is "2" (don't care). Therefore, this term is not included in the number of combinations. Although not shown in the table, combinations in which variable c has a value other than "2" and other two variables have a value of "2", for example "221" and "220", are not counted. However, combinations in which one of the variables other than c has a value of "2" and the other two variables each has a value other than "2", for example "211" and "120" are counted.

Similarly, the numbers of logical combinations of variables b and c with respective variables d, e, f, g, h, i, and j are described in the fourth through tenth columns in the eleventh row. In the twelfth and following rows, the number of logical combinations are determined in a similar manner.

Alternatively, v variables may be combined together instead of (v+1) variables. In this case, the numbers of combinations will be as shown in FIG. 18. However, the differences in the number of combinations are easier to determine when (v+1) variables are combined. In general, when the number of product terms is greater than $2^v$, (v+1) variables are combined together, and v variables are combined together if the number of product terms is less than (v+1).

In this embodiment, v is set to 2. However, v can be set to a different value. When v=1 and (v+1) variables are combined, combinations such as "21" and "20" are counted. When v=1 and v variables are combined, "1" and "0" are regarded as "combinations", and counted.

After determining the number of logical combinations for all possible sets, the maximum number of logical combinations with respect to the respective variables a through j, and the frequency of occurrence of that maximum number are determined. For example, the numbers of logical combinations with respect to variable a are shown in the first column in the rows from the eleventh row in FIG. 14 to the sixth row in FIG. 17 counted from the bottom. As shown, the maximum number is "eight" and the frequency of occurrence of "eight" is six. Thus, the first column in the fourth row counted from the bottom (maximum number of combinations) in FIG. 17 is filled with "8", and the first column in the third row counted from the bottom (occurrence of maximum number) is filled with "6". In this embodiment, at most v variables are selected in such a manner that a variable having the greater number of "maximum number of combinations" is selected first, a variable having the next greatest number of "maximum number of combinations" is selected next, and so on. If there are plurality of variables having an equal number of "maximum number of combinations", variables which are greater in "occurrence of maximum number" are selected earlier. That is, variables are selected in the order from that included in a set of variables having a greater number of combinations toward that included in a set having a smaller number of combination. When the number of combinations is equal, variables are selected in the order from that having a greater frequency of occurrence of being included in sets of variables having a greater number of combinations toward that having a smaller frequency of occurrence.

The selected variables are employed as complementary variables and the product terms including those complementary variables are grouped. In the present specific example, variable b (whose maximum number of combinations is 8 and whose frequency of occurrence is 10) is selected first, and then variable a (whose maximum number of combinations is 8 and whose frequency of occurrence is 6) is selected next. Then the product terms in equation (2) are grouped as shown below in equation (4).

$$X = \bar{a} \cdot \bar{b} \cdot (\bar{c} \cdot \bar{d} \cdot \bar{e} \cdot \bar{f} \cdot \bar{g} \cdot \bar{h} \cdot \bar{i} + \bar{c} \cdot \bar{d} \cdot \bar{e} \cdot f \cdot g \cdot h \cdot j + \quad (4)$$
$$\bar{c} \cdot d \cdot f \cdot g \cdot h \cdot \bar{i} \cdot \bar{j}) + a \cdot b \cdot (c \cdot d \cdot e \cdot \bar{f} \cdot \bar{g} \cdot \bar{i} \cdot \bar{j} +$$
$$c \cdot d \cdot e \cdot f \cdot h \cdot i \cdot j + c \cdot \bar{d} \cdot \bar{e} \cdot \bar{g} \cdot \bar{h} \cdot i \cdot j) +$$
$$a \cdot \bar{b} \cdot (c \cdot e \cdot \bar{f} \cdot g \cdot \bar{h} \cdot i \cdot \bar{j}) + \bar{a} \cdot b \cdot (d \cdot \bar{e} \cdot f \cdot \bar{g} \cdot h \cdot \bar{i} \cdot j)$$

Thus, the first cycle of optimization according to the first embodiment is completed.

In equation (4), variables a and b placed outside the parentheses are complementary variables and the variables inside the respective parentheses make up logic functions which share the complementary variables.

The procedure of introducing parentheses as shown in equation (4) is only for an easier understanding and is not essential to the invention. In a practical process of designing a logic circuit using a CAD system, a logical expression is stored at proper locations in a storage device in a form which can be read by a CPU. Which variables are complementary variables and which logic functions share the complementary variables are determined, and the results are stored in the storage device in a form which can be read by the CPU. Thus the grouping is performed by the CPU.

In the example described above, both selected variables a and b are complementary variables. That is, two complementary variables can be identified by the procedure described above. However, it is not always possible to identify v complementary variables. For example, when v=2 and the number of combinations of two variables is four, it is possible to group the product terms into a form having two multiple-complementary variables such as (a·b·C+a·b̄·D+ā·b·E+ā·b̄·F). In the case where the number of combinations of two variables is three, it is possible to group the product terms into a form having partial two multiple-complementary variables such as (a·b·C+a·b̄·D+ā·b·E). On the other hand, when the number of combinations of two variables is two, only one variable can be a complementary variable. In this case, the product terms may be grouped either into a form having one complementary variable (such as a·b·C+ā·b̄·F where either a or b can be a complementary variable) or into a form having one complementary variable and one common variable (such as a·b·C+ā·b·E where a is a complementary variable and b is a common variable).

Considering these facts, variables which can actually be complementary variables may be identified and grouping may be performed with respect to the identified complementary variables. Alternatively, v variables may be selected with no restriction and grouping may be performed with respect to the selected variables. The former technique allows a better optimization whereas the latter technique is simpler in process.

Subsequently, a similar procedure is repeated as the second cycle of the optimization procedure. In this cycle of the procedure, lower-level logic groups in each group, that is, logic functions in the respective parentheses are regarded as logical expressions and the product terms included in the logical expressions are grouped in a similar manner. In this procedure, to reduce the process time, it is desirable that common variables in the groups be removed and they be not subjected to the procedure of determining the number of combinations. The removal can be performed simply by, for example, determining the logical product of all product terms included in each group. This also makes it easier to map the common variables at input terminals of a multiple-input logic in a form in which the advantages of the multiple-input logic gate are utilized.

In equation (4) described above, c̄ in the three product terms in the parentheses in the first term and c in the three product terms in the parentheses in the second term are common variables in the respective groups. After removing these common variables, numbers of logical combinations associated with the product terms in the parentheses of the first term may be determined as shown in tables of FIGS. 19 and 20 wherein a single table is divided into two. In the second through fourth rows of the table, three product terms (arising from the first, second, and sixth terms in equation (2)) in the group except for the complementary variables and the common variables are shown. As shown in the fourth row, counted from the bottom, in the table of FIG. 20, the maximum number of combinations is three wherein sets of variables including variables d, f, g, and h have the maximum number of three. Of these, variable d has the greatest frequency of occurrence 30 as shown in the third row from the bottom. Variables f, g, and h have the next greatest frequency of occurrence 28. Thus, variable d is selected first. Although any of variables f, g, and h may be selected next because they are equivalent, variable f is selected herein. Using the selected variables d and f as complementary variables, the product terms in the group is further grouped.

Similarly, the product terms in the second term is further grouped. Thus, the original logical expression is transformed into the form shown in equation (5).

$$X = \bar{a} \cdot \bar{b} \cdot \{\bar{c} \cdot (\bar{d} \cdot \bar{f} \cdot (\bar{e} \cdot \bar{g} \cdot \bar{h} \cdot \bar{i}) + \bar{d} \cdot f \cdot (\bar{e} \cdot g \cdot h \cdot j) + \quad (5)$$
$$d \cdot f \cdot (g \cdot h \cdot \bar{i} \cdot \bar{j}))\} + a \cdot b \cdot \{c \cdot (d \cdot \bar{i} \cdot (e \cdot \bar{f} \cdot \bar{g} \cdot \bar{j}) +$$
$$d \cdot i \cdot (e \cdot f \cdot h \cdot j) + \bar{d} \cdot i \cdot (\bar{e} \cdot \bar{g} \cdot \bar{h} \cdot j))\} +$$
$$a \cdot \bar{b} \cdot (c \cdot e \cdot \bar{f} \cdot g \cdot \bar{h} \cdot i \cdot \bar{j}) + \bar{a} \cdot b \cdot (d \cdot \bar{e} \cdot f \cdot \bar{g} \cdot h \cdot \bar{i} \cdot j)$$

The above procedure is performed repeatedly until any lowest-level group only includes one or no product term which includes only variables. In equation (5), any of the logic functions in the lowest-level groups, that is, any of the logic functions in the deepest-nested parentheses includes only one product term including only variables. This means that the number of combinations of variables in the lowest-level groups is 1 or 0, and thus any group cannot be further grouped.

If the logical expression (5) which has been optimized according to the present embodiment of the invention is subjected to the preliminary mapping process according to the first embodiment described later and the logic level adjustment according to the sixth embodiment which will also be described later, a logic circuit is obtained as shown in FIGS. 21–26 wherein a single circuit diagram is divided into a plurality of parts shown in FIGS. 21 through 26. In these figures, symbols S11–S22 are used to describe the signal connections in the logic circuit. That is, it should be understood that signals denoted by the same symbols in different figures are connected to each other. This logic circuit includes 133 transistors in total and the maximum number of stages is 9. Although this logic circuit is not the best solution, it is in an acceptable form. If similar circuit structures are shared by a plurality of parts of the circuit, the structure of the logic circuit is further improved. For example, in the part shown at the top of FIG. 21, one multiplexer is used in common to generate signals S11 and S17.

The logic circuit shown in FIGS. 21–26 includes twenty-two unit multiplexers, ten multiple-input logic gates, and one inverter.

Figure 22:
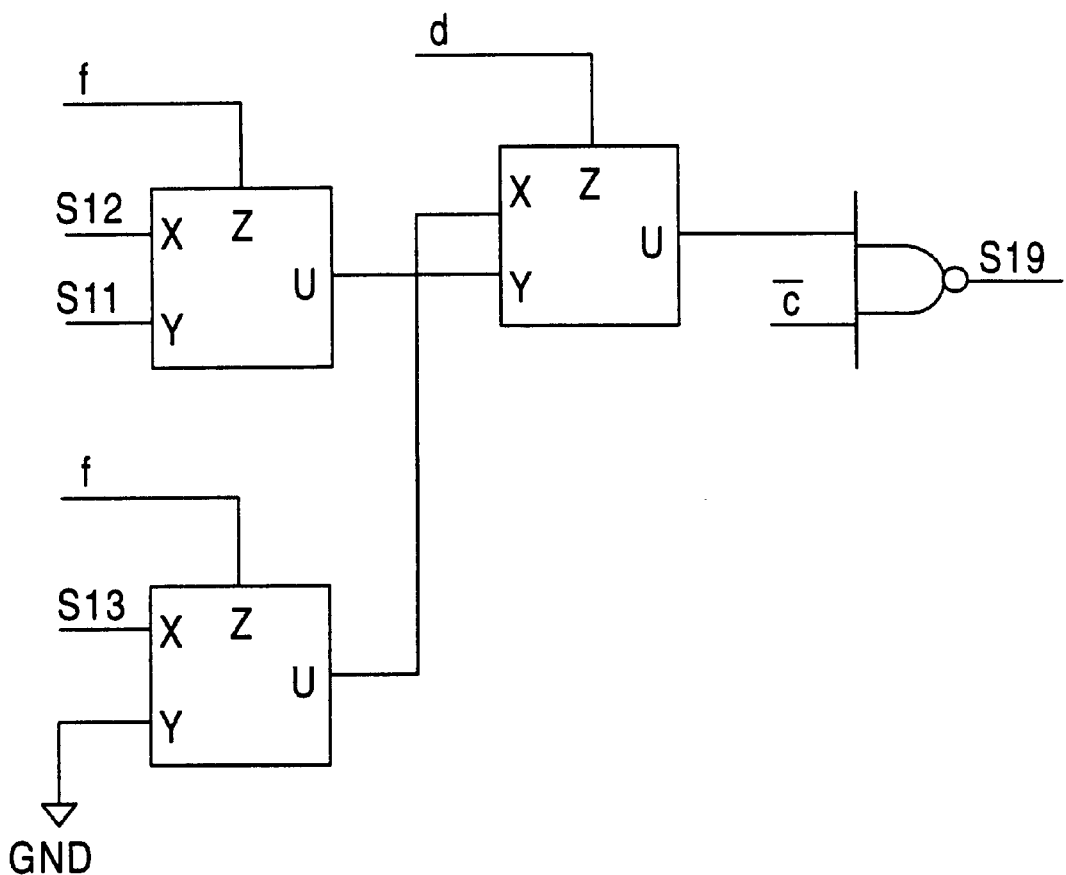
FIG. 22 is a circuit diagram illustrating another part of the logic circuit according to the first embodiment.
Figure 23:
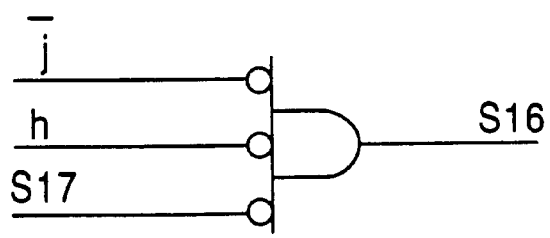
FIG. 23 is a circuit diagram illustrating still another part of the logic circuit according to the first embodiment.
Figure 24:
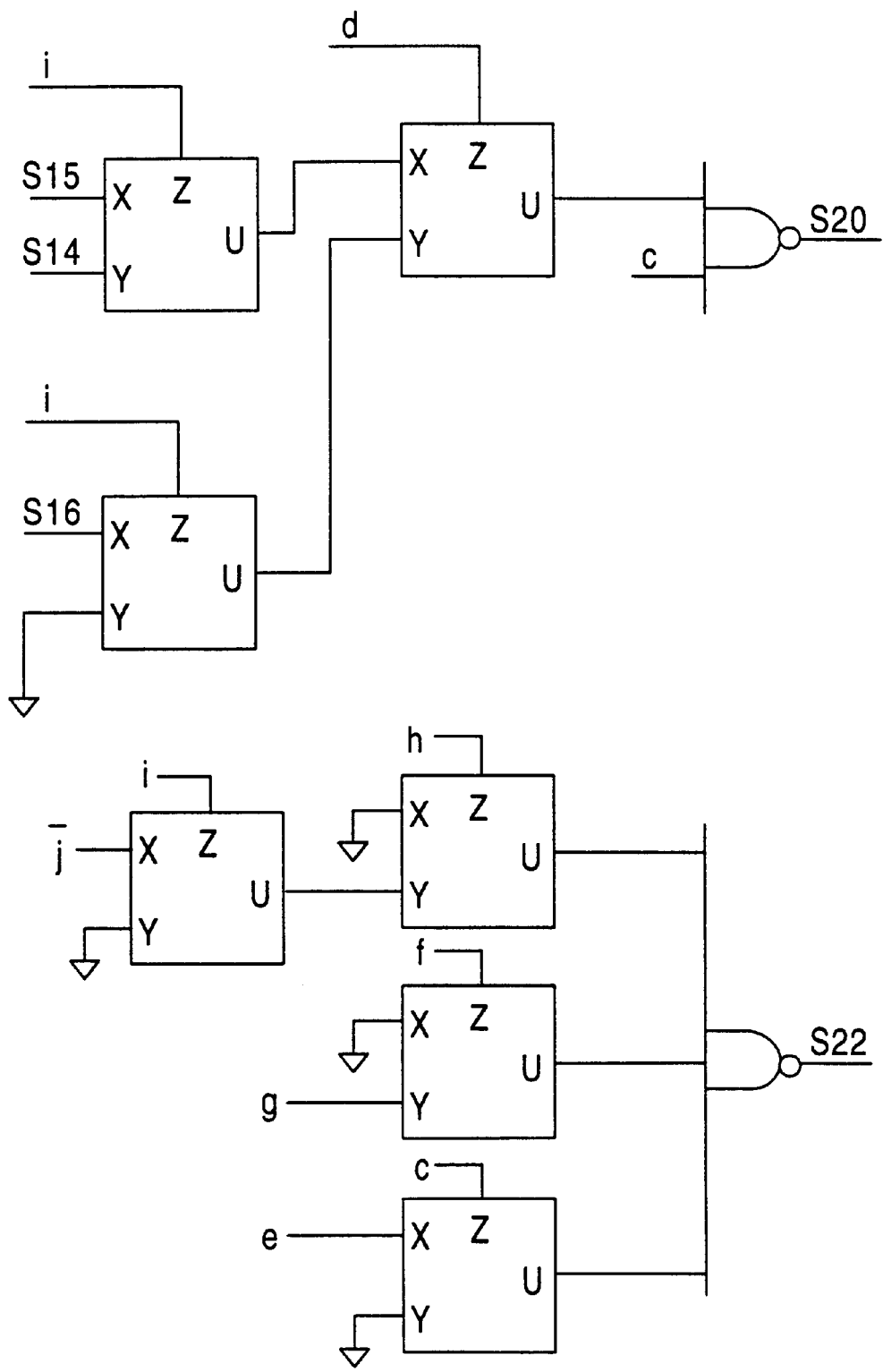
FIG. 24 is a circuit diagram illustrating still another part of the logic circuit according to the first embodiment.
Figure 26:
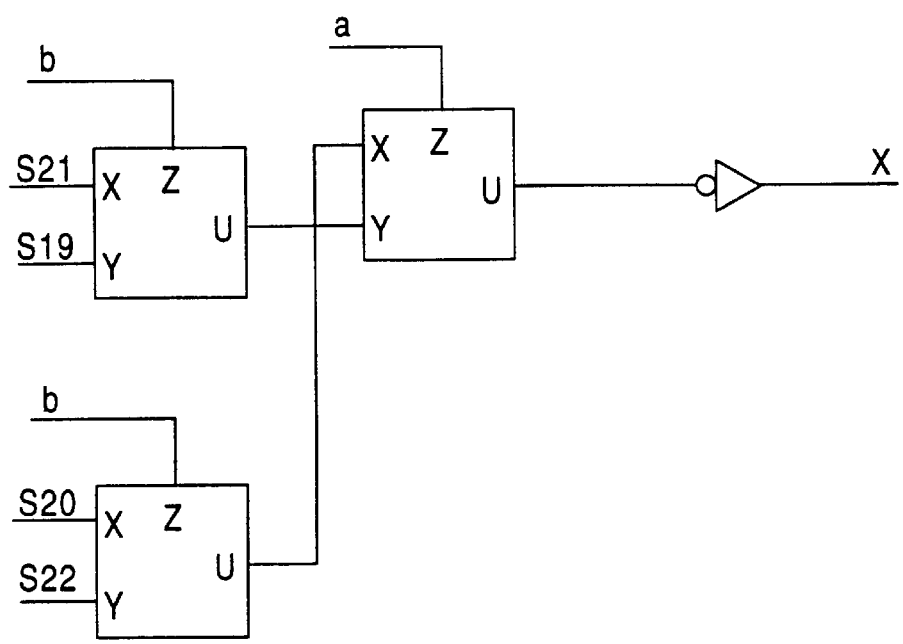
FIG. 26 is a circuit diagram illustrating still another part of the logic circuit according to the first embodiment.

This circuit includes two-stage multiplexers for example in the part shown in FIG. 22. This two-stage multiplexer is used to map a logic group $\overline{d}\cdot\overline{f}\cdot(\overline{e}\cdot\overline{g}\cdot\overline{h}\cdot\overline{i})+\overline{d}\cdot f\cdot(\overline{e}\cdot g\cdot h\cdot j)+d\cdot f(g\cdot h\cdot \overline{i}\cdot \overline{j})$ including two multiple-complementary variables d and f. That is, the complementary variables d and f are input to the control terminals, and the logic functions $\overline{e}\cdot\overline{g}\cdot\overline{h}\cdot\overline{i}$, $\overline{e}\cdot g\cdot h\cdot j$, $g\cdot h\cdot \overline{i}\cdot \overline{j}$ are input as signals S11, S12, and S13 to the input terminals. Similarly, the two-stage multiplexer in the part shown in FIG. 24 is used to map a logic group $d\cdot\overline{i}\cdot(e\cdot\overline{f}\cdot\overline{g}\cdot\overline{j})+d\cdot i\cdot(e\cdot f\cdot h\cdot j)+\overline{d}\cdot i\cdot(\overline{e}\cdot\overline{g}\cdot\overline{h}\cdot j)$ including two multiple-complementary variables d and i, and the two-stage multiplexer in the part shown in FIG. 26 is used to map a logic group including two multiple-complementary variables a and b. That is, the entire parts of equation (5) is mapped by this two-stage multiplexer with other parts of the circuit which produce the signals S19, S20, S21 and S22. As described above, this logic circuit includes three two-stage multiplexers for mapping logic groups each including two multiple-complementary variables. In other words, there are nine unit multiplexers for mapping logic groups including complementary variables. Thus, in this circuit, the advantages of multiplexers are well utilized. This is a characteristic feature of a logic circuit obtained by mapping a logical expression optimized according to the variable-combination method in which product terms are grouped so that the number of combinations is maximized. In particular, because the complementary variables are identified and the logical expression is optimized under the condition that the maximum number of pass-transistor stages v=2, a great number of two-stage multiplexers are used to map logic groups including two multiple-complementary variables. Because the circuit is designed under the condition that the maximum allowable number of pass-transistor stages is two, multiplexers used in the circuit have at most two stages. If at most three or more stages of pass-transistors are allowed, a multiplexer having three or more stages can be used to map a logic group including three or more multiple-complementary variables.

The present logic circuit also include multiple-input logic gates for mapping logic groups including common variables. For example, a two-input NAND gate in the part shown in FIG. 22 is used to map a logic group $\overline{c}\cdot(\overline{d}\cdot\overline{f}\cdot(\overline{e}\cdot\overline{g}\cdot\overline{h}\cdot\overline{i})+\overline{d}\cdot f\cdot(\overline{e}\cdot g\cdot h\cdot j)+d\cdot f\cdot(g\cdot h\cdot \overline{i}\cdot \overline{j}))$ including a common variable c, and the result of operation is output as a signal S19 from its output terminal. That is, the common variable $\overline{c}$ is input to one input terminal of the two-input NAND gate, and the sum of the logic functions which share the common variable $\overline{c}$ is mapped by a two-stage multiplexer and is then input to the other input terminal of the NAND gate. Similarly, a two-input NAND gate in the part shown in upper part of FIG. 24 is used to map a logic group $c\cdot(d\cdot\overline{i}\cdot(e\cdot\overline{f}\cdot\overline{g}\cdot\overline{j})+d\cdot i\cdot(e\cdot f\cdot h\cdot j)+\overline{d}\cdot i\cdot(\overline{e}\cdot\overline{g}\cdot\overline{h}\cdot j))$ including a common variable c.

Multiplexers other than those nine unit multiplexers used to map logic groups including complementary variables and multiple-input logic gates other than those to which common variables are input are used to map products of variables.

Figure 25:
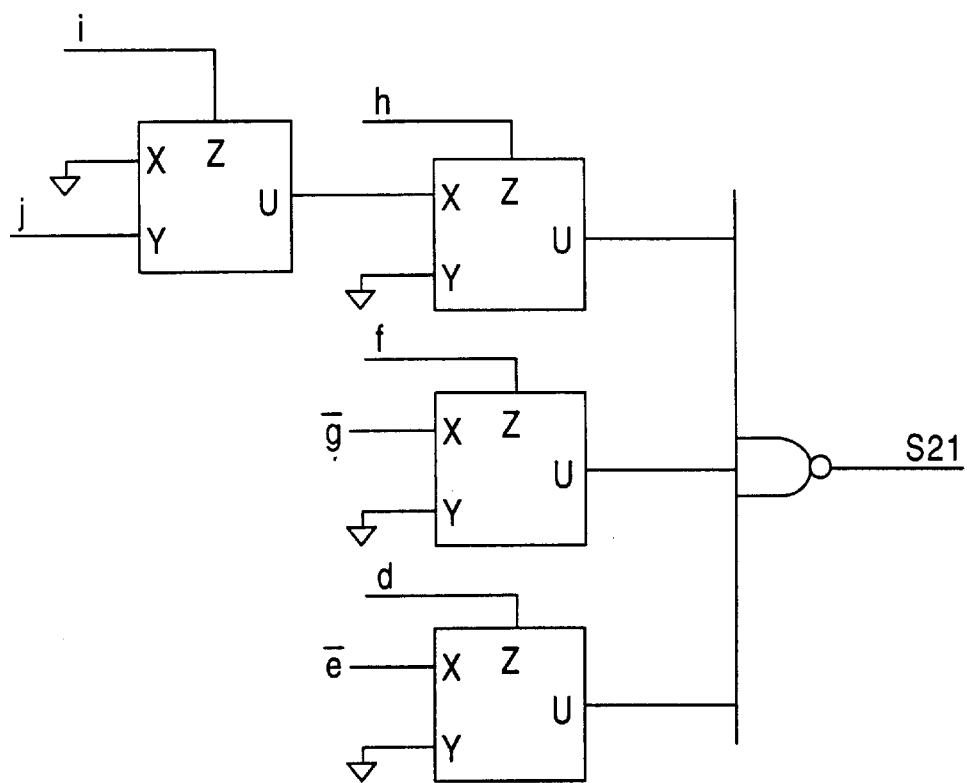
FIG. 25 is a circuit diagram illustrating still another part of the logic circuit according to the first embodiment.

The part shown in FIG. 25 includes a composite pass-transistor logic circuit in which the outputs of a plurality of pass-transistor logic trees are separately input to input terminals of a multiple-input logic gate. However, this logic circuit is not constructed in such a manner as to intend to obtain a particular connection between pass-transistor logic trees and multiple-input logic gates. On the contrary, this circuit structure is obtained as a result of the process of performing preliminary mapping of the optimized logical expression (5) according to the fifth embodiment described later and then performing logic level adjustment according to the sixth embodiment described later in which no particular restriction is assumed on the connections between the pass-transistor logic trees and the multiple-input logic gates. As described above, equation (5) is obtained by optimizing the given logic expression so that pass transistors and multiple-input logic gates may be used in an advantageous fashion. Therefore, the resultant logic circuit includes circuit structures including pass-transistor logic circuits (pass-transistor logic trees) and multiple-input logic gates which are connected in various manners to one another so that the given logical expression can be realized in an efficient fashion.

For example, in the case of the two-stage multiplexer disposed at the final stage of the circuit (FIG. 26), complementary variables a and b are input to the control terminals, and signals S19, S20, S21, and S22 which are logically independent of one another are input to the four input terminals, respectively. Here, "logically independent" signals are not equal to one another nor be complementary to one another. These signals S19, S20, S21, and S22 are supplied from the output terminals of different multiple-input logic gates. That is, the signal S19 corresponds to a logic function in the parentheses of the first term of equation (5), and, as shown in FIG. 22, the signal S19 is obtained by inputting to a multiple-input logic gate (NAND gate) the common variable $\overline{c}$ and the logic group including complementary variables d and f mapped by a two-stage multiplexer. Signals S11, S12, and S13 independent of one another are input to three input terminals of the four input terminals of the two-stage multiplexer shown in FIG. 22, and a constant signal having "0" logic level is input to the remaining input terminal. The signals S11, S12 and S13 each correspond to a product term including only variables which is mapped using a circuit including a three-input logic gate whose one input terminal is connected to a multiplexer. The signal S20 corresponds to a logic function in the parentheses of the second term of equation (5), and, as shown in FIG. 24, the signal S20 is obtained by inputting to a multiple-input logic gate (NAND gate) the common variable c and the logic group including complementary variables d and i input to the control terminals of a two-stage multiplexer. Signals S14, S15, and S16 independent of one another are input to three input terminals of the four input terminals of the two-stage multiplexer shown in FIG. 24, and a constant signal having "0" logic level is input to the remaining input terminal. The signals S14, S15 and S16 each corresponds to a product term including only variables which is mapped using a circuit including a three-input zero-AND gate whose one input terminal is connected to a multiplexer. On the other hand, the signal S22 corresponds to a product term c·e·$\overline{f}$·g·$\overline{h}$·i·$\overline{j}$ in the parentheses of the third term of equation (5), and the signal S22 is obtained using a three-input NAND gate whose one input terminal is connected to a two-stage multiplexer and whose other two input terminals are connected to one-stage multiplexers, respectively. The signal S21 corresponds to a product term in the parentheses of the fourth term of equation (5), and, as shown in FIG. 25, the signal S21 is obtained using a multiple-input logic gate whose input terminals are connected to two one-stage multiplexers and a two-stage multiplexer, respectively. As described above, the logic circuit designed according to the present invention has a circuit structure including pass transistors and multiple-input logic gates which are combined in various fashions so that the advantages of both types of elements are realized therein.

In a practical mapping process using a CAD system, information representing a logic circuit is written in a specific location in a storage device in a form which can be read by a CPU.

Figure 27:
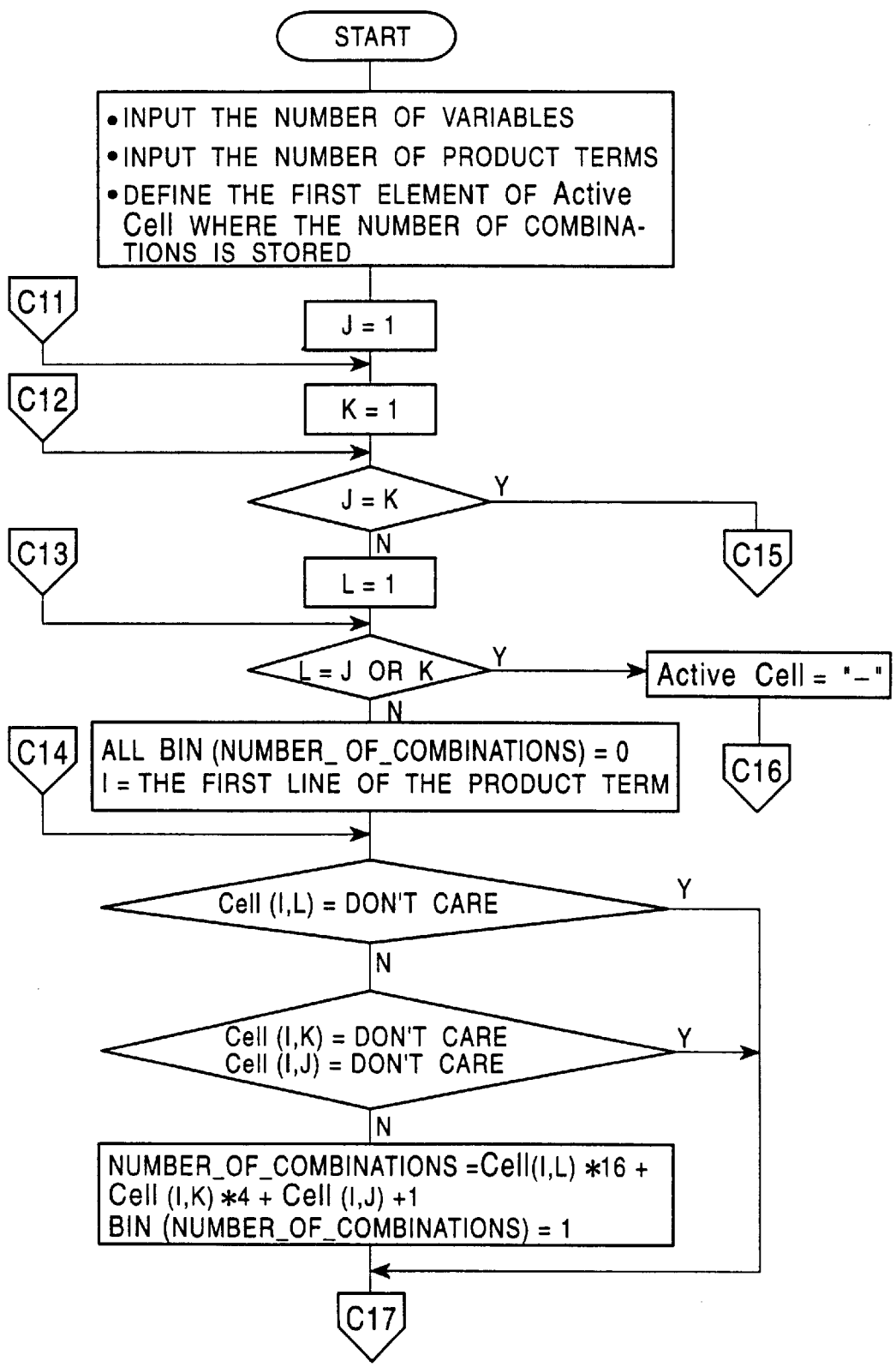
FIG. 27 is a flow chart illustrating a first half of a procedure according to the first embodiment.
Figure 28:
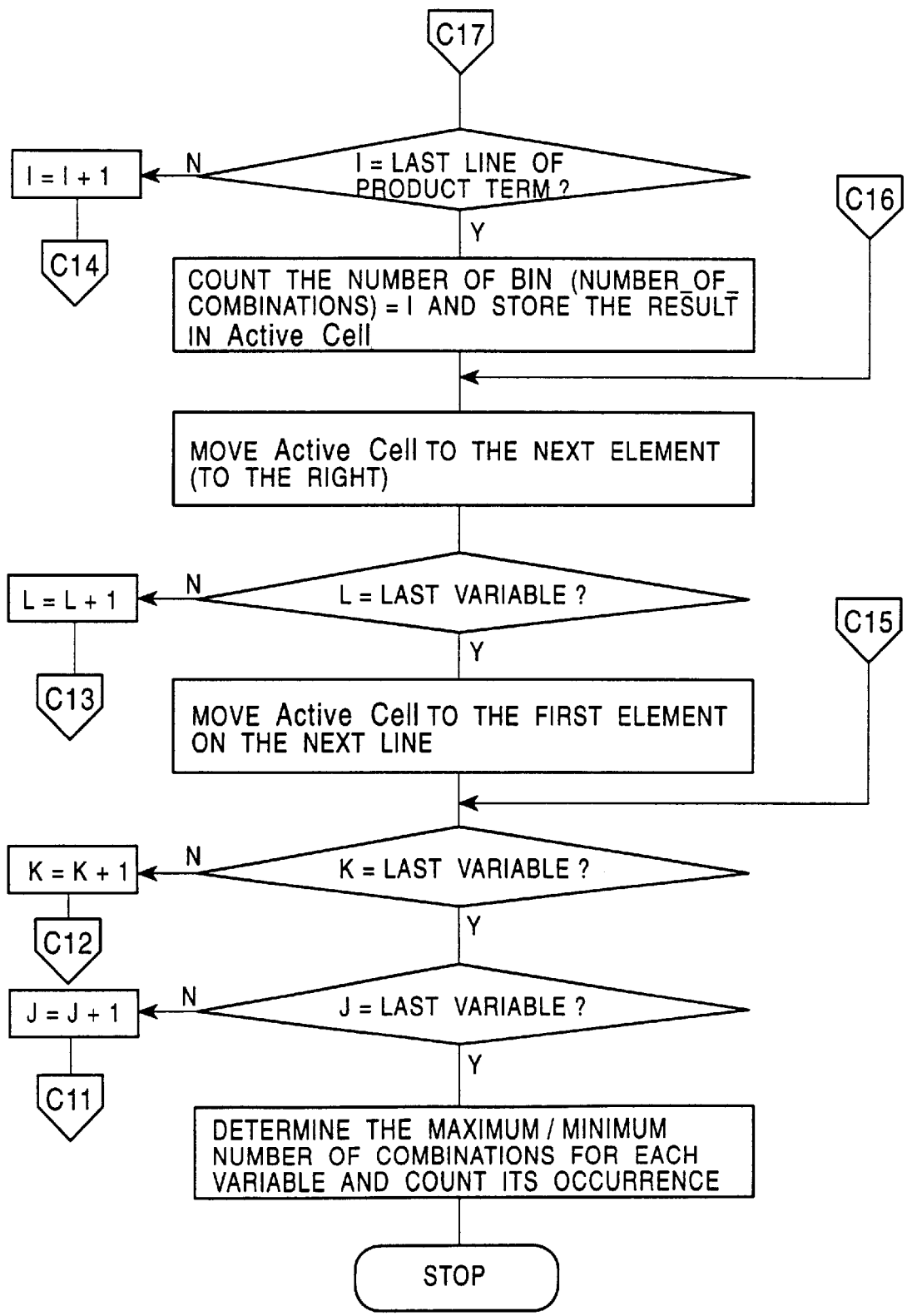
FIG. 28 is a flow chart illustrating a second half, following the part shown in FIG. 27, of the procedure according to the first embodiment.

The above-described process according to the present embodiment is shown in the form of a flow chart in FIGS. 27 and 28 wherein a single flow chart is divided into two. The process described by this flow chart can be computer-programmed and the resultant program can be installed on a CAD system.

When the logical expression to be optimized according to the present embodiment of the invention includes n input variables and m product terms, the first cycle of the procedure needs a computation time of the order represented below by equation (6).

$$O((m-1)_nP_{v+1}n_nP_v) \qquad (6)$$

In equation (6), $_nP_{v+1}$ denotes the possible number of permutations of (v+1) elements selected from a set of n elements. The computation times required for the second and following cycles decrease rapidly because the number of input variables decreases by v from one cycle to the next cycle and because the computation can be performed without including common variables. The computation in the present embodiment is simple comparison, and thus is easy to perform on a computer system or a CAD system.

In the present embodiment, as described above, the grouping procedure according to the variable-combination method is performed repeatedly until a given logical expression such as equation (2) is transformed into an optimum form such as equation (5) in which lowest-level groups include only variables. However, the present invention is not limited to this embodiment. For example, the grouping procedure according to the variable-combination method may be combined with a grouping procedure according to another technique.

Now methods of designing a logical circuit according to the second and third embodiments of the invention are described below. Both the second and third embodiments are based on the common-variable method wherein the second embodiment is based on the bottom-up common-variable method and the third embodiment is based on the top-down common-variable method.

Figure 29:
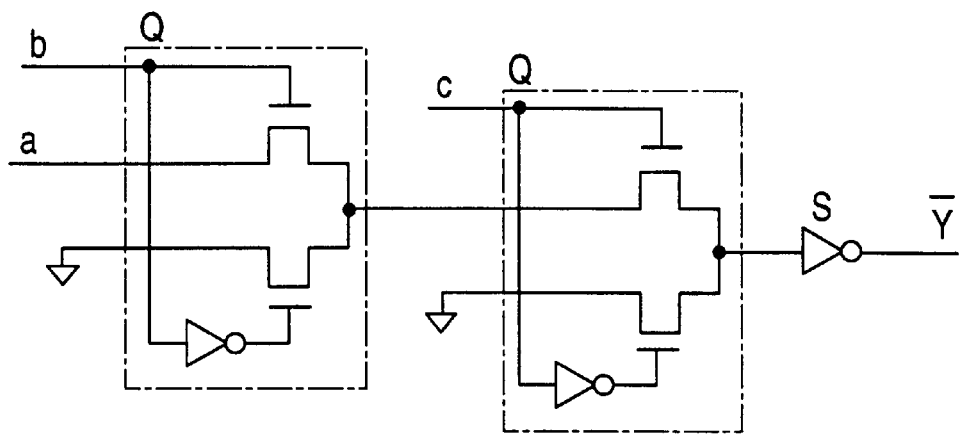
FIG. 29 is a circuit diagram illustrating a pass-transistor logic circuit implementing a NAND logic.

In a pass-transistor logic circuit, as described above, if a logical OR operation is realized using a multiplexer, the resultant circuit includes a small number of transistors and it can operate at a high speed. However, to realize an logical AND operation or a logical NAND operation in the form of a pass-transistor logic circuit, it is required to connect a plurality of pass transistors in series. As a result, a great number of transistors are needed and the number of stages becomes great. For example, when a logical expression given by equation (7) is realized using a pass-transistor logic circuit, the resultant circuit will be as shown in FIG. 29.

$$\overline{Y}=a\cdot b\cdot c \qquad (7)$$

Figure 30:
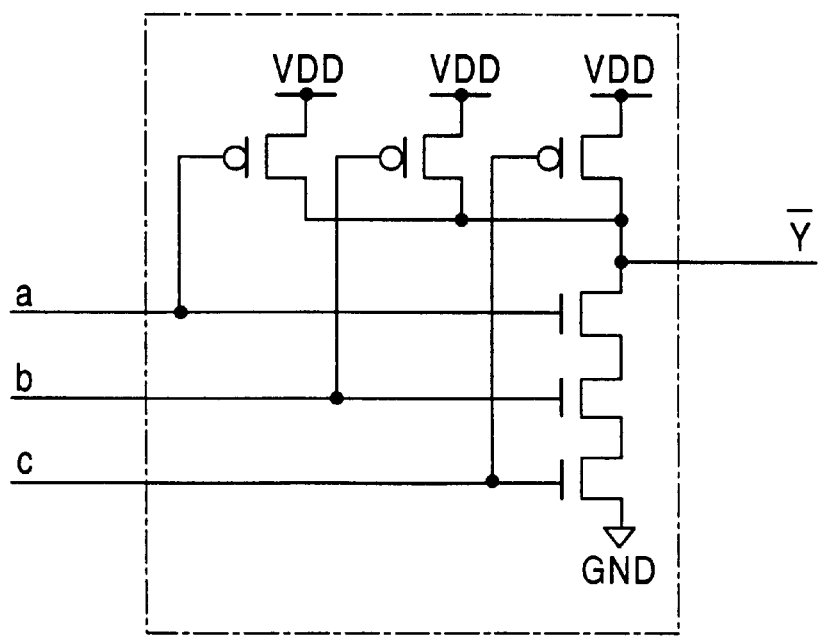
FIG. 30 is a circuit diagram illustrating a CMOS-NAND gate.

On the other hand, if the logical expression (7) is realized using CMOS-NAND logic gates, the resultant circuit will be as shown in FIG. 30. As can be seen from FIGS. 29 and 30, logical NAND operations and logical AND operations can be realized using CMOS-NAND gates in a more efficient fashion in terms of the number of transistors and the number of stages, than using pass transistors. If the above fact is taken into account, when a logic circuit including both pass-transistors and multiple-input logic gates is designed, it is desirable that logical AND operations and logical NAND operations be realized using multiple-input logic gates. Furthermore, to reduce the number of multiple-input logic gates required to realize logical AND operations and logical NAND operations, it is desirable that, instead of dispersing AND and NAND terms over separate product terms, AND and NAND terms should be grouped as logic groups including common variables. The logic group can be mapped by a common multiple-input AND or NAND gate. In the second and third embodiments described below, there are presented the common-variable methods for identifying common variables from a set of product terms in a given logical expression and grouping the product terms in an efficient manner.

First, the second embodiment based on the bottom-up common-variable method is described in detail.

In this embodiment, two product terms are first combined together, and common variables and the number thereof are determined. Product terms are grouped by common variables in the order from the set of product terms having a greater number of common variables to that having a smaller number of common variables. Furthermore, the common variables in each group are regarded as new product terms, and similar procedure is performed repeatedly until there is no longer common variable.

Variable tables used in this embodiment are shown in FIGS. 31 and 32 wherein a single table is divided into two. 31 and 32. The first through ninth rows in FIG. 31 are the same as the first through ninth rows in FIG. 14. In the row from the eleventh row counted from the top in FIG. 31 to the fourth row counted from the bottom in FIG. 32, two symbols I–VIII at the right of each row denote a set of two product terms which are checked whether they include a common variable. At the extreme right of each row, there is shown the number of common variables included in the two product terms under consideration.

In this variable table, a series of ten numerals in each row from the extreme left to right represents whether each variable a to j is a common variable or not. When a numeral is equal to "0" or "1", the corresponding variable is a common variable. If a numeral is "2", it is not a common variable. In the second row counted from the bottom in FIG. 32, there are shown the numbers of combinations having common variables denoted by "0" for the respective variables a to j. In the bottom row in FIG. 32, there are shown the numbers of combinations having common variables denoted by "1" for the respective variables a to j.

In the table shown in FIGS. 31 and 32, of the numbers of common variables shown at the extreme right of the respective rows, the greatest value "6" appears at the first row in FIG. 32. Therefore, product terms II and VI corresponding to this row are first grouped. By checking the next greatest value "5", combinations of terms III and IV, III and VII, IV and V, and IV and VIII are found in addition to those combinations which include either the product term II or VI which have already been employed in the previous grouping. If the common variables included in the product terms in the above four combinations in addition to the combinations including II or VI are regarded as new product terms in the next cycle of the optimization procedure, and if common variables included each combination of two product terms are determined, the result will be as shown in the variable table of FIG. 33. In the second through sixth rows in FIG. 33, there are shown common variables included in combinations of VI and II, IV and III, VII and III, V and IV, and VIII and IV wherein these combinations are renamed as the product terms I to V. In the eighth through seventeenth rows, common variables included in each combination of two new product terms are shown.

By searching the values shown at the extreme right in the eighth through seventeenth rows in FIG. 33, it is found that the maximum number of common variables is 3, and that the maximum number appears in the set of product terms III and II and the set of IV and II (represented in the new symbols). If the corresponding sets of product terms IV and III, III and VII, and V and IV (represented in the product term symbols defined in FIG. 31) are selected, then it is possible to preferably perform the second cycle such that the resultant groups include a great number of common variables.

However, if the set of product terms IV and III is selected, the other sets of product terms, III and VII, and V and IV, can no longer be selected. Thus, in this case, the sets of product terms, III and VII, and V and IV, are selected. Thus the product terms in the logical expression given as equation (2) can be grouped according to the present embodiment into the form as shown below in equation (8).

$$X = \overline{a} \cdot \overline{b} \cdot \overline{c} \cdot f \cdot g \cdot h \cdot (\overline{d} \cdot \overline{e} \cdot j + d \cdot \overline{i} \cdot \overline{j}) + \quad (8)$$
$$a \cdot b \cdot c \cdot i \cdot j \cdot (d \cdot e \cdot f \cdot h + \overline{d} \cdot \overline{e} \cdot \overline{g} \cdot \overline{h}) +$$
$$a \cdot c \cdot e \cdot \overline{f} \cdot \overline{j} \cdot (b \cdot d \cdot \overline{g} \cdot \overline{i} + \overline{b} \cdot g \cdot \overline{h} \cdot i) +$$
$$\overline{a} \cdot \overline{e} \cdot \overline{g} \cdot \overline{i} \cdot (\overline{b} \cdot \overline{c} \cdot \overline{d} \cdot \overline{f} \cdot \overline{h} + b \cdot d \cdot f \cdot h \cdot j)$$

In equation (8), the first through third terms are groups corresponding to the sets of product terms VI and II, V and IV, and VII and III selected in the above-described process. The fourth term is a group made from the remaining product terms VIII and I. Each term of equation (8) is in the form of a product term of variables (common variables) and a logic function in a parenthesis.

In this specific example, since an even number of product terms are grouped together, all product terms are grouped into either one of the groups. If the above-described procedure is applied to a logical expression including an odd number of product terms, one product term will remain without being grouped. Furthermore, in practice, there can be a case that there is no common variable between two product terms. In such a case, even if the given logical expression includes an even number of product terms, some product term will remain without being grouped.

Subsequently, a similar procedure is repeated as shown in the variable table of FIG. 34 in the second cycle of the optimization procedure. In this cycle, the common variables in the four groups in equation (8) are regarded as new product terms. As shown in the variable table, if these four new product terms are named I, II, . . . , IV, respectively, the combination of product terms II and III and the combination of product terms I and IV have a large number of common variables. If equation (8) is further optimized employing these combinations, the result will be as shown below in equation (9).

$$X = a \cdot c \cdot (b \cdot i \cdot j \cdot (d \cdot e \cdot f \cdot h + \overline{d} \cdot \overline{e} \cdot \overline{g} \cdot \overline{h}) + \quad (9)$$
$$e \cdot \overline{f} \cdot \overline{j} \cdot (b \cdot d \cdot \overline{g} \cdot \overline{i} + \overline{b} \cdot g \cdot \overline{h} \cdot i)) +$$
$$\overline{a} \cdot (\overline{b} \cdot \overline{c} \cdot f \cdot g \cdot h \cdot (\overline{d} \cdot \overline{e} \cdot j + d \cdot \overline{i} \cdot \overline{j}) +$$
$$\overline{e} \cdot \overline{g} \cdot \overline{i} \cdot (\overline{b} \cdot \overline{c} \cdot \overline{d} \cdot \overline{f} \cdot \overline{h} + b \cdot d \cdot f \cdot h \cdot j))$$

In equation (9), there is no longer any common variable between the first and second terms. This means that equation (9) cannot be further optimized according to the common-variable method.

If a primary mapping according to the fifth embodiment described later and a logic level adjustment according to the sixth embodiment are performed on the logical expression (9), a logic circuit will be obtained as shown in FIGS. 35–40. In these figures, symbols S31–S35 are used to describe the signal connections in the logic circuit. The logic circuit includes 122 transistors, and the maximum number of signal pass stages is 8. Although this logic circuit is not the best solution, it is in an acceptable form. Although the number of transistors included in this logic circuit obtained according to the bottom-up common-variable method in the present embodiment is similar to that included in the logic circuit obtained according the variable-combination method of the first embodiment described above, the number of stages is smaller. In this logic circuit, no modification for sharing similar parts of the circuit is made.

This logic circuit includes eleven unit multiplexers, thirteen multiple-input logic gates, and one inverter.

In this logic circuit, multiple-input logic gates are used to map logic groups having common variables as described below. That is, in FIG. 35, a three-input zero-AND gate is used to receive common variables b and i at its input terminals and output a signal S31 from its output terminal. In FIG. 36, a three-input zero-AND gate is used to receive common variables e and f at its input terminals and output a signal S32 from its output terminal. In FIG. 37, a two-input NAND gate is used to receive a common variable c at its one input terminal and output a signal S33 from its output terminal. In FIG. 38, a three-input NAND gate is used to receive common variables $\overline{b}$, $\overline{c}$, f, and h at its input terminals and outputs a signal S34 from its output terminal. In FIG. 39, a three-input NAND gate is used to receive common variables $\overline{e}$ and $\overline{i}$ at its input terminals and outputs a signal S35 from its output terminal. These multiple-input logic gates used to map logic groups including common variables are in the form of either a zero-AND gates (=NOR gate) or a NAND gate as a result of the logic level adjustment which will be described later. Common variables input to the zero-AND gates are inverted in logic level as a result of the logic level adjustment. In FIG. 38, the product between the common variables f and h and also the product between $\overline{b}$ and $\overline{c}$ are first generated by separate unit multiplexers, respectively, and then the resultant products of the common variables are input to two input terminals, respectively, of the multiple-input logic gate.

Figure 40:
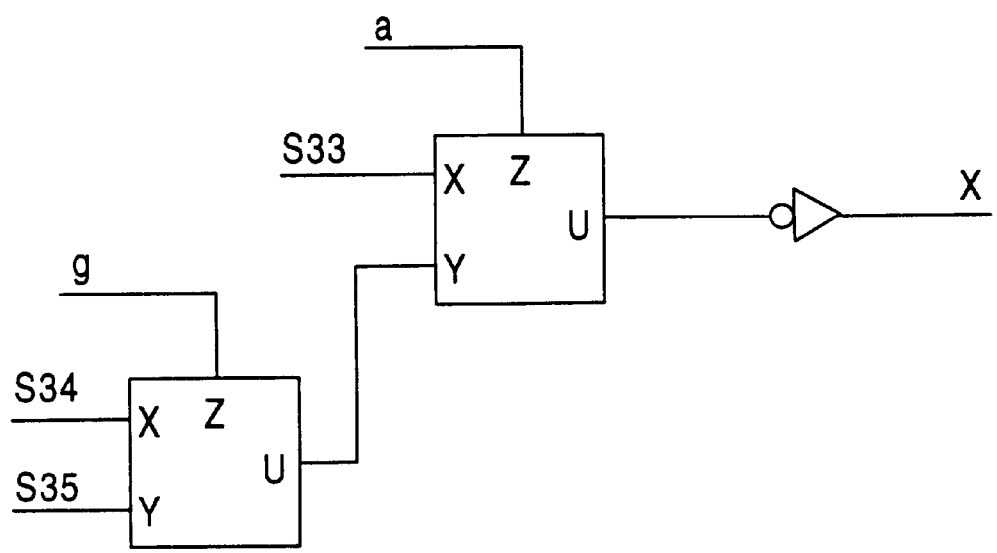
FIG. 40 is a circuit diagram illustrating still another part of the logic circuit according to the second embodiment.

In the above mapping procedure for obtaining the logic circuit, an additional procedure to identify logic groups including a complementary variable is performed so that such logic groups can be mapped using multiplexers. For example, the common variables a·c and $\bar{a}$ in the first and second terms in the highest-level group include the variable a in the positive- and negative-logic forms, and thus variable a is a complementary variable. Therefore, in the second stage counted from the final stage of the circuit shown in FIG. 40, there is disposed a multiplexer whose control terminal is coupled to input the complementary variable a. Furthermore, the common variables $\bar{b}\cdot\bar{c}\cdot f\cdot g\cdot j$ and $\bar{e}\cdot g\cdot \bar{i}$, in the first and second terms of the second-level group in the second term, include the variable g in the positive- and negative-logic forms. Thus, as shown in FIG. 40, in the third stage counted from the final stage of the circuit shown, there is disposed a multiplexer whose control terminal is coupled to input the complementary variable g. Similarly, complementary variables in the second-level group in the first term and in the lower level groups are identified and multiplexers to map the logic groups including the identified complementary variables are placed in the logic circuit. The complementary variable can be identified, for example, by counting the number of logical combinations in each group.

Figure 35:
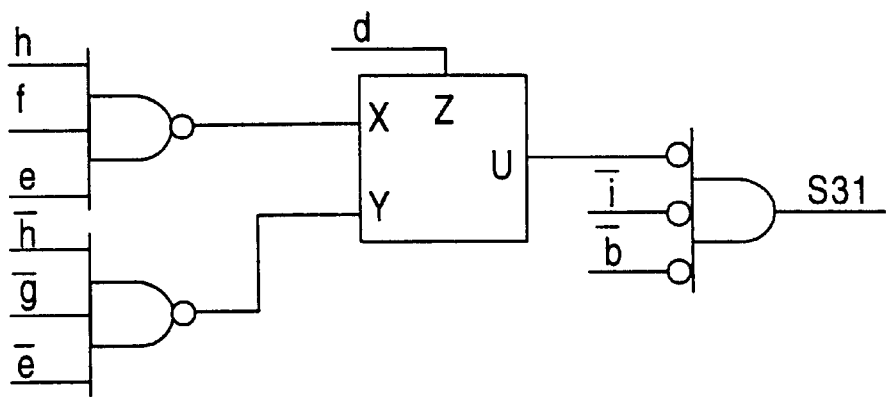
FIG. 35 is a circuit diagram illustrating a part of a logic circuit according to the second embodiment, wherein the entire logic circuit is made up of those parts shown in FIGS. 35–40.
Figure 36:
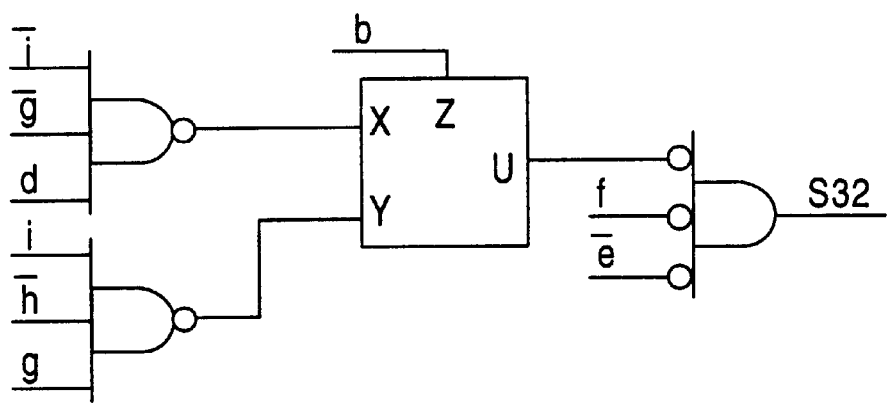
FIG. 36 is a circuit diagram illustrating another part of the logic circuit according to the second embodiment.
Figure 37:
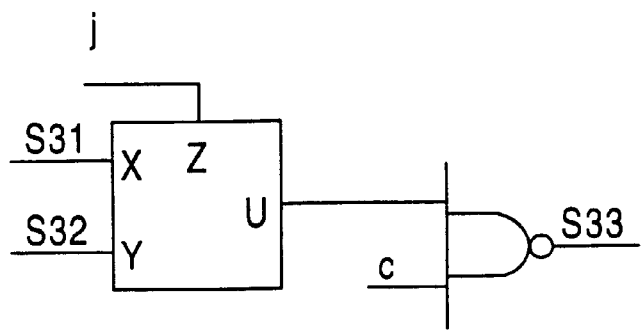
FIG. 37 is a circuit diagram illustrating still another part of the logic circuit according to the second embodiment.
Figure 38:
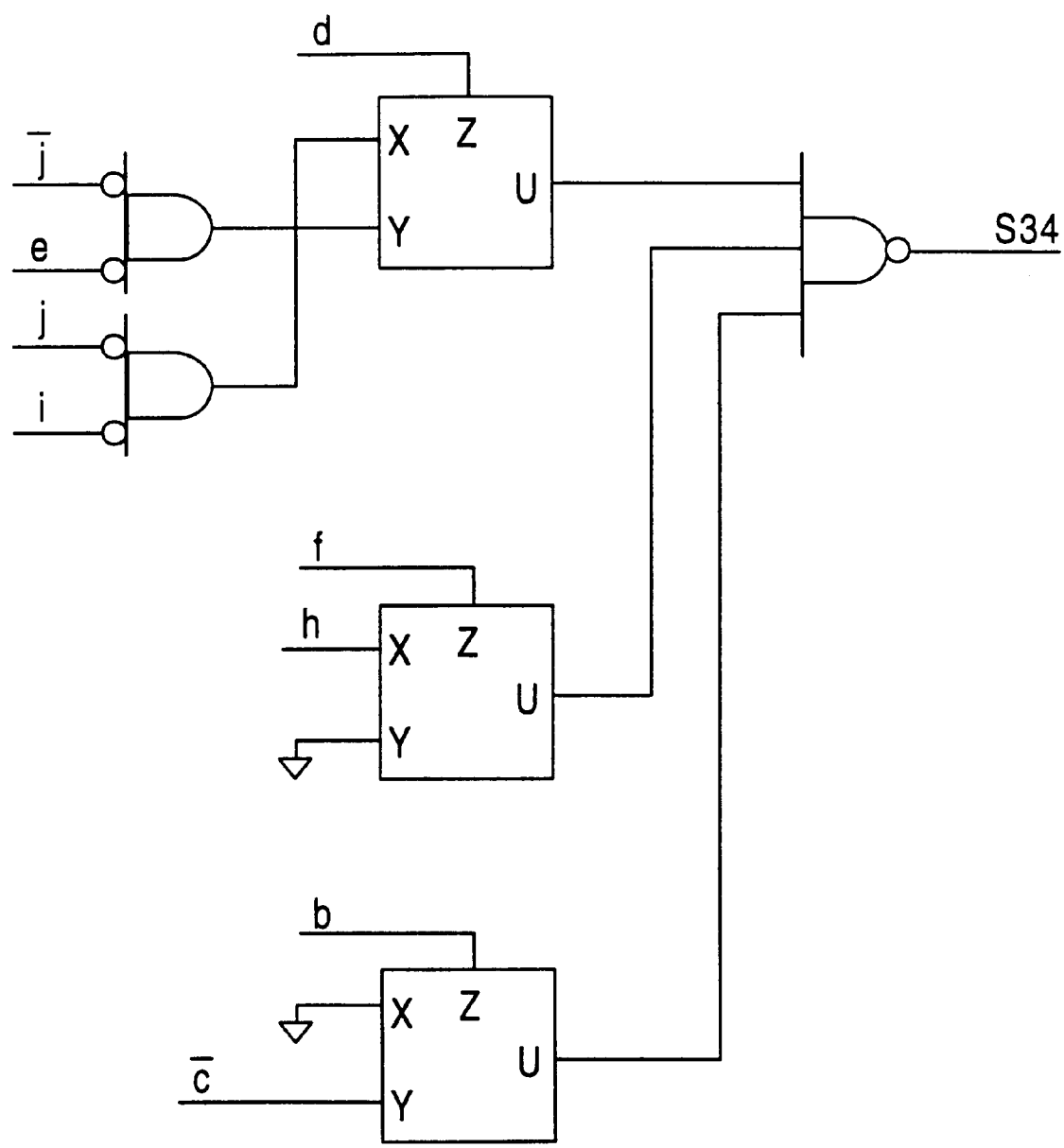
FIG. 38 is a circuit diagram illustrating still another part of the logic circuit according to the second embodiment.
Figure 39:
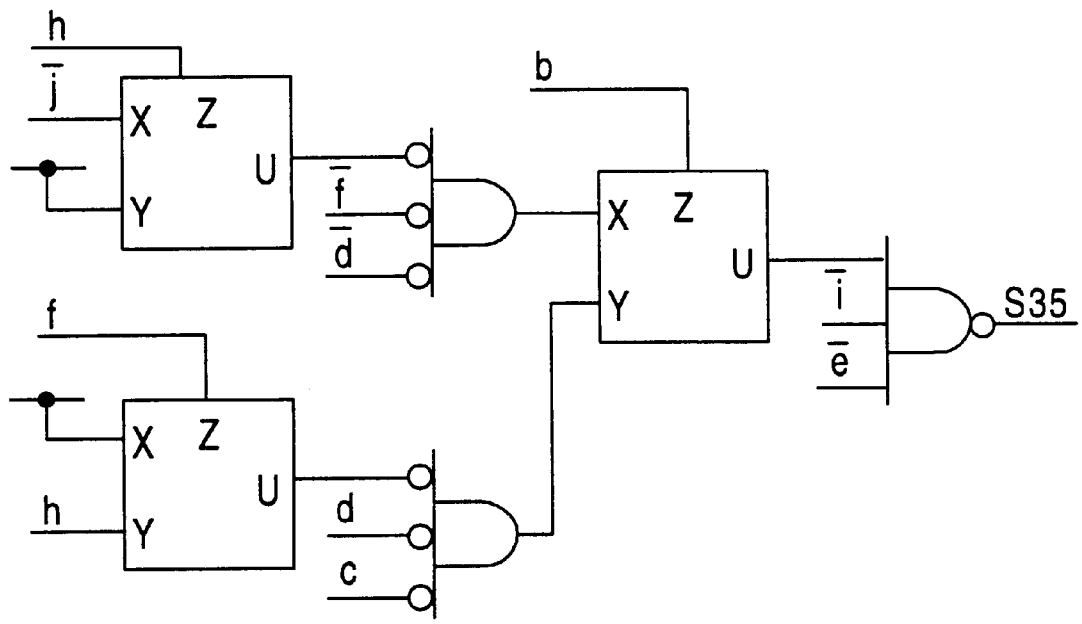
FIG. 39 is a circuit diagram illustrating still another part of the logic circuit according to the second embodiment.

Thus, a multiplexer whose control terminal is coupled input variable b shown in FIG. 39, a multiplexer whose control terminal is coupled to input variable d shown in FIG. 38, a multiplexer whose control terminal is coupled with variable j shown in FIG. 37, a multiplexer whose control terminal is coupled with variable b shown in FIG. 36, and a multiplexer whose control terminal is coupled to input variable d shown in FIG. 35, are placed. In this logic circuit, as described above, seven unit multiplexers in the form of one stage are used to map logic groups each including a complementary variable.

In the case of the two multiplexers shown in FIG. 40, they are connected in series such that a partial two-stage multiplexer is constructed. This multiplexer is not used to map a logic group including multiple-complementary variables, but each of the two unit multiplexers is used to map a logic group including one complementary variable. Because the present logic circuit is designed under the condition that the maximum allowable number of pass-transistor stages is two, the above two multiplexers are directly connected in series without inserting,any circuit element for restoring the logic swing, such as a buffer, an inverter, or a multiple-input logic gate. If the maximum allowable number of pass-transistor stages is set to three or greater, three or more multiplexers can be connected directly in series.

The logic circuit shown in FIGS. 35–40 includes a less number of multiplexers than the logic circuit optimized according to the variable-combination method (FIGS. 21–26). In particular, the number of multiplexers used to map a logic groups including complementary variables is reduced. Furthermore, in contrast to the logic circuit optimized according to the variable-combination method in which many two-stage multiplexers are used to map a logic group including multiple-complementary variables, the multiplexers, in the logic circuit according to the present embodiment, are used to map a logic group including one complementary variable. However, there are a greater number of multiple-input logic gates. In particular, there are a greater number of multiple-input logic gates for mapping logic groups including one or more common variables. In the case of the logic circuit optimized according to the variable-combination method, each multiple-input logic gate used to map a logic group including one or more common variables accepts only one common variable. In contrast, at most four common variables are input to multiple-input logic gates in the logic circuit according to the present embodiment. This is a characteristic feature of a logic circuit realized by mapping a given logic expression optimized according to the common-variable method.

Also in the logic circuit according to the present embodiment, multiplexers composed of pass transistors and multiple-input logic gates are connected in various manners so as to realize the given logic expression in an efficient fashion.

Figure 41:
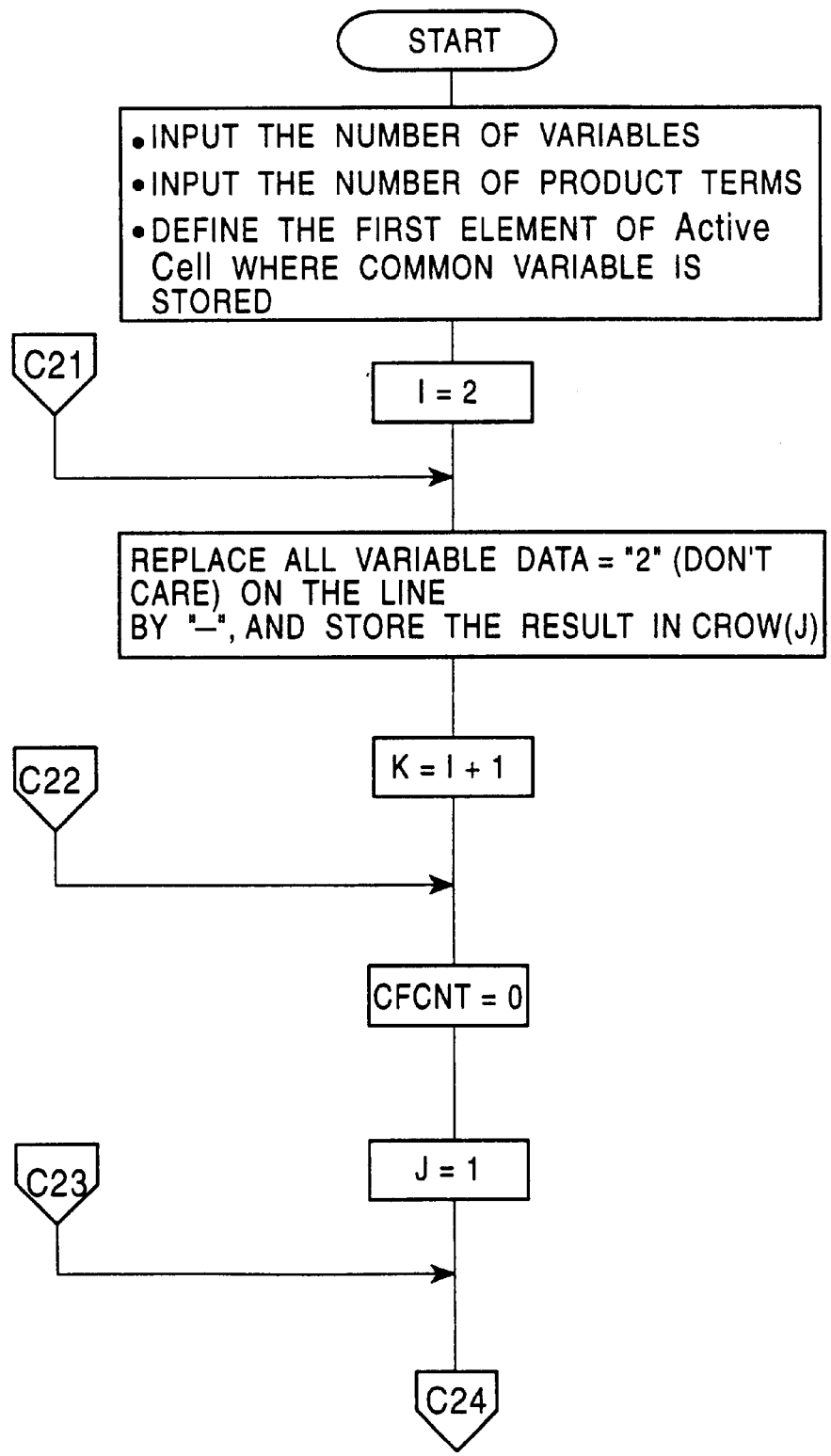
FIG. 41 is a flow chart illustrating a first half of a procedure according to the second embodiment.
Figure 42:
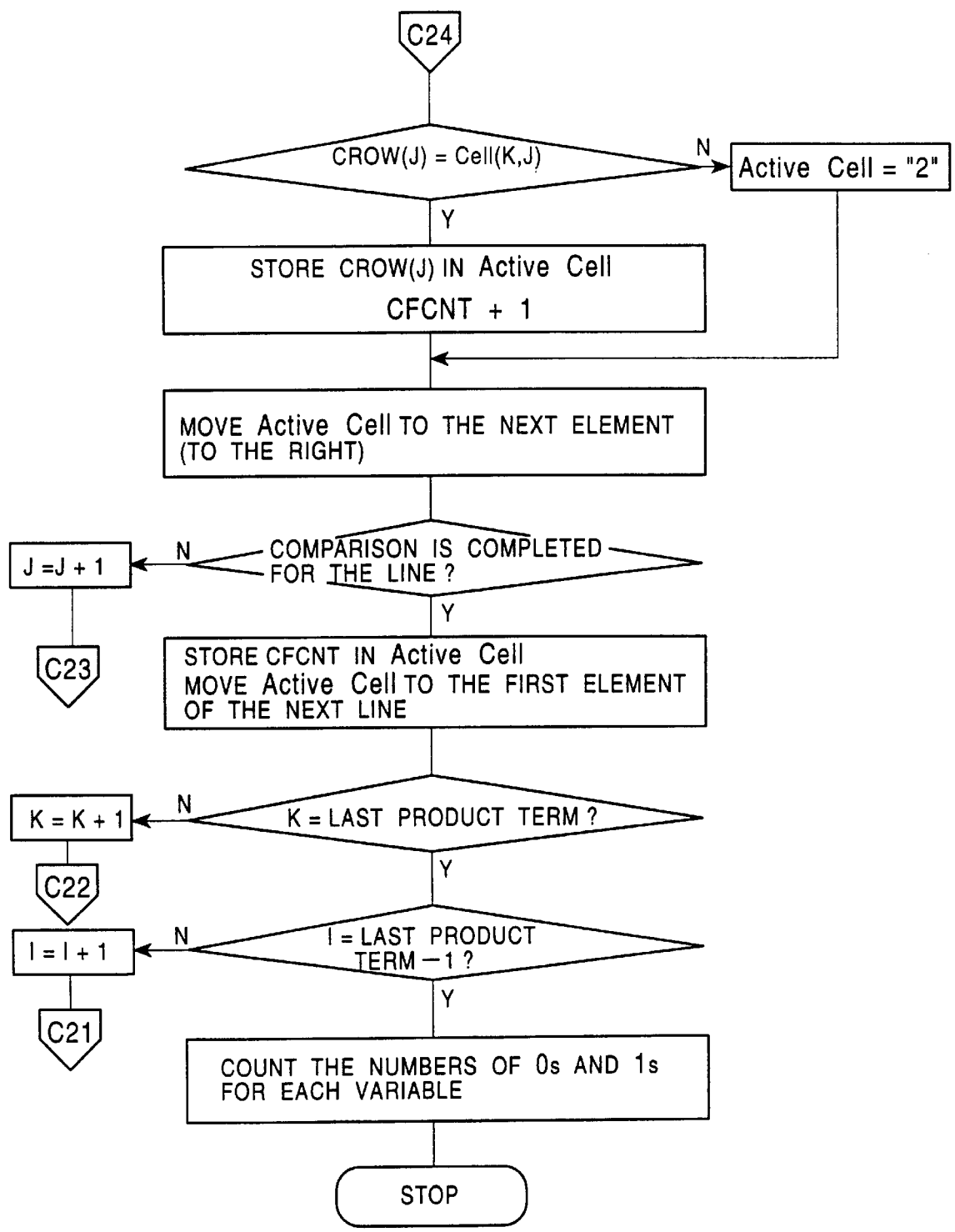
FIG. 42 is a flow chart illustrating a second half, following the part shown in FIG. 41, of the procedure according to the second embodiment.
Figure 47:
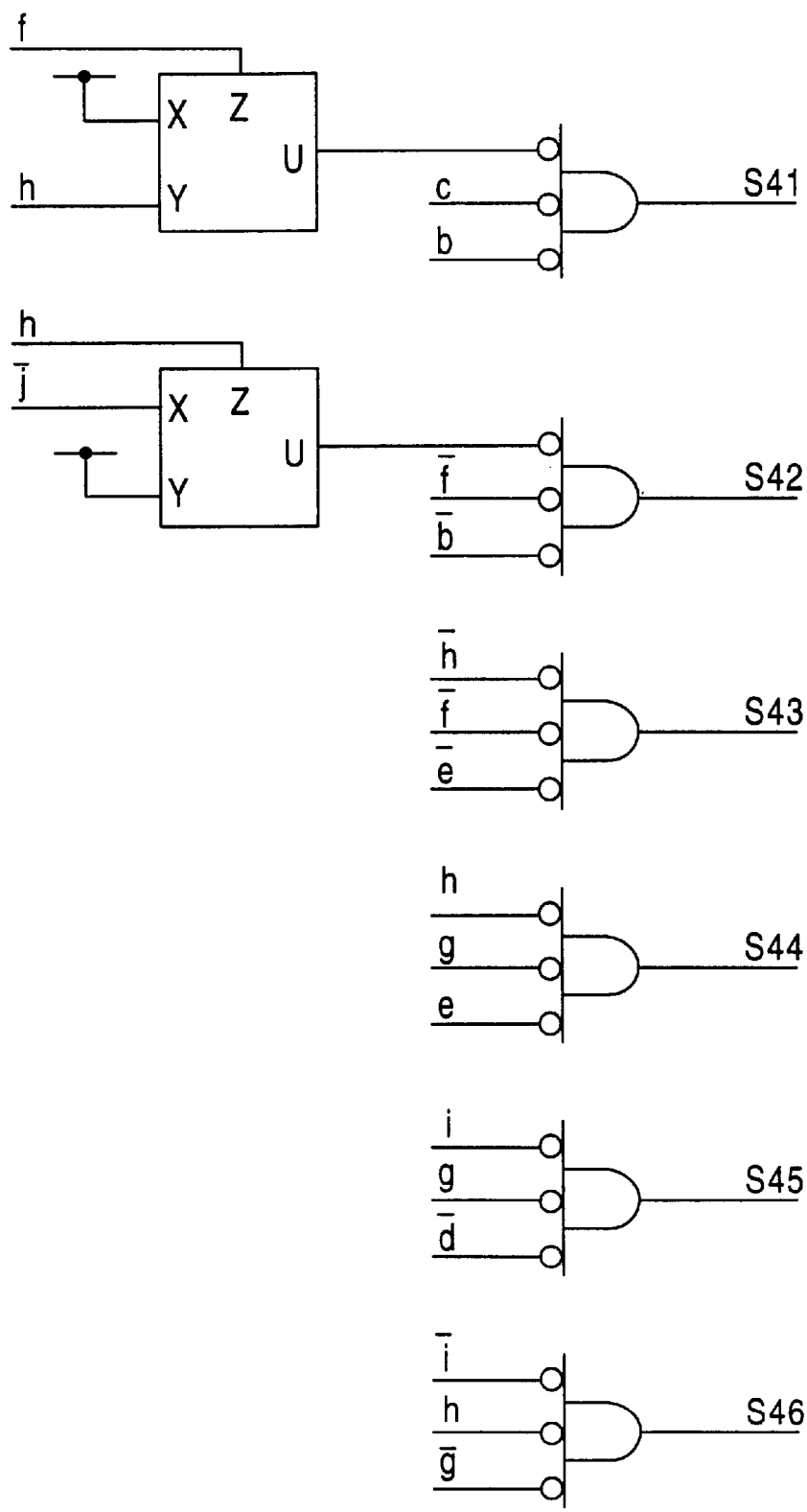
FIG. 47 is a circuit diagram illustrating a part of a logic circuit according to the fourth embodiment, wherein the entire logic circuit is made up of those parts shown in FIGS. 47–52.
Figure 48:
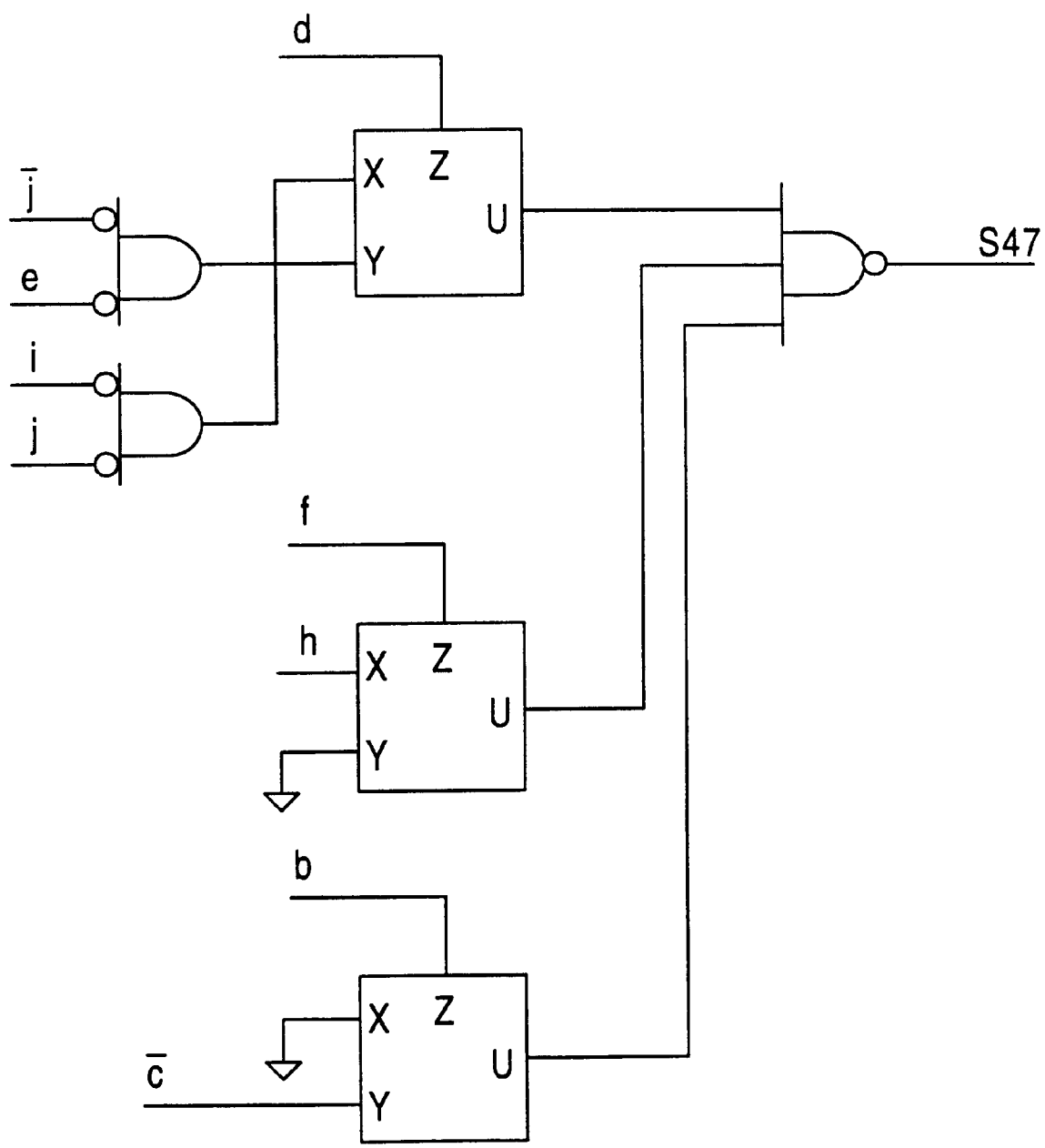
FIG. 48 is a circuit diagram illustrating another part of the logic circuit according to the fourth embodiment.

The above-described process according to the second embodiment is shown in the form of a flow chart in FIGS. 41 and 42 wherein a single flow chart is divided into two.

When the logical expression to be optimized according to the present embodiment includes n input variables and m product terms, the first cycle of the procedure needs a computation time of the order represented below by equation (10).

$$O(2n_m C_2) \qquad (10)$$

In equation (10), $_m C_2$ represents the number of possible combinations of two elements selected from a set of m elements. In the second and following cycles, m becomes a half of the previous value, and therefore the computation time decreases to about ¼ of the computation time in the previous cycle. In general, this methods needs a much less computation time than required in the variable-combination method. The computation required in the present embodiment is a simple comparison, and thus it is easy to perform it on a computer system or a CAD system. Because the program shown in the flow charts of FIGS. 41 and 42 is prepared to verify the algorithm, comparisons are made bit by bit. However, in a practical process, an AND operation between two lines can be performed in one step.

In this second embodiment, the grouping procedure according to the common-variable method is performed repeatedly until a given logical expression such as equation (2) is transformed into an optimum form such as equation (9) in which there is no further common variable. However, the present invention is not limited to this embodiment. For example, the grouping procedure according to the common-variable method may be combined with a grouping procedure according to another technique.

Now the third embodiment is described below. In this third embodiment, the optimization is performed according to the top-down common-variable method.

In this embodiment, as opposed to the second embodiment described above, grouping is performed from the highest level toward lower levels instead of from the lowest level toward higher level. The basic procedure according to this embodiment is as follows. The product terms in the given logical expression are combined into as many group as a value $2^v$ corresponding to the maximum number v of pass-transistor stages. For example, if v=2, the product terms are conbined into 4 groups. In the above grouping procedure, t product terms are grouped together wherein t is an integer which is the smallest integer greater than m/4 when the total number of product terms is m. In this way, the product terms are grouped in the order from that having a greater number of common variables to that having a smaller number of common variables. The above grouping procedure is performed repeatedly until the given logical expression is optimizedinto a final form in which there is no longer any common variable in each group or until t=1. In this embodiment, as described above, when v=2, the product terms are combined into four groups. The reason for this is to transform a given logical expression into a well optimized form taking into account the structure of a two-stage multiplexer.

When the logical expression to be optimized according to the present embodiment includes n input variables and m product terms, the first cycle needs a computation time of the order represented below.

$$O(2n_m C_t) \quad (11)$$

From equation (11), it can be seen that if there are too many product terms, the required computation time becomes very long. Furthermore, it is required to properly select the number of combinations in accordance with the number of product terms. In the case where the number of product terms in the group is too great relative to the number of product terms, for example when m=8 and t=3, the variable table will be as shown in FIGS. 43–45. As can be seen from the table, the number of combinations of product terms for m=8 and t=3 is greater than that in the bottom-up common-variable method (FIGS. 31 and 32). A longer computation time is needed to determine the number of common variable in these combinations. On the other hand, the maximum number of common variables is three, which is smaller than that, six, in the variable table shown in FIGS. 31 and 32. As can be seen from this example, if the number of product terms to be grouped together is set to an improper value, the computation time required in the top-down common-variable method becomes long compared to that required in the bottom-up common-variable method. Furthermore, the number of common variables decreases and thus AND terms are dispersed. However, if the number of product terms to be grouped is properly selected, that is, if t is set such that t=(8/4)=2, the above problem does not occur.

The difference between the bottom-up common-variable method and the top-down common-variable method will be described below for a particular example in which the maximum number of pass-transistor stages is 2 and the number of product terms is 32.

In the bottom-up common-variable method, since the grouping is performed using common variables between two product terms, 16 groups are created in the first grouping procedure wherein the number of created groups is equal to half the number of the product terms. Then the common variables are regarded as product terms, and grouping is further performed using common variables between two product terms. Thus, after the second optimization cycle, the number of groups becomes eight which is half the previous number. Similarly, the number of groups becomes four after the third cycle, two after the fourth cycle, and one after the fifth cycle.

On the other hand, in the top-down common-variable method, product terms are grouped into four groups in each cycle. In the first cycle, eight product terms are grouped using their common variables and thus four groups are formed. Then the logic functions in the respective groups are regarded as new given logical expressions, and grouping is further performed. In the second cycle, the eight product terms in each group are grouped into four groups, that is, four groups are created using a common variable between two product terms. After completion of the above second cycle, there is no common variable in any group, and thus the entire optimization procedure is completed.

In the above example, in both the first and second grouping processes, a logical expression including as many product terms as an integral multiple of $2^v$ is grouped. As a result, $2^v$, groups are created which each include as many product terms as the smallest integer greater than a quotient obtained by dividing the number of product terms by $2^v$. When the number of product terms is not equal to an integral multiple of $2^v$, there can appear a group which includes as many product terms as an integer which is smaller than the smallest integer greater than the quotient. Furthermore, even if the number of product terms is equal to an integral multiple of $2^v$, if there is no common variable shared by as many as product terms as the smallest integer greater than the quotient, then the number of product terms in each group becomes smaller than the smallest integer greater than the quotient. Besides, there can be a product term which is not grouped into any group.

Now, the method of designing a logic circuit according to the fourth embodiment of the invention will be described. In this fourth embodiment, the common-variable/variable-combination method is employed.

In the variable-combination method, the given logical expression is optimized into a form suitable for use of multiplexers. In contrast, logical AND and NAND operations are grouped in the common-variable method. Therefore, there can be a certain conflict between the variable-combination method and the common-variable method. Although dispersion of common variables is prevented in the common-variable method, dispersion of common variables occurs in the variable-combination method because grouping is performed in such a manner that the number of combinations of variables is increased.

In view of the above, in the common-variable/variable-combination method of the present embodiment, the advantages of both the variable-combination method and the common-variable method are incorporated. That is, grouping is first performed according to the common-variable method thereby preventing the dispersion of common variables. Then the common variables obtained in the procedure according to the common-variable method are regarded as new product terms, and grouping is performed according to the variable-combination method. When the common-variable method is performed in a bottom-up fashion, the first cycle of the optimization procedure is performed according to the variable table shown in FIGS. 31 and 32 and also according to the variable table shown in FIG. 33. When the logical expression includes n input variables and m product terms, the first cycle needs a computation time of the order represented below by equation (12).

$$O(2n_m C_2) \quad (12)$$

When the newly-regarded product terms obtained in the first procedure according to the common-variable method are subjected to the procedure according to variable-combination method. This optimization procedure is performed according to the variable table in FIG. 46. Because variable d does not appear in the newly-regarded product terms, variable d is omitted. In FIG. 46, it is assumed that the maximum allowable number of pass-transistor stages is two (v=2). Because the number of product terms (newly-regarded product terms) has become ½ of the number at the beginning, the number of product terms which are grouped together is set not to (v+1) but to v. In the third row counted from the bottom, distinct differences in the frequency of occurrence of the maximum number among variables are observed. If judgement is made according to the maximum number of combinations and the frequency of occurrence shown in this table, variable a is the first candidate and variable c is the second candidate. However, since the maximum number of combinations is two, the grouping will not result in the form of a logic group including two multiple-complementary variables which can be mapped to a two-stage multiplexer. Therefore, only variable a which is maximum in the frequency of occurrent is selected as a complementary variable, and grouping is performed. The computation time required in this process becomes rapidly decreases to a level represented below in equation (13).

$$O((m/2-1)_n P_v + n^2) \qquad (13)$$

The product terms in each group is further grouped according to the variable-combination method, the logical expression is optimized into a form described below.

$$X = \bar{a} \cdot (g \cdot (\bar{b} \cdot \bar{c} \cdot f \cdot h \cdot$$

$$(\bar{d} \cdot \bar{e} \cdot j + d \cdot \bar{i} \cdot \bar{f}))$$

$$+ \bar{g} \cdot (e \cdot \bar{i} \cdot$$

$$(\bar{d} \cdot \bar{b} \cdot \bar{c} \cdot f \cdot \bar{h} + d \cdot b \cdot f \cdot h \cdot j)))$$

$$+ a \cdot (j \cdot (b \cdot c \cdot i \cdot (d \cdot e \cdot f \cdot h + \bar{d} \cdot \bar{e} \cdot \bar{g} \cdot \bar{h})) + \bar{j} \cdot \qquad (14)$$

If a primary mapping process according to the fifth embodiment described later and a logic level adjustment according to the sixth embodiment described later are performed on the optimized logical expression (14), a logic circuit will be obtained as shown in FIGS. 47–52. In these figures, symbols S41–S50 are used to describe the signal connections in the logic circuit. In the optimization procedure of the present embodiment, the original logical expression is first grouped according to the common-variable method and then is grouped according to the variable-combination method. Thus, complementary variables are identified in equation (14). Therefore, it is possible to map equation (14) to a logic circuit in a form suitable for use of multiplexers. In equation (14), however, no complementary variable has been identified from the groups having logic functions which share common variables formed in the first procedure according to the common-variable method. When the logic circuit shown in FIGS. 47–52 is obtained, an additional procedure is performed so that the above parts may be realized using multiplexers. In the specific example of equation (14), the procedure of modifying the circuit so that similar parts are shared is not necessary. In this logic circuit, 123 transistors are used and the maximum number of signal pass stages is 8. Although this logic circuit is not the best solution, it is in an acceptable form. The number of stages is smaller than that obtained by the variable-combination method, although the number of transistors used is similar to that obtained in the variable-combination method. This logic circuit includes thirteen unit multiplexers, twelve multiple-input logic gates, and one inverter.

This logic circuit includes seven one-stage multiplexers for mapping logic groups each including a complementary variable. That is, in a part of the logic circuit shown in FIG. 48, there is provided a one-stage multiplexer wherein the complementary variable d is input to its control terminal and product terms which are mapped by different multiple-input logic gates are input to the respective input terminals. In a part of the logic circuit shown in FIG. 49, there is provided a one-stage multiplexer wherein the complementary variable d is input to its control terminal and signals S41 and 42 are input to the respective input terminals. In a part of the logic circuit shown in FIG. 50, there is provided a one-stage multiplexer wherein the complementary variable d is input to its control terminal and signals S43 and 44 are input to the respective input terminals. In a part of the logic circuit shown in FIG. 51, there is provided a one-stage multiplexer wherein the complementary variable b is input to its control terminal and signals S45 and 46 are input to the respective input terminals. Furthermore, in a part of the logic circuit shown in FIG. 52, there are provided three one-stage multiplexers. In one multiplexer, the complementary variable g is input to its control terminal and signals S47 and S48 are input to the respective input terminals thereof. In another multiplexer, the complementary variable j is input to its control terminal and signals S49 and 50 are input to the respective input terminals thereof. In the third multiplexer, the complementary variable a is input to its control terminal and signals output from the former two multiplexers are input to the respective input terminals thereof.

Figure 52:
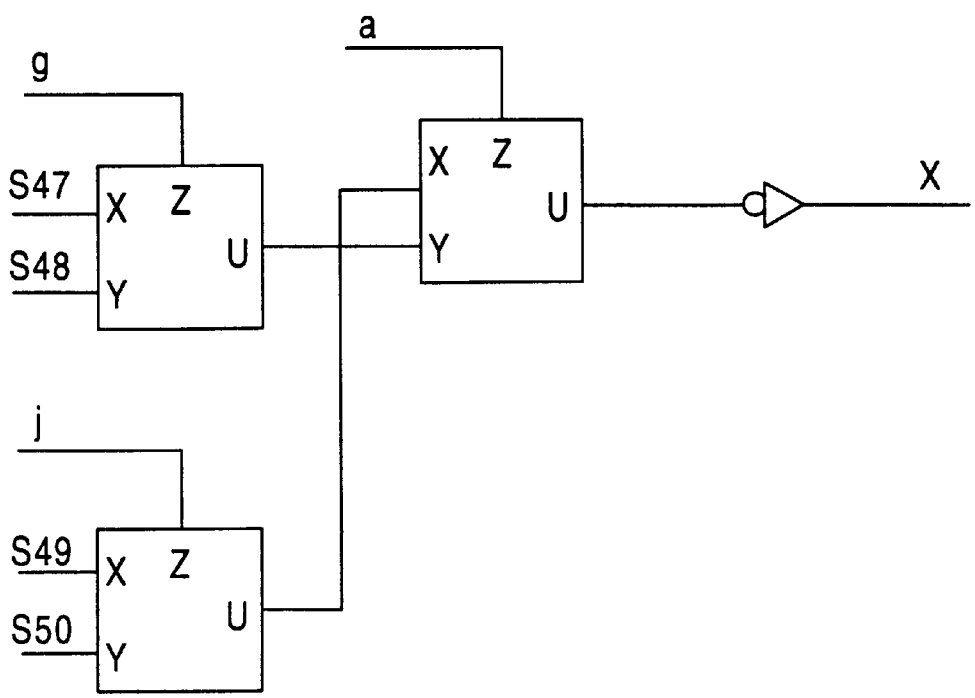
FIG. 52 is a circuit diagram illustrating still another part of the logic circuit according to the fourth embodiment.

In the case of the three multiplexers shown in FIG. 52, they are connected in series such that a two-stage multiplexer is constructed. However, the control terminals of the two multiplexers at the first stage receive different complementary variables, and thus these multiplexers are not used to map a logic group including multiple-complementary variables. That is, three multiplexers each used to map a logic group including one complementary variable are connected in series into the form of a two-stage multiplexer. Because the present logic circuit is designed under the condition that the maximum allowable number of pass-transistor stages is two, the above three multiplexers are directly connected in series without inserting any circuit element for restoring the logic swing, such as a buffer, an inverter, or a multiple-input logic gate.

Figure 49:
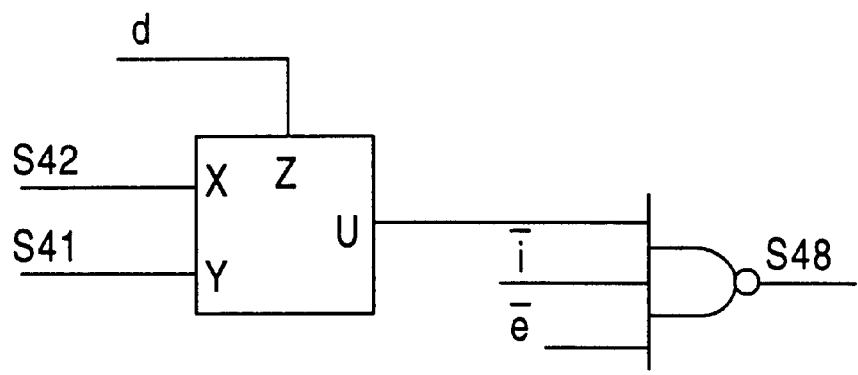
FIG. 49 is a circuit diagram illustrating still another part of the logic circuit according to the fourth embodiment.
Figure 50:
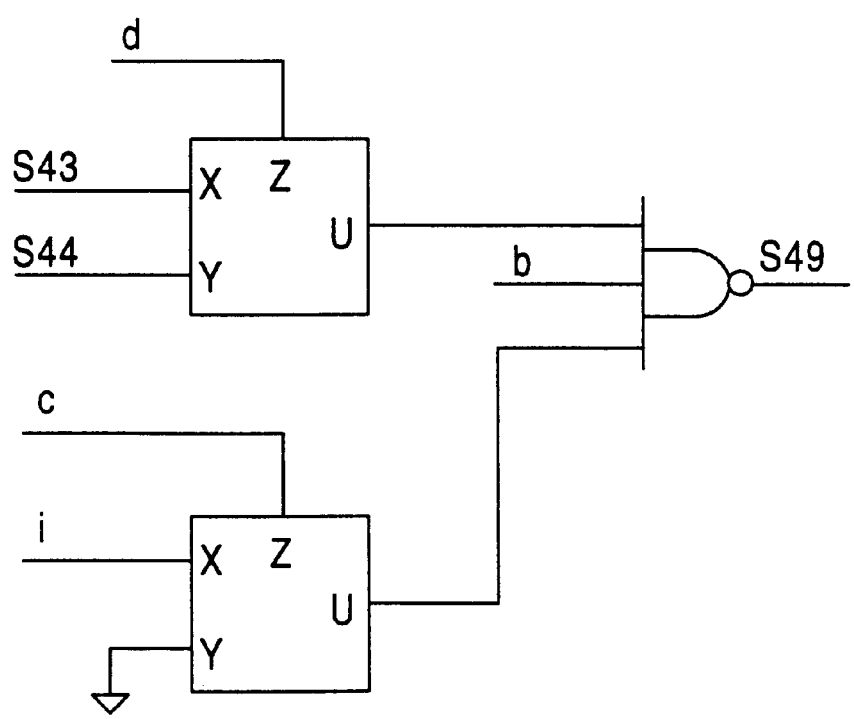
FIG. 50 is a circuit diagram illustrating still another part of the logic circuit according to the fourth embodiment.
Figure 51:
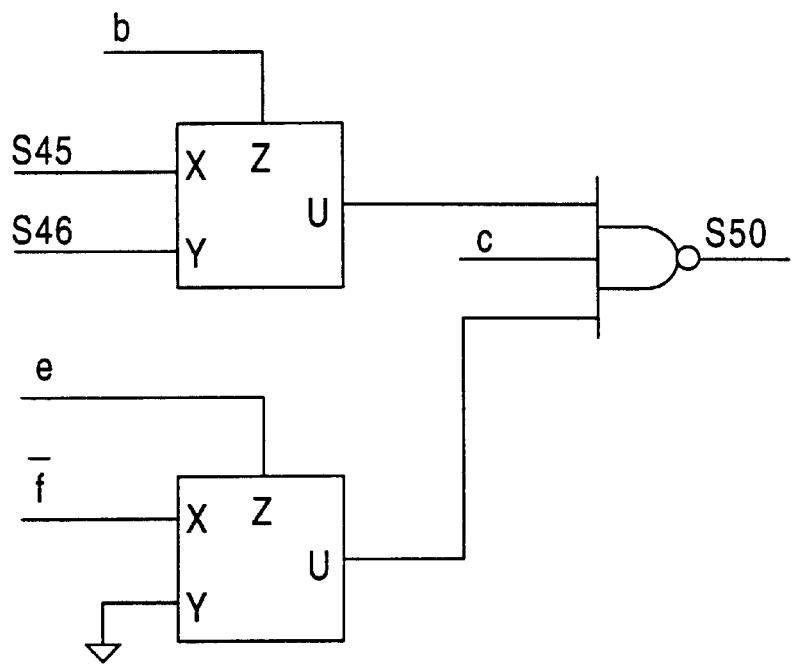
FIG. 51 is a circuit diagram illustrating still another part of the logic circuit according to the fourth embodiment.

The present logic circuit also include four multiple-input logic gates for mapping logic groups including common variables. That is, in FIG. 48, a three-input NAND gate is used to receive common variables $\bar{b}$, $\bar{c}$, f, and h at its input terminals and output a signal S47 from its output terminal. In FIG. 49, a three-input NAND gate is used to receive common variables $\bar{e}$ and $\bar{i}$ at its input terminals and output a signal S48 at its output terminal. In FIG. 50, a three-input NAND gate is used to receive common variables b, c, and i at its input terminals and output a signal S49 from its output terminal. In FIG. 51, a three-input NAND gate is used to receive common variables c, e, and $\bar{f}$ at its input terminals and output a signal S50 from its output terminal. Furthermore, in a part of the logic circuit shown in FIG. 47, there are six three-input zero-AND gates. In a first three-input zero-AND gate, one input terminal is connected to a multiplexer and a signal S41 is output from its output terminal. In a second three-input zero-AND gate, one input terminal is connected to a multiplexer and a signal S42 is output from its output terminal. In the remaining four three-input zero-AND gates output signals S43, S44, S45, and S46 are output from their output terminals. These six three-input zero-AND gates are each used to map product terms including only variables which are logically independent of one another.

The logic circuit shown in FIGS. 47–52 includes a less number of multiplexers, in particular those for mapping logic groups including complementary variables, than the logic circuit obtained according to the variable-combination method for the same logic expression (FIGS. 21–26). However, it includes a greater number of multiplexers than the logic circuit obtained according to the common-variable method (FIGS. 35–40). In particular, the logic circuit according to the common-variable/variable-combination method includes multiplexers having a full-two-stage structure, which do not appear in the logic circuit obtained according to the common-variable method. On the other hand, the logic circuit according to the common-variable/variable-combination method includes a less number of multiple-input logic gates, in particular those for mapping logic groups including a plurality of common variables than the logic circuit obtained according to the common-variable method. However, the number of multiple-input logic gates is greater than that included in the logic circuit obtained according to the variable-combination method. As described above, the logic circuit according to this fourth embodiment has a structure in which the advantages of both the variable-combination method and the common-variable method are achieved. Furthermore, composite pass-transistor logic circuits are used in the parts of the logic circuit shown in FIGS. 48, 50 and 51. Thus, the logic circuit according to the present embodiment is also well optimized into a circuit structure in which the advantages of composite pass-transistor logic circuits are achieved. In addition to the composite pass-transistor logic circuits, the present logic circuit also includes various circuit structures in which pass-transistor logic circuits and multiple-input logic gates are combined in various manners. For example, in the case of the two-stage multiplexer shown in FIG. 52, the input terminals thereof are coupled to input signals S47–S50, respectively, output from different multiple-input logic gates. These signals are logically independent of one another. On the other hand, the input terminals of one of the multiplexers shown in FIG. 50 and 51 are coupled to input signals S43 and S44 or S45 and S46, respectively, output from different multiple-input logic gates. Herein, the signals S43 and S44 are logically independent of each other, and similarly, the signals S45 and S46 are logically independent of each other. As described above, the logic circuit designed according to the present invention has a circuit structure including pass transistors and multiple-input logic gates which are combined into various manners so that the advantages of both types of circuit elements are utilized.

In the above specific example, there is no significant differences in the number of transistors and the number of stages between the logic circuit designed according to the common-variable/variable-combination method and that according to the common-variable method. However, this is true only when the given logical expression is not very complicated. In the case of a more complicated logical expression used in a practical application, common-variable/variable-combination method according to the present embodiment can result in a less number of transistors and less power consumption than the common-variable method. Furthermore, in the method according to the present embodiment, the computation time required to obtain an optimized logical expression or to obtain a logic circuit from the optimized logical expression is short. This makes it possible to design a large-scale logic circuit in a short time.

In the present embodiment, as described above, grouping is first performed according to the bottom-up common-variable method, and then grouping is further performed according to the variable-combination method. However, the present invention is not limited to this combination. For example, the first grouping process may be performed according to the top-down common-variable method, and then the variable-combination method may be performed. Furthermore, the number of cycles of the grouping procedure performed according to the common-variable method is not limited to one. That is, the grouping procedure according to the common-variable method may be performed in a plurality of cycles before performing the variable-combination method. However, one or two cycles are generally sufficient to achieve the advantages of the common-variable/variable-combination method. Conversely, grouping according to the variable-combination method may be performed first, and then grouping according to the common-variable method may be performed. In this case, the processing time required for the first grouping procedure according to the variable-combination method is of the order of $O((m-1)_n P_{v+1} + n_n P_v)$. The subsequent procedure according to the common-variable method requires a shorter processing time, because the number of product terms to be processed and the number of variables have been decreased in the previous grouping procedure according to the variable-combination method.

Furthermore, complementary variables and common variables may be identified according to a method other than the variable-combination method and the common-variable method described above with reference to the first through third embodiments, and then the logical expression may be optimized using the identified complementary variables and common variables.

In the first through fourth embodiments described above, it is assumed that the given logical expression to be optimized is a sum of product terms each including only variables, as is the case in equation (2). In general, each method described above is highly effective when the given logical expression to be processed has a sum of product terms each including only variables. Therefore, it is generally desirable that when a given logical expression to be processed includes a logic function which is not a simple product of variables, the given logical expression be first transformed into a form including only products of variables, and then the optimization be performed according to any technique disclosed in the first through fourth embodiments. When the given logical expression includes a logic function which can-be mapped to a particular circuit structure (such as a multiplexer) in an efficient fashion, such the logic function may be left unprocessed, and the optimization may be performed on the other portions of the logical expression.

Now, the method of designing a logic circuit according to the fifth embodiment of the invention will be described. In this fifth embodiment, a given logical expression is mapped to a logical circuit by a preliminary mapping procedure in which logic inversion is not taken into account. More specifically, the mapping is performed using non-inverting logic gates such as AND gates and OR gates.

It is desirable that the primary mapping process according to the present embodiment be performed on a logical expression which has been optimized according to any method disclosed in the first through fourth embodiments, although the optimization may also be performed according to other methods, or no optimization is necessary for some logical expressions.

In the present embodiment, the product terms in the lowest-level groups are first mapped into a form suitable for use of AND gates and pass-transistors. More specifically, if two or more variables are included in a product term in a lowest-level group and if the number of variables is equal to or less than the maximum allowable number (for example three) of input terminals of an AND gate, an AND gate is placed in the logic circuit, and the variables of that product term are connected to input terminals of that AND gate. In the case where the number of variables is equal to or greater than four, a pass transistor is added to the AND gate in such a manner that the output terminal of the pass transistor is input to an input terminal of the AND gate, and proper ones of the variables are connected to the input terminal and the control terminal of the pass transistor. For example, if a pass transistor is added to each of all the input terminals of a three-input AND gate, then it is possible to map a product term including up to six variables. If each pass transistor is replaced by a two-stage pass transistor, it is possible to map a product term including up to nine variables. In the case where the pass transistors combined with the AND gate is realized in the form of unit multiplexers having the circuit structure shown in FIG. 10, the input terminal to which no variable is input is fixed to "0" logic level. When a term in the lowest-level group includes only one variable, the mapping is not necessary for such the term at this stage, and thus the variable is directly input to the following stage in the logic circuit.

After mapping all product terms in the lowest-level groups in the above-described manner, mapping is further performed for second-lowest-level groups.

For example, if two terms in the lowest-level groups share a complementary variable, then the logic group in the second-lowest-level group includes that complementary variable. In this case, a multiplexer is placed in the logic circuit, and the two terms are input to the input terminals of the multiplexer and the complementary variable is input to the control terminal of the multiplexer. In the case where three or more terms share a plurality of complementary variables, a multiplexer having two or more stages (within the range allowed as the number of stages of the pass transistors) is placed in the logic circuit, and the complementary variables are input to the respective control terminals of the multiplexer and the product terms are input to the respective input terminals. If the logic group in the next level includes a complementary variable, a multiplexer is further placed at the following stage unless the number of stages exceeds the maximum allowable number. For example, a logical expression given below in equation (15) is mapped according to the method of the present embodiment into a logic circuit shown in FIG. 53.

$$Y = a \cdot b \cdot (c) + a \cdot b \cdot (d \cdot e) + \bar{a} \cdot b \cdot (f \cdot g \cdot h) + \bar{a} \cdot \bar{b} \cdot (i \cdot j \cdot k \cdot l) \qquad (15)$$

In equation (15), the insides of four parentheses are lowest-level groups. They are a variable c and product terms d·e, f·g·h, i·j·k·l, respectively. Of these, the second and third product terms include two and three variables, respectively, and therefore, each of these two product terms is mapped using one separate AND gate. Since the fourth product term includes four variables, this product term is mapped using a combination of an AND gate and a multiplexer. The logic group at the next higher level is such a logic group in which the above four terms share two multiple-complementary variables a and b, and thus further mapping is performed using a two-stage multiplexer. Herein, the term c including only one variable is directly input to an input terminal of the two-stage multiplexer.

Figure 53:
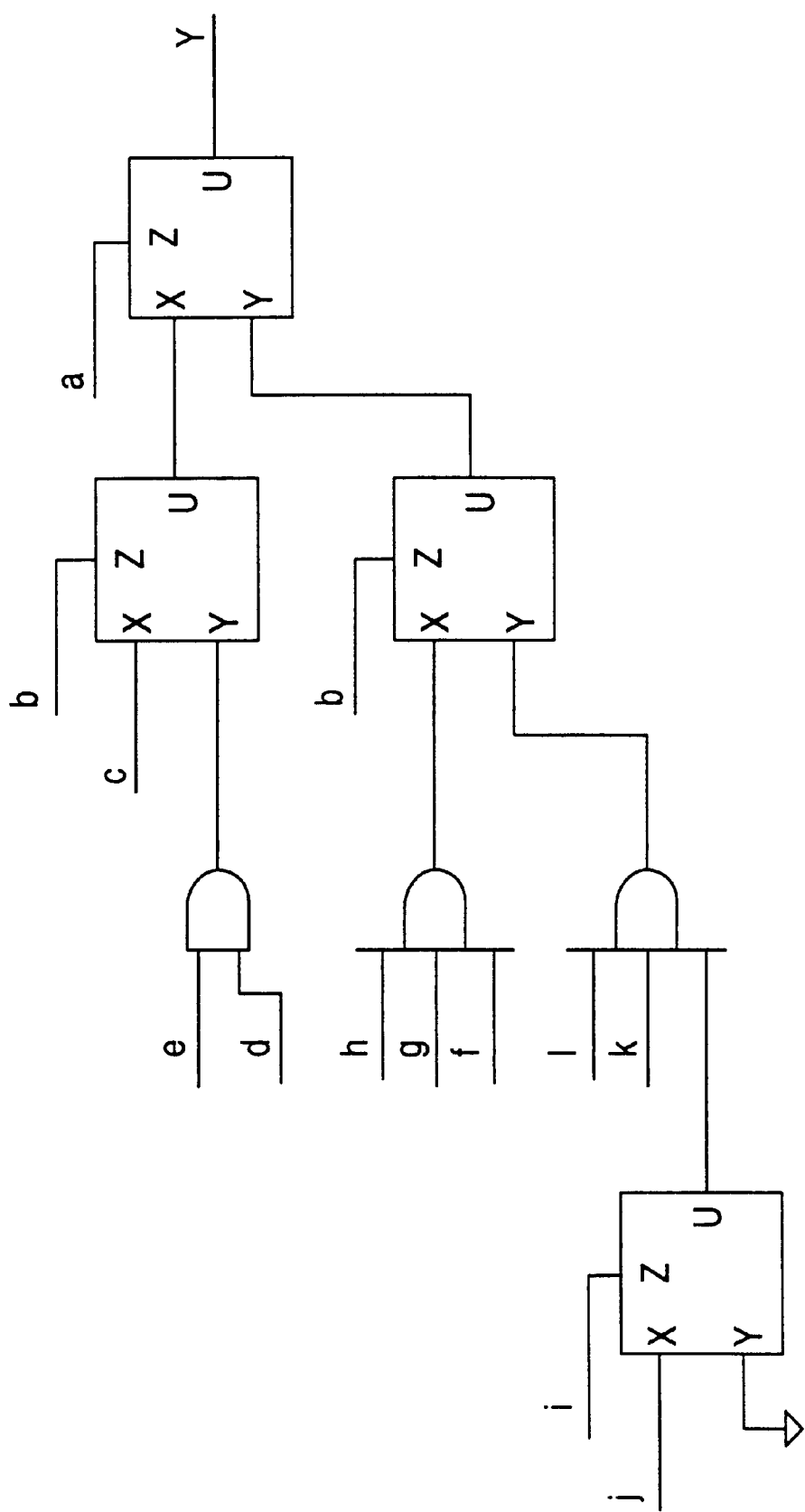
FIG. 53 is a circuit diagram illustrating a logic circuit designed according to a first method of a fifth embodiment of the invention.

In the logic circuit shown in FIG. 53, the complementary variable b is input to both the unit multiplexers at the second stage counted from the output end. The terms c and d·e which share the complementary variable b are input to the respective input terminals of one of these unit multiplexers, and the product terms f·g·h and i·j·k·l which also share the complementary variable b are input to the respective input terminals of the other unit multiplexer. The complementary variable a is input to the control terminal of the unit multiplexer at the final stage, and logic functions {b·c+ $\bar{b}$·(d·e)} and {b·(f·g·h)+$\bar{b}$·(i·j·k·l)} which share the complementary variable a are input to the respective input terminals of the unit multiplexer at the final stage.

In the case where a set of product terms shares a common variable, an AND gate is placed so as to map a logic group sharing the common variable, and the common variable and the sum of product terms sharing that common variable are input to the respective input terminals of the AND gate. If the number of common variables is great, a pass transistor is combined with the AND gate in such a manner that the output terminal of the pass transistor is connected to an input terminal of the AND gate. In the case where a higher-level group has a common variable, mapping is performed in a similar manner using an AND gate. Similar mapping is performed repeatedly until the highest-level group has been mapped. Thus, the preliminary mapping procedure is complete. For example, when the maximum allowable number of pass transistor stages is two, if the method of the present embodiment is applied to a logical expression given below in equation (16), then a logic circuit in the form shown in FIG. 54 is obtained.

$$Z = a \cdot (b \cdot c \cdot d) \cdot (e \cdot f \cdot (g) + e \cdot \bar{f} \cdot (h) + \bar{e} \cdot f \cdot (i) + \qquad (16)$$
$$\bar{e} \cdot \bar{f} \cdot (j)) + \bar{a} \cdot (k \cdot (l) + \bar{k} \cdot (m))$$

Figure 54:
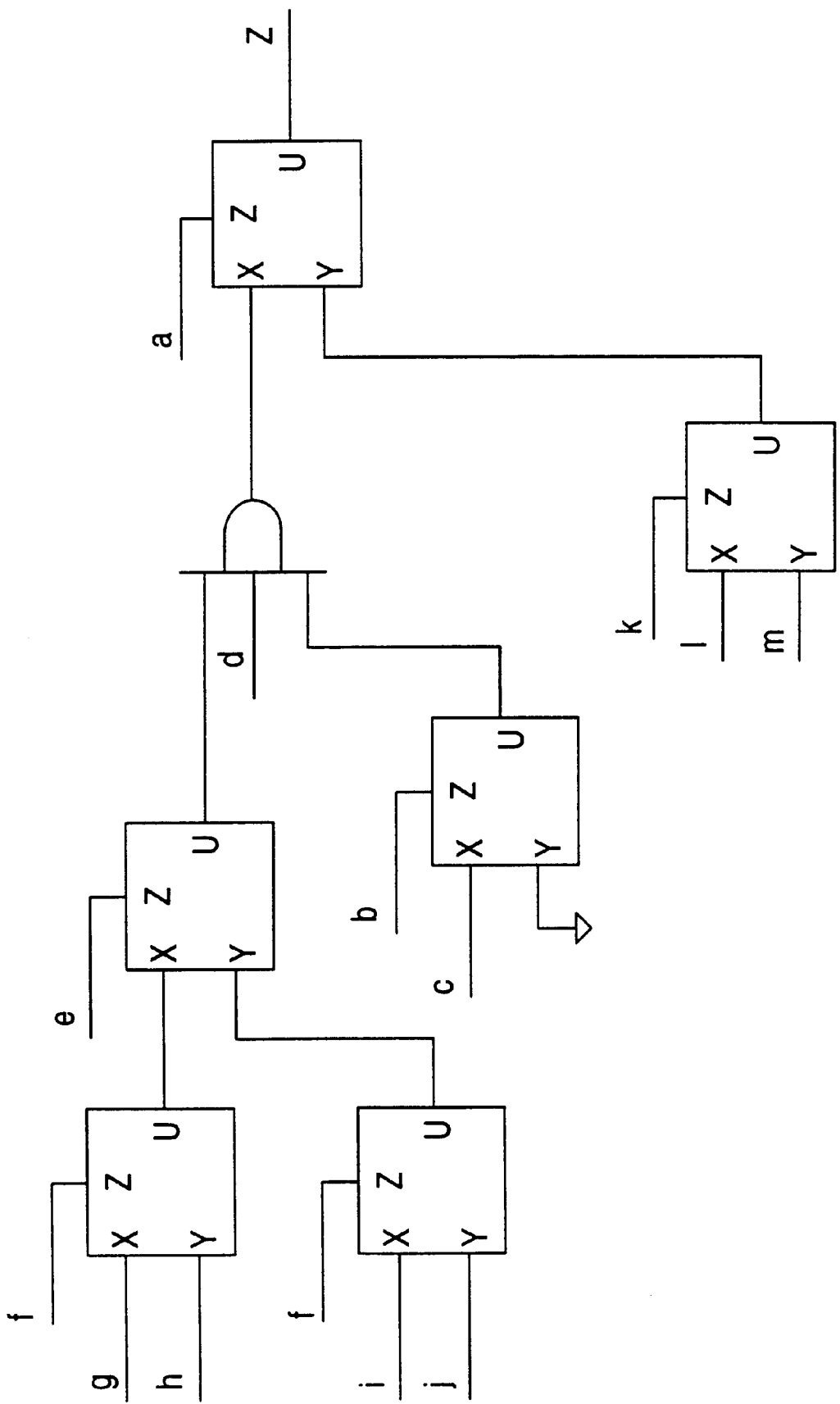
FIG. 54 is a circuit diagram illustrating a logic circuit designed according to a second method of the fifth embodiment of the invention.

In the logical circuit shown in FIG. 54, an AND gate at the second stage counted from the output end receives common variables b, c, and d at its two of the three input terminals. That is, the common variable d is input to one input terminal and b·c is input to another input terminal through an unit multiplexer. The other input terminals is used to input a logic function which is a sum of four product terms sharing the common variable b, c, and d. The sum of the product terms e·f·(g)+e·$\bar{f}$·(h)+$\bar{e}$·f·(i)+$\bar{e}$·$\bar{f}$·(j) is mapped at a previous stage using a two-stage multiplexer taking into account the fact that the sum is a logic group having two multiple-complementary variables e and f. In this specific example, the common variables are shared by product terms including only variables. In practice, a common variable can be shared by more complicated logic functions.

In the present specific example, one of the input terminals of the three-input AND gate used to map the logic group having common variables is connected to the two-stage multiplexer so that the sum of the logic functions sharing the common variables is input to the input terminal of the three-input AND gate. As a result, the number of remaining input terminals which can be used to receive common variables is two (herein it is assumed that the maximum allowable number of input terminals is three). Thus, an unit multiplexer is connected to one of the remaining input terminals so that three common variables can be input to the AND gate. Therefore, a number of necessary unit multiplexers to combine with an AND gate can be determined by the total number of the common variables and the sum of the logic functions sharing the common variables. In other words, if, instead of the number of variables included in a product term, the total number of logic functions (the sum of logic functions which share a common variable in this example) and variables (common variables in this example) included in a product term is employed as the measure, the number of necessary unit multiplexers to map a product term in a group which is not at the lowest level may be determined in the same manner as in the case of determining the number to map a product term in the lowest level.

More generally, because a variable is a kind of logic function, mapping of a product term including a plurality of logic functions may be performed using an AND gate and one or more unit multiplexers in accordance with the total number of logic functions included in the product term in the same manner regardless of whether all the logic functions included in the product term are simple variables or some or all of the logic functions are complicated logic functions. If some of the logic function in the product term are products of subservient logic functions, the number of such subservient logic functions should also be included in the count.

In the above example, only AND gates are employed as the multiple-input logic gates. However, in practice, various types of multiple-input logic gates including AND gates may be employed depending on a specific logical expression to be mapped. For example, to map a logic group having a plurality of independent groups, such as the form of equation (21) which will be described later, an OR gate is employed. On the other hand, to deal with the limitation of the number of pass-transistor stages, a buffer may be inserted. Further, when a multiplexer is placed at the final stage of a circuit, a buffer may added at the output terminal of the multiplexer to increase a driving ability and/or to restore the logic swing.

Now, the method of designing a logic circuit according to the sixth embodiment of the invention will be described. This sixth embodiment deals with the logic level adjustment.

In general, an AND gate is constructed by adding an inverter to an NAND gate. As a result, AND gates cause a greater propagation delay than NAND gates, and use of AND gates results in an increase in the number of transistors and thus an increase in power consumption. Similarly, OR gates cause a greater propagation delay than NOR gates, and use of OR gates results in an increase in the number of transistors and thus an increase in power consumption. For the above reasons, it is desirable to employ NAND gates and/or NOR gates. However, in the logic circuit obtained by the preliminary mapping according to the fifth embodiment described above, AND gates and/or OR gates are employed as multiple-input logic gates. Thus, it is desirable to improve the logic circuit obtained by the fifth embodiment by making a logic level adjustment according to the sixth embodiment. The improvement is achieved by replacing AND gates and OR gates by NAND gates and NOR gates. For the same reason, buffers are replaced by inverters. Furthermore, inconsistency in the logic level caused by the logic level inversion by NAND gates, NOR gates, and inverters is adjusted.

In the present embodiment, a logic circuit obtained by mapping for example according to the fifth embodiment is divided at multiple-input AND gates, OR gates, or buffers into positive-logic zones and negative-logic zones in such a manner that positive-logic (negative-logic) zones and negative-logic (positive-logic) zones are alternately located from the output side to the input side of the logic circuit. The polarity of the final stage is determined taking into account whether the given logical expression is in the positive- or negative-logic form. In negative-logic zones, the logic of direct-input signals are inverted. The logic of the signals input to input terminals of the multiple-input logic gates at output sides of negative-logic zones are also inverted. Furthermore, the logic of the signals output from output terminals of the multiple-input logic gates at input sides of negative-logic zones are inverted. As a result, AND gates at output sides of negative-logic zones are replaced by zero-AND gates or NOR gates. Similarly OR gates at output sides of negative-logic zones are replaced by zero-OR gates or NAND gates. On the other hand, AND gates at input sides of negative-logic zones are replaced by NAND gates, and OR gates at input sides of negative-logic zones are replaced by NOR gates. Buffers are replaced by inverters.

Herein, the direct-input signals refer to variables or constants which are directly input to input terminals of multiplexers or multiple-input logic gates, other than those signals supplied from output terminals of multiple-input logic gates or inverters in the preceding stage. Herein, the constants refer to signals having fixed logic levels, namely, "1" or "0" logic levels. For example, a ground potential (GND) and a power supply potential (VDD) are employed as the fixed logic levels.

For example, if a logical expression (17) is mapped by the preliminary mapping according to the fifth embodiment described earlier, a logic circuit in the form shown in FIG. 55 is obtained. This logic circuit can be converted into the form shown in FIG. 56 by the logic level adjustment according to the present embodiment. For convenience of comparison between the logic circuits and the logical expression, equation (17) is written in a somewhat redundant form.

$$W = a \cdot b \cdot c \cdot (d \cdot (e \cdot f \cdot g(h \cdot i + \bar{h})) + \bar{d}) \tag{17}$$

Figure 55:
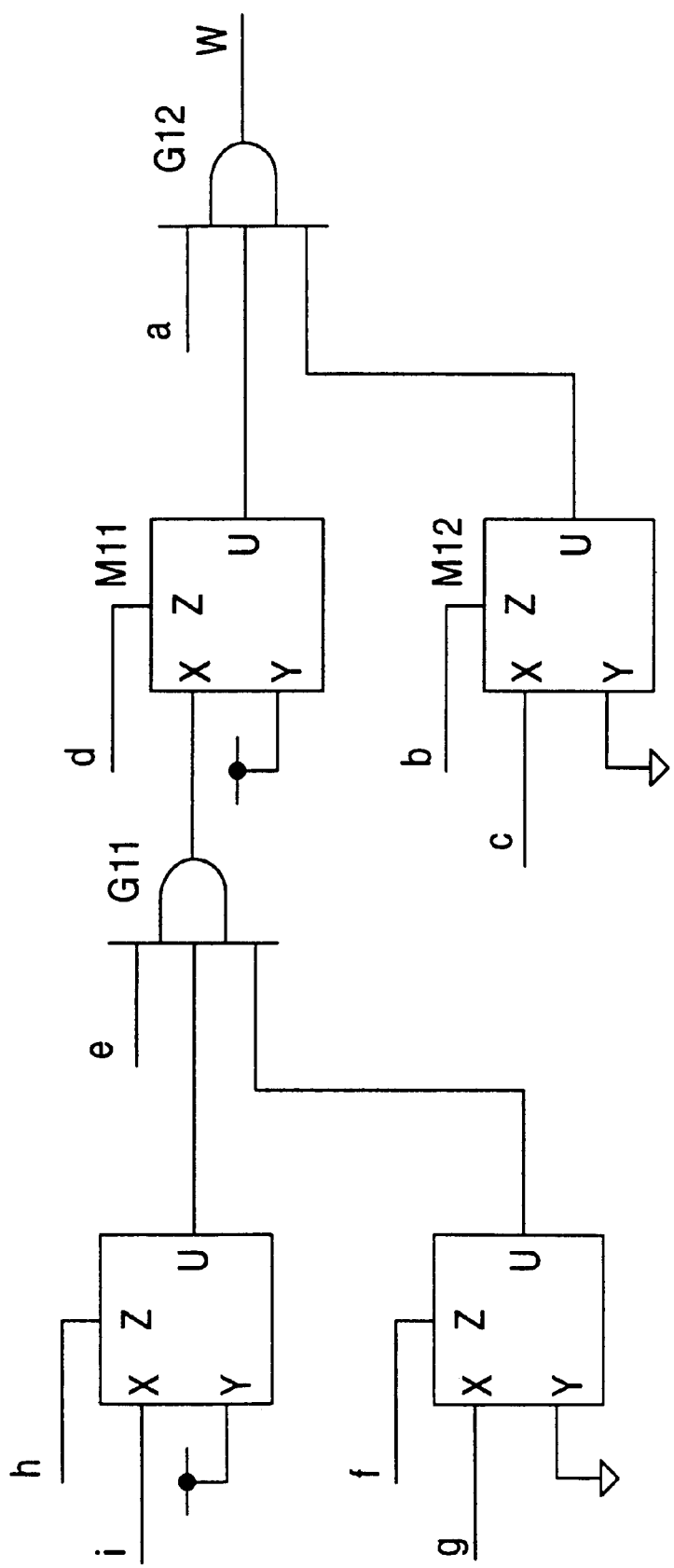
FIG. 55 is a circuit diagram illustrating a logic circuit to be processed according to a design method of a sixth embodiment of the invention.
Figure 56:
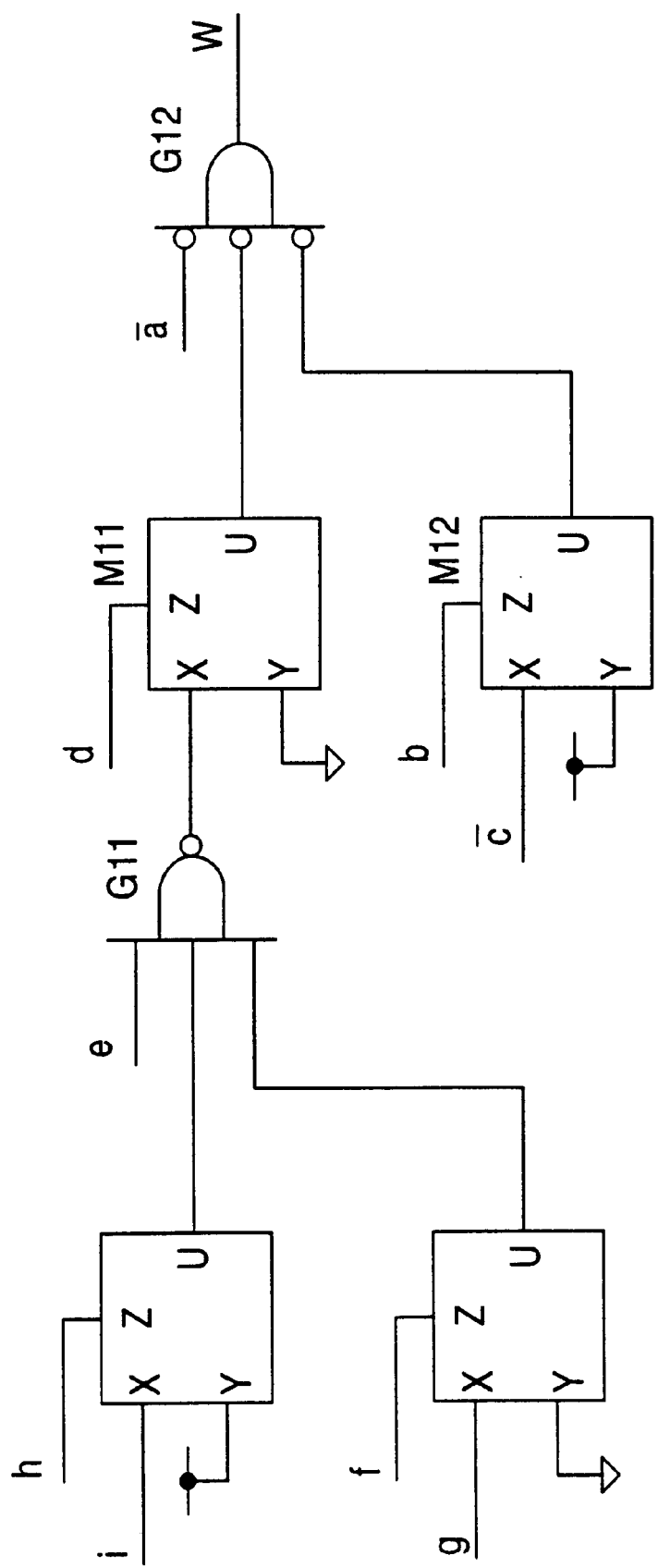
FIG. 56 is a circuit diagram illustrating a logic circuit which has been converted, by the process according to a sixth embodiment, from the logic circuit shown in FIG. 55.

In equation (17) and in the example shown in FIG. 55, output W is in the positive-logic form. Therefore, the zone between the AND gate G11 and the AND gate G12 is a negative-logic zone. Therefore, the AND gate G12 is replaced by an zero-AND gate, and the AND gate G11 is replaced by an NAND gate. Furthermore, the direct-input signals a and c are inverted, and the constant "1" input to an input terminal of the multiplexer M11 and the constant "0" applied to an input terminal of the multiplexer M12 are both inverted. No further modifications are required. Thus, the result is as shown in FIG. 56.

In equation (17), the group $h \cdot i + \bar{h}$ in the deepest-nested parenthesis can be easily rewritten as $i + \bar{h}$. This group is a "logic group having a plurality of independent subservient logic groups" which will be described later, and thus it may also be mapped using an OR gate. However, in the present example, an OR-configured multiplexer (a multiplexer at the first stage whose control terminal is coupled to input the variable h) is employed. The OR-configured multiplexer will be described in detail later with reference to FIG. 61. Similarly, the group $d \cdot (e \cdot f \cdot h \cdot (h \cdot i + \bar{h})) + \bar{d}$ (which can be rewritten as $(e \cdot f \cdot g \cdot (h \cdot i + \bar{h})) + d)$ is mapped using an OR-configured multiplexer (a multiplexer at the second stage counted from the final stage whose control terminal is coupled to input the variable d). As in the above examples, a logic group represented by a sum of one variable and one logic function, may be mapped in an efficient fashion using an OR-configured multiplexer wherein the variable is input to the control terminal thereof, the logic function or the product term except for the variable is input to one input terminal thereof, and a constant is input to the other input terminal. According to this method, it is possible to reduce the number of stages compared with the case where a two-input OR gate is employed. In the example shown in FIG. 55, the variable ($\bar{h}$ or $\bar{d}$) represented in the negative-logic form in equation (17) is input in the positive-logic form to the control terminal, and the logic function i or $(e \cdot f \cdot g \cdot (h \cdot i + \bar{h}))$ is input to the input terminal X. And a constant "1" is input to the input terminal Y. This makes it unnecessary to use inverters to invert the variables, and thus a reduction in the number of transistors is achieved.

In the logic circuit shown in FIGS. 21–26, the logic circuit shown in FIGS. 35–40, and the logic circuit shown in FIGS. 47–52, logic level adjustments are performed according to the present embodiment. The logical expression corresponding to the logic circuit which has been subjected to the logic level adjustment may be further improved using a proper algorithm. For example, using a binary decision diagram, nodes associated with the same logic may be shared, a plurality of nodes may be replaced by one node, and a part of variables may be converted so that an equivalent and simplified expression may be obtained.

The logic level adjustment according to the present embodiment may also be applied to a logic circuit which has been obtained by a preliminary mapping procedure according to a proper method other than the fifth embodiment. For example, in the fifth embodiment, mapping is performed starting with the lowest-level groups toward higher-level groups. Instead, mapping may be performed from the highest-level groups toward lower-level groups, and the resultant logic circuit may be subjected to the logic level adjustment according to the present embodiment.

Now, the method of designing a logic circuit according to the seventh embodiment of the invention will be described.

In this embodiment, a procedure corresponding to the preliminary mapping according to the fifth embodiment and a procedure corresponding to the logic level adjustment according to the sixth embodiment are performed simultaneously rather than separately. Furthermore, in this embodiment, as opposed to the fifth embodiment in which the mapping is performed in a bottom-up fashion from the lowest-level groups toward higher-level groups, mapping is performed in a top-down fashion from the highest-level group toward lower-level groups. In this embodiment, the highest-level group in the given logical expression are first mapped, and then mapping is further performed from level to level toward the lowest-level groups.

For the highest-level group, the mapping is performed in different manners depending on the structure of the highest-level group in the given logical expression as follows.

Figure 57:
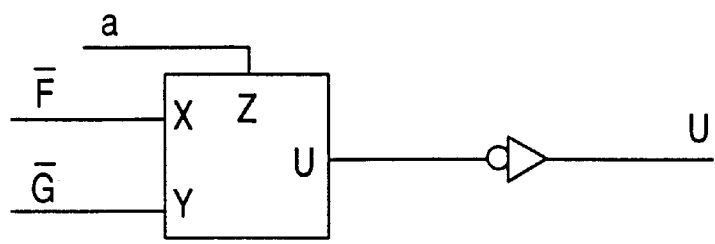
FIG. 57 is a circuit diagram illustrating an example of a logic circuit mapping a first type of logic group at the highest group, according to a method of designing a logic circuit of a seventh embodiment of the invention.

In a first structure, the highest-level group has only such logic functions which share one or more complementary variables. In this case, a multiplexer with an inverter at the output is placed at the final stage. For example, equation (18) having a complementary variable a and providing an output in the positive-logic form may be mapped to a logic circuit in the form shown in FIG. 57. If there are multiple-complementary variables, a multi-stage multiplexer is employed.

$$U = a \cdot F + \bar{a} \cdot G \qquad (18)$$

where F and G are arbitrary logic functions.

Figure 58:
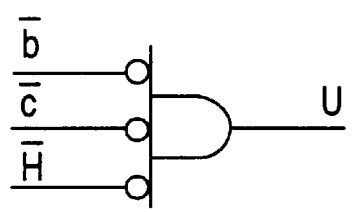
FIG. 58 is a circuit diagram illustrating an example of a logic circuit mapping a second type of logic group at the highest group, according to the design method of the seventh embodiment.

In a second structure, the highest-level group includes only one logic function having one or more common variables. In this case, if the output is in the positive-logic form, an zero-AND gate, that is, a NOR gate is placed at the final stage. If the output is in the negative-logic form, an NAND gate is placed. An example having common variables b and c is shown in equation (19). In equation (19), a logic function H is represented by a sum of a plurality of subservient logic functions which share the common variables a and b. If equation (19) is mapped according to the present embodiment, a logic circuit in the form shown in FIG. 58 is obtained. In the case where the number of common variables is as great as the maximum allowable number of input terminals of the multiple-input logic gate or greater, a multiplexer whose one input terminal is coupled to input a constant signal is added, as in the preliminary mapping procedure according to the fifth embodiment described above.

$$U = b \cdot c \cdot H \qquad (19)$$

where H is an arbitrary logic function.

Figure 59:
FIG. 59 is a circuit diagram illustrating an example of a logic circuit mapping a third type of logic group at the highest group, according to the design method of the seventh embodiment.

In a third structure, the highest-level group includes only one logic function having no common variable. In this case, an inverter is placed at the final stage. An example of such a logical expression in which the output is in the positive-logic form is shown in equation (20). In a special case, the logic function can have a logic group including a complementary variable as in the first structure. Mapping equation (20) according to the present embodiment results in a logic circuit in the form shown in FIG. 59.

$$U = I \qquad (20)$$

where I is an arbitrary logic function.

Figure 60:
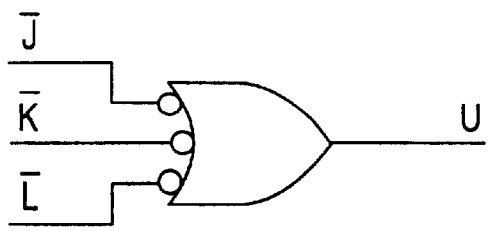
FIG. 60 is a circuit diagram illustrating an example of a logic circuit mapping a fourth type of logic group at the highest group, according to the design method of the seventh embodiment.

In a fourth structure, the highest-level group includes a plurality of independent subservient logic groups. In this case, if the output is in the positive-logic form, an zero-OR gate, that is, a NAND gate is placed at the final stage. On the other hand, if the output is in the negative-logic form, a NOR gate is placed at the final stage. Herein, the term "independent logic groups" is used to represent not only literally independent logic groups, but also groups having different complementary variables, groups having different common variables, and a mixture of such groups. An example is shown in equation (21). Mapping this equation according to the present embodiment yields a logic circuit in the form shown in FIG. 60.

$$U = J + K + L \qquad (21)$$

where J, K, and L are arbitrary logic functions.

Figure 61:
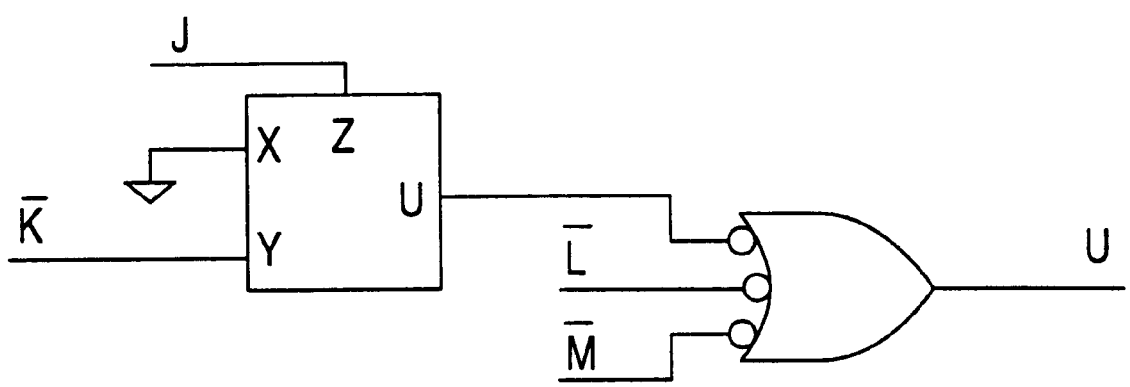
FIG. 61 is a circuit diagram illustrating a logic circuit obtained by adding a multiplexer to the fourth-type circuit shown in FIG. 60.
Figure 62:
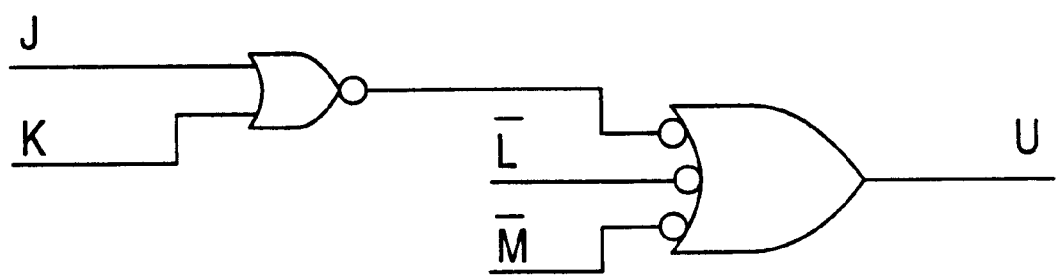
FIG. 62 is a circuit diagram illustrating a logic circuit obtained by adding a NOR gate to the fourth-type circuit shown in FIG. 60.
Figure 63:
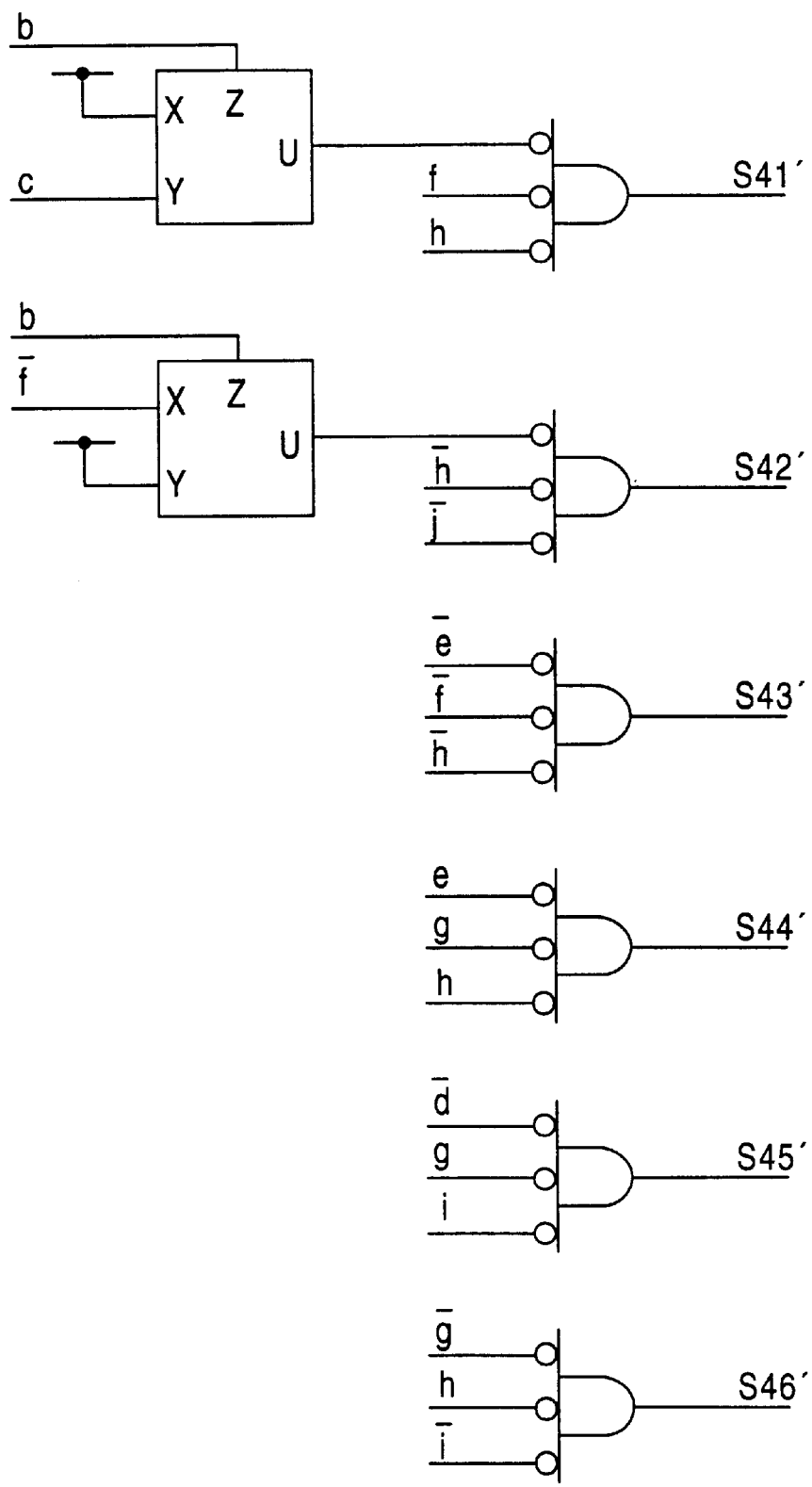
FIG. 63 is a circuit diagram illustrating a part of a logic circuit according to the seventh embodiment, wherein the entire logic circuit is made up of those parts shown in FIGS. 63–68.
Figure 64:
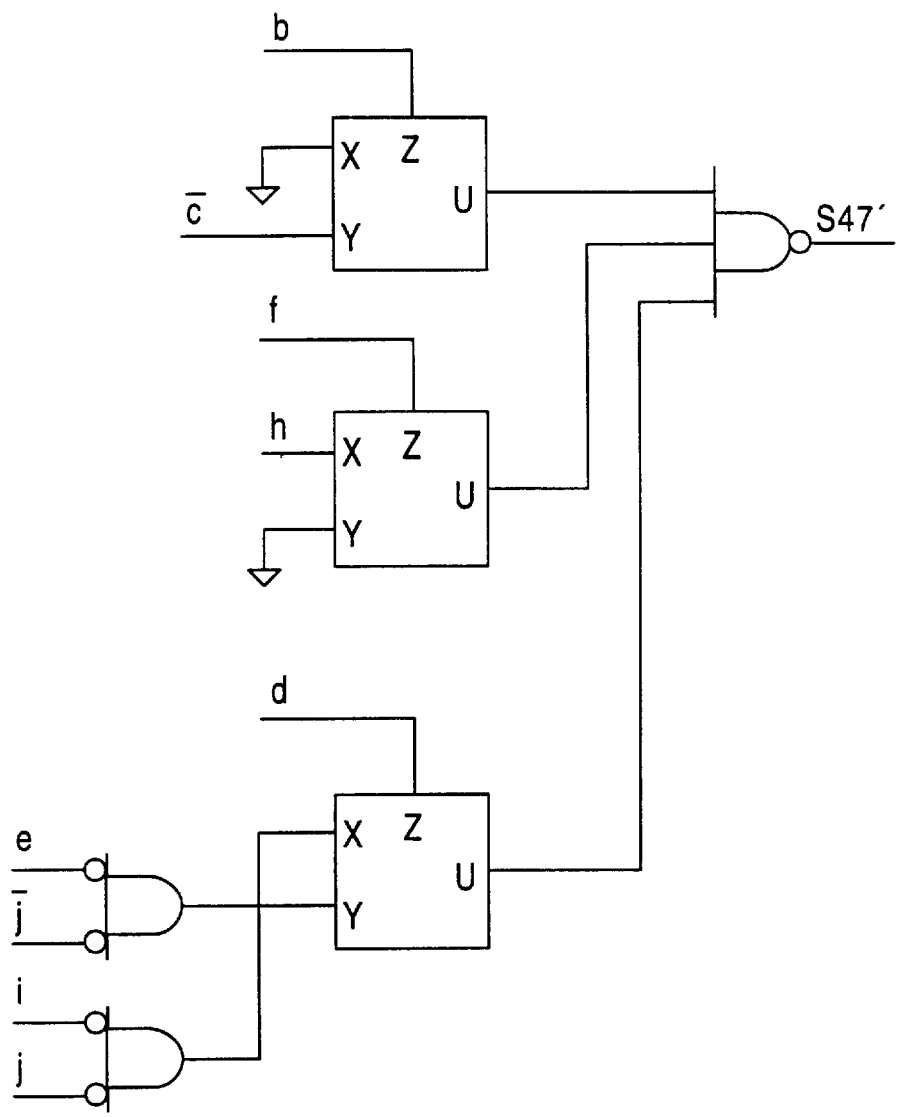
FIG. 64 is a circuit diagram illustrating another part of the logic circuit according to the seventh embodiment.
Figure 65:
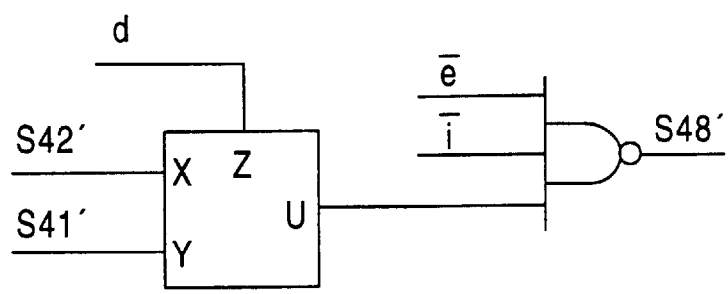
FIG. 65 is a circuit diagram illustrating still another part of the logic circuit according to the seventh embodiment.
Figure 66:
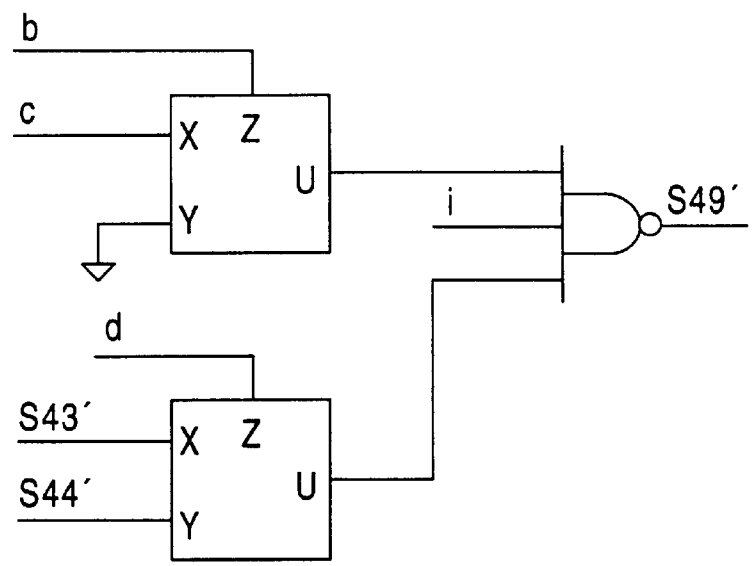
FIG. 66 is a circuit diagram illustrating still another part of the logic circuit according to the seventh embodiment.
Figure 67:
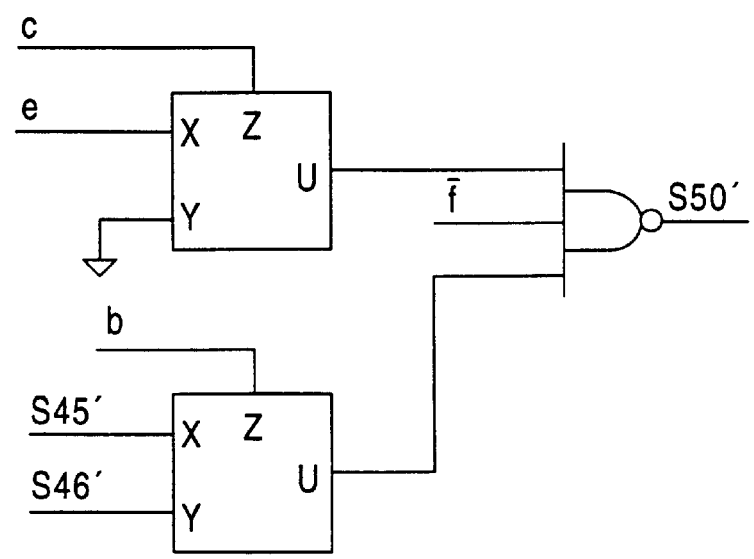
FIG. 67 is a circuit diagram illustrating still another part of the logic circuit according to the seventh embodiment.
Figure 68:
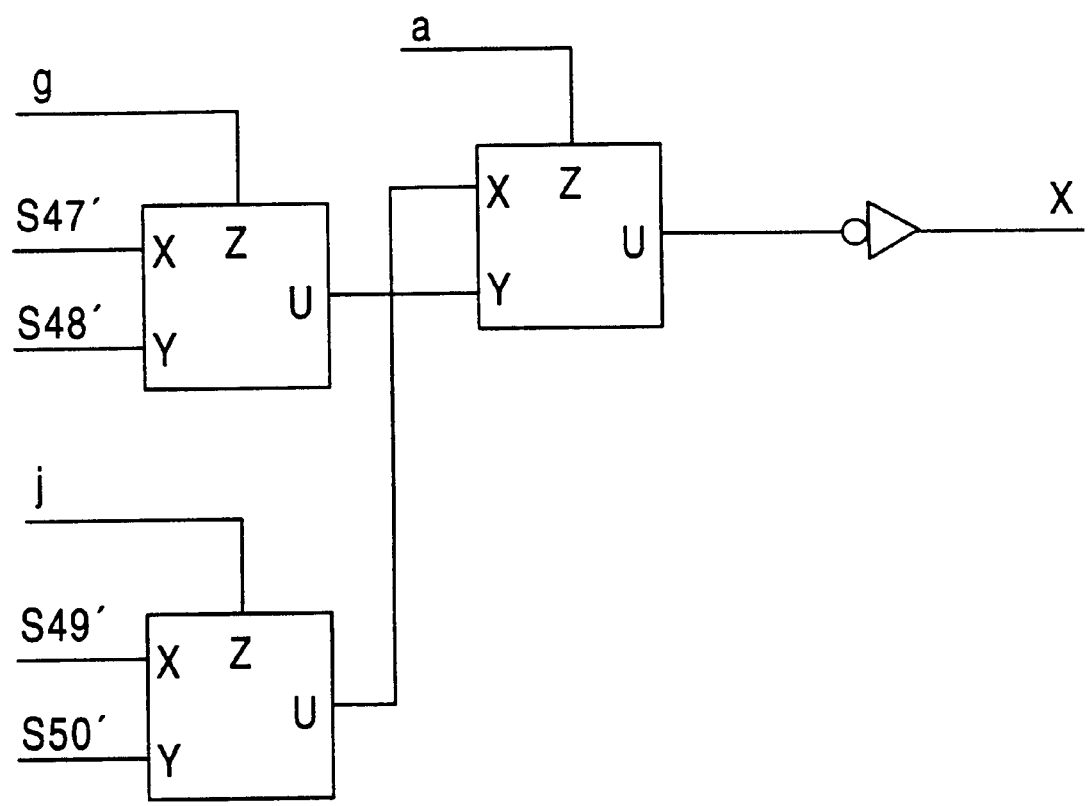
FIG. 68 is a circuit diagram illustrating still another part of the logic circuit according to the seventh embodiment.

In the fourth structure, if the highest-level group includes a larger number of independent subservient groups, an OR-configured multiplexer whose one input terminal is coupled to input a constant signal is added to the NAND or NOR gate, or otherwise a NOR gate is added. For example, if an OR-configured multiplexer is added to the logic circuit shown in FIG. 60, the resultant logic circuit will be as shown in FIG. 61. On the other hand, if a NOR gate is added, the resultant logic circuit will be as shown in FIG. 62. In the logic circuits shown in FIGS. 61 and 62, the positive-logic is assumed.

In the multiplexer shown in FIG. 61, when J is in a valid state (HIGH state), the constant input "GND" becomes enabled, and thus the output of the multiplexer becomes valid (LOW state). When J is in an invalid state, if $\overline{K}$ is valid (LOW state), then the output of the multiplexer becomes valid (LOW state). That is, if either J or K is valid, then the output of the multiplexer becomes valid. For the above reason, this multiplexer is called an "OR-configured multiplexer". In the example shown in FIG. 61, since the inputs of the NOR gate are in the negative-logic form, a multiplexer configured to implement a NOR logic is used. If the inputs of the NOR gate are in the positive-logic form, a multiplexer configured to implement an OR logic may be used. Both are OR-configured multiplexers.

In each example described above, an inverter or a multiple-input logic gate is placed at the final stage so as to restore the reduction in the logic swing caused by pass-transistor logic circuits and so as to ensure that the final stage has a sufficient ability to drive a circuit at the following stage, such as another logic circuit, sequential circuit, or memory circuit.

After completion of the mapping procedure of the highest-level group, mapping is further performed for the groups at subsequent levels as described below.

In this process, mapping is performed on the respective groups from level to level starting with the second highest level to the lowest level in such a manner that the number of pass-transistor stages is kept within the allowable range. In this mapping procedure, positive-logic zones (negative-logic zones) and negative-logic zones (positive-logic zones) are alternately formed starting with the output side toward the input side of the logic circuit wherein an inverting multiple-input logic gate or an inverter is placed at each boundary between adjacent zones.

The above procedure is performed in basically the same manner as in the fifth embodiment described above except that the logical level adjustment is simultaneously performed. More specifically, logic groups having one or more complementary variables are mapped by inputting the complementary variables) to the control terminal(s) of a multiplexer composed of a combination of pass transistors. On the other hand, logic groups having one or more common variables are mapped by inputting the common variable(s) to input terminal(s) of an NAND gate if the common variable (s) is input from a positive-logic zone or to a NOR gate if the common variable(s) is input from a negative-logic zone. In the above mapping, the lower-level groups represented by a sum of logic functions which share the common variable(s) are mapped in such a manner that the sum is input to one input terminal of the above NAND or NOR gate, and the common variable(s) is input to the remaining input terminal of the NAND or NOR gate. Direct-input signals are input after being inverted if the signals are input in a negative-logic zone. If there are so many common variables that all common variables cannot be input directly to a multiple-input logic gate, a multiplexer whose one input terminal is coupled to input a constant is added and some of the common variables are input through the multiplexer. In this case, if the multiplexer is placed in a positive-logic zone, then variables are directly input and the constant is a "GND" signal. On the other hand, if the multiplexer is placed in a negative-logic zone, then variables are input after being inverted and the constant is a "VDD" signal. The lowest-level product terms are mapped in a similar manner using all input terminals of a NAND gate or a NOR gate.

If the above-described logical expression (14) optimized according to the common-variable/variable-combination method of the fourth embodiment is mapped by means of the top-down mapping procedure according to the seventh embodiment, then a logic circuit in the form shown over FIGS. 63–68 is obtained. In equation (14), the highest-level group is a logic group having a complementary variable a. Thus, an inverter is placed at the final stage, and a multiplexer is placed on the input side of the inverter wherein the complementary variable a is input to the control terminal of the multiplexer.

This logic circuit is basically the same as that shown over FIGS. 47–52 obtained by making the logical level adjustment after the bottom-up preliminary mapping procedure, although there are some differences in detail. Signals denoted by symbols S41'–S50' are similar to signals S41–S50 in the logic circuit shown in FIGS. 47–52. The number of transistors used and the maximum number of signal pass stages are also the same as those in the circuit shown over FIGS. 47–52. However, depending on the given logical expression, the logic circuit obtained in this embodiment may be different from that obtained by making a logical level adjustment after the preliminary mapping.

The logic circuits obtained by means of the preliminary mapping and the logic level adjustment according to the fifth and sixth embodiments, or by means of the top-down mapping according to the seventh embodiment include various unique circuit structures.

Figure 21:
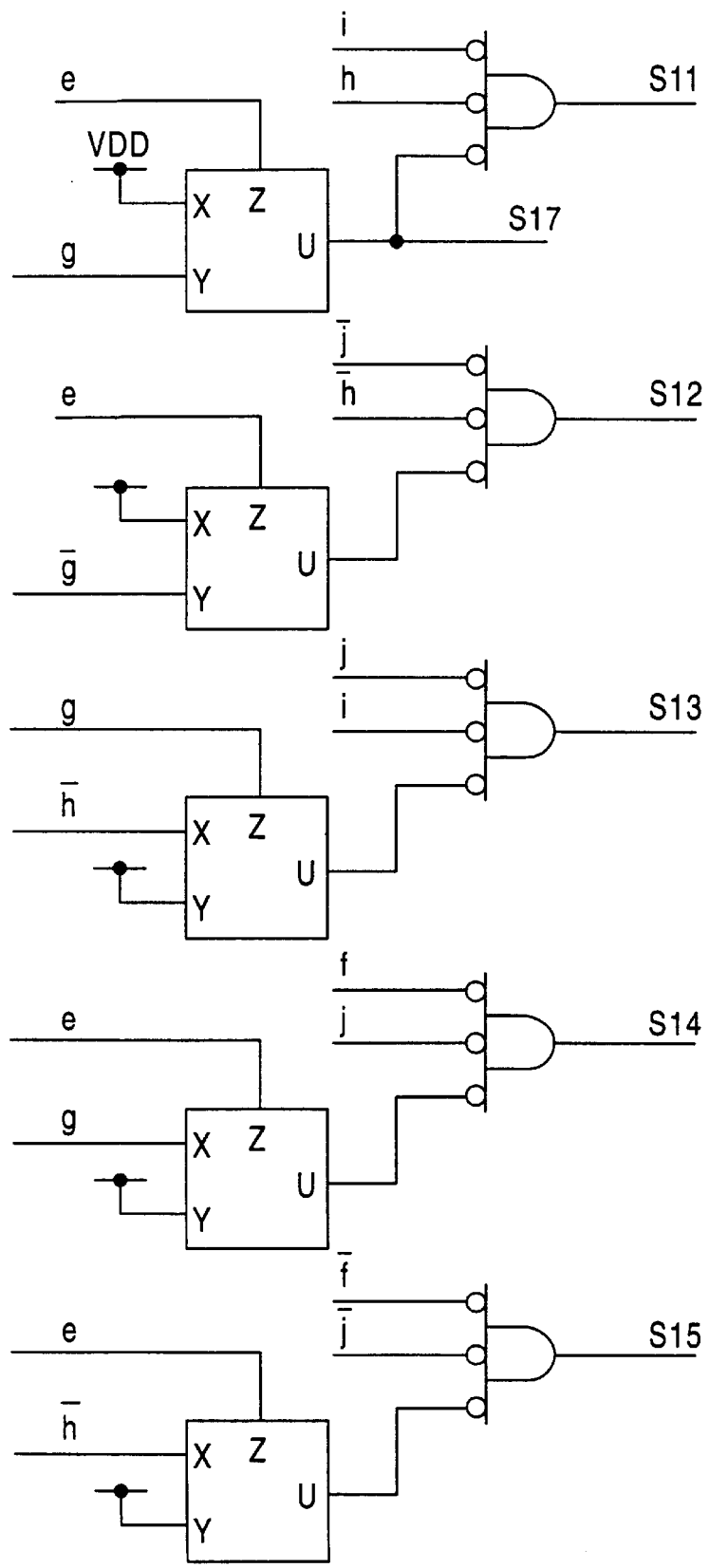
FIG. 21 is a circuit diagram illustrating a part of a logic circuit according to the first embodiment, wherein the entire logic circuit is made up of those parts shown in FIGS. 21–26.

In the logic circuit shown over FIGS. 21–26 obtained by performing the preliminary mapping on the logical expression (5) optimized according to the variable-combination method and then making the logical level adjustment, a circuit structure appears in the part shown over FIGS. 21 and 22, which has a NOR gate, a pass-transistor logic circuit (multiplexer), and a NAND gate arranged from the input side toward the output side. That is, in FIG. 22, the output of a two-stage multiplexer is connected to one input terminal of a two-input NAND gate which outputs a signal S19, wherein signals S11, S12, and S13 generated by three three-input NOR gates (zero-AND gates) shown in FIG. 21 are input to three input terminals of the two-stage multiplexer. This circuit structure inevitably appears when, for example, a logic group having a common variable shared by subservient logic functions wherein a sum of subservient logic functions is a subservient logic group having complementary variables shared by product terms is mapped according to the present invention. That is, NOR gates in FIG. 21 map the product terms. Then the multiplexer in FIG. 22 maps the subservient logic group. The NAND gate in FIG. 22 maps the logic group by inputting the common variable and the subservient logic group to its input terminals. In the preliminary mapping procedure, AND gates are placed as the multiple-input logic gates.

In this case, since the multiplexer is located in a positive-logic zone, the multiple-input logic gates for mapping the product terms are replaced by NOR gates, and the multiple-input logic gate for mapping the logic group is replaced by a NAND gate. In the case that the multiplexer is located in a negative-logic zone, a NAND gate is employed as the multiple-input logic gate for mapping the product terms, and a NOR gate is employed as the multiple-input logic gate for mapping the logic group. In this case, the circuit structure has a NAND gate, a pass-transistor logic circuit, and a NOR gate arranged from the input side toward the output side. Such a circuit structure appears in the logic circuit shown in FIG. 56. Similarly, in the case where the mapping and the logic level adjustment are simultaneously performed, either circuit structure is obtained depending on whether a multiplexer is located in a positive-logic zone or a negative-logic zone.

In the examples described above, each product term mapped by a NOR gate includes only variables. However, in general, product terms include logic functions. For example, in the logic circuit shown over FIGS. 35–40 obtained by mapping the logical expression (9) optimized according to the common-variable method, there appears a circuit structure having a NAND gate, a pass-transistor logic circuit, a NOR gate, a pass-transistor logic circuit, and a NAND gate arranged from the input side toward the output side. For example, in FIG. 37, the output of a one-stage multiplexer is input to one input terminal of a two-input NAND gate which outputs a signal S33. Signals S31 and S32 generated by a three-input NOR gates (zero-AND gate) shown in FIGS. 35 and 36 are input to two input terminals of the one-stage multiplexer in FIG. 37. Furthermore, outputs of other one-stage multiplexers are input to one input terminal of the above NOR gates, wherein the outputs of three-input NAND gates are input to the two input terminals, respectively, of these other one-stage multiplexers.

This circuit structure inevitably appears when, for example, the mapping method according to the present invention is applied to such a logical expression in which a logic group has a common variable shared by subservient logic functions wherein a sum of the subservient logic functions is a subservient logic group having a complementary variable shared by product terms, and each product term is a product of subservient common variables and a second-subservient logic group having a subservient complementary variable shared by subservient product terms. That is, the NAND gates in FIGS. 35 and 36 map the subservient product terms. The multiplexers in FIGS. 35 and 36 map the second-subservient logic groups, and each NOR gates in FIGS. 35 and 36 maps the product of the subservient common variables and the second subservient logic group. The multiplexer shown in FIG. 37 maps the subservient logic group, and the NAND gate in FIG. 37 maps the logic group. Also in the case where the mapping and the logic level adjustment are simultaneously performed, similar circuit structure is obtained.

Depending on the manner in which the circuit is divided into positive-logic and negative-logic zones, there can also occur such a structure including a NOR gate, a pass-transistor logic circuit, a NAND gate, a pass-transistor logic circuit, and a NOR gate arranged from the input side toward the output side. In the case where a large-scale logical expression is mapped, there will be appear such a structure in which NAND gates and NOR gates are alternately located via pass-transistor logic circuits over a greater number of stages.

The methods of designing a logic circuit including no multiple-input logic gates according to the eighth and ninth embodiment of the invention will be described below. Herein, the procedure in step SR14 shown in FIG. 7 (the preliminary mapping procedure), the procedure in step SR16 (logic level adjustment procedure), and also the procedure of simultaneously performing the mapping and the logic level adjustment will be described. The optimization in step SR12 may be performed for example according to any method disclosed above in the first through fourth embodiments, or according to other techniques. The optimization method according to any method disclosed in the first through fourth embodiments may be employed to design not only such a logic circuit including both pass transistors and multiple-input logic gates, but also such a logic circuit including no multiple-input logic gates.

First, the eighth embodiment is described. In this eighth embodiment, a preliminary mapping procedure is performed starting with the lowest-level groups toward higher-level groups in a similar manner to the fifth embodiment. In the present embodiment, mapping is performed such that the resultant circuit will include a circuit structure that has a plurality of pass transistors connected in series via buffers.

In the preliminary mapping procedure in the present embodiment, the product terms in the lowest-level groups are first mapped using AND-configured multiplexers. A required number of AND-configured multiplexers are connected in series depending on the number of variables included in the product terms. That is, the output terminal of a multiplexer at a preceding stage is connected to an input terminal of the following multiplexer. To prevent degradation in the logic swing, a buffer is inserted whenever the number of pass-transistor stages reaches a predetermined maximum allowable value, for example two. When a term includes only one variable, the mapping is not necessary for such the term at this stage, and thus the variable is directly input to the following stage.

After mapping all product terms in the lowest-level groups in the above-described manner, mapping is further performed for higher-level groups.

For example, if two terms in a lowest-level group share a complementary variable, then the logic group in the second-lowest-level group includes that complementary variable. In this case, a multiplexer is placed in the logic circuit, and the two terms are input to the input terminals of the multiplexer and the complementary variable is input to the control terminal of the multiplexer. In the case where three or more terms share multiple-complementary variables, a multiplexer with two or more stages is placed in the logic circuit (such that the number of pass-transistor stages does not exceeds the maximum allowable value), and the complementary variables are input to the respective control terminals of the multiplexer and the terms are input to the respective input terminals. If the logic group in the next higher level includes a complementary variable, a multiplexer is further placed at the following stage unless the number of stages exceeds the maximum allowable number.

Figure 69:
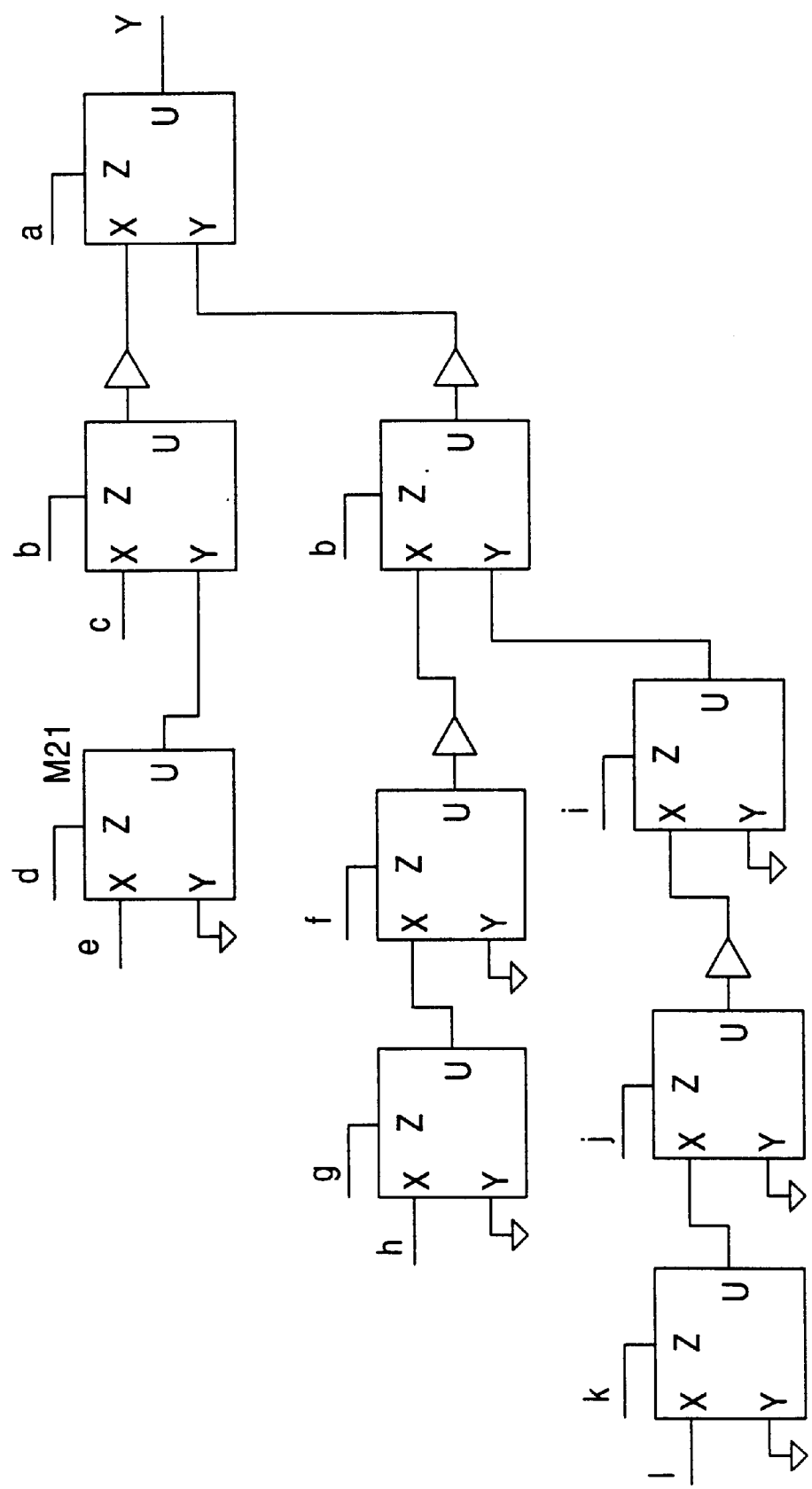
FIG. 69 is a circuit diagram illustrating a first example of a logic circuit obtained by means of a preliminary mapping according to an eighth embodiment of the invention.

For example, if the logical expression (15) described above is mapped by means of the above-described preliminary mapping procedure, a logic circuit in the form shown in FIG. 69 is obtained.

In equation (15), the insides of four parentheses are lowest-level groups. They have a term including only one variable c, and product terms d·e, f·g·h, i·j·k·l, respectively. Of these, the second and third product terms include two and three variables, respectively, and therefore these two product terms are mapped using one AND-configured multiplexer and two AND-configured multiplexers, respectively. Since the fourth product term includes four variables, this product term is mapped using a combination of three AND-configured multiplexers connected in series. Because the maximum allowable number of pass-transistor stages is two, a buffer is inserted between the second- and third-stage AND-configured multiplexers. The above four terms make up logic functions which shares two complementary variables a and b, and thus further mapping is performed using a two-stages multiplexer. The final and preceding stages are basically the same as those in the circuit shown in FIG. 53 except that buffers are inserted between the first- and second-stage of the multiplexer used to map the logic group having two complementary variables so that the number of pass-transistor stages does not exceed the maximum allowable value.

An example of the AND-configured multiplexer described above with reference to the preliminary mapping procedure is the multiplexer M21 shown in FIG. 69. In this multiplexer M21, if and only if variables d and e are in a valid state (HIGH state), the output of the multiplexer M21 becomes valid (HIGH state). In this specific example, since the multiplexer M21 is constructed in the positive-logic form, AND logic is employed. However, if the constant and the variable input to the input terminals are inverted, NAND logic may also be employed. Herein, the term "AND-configured multiplexer" is also used to describe such the multiplexer.

On the other hand, a logical group having a common variable is mapped using an AND-configured multiplexer. In this case, a buffer is inserted for example every two pass-transistor stages. When the logical group has one common variable, the sum of logic functions which share that common variable is input to the input terminal of the AND-configured multiplexer, and the common variable is input to the control terminal thereof. If the logical group includes a plurality of common variables, after mapping the product of the common variables using other AND-configured multiplexers, the product is input to the AND-configured multiplexer used to map the group having the common variables. In the above structure, of the product of the common variables and the sum of the logic functions which share the common variables, the one having a greater number of pass stages is input to the input terminal of the AND-configured multiplexer and the other one having a smaller number of pass stages is input to the control terminal.

In the case where the signal to the control terminal is supplied without being passed through a buffer, a buffer is inserted. The buffer serves to restore the logic swing. That is, a HIGH signal is restored to the power supply potential level, and a LOW signal is restored to the ground potential level. When the number of pass stages associated with the product of the common variables is equal to the number of pass stages associated with the sum of logic functions which share the common variables, either one may be input to the control terminal. The logical expression (16) described above is an example which includes a logic group having common variables wherein the number of pass stages associated with the product of common variables is equal to the number of pass stages associated with the sum of logic functions. If the logical expression (16) is mapped by means of the preliminary mapping procedure disclosed herein, then a logic circuit in the form shown in FIG. 70 is obtained.

Figure 70:
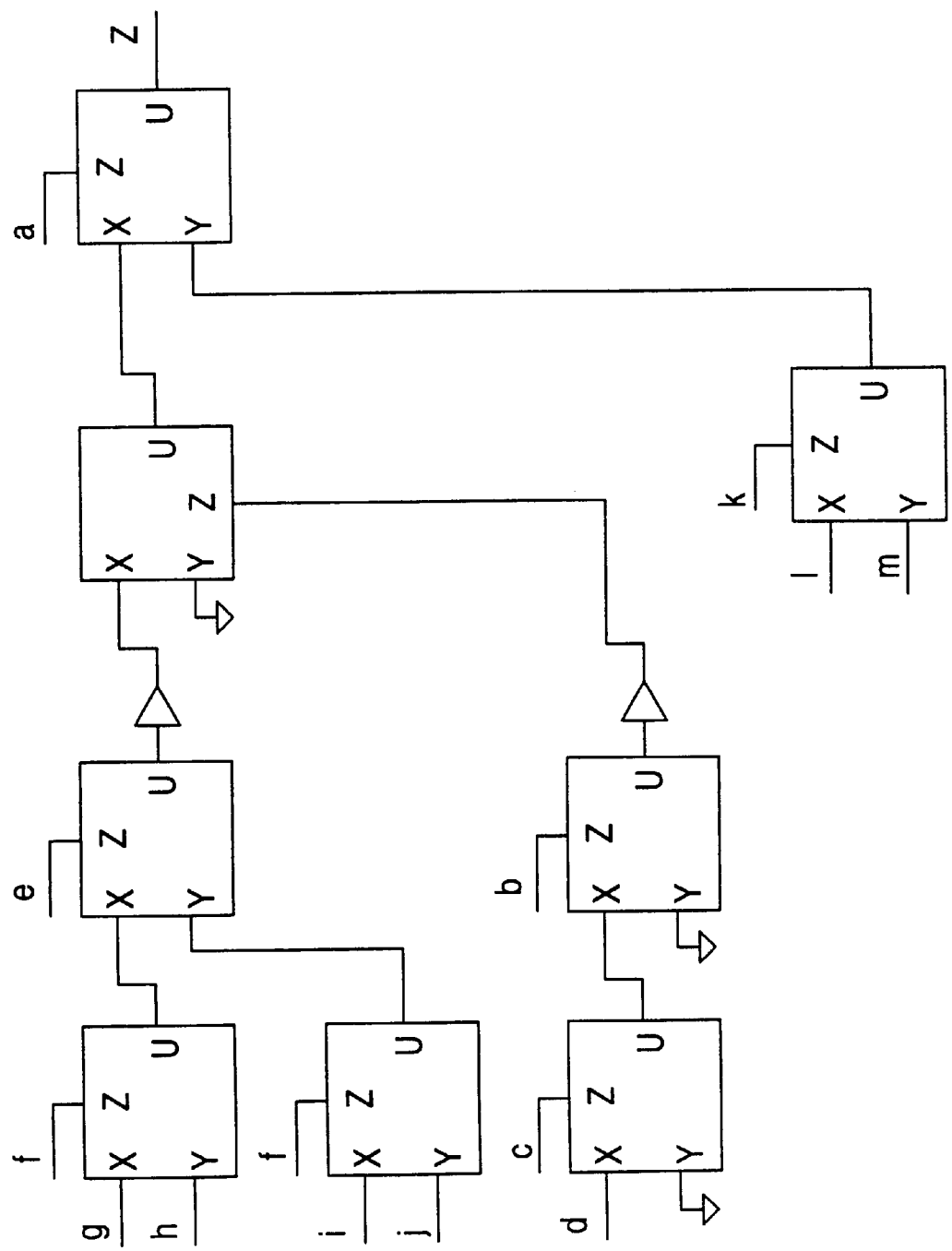
FIG. 70 is a circuit diagram illustrating a second example of a logic circuit obtained by means of the preliminary mapping according to the eighth embodiment.

In the logical circuit shown in FIG. 70, the common variables b, c, and d are mapped using two AND-configured multiplexers and its output is input to the control terminal of the multiplexer preceding the final stage. The logical sum of four logic functions $e \cdot f \cdot g + e \cdot \bar{f} \cdot h + \bar{e} \cdot f \cdot i + \bar{e} \cdot \bar{f} \cdot j$, which share the common variables b, c, and d, is input to the input terminal of the AND-configured multiplexer, wherein the sum of logic functions $e \cdot f \cdot g + e \cdot \bar{f} \cdot h + \bar{e} \cdot f \cdot i + \bar{e} \cdot \bar{f} \cdot j$ is mapped using two-stage multiplexer taking into account the fact that variables e and f act as multiple-complementary variables.

Figure 1:
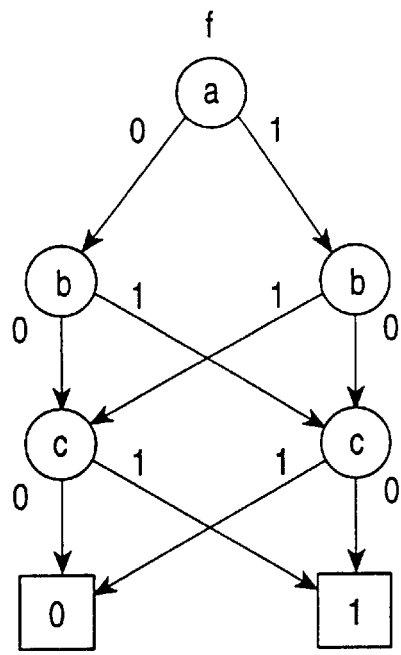
FIG. 1 is a binary decision diagram representing a logical expression.
Figure 2:
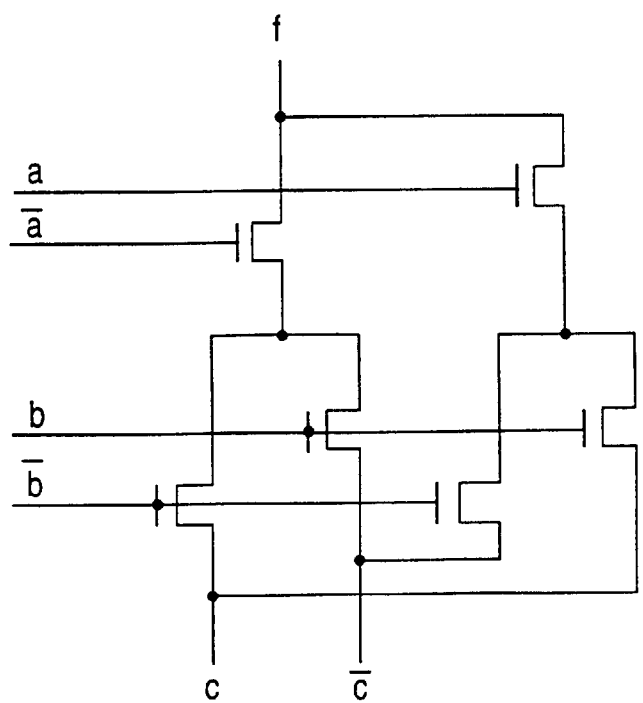
FIG. 2 is a logic circuit mapping the logical expression shown in FIG. 1.
Figure 3:
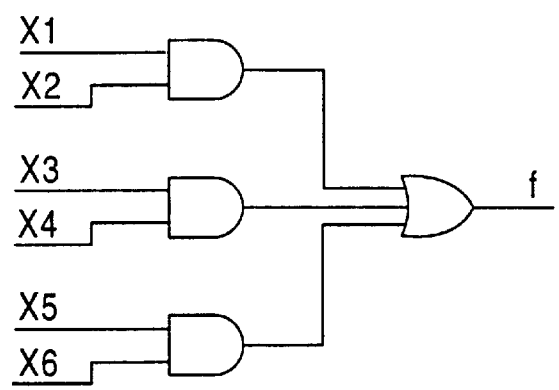
FIG. 3 is a circuit diagram of a logic circuit wherein input variables of a logical expression are input in a certain order to the logical circuit.
Figure 4:
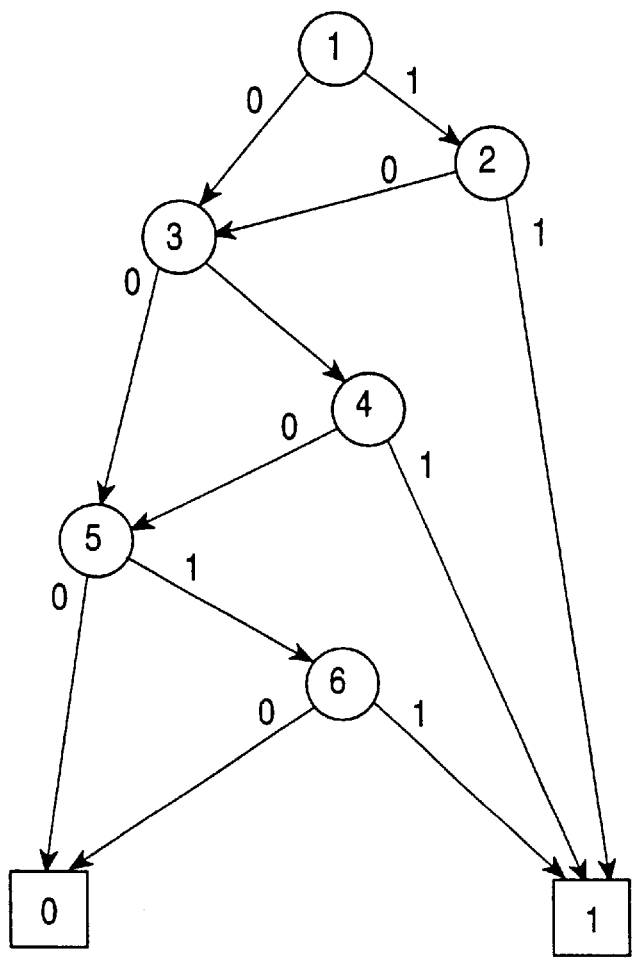
FIG. 4 is a binary decision diagram representing the logical expression mapped to the logic circuit shown in FIG. 3.
Figure 5:
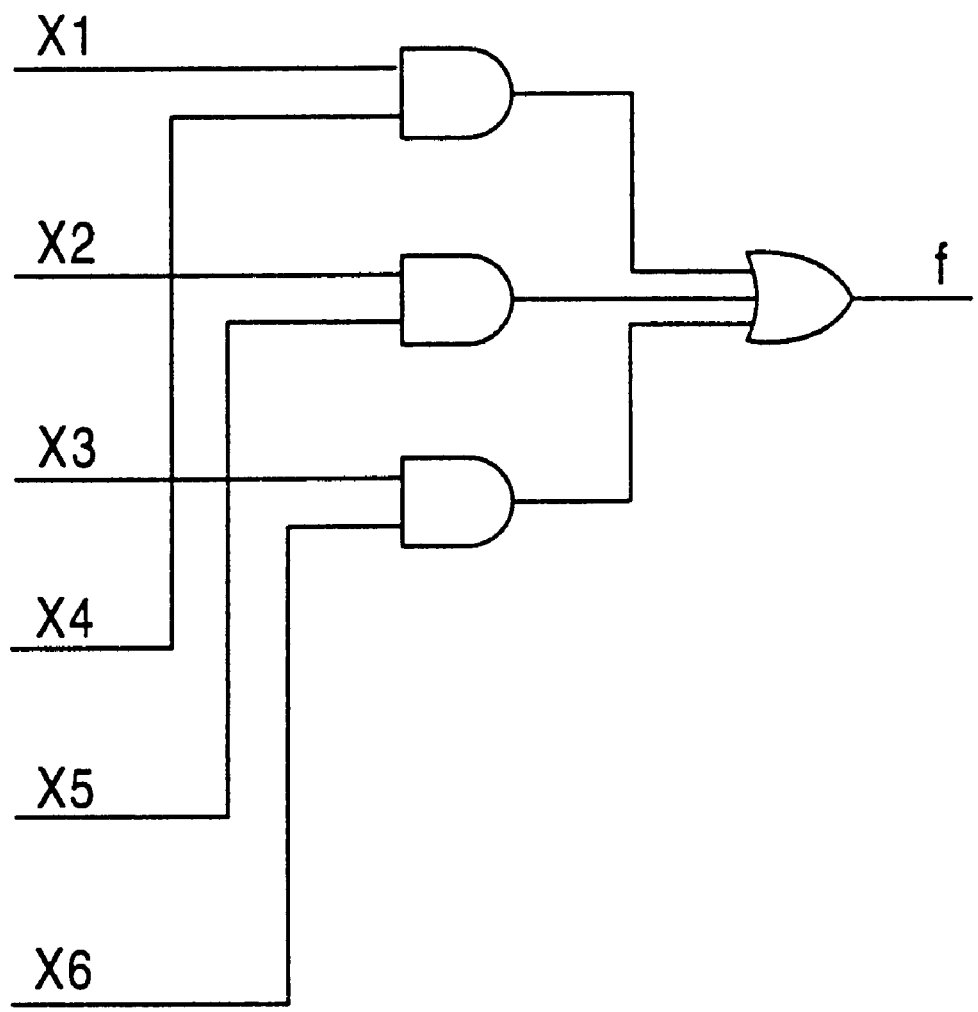
FIG. 5 is a circuit diagram of a logic circuit which maps an equivalent logical expression as that mapped by the logic circuit shown in FIG. 3 but which is realized such that the input variables are input in a different order.
Figure 6:
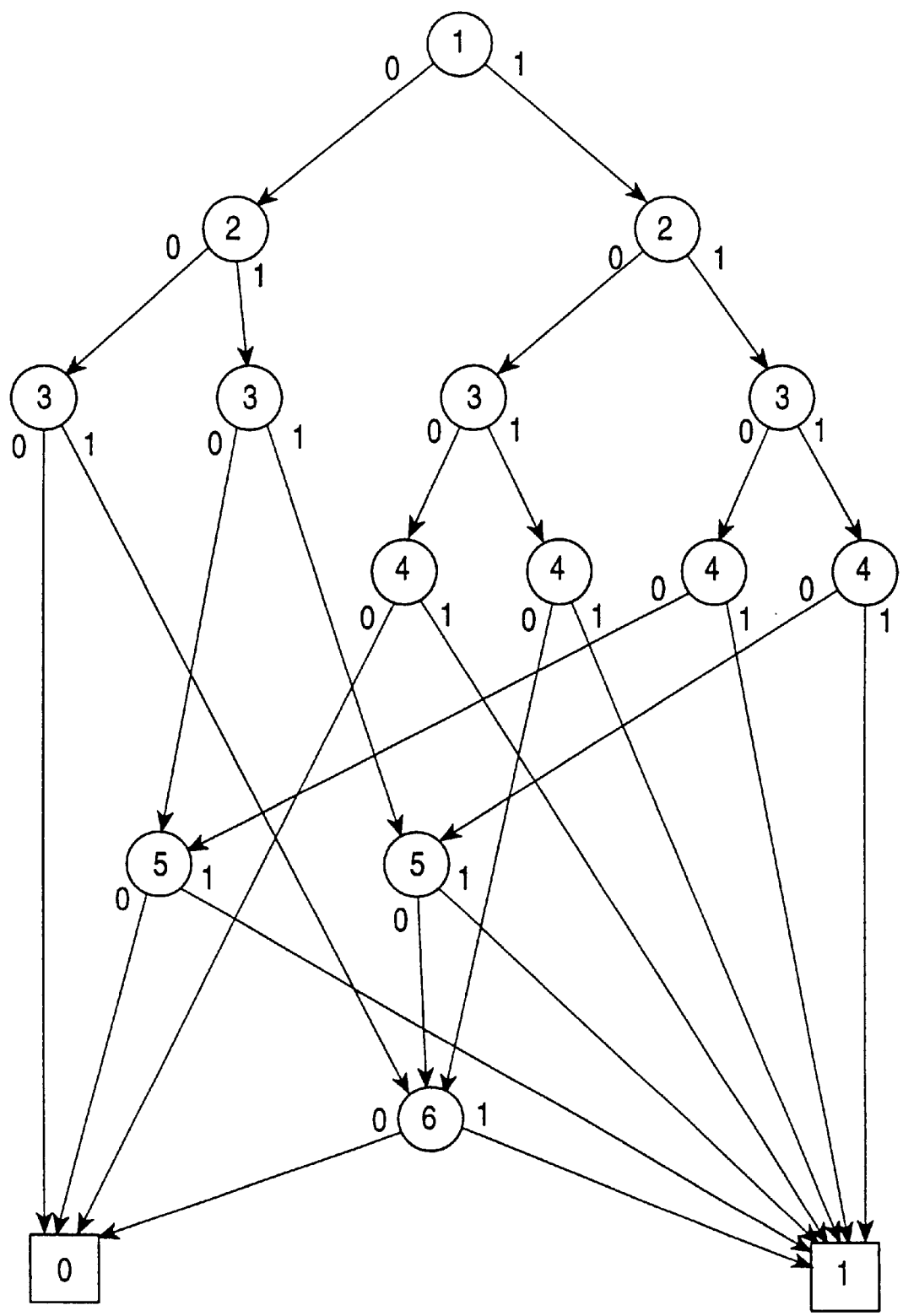
FIG. 6 is a binary decision diagram representing the logical expression mapped to the logic circuit shown in FIG. 5.
Figure 7:
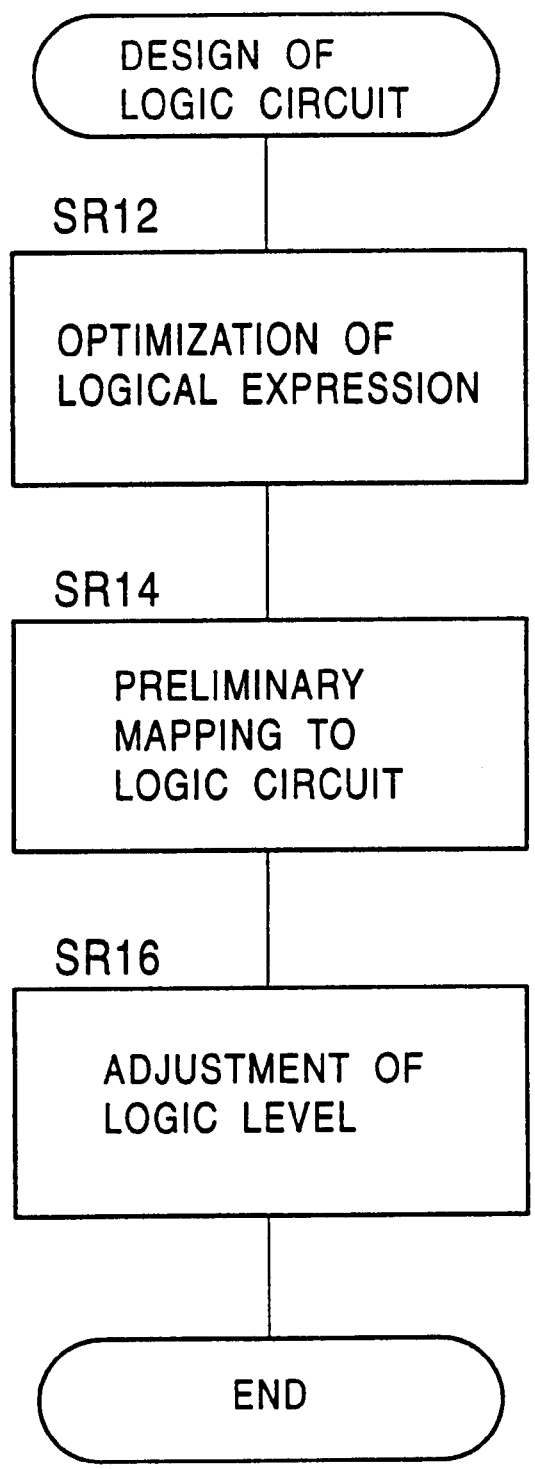
FIG. 7 is a flow chart illustrating the procedure to design logic circuits according to an embodiment of the invention.

After the preliminary mapping procedure, a logic level adjustment corresponding to step SR16 in the flow chart of FIG. 7 is performed.

In the logic level adjustment procedure in the present embodiment, the logic level is adjusted so that positive-logic (negative-logic) zones and negative-logic (positive-logic) zones are alternately located from the output side toward the input side. The polarity of the final stage is determined taking into account whether the given logical expression is in positive- or negative-logic form. More specifically, each buffer is first replaced by one inverter, and the logic circuit is divided at each inverter into positive-logic zones and negative-logic zones. Signals which are directly input in the negative-logic zones are inverted.

Figure 71:
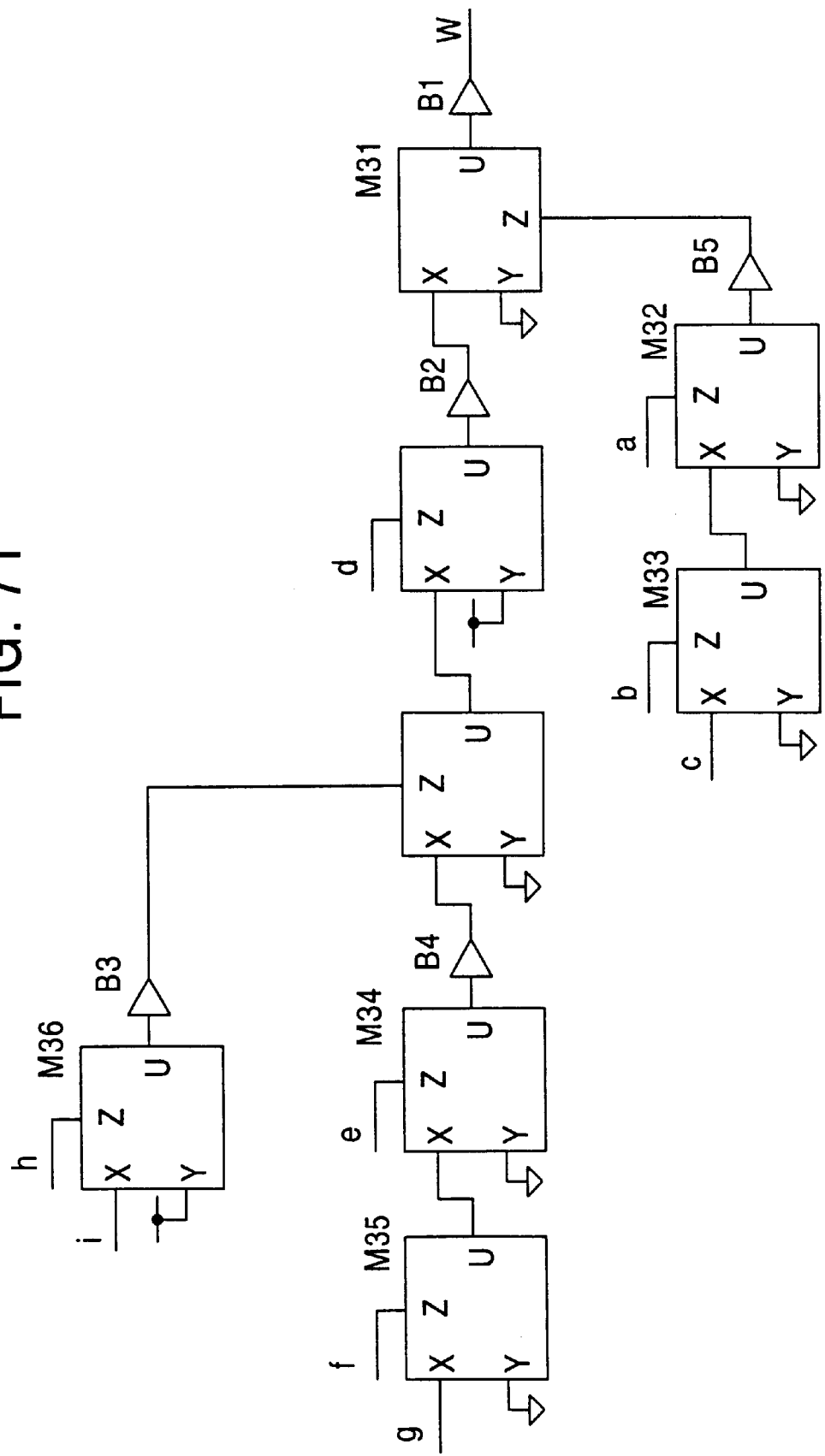
FIG. 71 is a circuit diagram illustrating a logic circuit to be subjected to a logic level adjustment according to the eighth embodiment.
Figure 72:
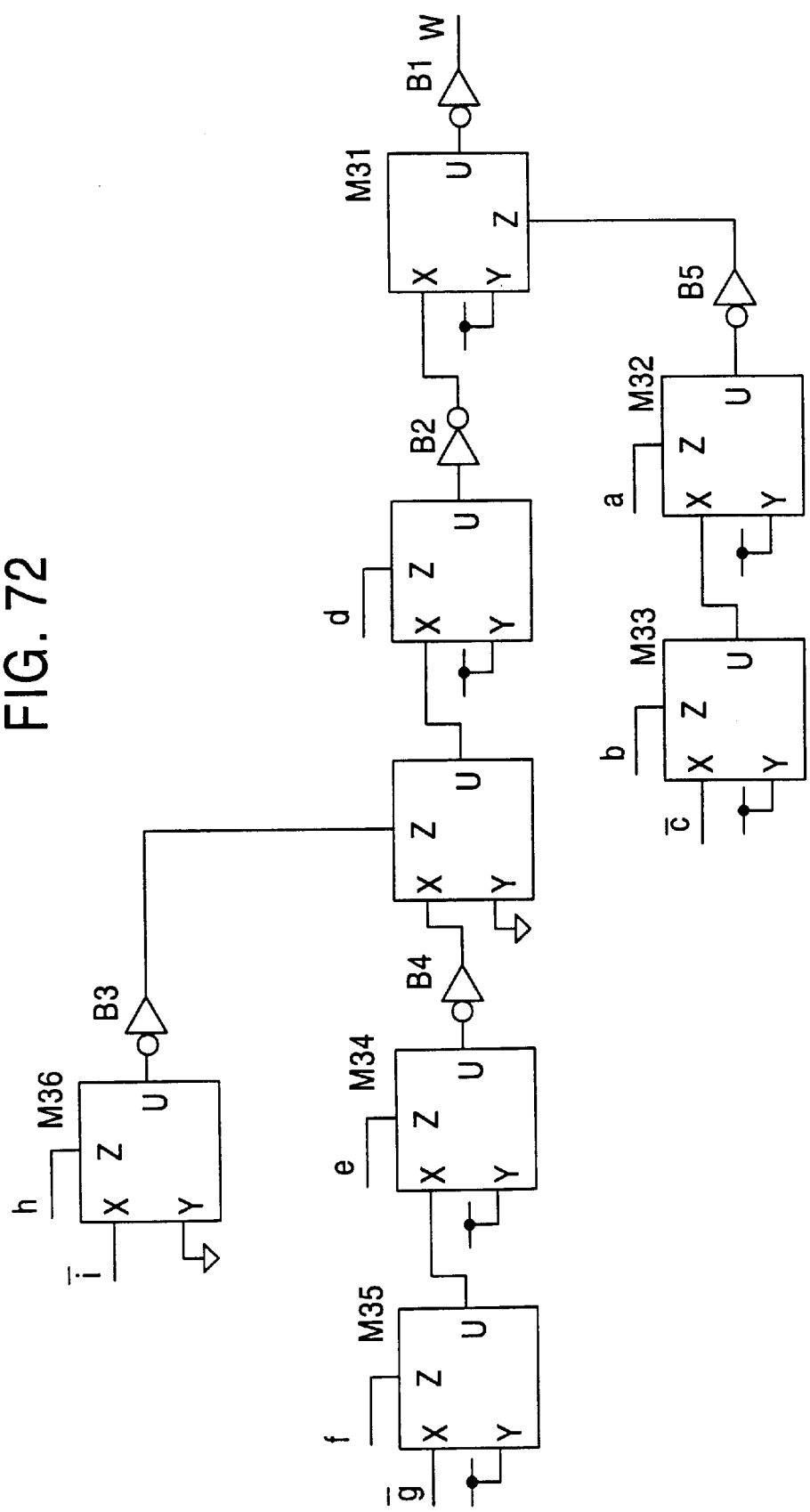
FIG. 72 is a circuit diagram illustrating a logic circuit which has been converted, by the procedure according to the eighth embodiment, from the logic circuit shown in FIG. 71.

If the preliminary mapping procedure according to the present embodiment is applied to the logical expression (17) described earlier, then a logic circuit in the form shown in FIG. 71 is obtained. If the logical level adjustment described above is performed on this logic circuit, the result will be as shown in FIG. 72.

In the example shown in FIG. 71, because the logical expression (17) is in the positive-logic form, the output w is in a positive-logic zone. Therefore, the part of the circuit between the buffers B1 and B2, the part preceding the buffer B3, and the part preceding the buffer B4 are in negative-logic zones. Although the control signals input to control terminals of the multiplexers may be given in either the positive- or negative-logic form, they are given in the positive-logic form in this specific example. The part preceding the buffer B5 is also in a negative-logic zone. More specifically, variables c, g, and i, which are direct-input signals, are inverted. Similarly, LOW constant signals input to the multiplexers M31–M35 and HIGH constant signals input to the multiplexer, M36 are inverted. No other modifications are required. If the logical level adjustment described above is performed on the logic circuit shown in FIG. 71, it is transformed into the form shown in FIG. 72.

The ninth embodiment is now described.

In this ninth embodiment, after completion of optimizing a given logic expression, mapping procedure is performed first for the highest-level group and then for lower-level groups simultaneously adjusting the logic level.

The mapping for the highest-level group and that for the lower-level groups may be performed in substantially the same manner. However, if the highest-level group includes a plurality of independent subservient groups as is the case in equation (21), it is desirable to properly select the order of inputting the plurality of groups so that the maximum number of stages is minimized.

Figure 73:
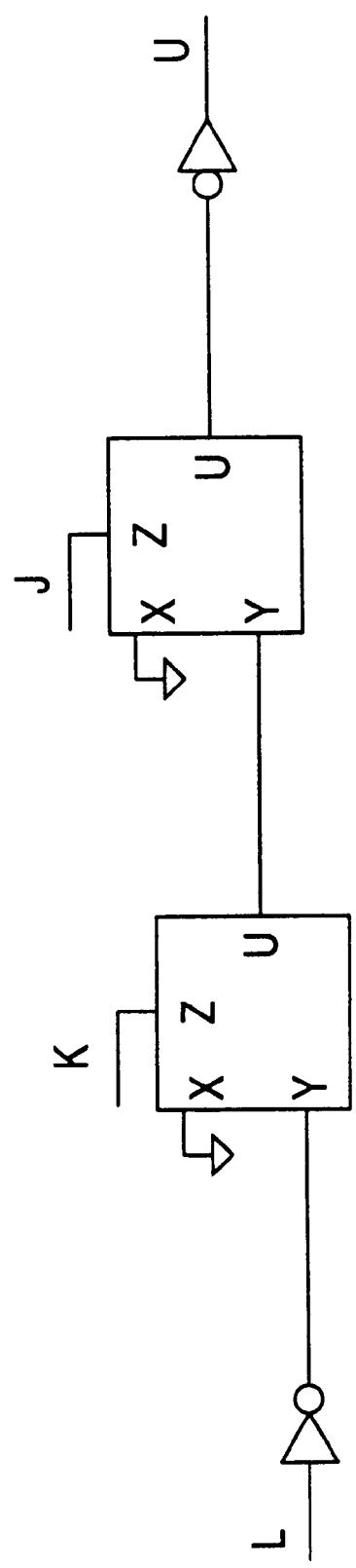
FIG. 73 is a circuit diagram illustrating an example of a logic circuit with an OR logic structure mapping a highest-level group according to a method of designing a logic circuit of a ninth embodiment of the invention.
Figure 74:
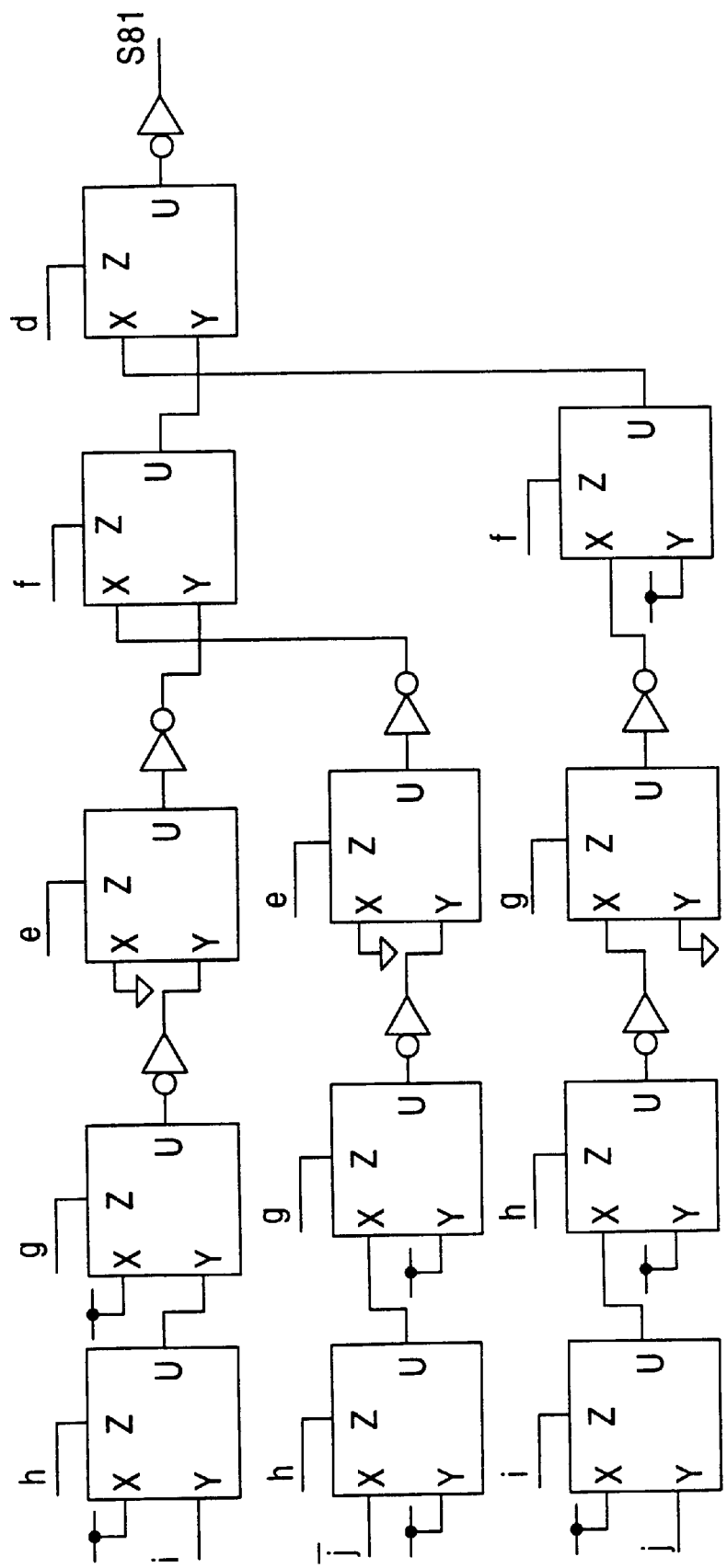
FIG. 74 is a circuit diagram illustrating a part of an example of a logic circuit mapping a logical expression optimized according to a variable-combination method, according to the eighth embodiment, wherein the entire parts of the circuit are shown over FIGS. 74–77.
Figure 75:
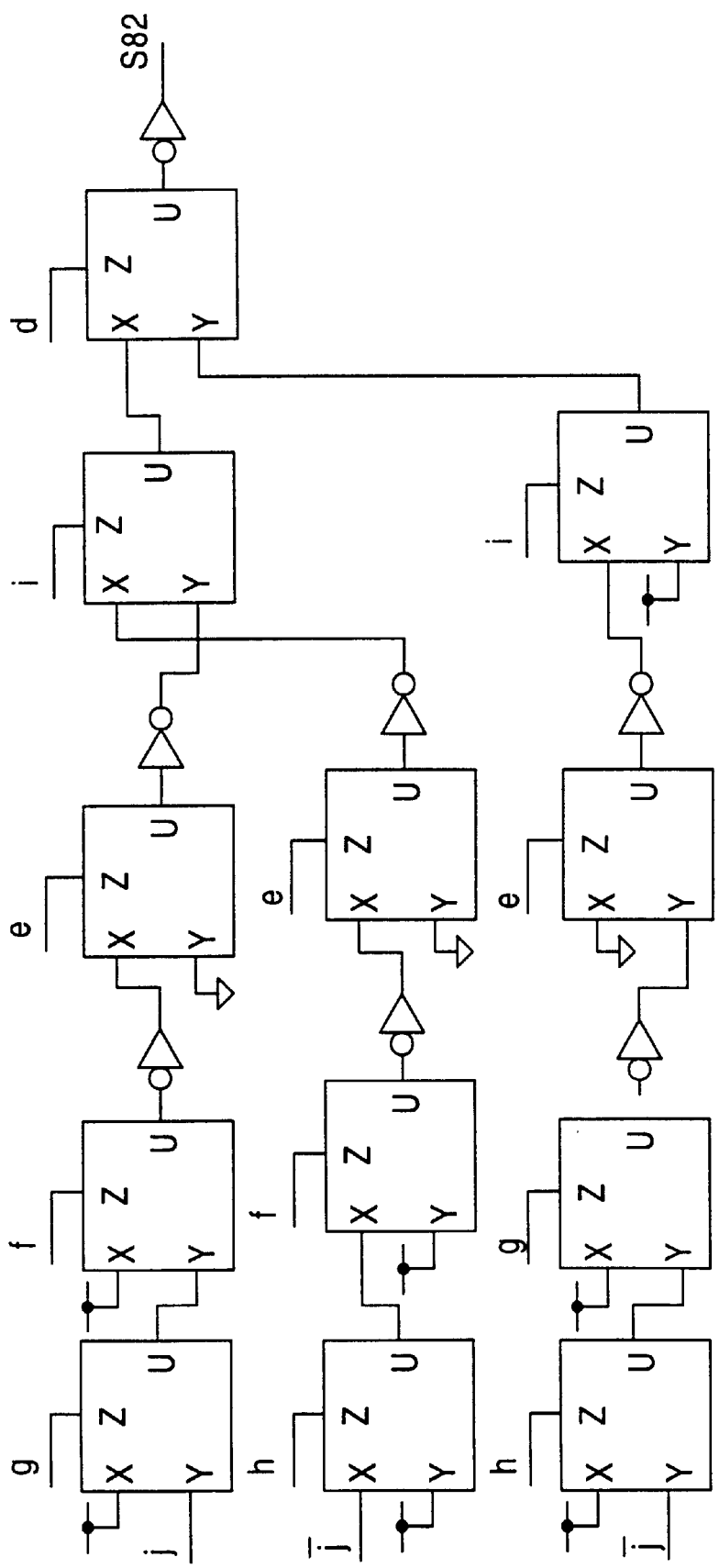
FIG. 75 is a circuit diagram illustrating another part of the logic circuit according to the variable-combination method.
Figure 76:
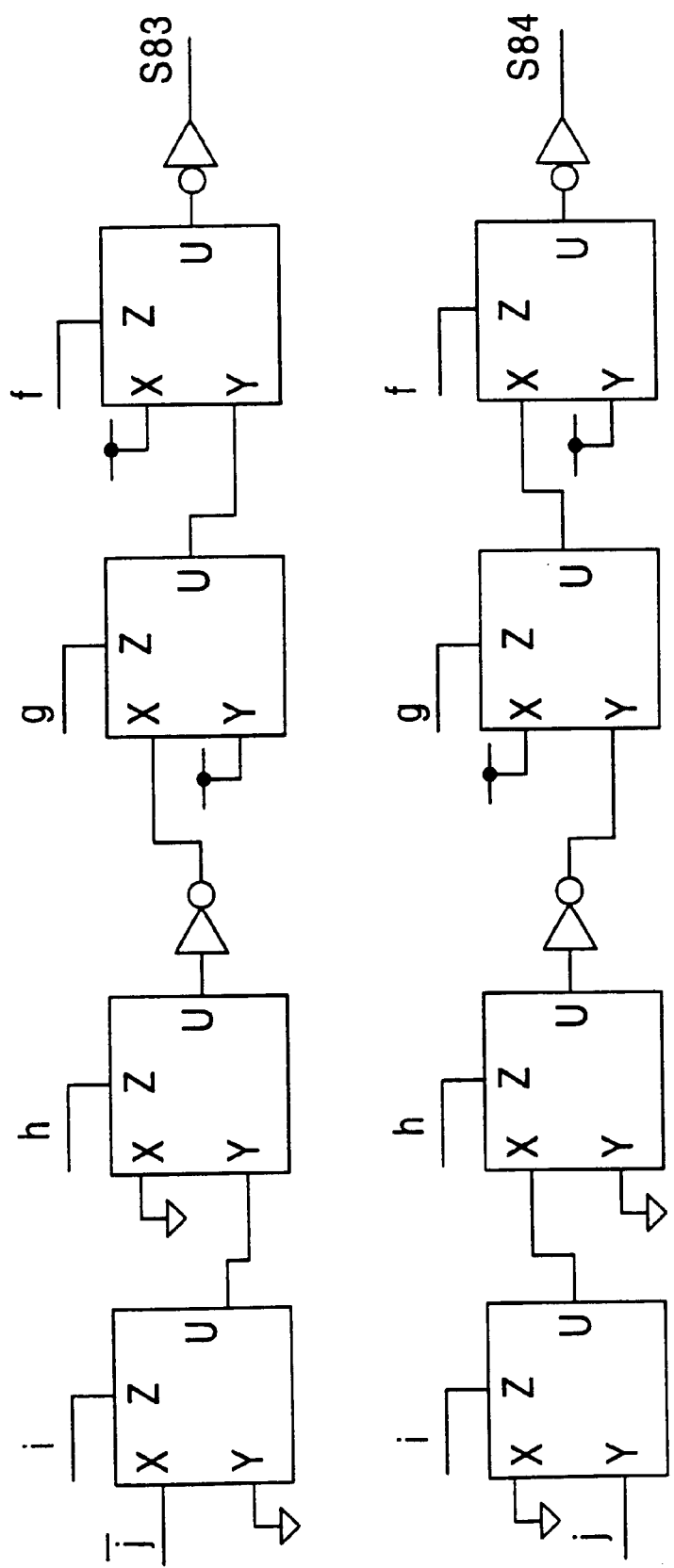
FIG. 76 is a circuit diagram illustrating still another part of the logic circuit according to the variable-combination method.
Figure 77:
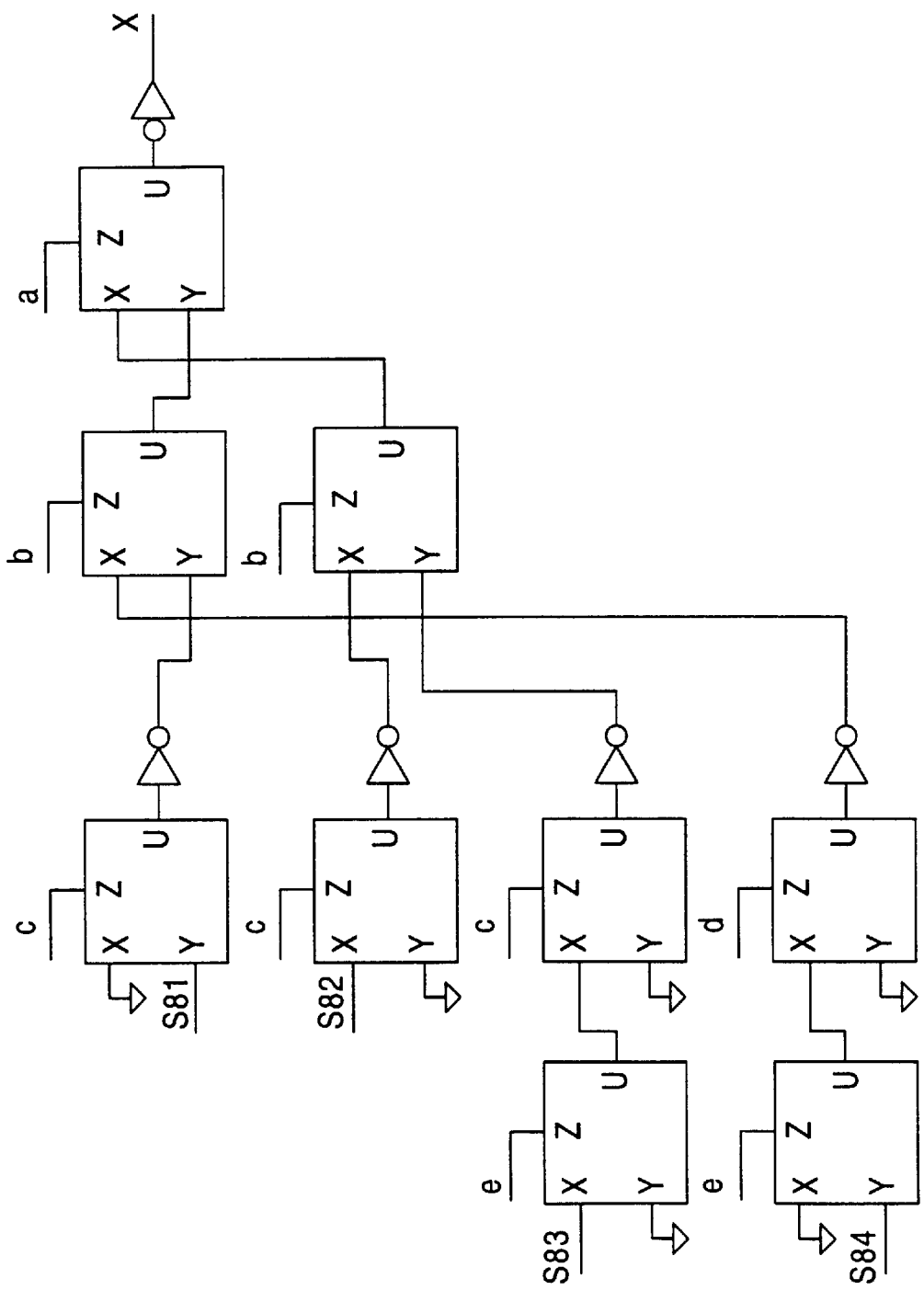
FIG. 77 is a circuit diagram illustrating still another part of the logic circuit according to the variable-combination method.
Figure 78:
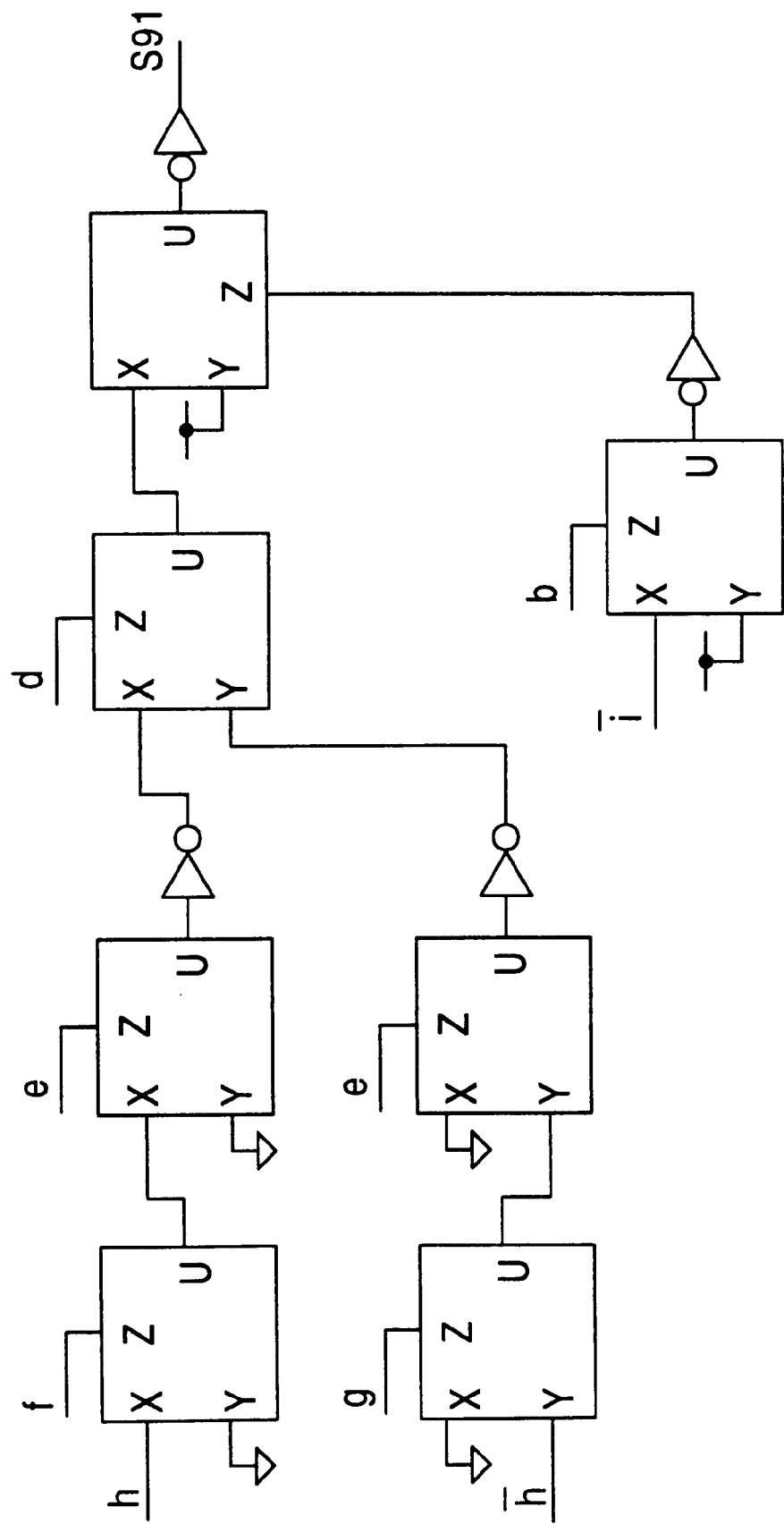
FIG. 78 is a circuit diagram illustrating a part of an example of a logic circuit mapping a logical expression optimized according to a common-variable method, according to the eighth embodiment, wherein the entire parts of the circuit are shown over FIGS. 78–82.
Figure 79:
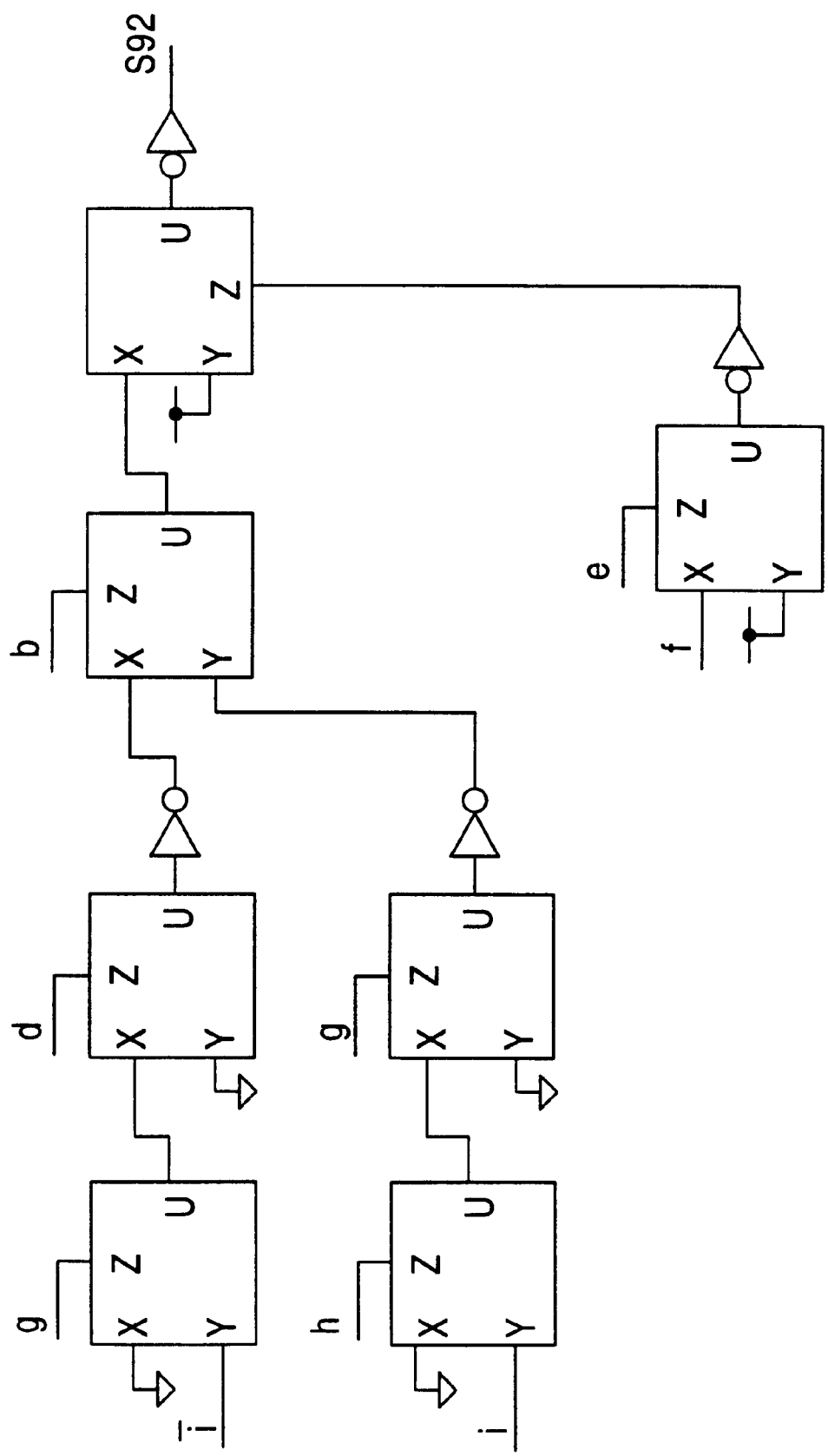
FIG. 79 is a circuit diagram illustrating another part of the logic circuit according to the common-variable method.
Figure 80:
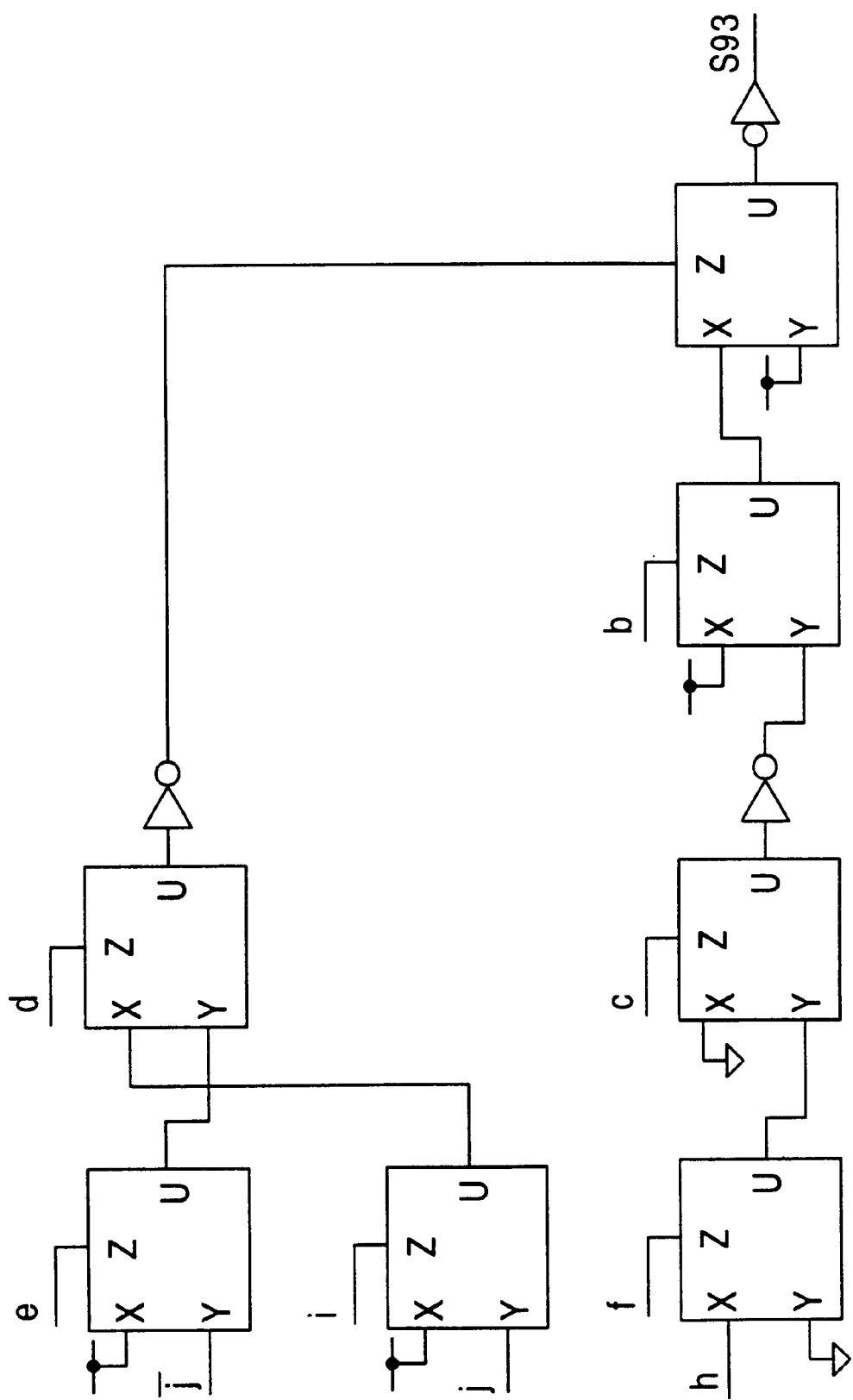
FIG. 80 is a circuit diagram illustrating still another part of the logic circuit according to the common-variable method.
Figure 81:
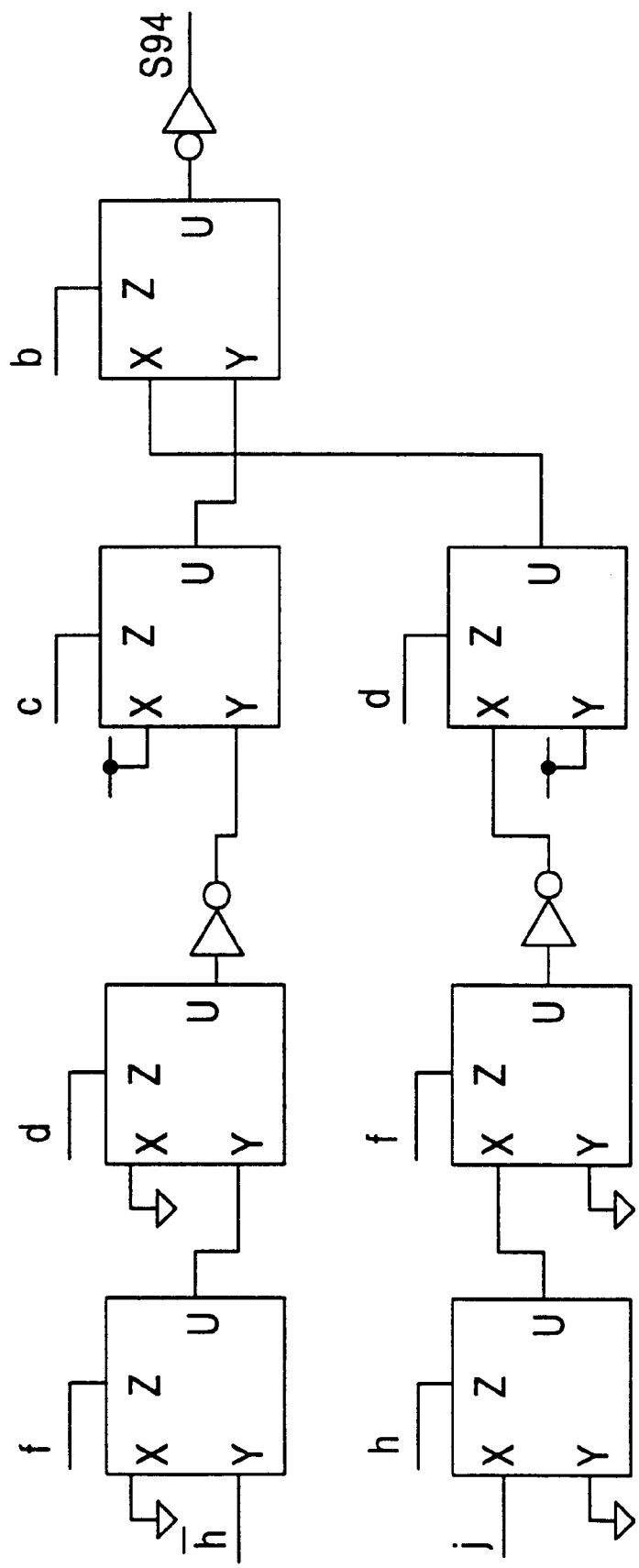
FIG. 81 is a circuit diagram illustrating still another part of the logic circuit according to the common-variable method.
Figure 82:
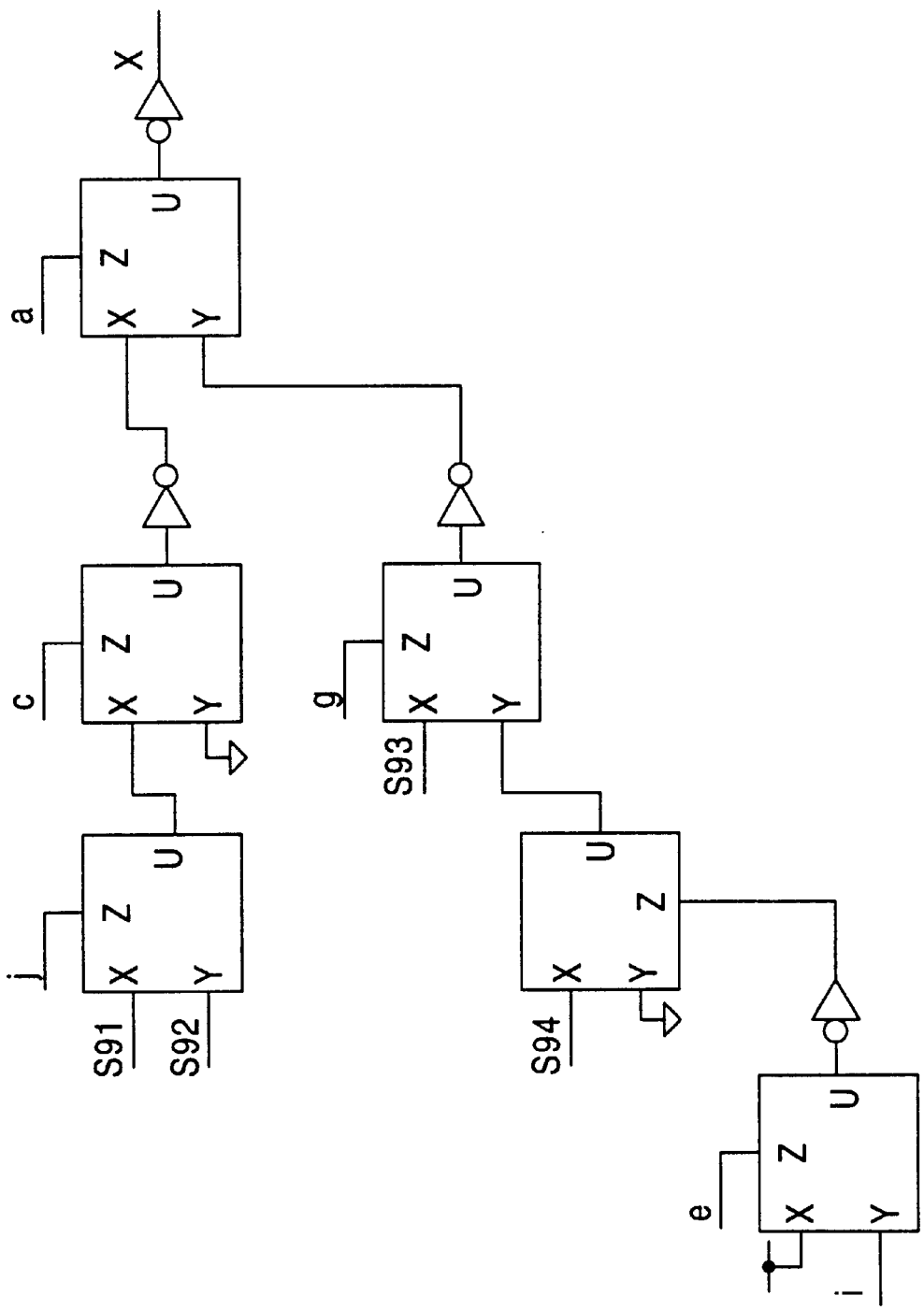
FIG. 82 is a circuit diagram illustrating still another part of the logic circuit according to the common-variable method.
Figure 83:
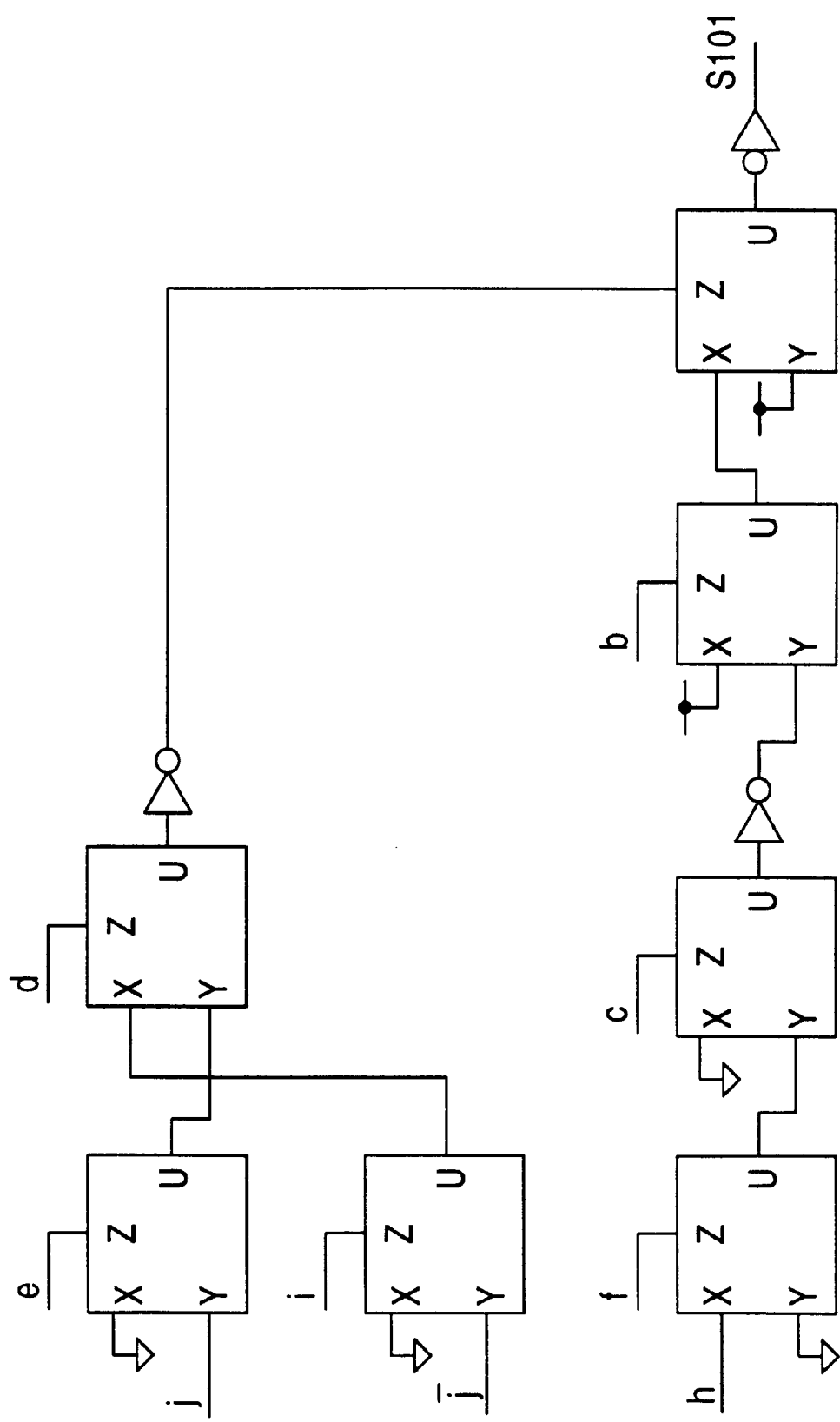
FIG. 83 is a circuit diagram illustrating a part of an example of a logic circuit mapping a logical expression optimized according to a common-variable/variable-combination method, according to the eighth embodiment, wherein the entire parts of the circuit are shown over FIGS. 83–87.
Figure 84:
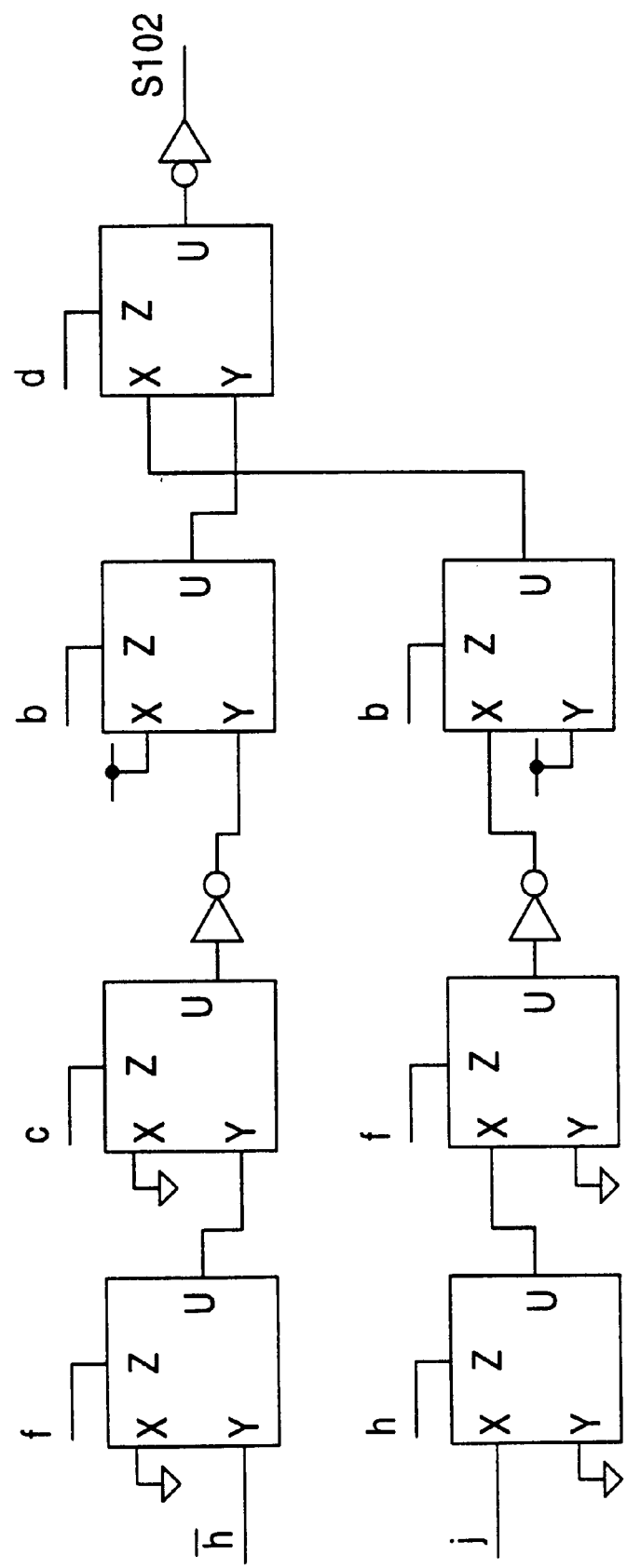
FIG. 84 is a circuit diagram illustrating another part of the logic circuit according to the common-variable/variable-combination method.
Figure 85:
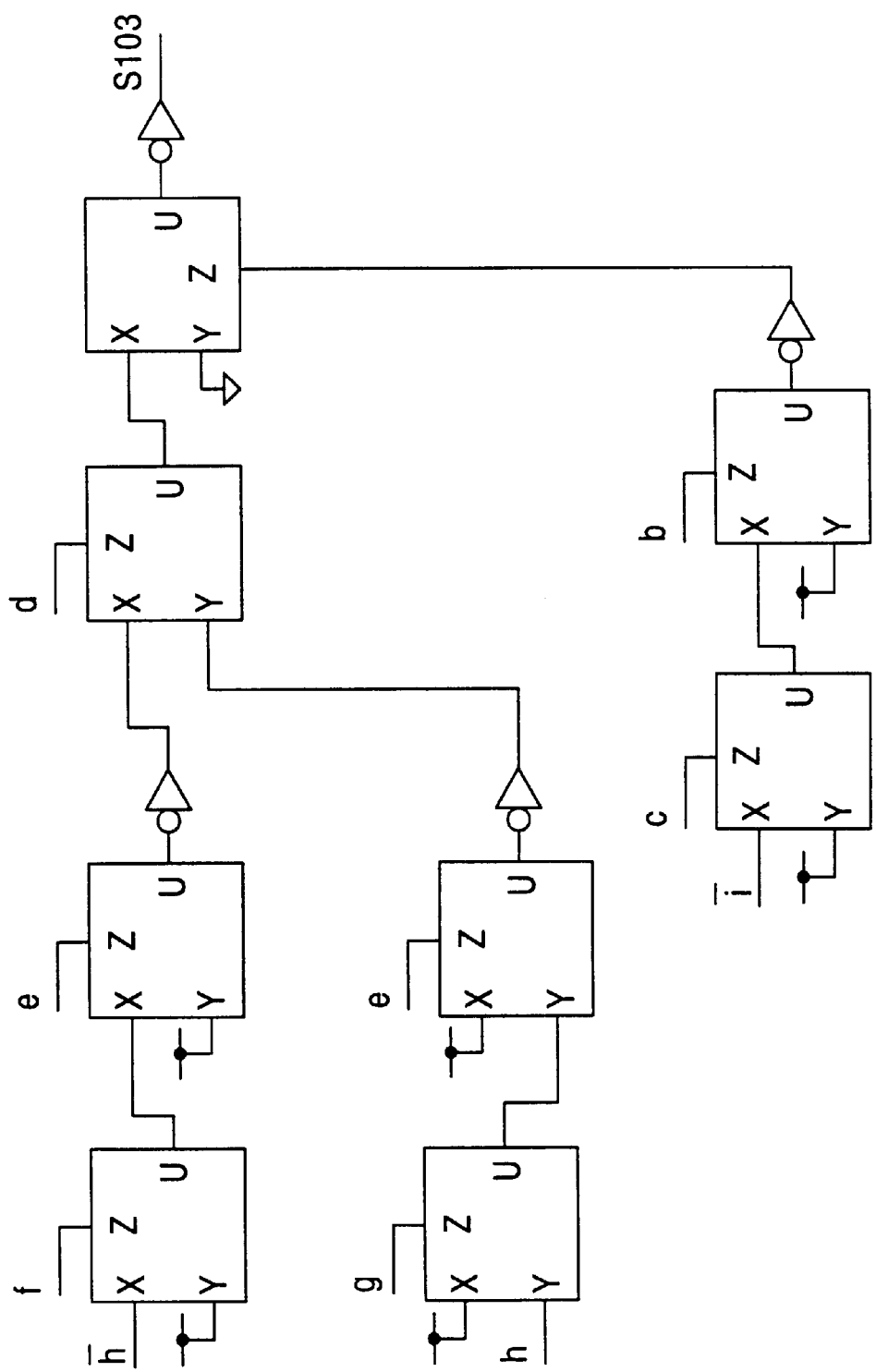
FIG. 85 is a circuit diagram illustrating still another part of the logic circuit according to the common-variable/variable-combination method.
Figure 86:
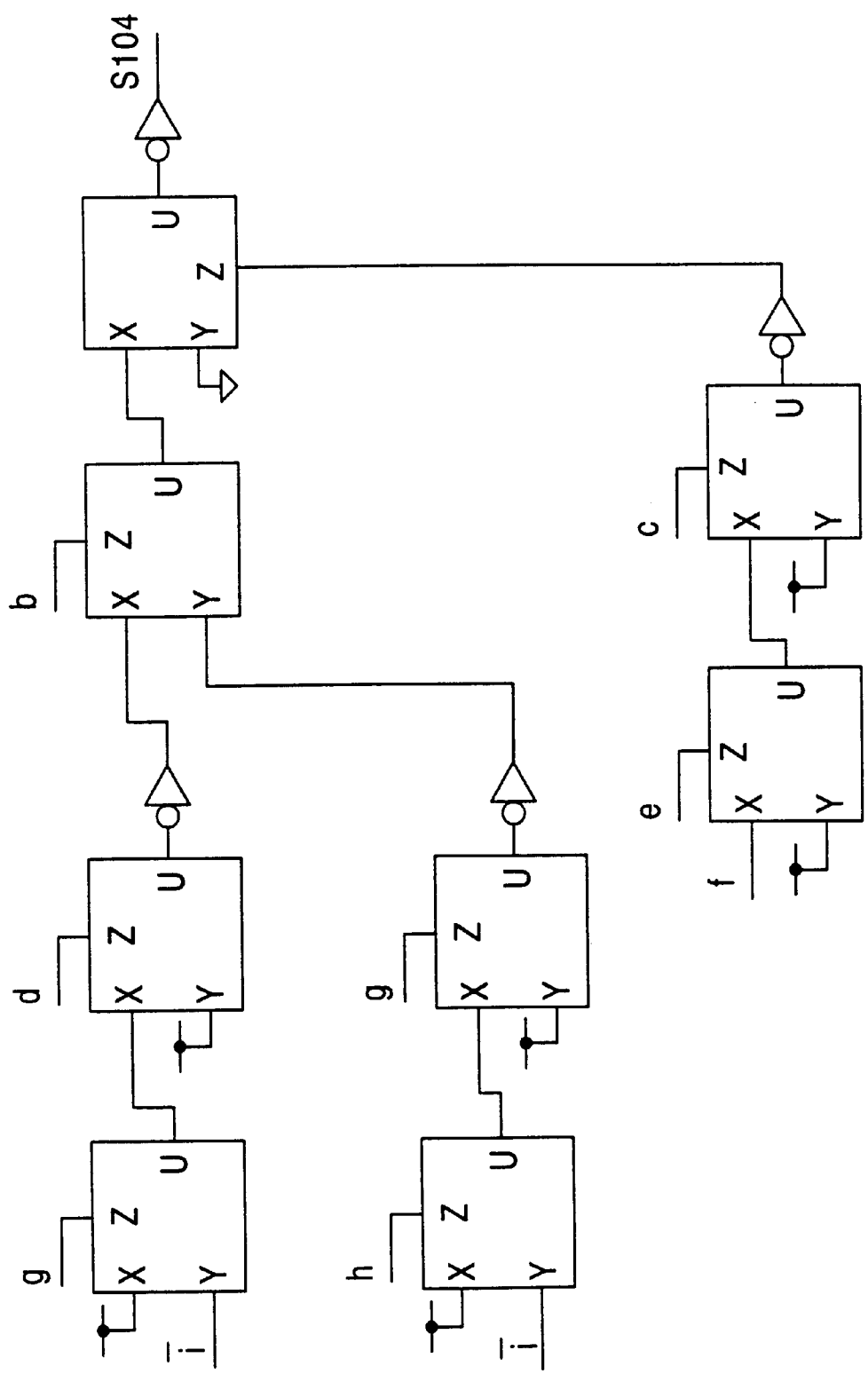
FIG. 86 is a circuit diagram illustrating still another part of the logic circuit according to the common-variable/variable-combination method.
Figure 87:
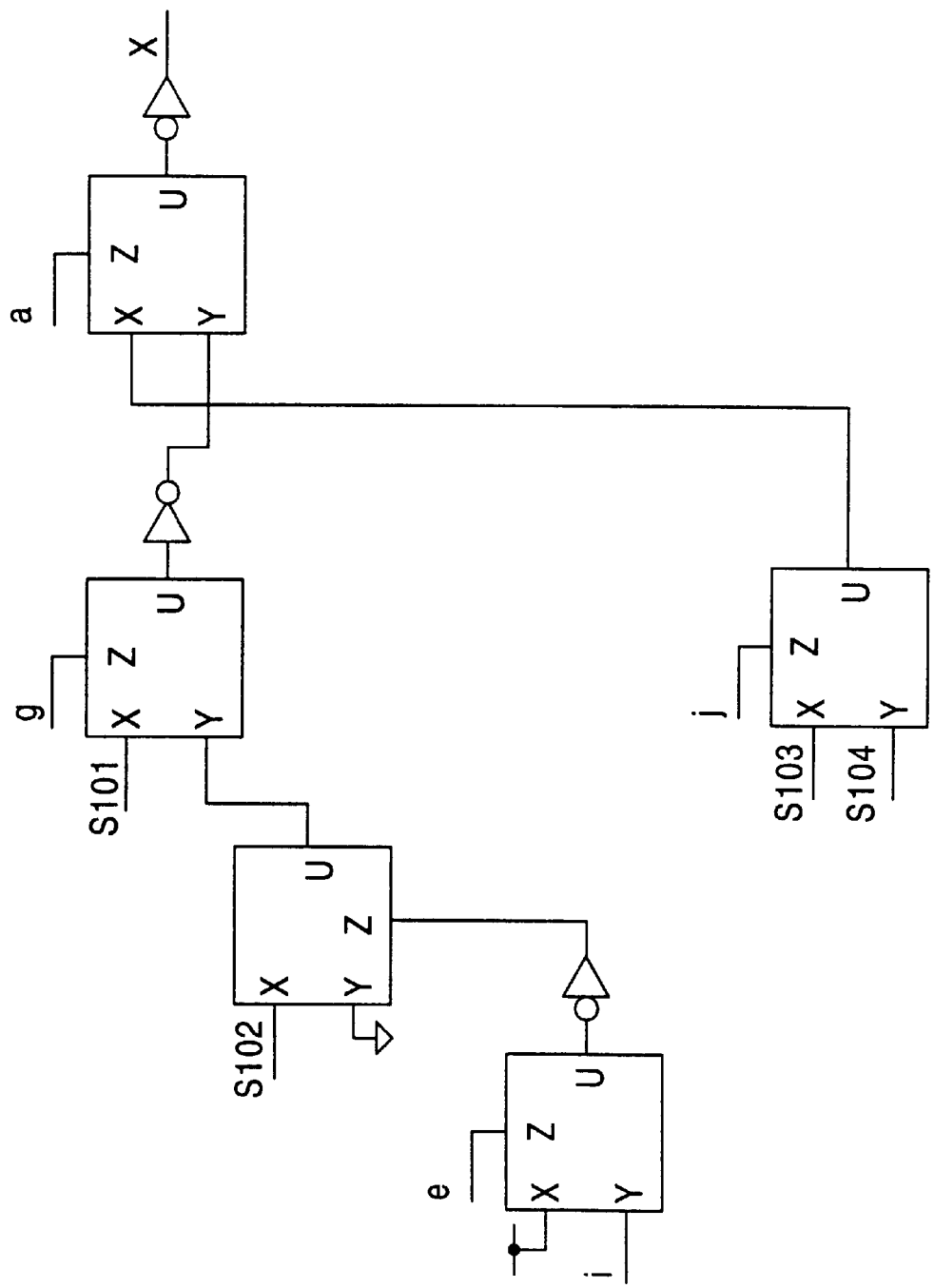
FIG. 87 is a circuit diagram illustrating still another part of the logic circuit according to the common-variable/variable-combination method.

To this end, OR-configured multiplexers whose one input terminal is coupled to input a constant signal are employed. In order that the numbers of pass-transistor stages fall within the allowable range, inverters are inserted at proper locations. The mapping is performed from those groups having a greater number of pass stages to groups having a smaller number of pass stages, and from the output side to the input side. For example, in equation (21), if the number of pass stages decreases in the order from the logic groups J through K to L, the resultant logic circuit will be as shown in FIG. 73.

The number of pass stages can be roughly estimated as follows. Of the terms in the lowest-level group in a certain group under consideration, the greatest number of variables in the terms and the number of common variables shared by the terms in the lowest-level group are compared with each other. The greater value is taken, and 1 is added to that. Furthermore, the number of complementary variables is added to that. The above procedure is performed repeatedly for the higher-level logic groups, and the obtained values are added to the above value. The value, which is finally obtained after the above procedure has been performed on the highest-level group (the logic groups J, K, and L in the case of equation (21)), is employed as the estimated number of pass stages.

The mapping process is performed for the highest-level group having structures other than the structure of equation (21) and also for the lower-level groups. In this mapping procedure for the respective groups, the mapping is performed from the highest-level to lowest-level groups so that the numbers of pass-transistor stages do not exceed the maximum allowable number. In this mapping procedure, positive-logic zones (negative-logic zones) and negative-logic zones (positive-logic zones) are alternately formed starting with the output side toward the input side so that adjacent positive- and negative-logic zones are bounded by each other via an inverter.

The above procedure is performed in basically the same manner as in the eighth embodiment described above except that the logical level adjustment is simultaneously performed.

More specifically, logic groups having complementary variables are mapped by multiplexers, and logic groups having common variables are mapped using AND-configured multiplexers. The estimated number of pass stages is determined for the product of common variables and for the sum of logic functions which share the common variables, and either the product of the common variables or the sum of the logic functions having a larger estimated number of pass stages are input to the input terminals of AND-configured multiplexers, and the others are input to the control terminals of the corresponding multiplexers. If a signal input to the control terminal of a multiplexer is supplied without being passed through an inverter, an inverter is inserted. Signals which are directly input in negative-logic zones are inverted.

In the eighth and ninth embodiments, as described above, the given logical expression to be realized into a logic circuit is mapped using pass-transistor logic circuits. The logical expression (5) optimized according to the variable-combination method described earlier, the logical expression (9) optimized according to the bottom-up common-variable method, and the logical expression (14) optimized according to the common-variable/variable-combination method can be mapped using pass-transistor logic circuits according to the method of the eighth embodiment to logic circuits shown over FIGS. 74–77, FIGS. 78–82, and FIGS. 83–87, respectively.

In the logic circuit shown over FIGS. 74–77, 166 transistors are used and the maximum number of signal pass stages is 14. In the logic circuit shown over FIGS. 78–82, 141 transistors are used and the maximum number of signal pass stages is 12. In the logic circuit shown over FIGS. 83–87, 142 transistors are used and the maximum number of signal pass stages is 12.

In each embodiment described above, symbols S81–S84, S91–S94, and S101–S104 are used to describe the signal connections in the logic circuits.

According to the techniques disclosed herein in various embodiments of the invention, at least one of the following advantages can be achieved.

According to the method of designing a logic circuit, a logic group having a complementary variable can be mapped using a multiplexer composed of a combination of pass transistors to a logic circuit including a small total number of transistors and a small number of stages. In one embodiment of the invention, a logic group having a common variable are further mapped using a multiple-input logic gate thereby achieving a logic circuit including a smaller number of transistors and a smaller number of stages. A CAD system according to the present invention may be used to practice such the mapping procedure in a desirable fashion.

In the method of designing a logic circuit according to the present invention, an optimization procedure including a procedure of grouping product terms by one or more complementary variables is performed on a given logical expression so that the optimized logical expression may be easily mapped using a multiplexer to a logic circuit including a small number of transistors and a small number of stages. In one embodiment of the invention, the given logical expression is optimized by means of the optimization procedure further including a procedure of grouping product terms by one or more common variable so that the optimized logical expression may be easily mapped using a multiple-input logic gate to a logic circuit including a smaller number of transistors and a smaller number of pass-transistor stages. A CAD system according to the present invention may be used to practice such the mapping procedure in a desirable fashion.

According to the method of mapping of the present invention, a combinational logical expression may be mapped, using a circuit structure composed of a multiplexer and inverting logic gates, to a logic circuit including a small number of transistors and a small number of stages. A CAD system according to the present invention may be used to practice such the mapping procedure in a desirable fashion.

According to the method of mapping of the present invention, product terms including various numbers of logic functions may be mapped, using a combination of a multiple-input logic gate and a necessary number of multiplexer(s), to a logic circuit including a small number of transistors and a small number of stages. A CAD system according to the present invention may be used to practice such the mapping procedure in a desirable fashion. According to the present invention, it is possible to realize a logic circuit for executing a logical operation expressed by a logical expression comprising product terms including various numbers of logic functions, by using a combination of a multiple-input logic gate and a necessary number of multiplexer(s) with a small number of transistors and a small number of stages. An electronic system according to the present invention is realized using such a logic circuit. In the method of executing a logical operation according to the present invention, a logical operation expressed by a logical expression that has product terms including various numbers of logic function may be executed in an efficient fashion using a logic circuit in any form described above.

According to the method of mapping of the present invention, a logical expression including a logic group having one or more complementary variables shared by logic functions wherein some or all of the logic functions are products of subservient logic functions, may be mapped, using a combination of one or more multiple-input logic gates and a multiplexer, to a logic circuit including a small number of transistors and a small number of stages. A CAD system according to the present invention may be used to practice such the mapping procedure in a desirable fashion. According to the present invention, it is possible to realize a logic circuit suitable for executing a logical operation expressed by a logical expression including a logic group having one or more complementary variables shared by logic functions wherein one or all of the logic functions are products of subservient logic functions, by using a combination of one or more multiple-input logic gates and a multiplexer with a small number of transistors and a small number of stages. An electronic system according to the present invention is realized using such a logic circuit. In the method of executing a logical operation according to the present invention, it is possible to execute in an efficient fashion a logical operation represented by a logical expression including a logic group having one or more complementary variables shared by logic functions wherein some or all of the logic functions are products of subservient logic functions, by using a logic circuit including a combination of one or more multiple-input logic gates and a multiplexer in any form described above.

According to the mapping method of the present invention, a logical expression including a logic group including one or more common variables shared by logic functions wherein a sum of the logic functions is a subservient logic group including one or more complementary variables shared by subservient logic functions, may be mapped, using a combination of a multiple-input logic gate and a multiplexer, to a logic circuit including a small number of transistors and a small number of stages. A CAD system according to the present invention may be used to practice such the mapping procedure in a desirable fashion. According to the present invention, it is possible to realize a logic circuit suitable for executing a logical operation expressed by a logical expression including a logic group including one or more common variables shared by logic functions wherein a sum of the logic functions is a subservient logic group including one or more complementary variables shared by subservient logic functions, by using a combination of a multiple-input logic gate and a multiplexer with a small number of transistors and a small number of stages. An electronic system according to the present invention is realized using such a logic circuit. In the method of executing a logical operation according to the present invention, it is possible to execute in an efficient fashion a logical operation represented by a logical expression including a logic group including one or more common variables shared by logic functions wherein a sum of the logic functions is a subservient logic group including one or more complementary variables shared by subservient logic functions, by using a logic circuit including a combination of a multiple-input logic gate and a multiplexer in any form described above.

According to the method of mapping a logical expression, a logical expression is mapped using a combination of two types of multiple-input logic gates and a multiplexer. This method enables to map a logical expression such as including a logic group comprising a product of logic functions wherein at least one of the logic functions is a subservient logic group including one or more complementary variables shared by subservient logic functions, at least one of the subservient logic functions is a product of second-subservient logic functions, to a logic circuit including a small number of transistors and a small number of stages. A CAD system according to the present invention may be used to practice such the mapping procedure in a desirable fashion. The logic circuit according to the present invention includes a first-type and second-type multiple-input logic gate and a multiplexer and, the output terminal of a first-type multiple-input logic gate is non-invertingly connected to one of the input terminals of the multiplexer and the output terminal of the multiplexer is non-invertingly connected to one of the input terminals of the second-type multiple-input logic gate. This circuit is suitable to execute a logical operation represented by a logical expression such as including a logic group comprising a product of logic functions wherein at least one of the logic functions is a subservient logic group including one or more complementary variables shared by subservient logic functions, at least one of the subservient logic functions is a product of second-subservient logic functions, with a small number of transistors and a small number of stages. An electronic system according to the present invention is realized using such a logic circuit. In the method of executing a logical operation according to the present invention, it is possible to execute in an efficient fashion a logical operation represented by a logical expression including a logic group comprising a product of logic functions wherein at least one of the logic functions is a subservient logic group including one or more complementary variables shared by subservient logic functions, at least one of the subservient logic functions is a product of second-subservient logic functions, by using a logic circuit including a combination of two types of multiple-input logic gates and a multiplexer in any form described above.

The foregoing description of the present invention is illustrative, and variations and additions to the constructions described will occur to persons skilled in the art. The scope of the invention is intended to be limited only by the following claims.

What is claimed is:

1. A method of designing a logic circuit for mapping a logical expression, comprising:
   optimizing the logical expression including at least one cycle of a first procedure comprising:
   (a) selecting at least a part of the logical expression including a plurality of product terms each including a plurality of variables;
   (b) identifying at least one complementary variable complementarily included in at least two of the product terms; and
   (c) grouping the at least two product terms by the at least one complimentary variable to make a logic group including the at least one complementary variable and at least two logic functions sharing the at least one complementary variable; and
   wherein said identifying comprises:
   determining numbers of logical combinations of sets of variables in the product terms; and
   selecting at least one of the variables included in at least one of the sets of variables having a largest number of logical combinations as a candidate for the at least one complementary variable; and
   mapping the optimized logic expression to the logic circuit.

2. The method according to claim 1, wherein each of said sets of variables includes v of the variables, where v is a positive integer.

3. The method according to claim 1, wherein said selecting at least one of the variables step selects at most v of the variables.

4. The method according to claim 2, wherein said mapping step comprises placing a multiple-stage pass transistor multiplexer with a maximum allowable number of pass-transistor stages which can be connected in series equal to v.

5. The method according to claim 1, wherein
   each of said sets of variables includes v+1 of the variables, where v is a positive integer; and
   said selecting at least one of the variables step selects at most v of the variables.

6. The method according to claim 5, wherein said mapping step comprises placing a multiple-stage pass-transistor multiplexer with a maximum allowable number of pass-transistor stages which can be connected in series equal to v.

7. The method according to claim 1, wherein
   each of said sets of variables includes v+1 of the variables, where v is a positive integer; and
   said determining step determines the number of logical combinations with respect to each of the variables.

8. The method according to claim 1, wherein
   said optimizing step further includes at least one cycle of a second procedure comprising:
   (a) selecting at least a part of the logical expression including a second plurality of product terms each including a second plurality of variables;
   (b) identifying a set of at least one common variable commonly included in at least two of the second product terms; and
   (c) grouping the at least two of the second plurality of product terms to make a second logic group including the at least one common variable and second logic functions sharing the at least one common variable.

9. The method according to claim 8, wherein said mapping step includes placing a non-pass-transistor multiple-input logic gate in the logic circuit, and connecting input terminals of the non-pass-transistor multiple-input logic gate to input the at least one common variable and a sum of the second logic functions to output the second logic group from an output terminal of the non-transistor multiple-input logic gate.

10. The method according to claim 9, wherein said mapping step further includes:
    placing a pass-transistor multiplexer having input terminals, at least one control terminal and an output terminal in the logic circuit; and
    connecting the input terminals and the at least one control terminal of the pass-transistor multiplexer to input the first logic functions and the at least one complementary variable to output the first logic group from the output terminal of the pass-transistor multiplexer.

11. A method of designing a logic circuit for mapping a logical expression, comprising:
    optimizing the logical expression including at least one cycle of a first procedure comprising:
    (a) selecting at least a part of the logical expression including a plurality of product terms each including a plurality of variables;
    (b) identifying at least one complementary variable complementarily included in at least two of the product terms; and (c) grouping the at least two product terms by the at least one complimentary variable to make a logic group including the at least one complementary variable and at least two logic functions sharing the at least one complementary variable; and wherein said identifying step comprises:

determining numbers of logical combinations of sets of variables in the product terms;

selecting at least two of the variables each included in at least one of the sets of variables having a largest number of logical combinations;

determining frequencies that each of the at least two of the variables being included in the sets of variables having the largest number of logical combinations; and selecting at least one of the at least two of the variables having a highest frequency of being included in the sets of variables having the largest number of logical combinations as a candidate for the at least one complementary variable; and mapping the optimized logic expression to the logic circuit.

12. A method of designing a logic circuit for mapping a logical expression, comprising:

optimizing he logical expression including a cycle of a second procedure followed by the at least one cycle of the first procedure, the first procedure comprising:

(a1) selecting at least a first part of the logical expression including a first plurality of product terms each including a first plurality of variables;

(b1) identifying at least one complementary variable complementarily included in at least two of the first plurality of product terms; and (c1) grouping the at least two of the first plurality of product terms by the at least one complementary variable to make a first logic group including the at least one complementary variable and at least two first logic functions sharing the at least one complementary variable; and the second procedure comprising:

(a2) selecting at least a second part of the logical expression including a second plurality of product terms each including a second plurality of variables;

(b2) identifying a set of at least one common variable commonly included in at least two of the second plurality of product terms; and (c2) grouping the at least two of the second plurality of product terms to make a second logic group including the at least one common variable and second logic functions sharing the at least one common variable; and mapping the optimized logical expression to the logic circuit, wherein:

said identifying step in the second procedure identifies at least two sets of at least two common variables: and said selecting step in the first procedure selects the first part of the logical expression including product terms each of which including one of the at least two common variables in the at least two sets of at least two common variables identified in the second procedure as the at least two of the first plurality of product terms of the first part of the logical expression.

13. The method according to claim 12, wherein said mapping includes:

placing a non-pass-transistor multiple-input logic gate in the logic circuit;

connecting input terminals of the non-pass-transistor multiple-input logic gate to input the at least one common variable and a sum of the second logic functions to output the second logic group from an output terminal of the non-pass-transistor multiple-input logic gate;

placing a pass-transistor multiplexer having input terminals, at least one control terminal and an output terminal in the logic circuit; and connecting the input terminals and the at least one control terminal of the pass-transistor multiplexer to input the first logic functions and the at least one complementary variable to output the first logic group from the output terminal of the pass-transistor multiplexer.

14. A CAD system for designing a logic circuit for mapping a logical expression, the system comprising:

means for optimizing the logical expression including at least one cycle of a first procedure comprising:

(a) selecting at least a part of the logical expression including a plurality of product terms each including a plurality of variables;

(b) identifying at least one complementary variable complementarily included in at least two of the product terms; and (c) grouping the at least two product terms by the at least one complementary variable to make a logic group including the at least one complementary variable and at least two logic functions sharing the at least one complementary variable; and wherein said identifying comprises:

determining numbers of logical combinations of sets of variables in the product terms; and selecting at least one of the variables included in at least one of the sets of variables having a largest number of logical combinations as a candidate for the at least one complementary variable; and means for mapping the optimized logical expression to the logic circuit including pass-transistor circuit.

15. A method of designing a logic circuit for mapping a logical expression, comprising:

optimizing the logical expression including at least one cycle of a procedure comprising:

(a) selecting at least a part of the logical expression including a plurality of product terms each including a plurality of variables;

(b) identifying a plurality of sets of common variables, each of the sets including at least one common variable commonly included in a predetermined number of the product terms; and (c) grouping the plurality of product terms to make logic groups each including the at least one common variable of one of the sets of common variables and logic functions sharing the at least one common variable; and mapping the optimized logical expression to the logic circuit including a pass-transistor multiplexer including, identifying a second logic group included in the logic groups having at least one complementary variable and second logic functions sharing the at least one complementary variable in the optimized logical expression;

connecting input terminals and at least one control terminal of the pass-transistor multiplexer to input the second logic functions and the at least one complementary variable to output the second logic group from the output terminal of the pass-transistor multiplexer, placing a non-pass transistor multiple-input logic gate in the logic circuit; and connecting input terminals of the non-pass transistor multiple-input logic gate to input the at least one common variable and a sum of the logic functions to output the logic group from an output terminal of the non-pass-transistor multiple-input-logic gate.

16. The method according to claim 15, wherein said predetermined number is two.

17. The method according to claim 15, wherein said identifying step includes selecting the predetermined number of product terms such that a number of at least one common variable in each of the sets is increased.

18. A method of designing a logic circuit for mapping a logical expression, comprising:

optimizing the logical expression including at least one cycle of a procedure comprising:

(a) selecting at least a part of the logical expression including a plurality of product terms each including a plurality of variables;

(b) identifying a predetermined number of sets of common variables, each of the sets including at least one common variable commonly included in at least two of the product terms; and (c) grouping the plurality of product terms to make logic groups each including the at least one common variable of one of the sets of common variables and logic functions sharing the at least one common variable; and mapping the optimized logical expression to the logic circuit including a pass-transistor multiplexer including, identifying a second logic group included in the logic groups having at least one complementary variable and second logic functions sharing the at least one complementary variable in the optimized logical expression;

connecting input terminals and at least one control terminal of the pass-transistor multiplexer to input the second logic functions and the at least one complementary variable to output the second logic group from the output terminal of the pass-transistor multiplexer;

placing a non-pass-transistor multiple-input logic gate having input terminals and an output terminal in the logic circuit; and connecting the input terminals of the non-pass-transistor multiple-input logic gate to input the at least one common variable and a sum of the logic functions to output the logic group form the output terminal of the non-pass-transistor multiple-input logic gate.

19. The method according to claim 18, wherein said predetermined number is $2^v$, where v is a positive integer.

20. The method according to claim 19, wherein said mapping step comprises placing a multiple-stage pass-transistor multiplexer with a maximum allowable number of pass- transistor stages which can be connected in series equal to v.

21. The method according to claim 18, wherein said predetermined number is four.

22. The method according to claim 18, wherein said identifying step includes selecting the at least two of the product terms such that a number of at least one common variable in each of the sets is increased.

23. A CAD system for designing a logic circuit for mapping a logical expression, the system comprising:

means for optimizing the logical expression including at least one cycle of a procedure comprising:

(a) selecting at least a part of the logical expression including a plurality of product terms each including a plurality of variables;

(b) identifying a plurality of sets of common variables, each of the sets including at least one common variable commonly included in a predetermined number of the product terms; and (c) grouping the plurality of product terms to make logic groups each including the at least one common variable of one of the sets of common variables and logic functions sharing the at least one common variable; and means for mapping the optimized logical expression to the logic circuit including a pass-transistor multiplexer including, identifying a second logic group included in the logic groups having a least one complementary variable and second logic functions sharing the at least one complementary variable in the optimized logical expression;

connecting input terminals and at least one control terminal of the pass-transistor multiplexer to input the second logic functions and the at least one complementary variable to output the second logic group from the output terminal of the pass-transistor multiplexer;

placing a non-pass transistor multiple-input logic gate in the logic circuit; and connecting input terminals of the non-pass-transistor multiple-input logic gate to input the at least one common variable and a sum of the logic functions to output the logic group from an output terminal of the non-pass-transistor multiple-input-logic gate.

24. A method of designing a logic circuit mapping a logical expression, comprising:

optimizing the logic expression including at least one cycle of a procedure comprising:

(a) selecting at least a part of the logical expression including a plurality of product terms each including a plurality of variables;

(b) identifying a predetermined number of sets of common variables, each of the sets including at least one common variable commonly included in at least two of the product terms, wherein said predetermined number is $2^v$ where v is a positive integer; and (c) grouping the plurality of product terms to make logic groups each including the at least one common variable of one of the sets of common variables and logic functions sharing the at least one common variable; and mapping the optimized logical expression to the logic circuit including a pass-transistor multiplexer, wherein said mapping step comprises placing a multiple-stage pass-transistor multiplexer with a maximum allowable number of pass-transistor stages which can be connected in series equal to v.

* * * * *